/ United States Patent US009528879B2

(12) United States Patent  (10) Patent No.: US 9,528,879 B2
Watabe et al.  (45) Date of Patent: Dec. 27, 2016

(54) INFRARED DETECTION ELEMENT, INFRARED DETECTOR, AND INFRARED TYPE GAS SENSOR

(71) Applicant: PANASONIC INTELLECTUAL PROPERTY MANAGEMENT CO., LTD., Osaka (JP)

(72) Inventors: Yoshifumi Watabe, Osaka (JP); Sadayuki Sumi, Hyogo (JP); Yuichi Inaba, Osaka (JP); Junichi Hozumi, Kanagawa (JP); Takahiko Hirai, Osaka (JP); Tsuyoshi Kuroda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/761,807

(22) PCT Filed: Jan. 20, 2014

(86) PCT No.: PCT/JP2014/000243
§ 371 (c)(1),
(2) Date: Jul. 17, 2015

(87) PCT Pub. No.: WO2014/112392
PCT Pub. Date: Jul. 24, 2014

(65) Prior Publication Data
US 2015/0369668 A1 Dec. 24, 2015

(30) Foreign Application Priority Data

Jan. 21, 2013 (JP) ................................. 2013-008646
Jan. 23, 2013 (JP) ................................. 2013-010313

(Continued)

(51) Int. Cl.
*G01J 5/00* (2006.01)
*G01J 5/16* (2006.01)
(Continued)

(52) U.S. Cl.
CPC ............ *G01J 5/0014* (2013.01); *G01J 1/0271* (2013.01); *G01J 3/42* (2013.01); *G01J 5/045* (2013.01);
(Continued)

(58) Field of Classification Search
CPC ............... G01J 5/16; G01J 5/34; G01J 5/0014
(Continued)

(56) References Cited

U.S. PATENT DOCUMENTS 3,604,933 A  9/1971 Cross
6,313,462 B1  11/2001 Matsuda et al.
(Continued)

FOREIGN PATENT DOCUMENTS

DE  102006004003  10/2006
EP  0 421 304  12/1994
(Continued)

OTHER PUBLICATIONS

Search Report issued by P.C.T. patent office in Patent Application No. PCT/JP2014/00243, dated Apr. 28, 2014.
(Continued)

*Primary Examiner* — Yara B Green
*Assistant Examiner* — Meenakshi Sahu
(74) *Attorney, Agent, or Firm* — Greenblum & Bernstein P.L.C.

(57) ABSTRACT

An infrared detection element includes first and second pyroelectric elements which are arranged in a single pyroelectric substrate. First pyroelectric element includes a first surface electrode, a first back face electrode, and a first portion interposed between first surface and back face
(Continued)

electrodes. First portion is provided as part of pyroelectric substrate. Second pyroelectric element includes a second surface electrode, a second back face electrode, and a second portion interposed between second surface and back face electrodes. Second portion is provided as part of pyroelectric substrate. Pyroelectric substrate is provided in part thereof surrounding first pyroelectric element with a slit shaped along an outer periphery of first pyroelectric element. Slit is formed out of regions in which a first surface wiring and a first back face wiring are disposed. Part of pyroelectric substrate surrounding second pyroelectric element is continuously formed over an entire circumference of second portion.

22 Claims, 61 Drawing Sheets

(30) Foreign Application Priority Data

| Jan. 23, 2013 | (JP) | ................................. 2013-010314 |
|---|---|---|
| Oct. 8, 2013 | (JP) | ................................. 2013-211463 |
| Oct. 8, 2013 | (JP) | ................................. 2013-211464 |

(51) Int. Cl.

| *H01L 37/02* | (2006.01) |
|---|---|
| *G01J 5/04* | (2006.01) |
| *G01J 5/08* | (2006.01) |
| *G01J 3/42* | (2006.01) |
| *G01J 5/34* | (2006.01) |
| *G01J 1/02* | (2006.01) |

(52) U.S. Cl.
CPC .............. *G01J 5/046* (2013.01); *G01J 5/0815* (2013.01); *G01J 5/0831* (2013.01); *G01J 5/0853* (2013.01); *G01J 5/0862* (2013.01); *G01J 5/0875* (2013.01); *G01J 5/16* (2013.01); *G01J 5/34* (2013.01); *H01L 37/02* (2013.01)

(58) Field of Classification Search
USPC ....................................................... 250/338.3
See application file for complete search history.

(56) References Cited

U.S. PATENT DOCUMENTS

| 7,635,605 | B2 | 12/2009 | Shibayama | |
|---|---|---|---|---|
| 2001/0020681 | A1* | 9/2001 | Yagyu | ....................... G01J 5/34 |
| | | | | 250/338.3 |
| 2006/0219923 | A1 | 10/2006 | Uchida et al. | |
| 2007/0278605 | A1 | 12/2007 | Shibayama | |
| 2008/0087824 | A1 | 4/2008 | Hayashi et al. | |
| 2009/0026372 | A1 | 1/2009 | Hayashi et al. | |
| 2009/0212218 | A1 | 8/2009 | Hayashi et al. | |
| 2012/0298867 | A1 | 11/2012 | Nishikawa et al. | |
| 2012/0318980 | A1* | 12/2012 | Sono | ........................ G01J 5/16 |
| | | | | 250/338.3 |

FOREIGN PATENT DOCUMENTS

| FR | 2866115 | 8/2005 |
|---|---|---|
| JP | 59-025268 | 2/1984 |
| JP | 62-147388 | 7/1987 |
| JP | 62-222134 | 9/1987 |
| JP | 02-095218 | 4/1990 |
| JP | 03-035128 | 2/1991 |
| JP | 04-076235 | 12/1992 |
| JP | 05-018816 | 1/1993 |
| JP | 05-081667 | 11/1993 |
| JP | 06-160175 | 6/1994 |
| JP | 07-60119 | 6/1995 |
| JP | 08-178741 | 7/1996 |
| JP | 08-178748 | 7/1996 |
| JP | 08-184493 | 7/1996 |
| JP | 3043381 | 11/1997 |
| JP | 10-002793 | 1/1998 |
| JP | 11-006763 | 1/1999 |
| JP | 11-064111 | 3/1999 |
| JP | 2000-503122 | 3/2000 |
| JP | 3247813 | 1/2001 |
| JP | 2001-304955 | 10/2001 |
| JP | 2002-054997 | 2/2002 |
| JP | 3372180 | 1/2003 |
| JP | 3420432 | 6/2003 |
| JP | 2005-049171 | 2/2005 |
| JP | 2005-241457 | 9/2005 |
| JP | 2007-288168 | 11/2007 |
| JP | 2011-128015 | 6/2011 |
| JP | 2012-013584 | 1/2012 |
| JP | 2012-159450 | 8/2012 |
| JP | 2013-004780 | 1/2013 |
| JP | 2013-057632 | 3/2013 |
| WO | 96/01418 | 1/1996 |
| WO | 97/25613 | 7/1997 |
| WO | 2006/120863 | 11/2006 |
| WO | 2011/071011 | 6/2011 |

OTHER PUBLICATIONS

Search Report issued in European Patent Office (EPO) Patent Application No. 14740724.1, dated Jun. 20, 2016.

* cited by examiner

INFRARED DETECTION ELEMENT, INFRARED DETECTOR, AND INFRARED TYPE GAS SENSOR

TECHNICAL FIELD

The invention relates to an infrared detection element that is configured to detect infrared by pyroelectric effect as a pyroelectric infrared detection element, an infrared detector, and an infrared type gas sensor.

BACKGROUND ART

As an infrared detector, there has been known a pyroelectric infrared detector, incorporated in a gas analyzer, a radiation thermometer, a flame detector, an intruder alarm or the like (e.g., see JP 3247813 B2: hereinafter, referred to as "Document 1").

In Document 1, a pyroelectric infrared detector 200 that has a configuration shown in FIG. 72 is described. The pyroelectric infrared detector 200 includes a case 201, an infrared transmission window 202, a stem 203, a circuit substrate 204, a pyroelectric member 205, and a spacer 206. In addition, two electrodes 207 and 208 that constitute an electrode portion are provided on both of top and bottom surfaces of the pyroelectric member 205, respectively.

The pyroelectric infrared detector 200 is a dual type, and the two electrodes 207 and 208 are connected in series so as to have a reverse polarity to each other.

The pyroelectric infrared detector 200 is configured such that only one electrode 207 of the two electrodes 207 and 208 faces the infrared transmission window 202, and accordingly, infrared light 213 passing through the infrared transmission window 202 is incident on the one electrode 207, but infrared light is not incident on the other electrode 208. Hereinafter, the one electrode 207 and the other electrode 208 are respectively referred to as an "electrode for receiving infrared light" 207 and an "electrode for compensating temperature" 208.

In the pyroelectric infrared detector 200, a thickness of the electrode for compensating temperature 208 is set to be larger that of the electrode for receiving infrared light 207, so that an optical absorption coefficient in an infrared region of the electrode for compensating temperature 208 is less than that of the electrode for receiving infrared light 207. In the pyroelectric infrared detector 200, for example, the electrode for receiving infrared light 207 has the thickness of 100 Å, and the electrode for compensating temperature 208 has the thickness of 1000 Å. Accordingly, in the pyroelectric infrared detector 200, the optical absorption coefficient in the infrared region of the electrode for compensating temperature 208 is set to half of that of the electrode for receiving infrared light 207. Therefore, even if infrared light is incident on the electrode for compensating temperature 208 due to crosstalk, a signal is hardly output from the electrode for compensating temperature 208, and sensitivity of the pyroelectric infrared detector 200 is accordingly improved.

DISCLOSURE OF THE INVENTION

Problems to be Resolved by the Invention

It is expected that the sensitivity is further improved for the fields of a pyroelectric infrared detection element, infrared detector and infrared type gas sensor.

The invention has been made in view of the above-described matters, and an object of the invention is to provide an infrared detection element, an infrared detector and an infrared type gas sensor, which can provide higher sensitivity.

Means of Solving the Problems

An infrared detection element according to the invention includes a first pyroelectric element and a second pyroelectric element. The first pyroelectric element and the second pyroelectric element are arranged in a single pyroelectric substrate. The first pyroelectric element includes a first surface electrode, a first back face electrode and a first portion. The first surface electrode is provided on a surface of the single pyroelectric substrate. The first back face electrode is provided on a back face of the single pyroelectric substrate. The first portion is interposed between the first surface electrode and the first back face electrode. The first portion is provided as part of the single pyroelectric substrate. The first back face electrode faces the first surface electrode through the first portion. The second pyroelectric element includes a second surface electrode, a second back face electrode and a second portion. The second surface electrode is provided on the surface of the single pyroelectric substrate. The second back face electrode is provided on the back face of the single pyroelectric substrate. The second portion is interposed between the second surface electrode and the second back face electrode. The second portion is provided as part of the single pyroelectric substrate. The second back face electrode faces the second surface electrode through the second portion. The single pyroelectric substrate is provided on the surface thereof with a first surface wiring and a second surface wiring that are electrically connected with the first surface electrode and the second surface electrode, respectively. The single pyroelectric substrate is provided on the back face thereof with a first back face wiring and a second back face wiring that are electrically connected with the first back face electrode and the second back face electrode, respectively. The single pyroelectric substrate is provided in part thereof surrounding the first pyroelectric element with a slit that is shaped along an outer periphery of the first pyroelectric element. The slit is formed out of regions in which the first surface wiring and the first back face wiring are disposed. Part of the single pyroelectric substrate surrounding the second pyroelectric element is continuously formed over an entire circumference of the second portion.

In the infrared detection element, preferably, the slit of the single pyroelectric substrate is at least along a side of the first pyroelectric element, facing the second pyroelectric element.

Preferably, the infrared detection element includes at least two sets of the first pyroelectric element and the second pyroelectric element. The single pyroelectric substrate is formed with the slit at each of facing sides of two adjacent first pyroelectric elements.

Preferably, the infrared detection element further includes an infrared absorption layer for absorbing infrared, which is on the first surface electrode.

In the infrared detection element, preferably, the first surface electrode and the second surface electrode have sheet resistances that function as infrared reflection layers for reflecting infrared.

In the infrared detection element, preferably, the sheet resistances of the first surface electrode and the second surface electrode are equal to each other.

In the infrared detection element, preferably, the infrared absorption layer is provided so as to cover a whole region that is surrounded by the slit in planar view. The infrared absorption layer is preferably formed of a first resin layer in which at least one kind of conductive fine powder is dispersed in resin. The at least one kind of conductive fine powder is preferably selected from a group of carbon fine powder, metal fine powder and metal oxide fine powder.

In the infrared detection element, preferably, the first surface electrode is provided such that an outer circumferential edge thereof is spaced from an aperture edge of the slit facing a side of the first surface electrode.

In the infrared detection element, preferably, the resin is phenolic resin.

An infrared detector according to the invention includes any one of the above-mentioned infrared detection elements, an optical filter, an IC element, a base body and a package. The optical filter is disposed in front of the infrared detection element, and configured to transmit infrared having a wavelength band, as a detection object to be detected by the infrared detection element. The IC element is for signal processing an output signal of the infrared detection element. The infrared detection element and the IC element are mounted on the base body. The package houses the infrared detection element, the optical filter, the IC element and the base body. The package includes a pedestal, a metal cap, a window hole and a window member. The pedestal supports the base body. The metal cap is fixed to the pedestal so as to cover the infrared detection element and the optical filter. The window hole is in a top plate of the metal cap. The window member is disposed to close the window hole. The window member allows infrared to pass through.

In the infrared detector, preferably, the window hole of the package is provided such that the first pyroelectric element is disposed in an area of the infrared detection element, which is a vertically projected area from the window hole, and the second pyroelectric element is disposed outside the vertically projected area.

In the infrared detector, preferably, the window member is disposed to close the window hole from an inside of the cap. The infrared detector preferably further includes a second resin layer that is on a bottom surface of the top plate facing the infrared detection element. The second resin layer is preferably configured to cover a whole of an area of the bottom surface, with which the window member does not overlap.

In the infrared detector, the infrared detection element includes two sets of the first pyroelectric element for receiving infrared light and the second pyroelectric element for compensating temperature. One set thereof constitutes a first detection element. Another set thereof constitutes a second detection element. The first detection element and the second detection element are on the single pyroelectric substrate. The optical filter includes a first optical filter and a second optical filter. The first optical filter is disposed in front of a light receiving surface of the first pyroelectric element of the first detection element. The second optical filter is disposed in front of a light receiving surface of the first pyroelectric element of the second detection element. The first detection element and the second detection element respectively include first output terminals provided on the surface of the single pyroelectric substrate. The first detection element and the second detection element further respectively include second output terminals provided on the back face of the single pyroelectric substrate. The first output terminals are disposed so as not to overlap with the second output terminals in a thickness direction of the single pyroelectric substrate. The base body includes: an insulation base member having an electric insulation property; two first lead terminals; and two second lead terminals. The two first lead terminals and the two first lead terminals are provided integrally with the insulation base member. In the infrared detector, the first lead terminals are respectively electrically connected with the first output terminals of the first detection element and the second detection element individually via first bonding portions, each of which is made of a conductive adhesive. In the infrared detector, the second lead terminals are respectively electrically connected with the second output terminals of the first detection element and the second detection element individually via second bonding portions, each of which is made of a conductive adhesive. The insulation base member is provided on a first surface thereof with at least one of a projection for positioning the infrared detection element and a wall for positioning the infrared detection element. The projection projects between each of the first lead terminals and a corresponding second lead terminal, outside an area where the infrared detection element is to be mounted, in a thickness direction of the insulation base member. The wall projects, outside the area where the infrared detection element is to be mounted, in the thickness direction of the insulation base member, a height of the wall being smaller than a thickness of the infrared detection element.

In the infrared detector, the insulation base member is preferably provided with a positioning portion for positioning the first optical filter and the second optical filter. The positioning portion preferably projects from the first surface of the insulation base member in a direction along a thickness direction of the infrared detection element.

In the infrared detector, the positioning portion preferably includes: a wall portion for defining positions of the first optical filter and the second optical filter in a direction orthogonal to a direction in which the first optical filter and the second optical filter are arranged in planar view; and supporting portions between which the first optical filter and the second optical filter are installed.

In the infrared detector, preferably, each of the supporting portions has a projection dimension larger than the thickness of the infrared detection element. The first optical filter and the second optical filter are preferably spaced from the infrared detection element in the thickness direction of the infrared detection element.

In the infrared detector, preferably, each of the supporting portions is provided with a recess in a face thereof facing a lateral side of the infrared detection element.

In the infrared detector, preferably, the wall portion is provided with a recessed part such that an end face of the wall portion and a face of the wall portion facing the first optical filter and the second optical filter are recessed. The first optical filter and the second optical filter are preferably fixed to the wall portion with a bonding part as an adhesive in the recessed part.

In the infrared detector, preferably, the first detection element and the second detection element include respective electric insulation layers that are provided on the back face of the single pyroelectric substrate so as to surround outer circumferential surfaces of the second output terminals except for surfaces thereof parallel to lateral sides of the single pyroelectric substrate. The electric insulation layers are preferably made of material that has less wettability to the conductive adhesive than that of the single pyroelectric substrate.

In the infrared detector, preferably, the base body is provided with a hollow for thermal insulation. The hollow is preferably disposed in an area of a first surface of the base body, which is a vertically projected area from the first pyroelectric element and the second pyroelectric element.

The infrared detector preferably further includes: a first IC element for signal processing a first output signal of the first detection element; and a second IC element for signal processing a second output signal of the second detection element. The infrared detection element is preferably disposed on a first surface side of the base body. The first IC element and the second IC element are preferably disposed on a second surface side of the base body.

In the infrared detector, preferably, the first pyroelectric element for receiving infrared light and the second pyroelectric element for compensating temperature, which are paired, of the infrared detection element are arranged on the single pyroelectric substrate. The first pyroelectric element and the second pyroelectric element, which are paired, are preferably connected in reverse parallel to or in reverse series to each other. The infrared detection element is preferably disposed such that the first pyroelectric element is positioned in an area of the infrared detection element, which is a vertically projected area from the window hole. The optical filter is preferably disposed between the window member and the first pyroelectric element. The infrared detector preferably further includes a light blocking member that is disposed between the window member and the infrared detection element. The light blocking member is preferably configured to block infrared that is directed toward the second pyroelectric element, after passing through the window member from an outside of the package and entering the package. The light blocking member is preferably held by the base body.

In the infrared detector, preferably, the first pyroelectric element of the infrared detection element is provided in a central area of the single pyroelectric substrate. The second pyroelectric element of the infrared detection element is preferably provided in a peripheral area of the single pyroelectric substrate. The light blocking member preferably has a plate shape, and is provided in a central area thereof with an opening. The opening is preferably larger than an area of the light blocking member, which is a vertically projected area from the first pyroelectric element in a thickness direction of the first pyroelectric element.

In the infrared detector, preferably, the light blocking member is further provided with: a depression formed in a peripheral part of the opening such that end faces of the peripheral part facing the window member and the opening are recessed; and a window part through which part of the infrared detection element is visible from a first surface of the light blocking member. The window part is preferably out of: the opening; the depression; and an area of the light blocking member, which is a vertically projected area from the second pyroelectric element in a thickness direction of the second pyroelectric element. The optical filter is preferably disposed to close the opening, and positioned to the light blocking member with a periphery thereof mounted on the depression.

In the infrared detector, preferably, the light blocking member has a shape so as to be in contact with an inner circumference surface of the cap, and the cap is positioned into a plane orthogonal to a thickness direction of the pedestal by the light blocking member.

In the infrared detector, preferably, the light blocking member is further provided with a protrusion that protrudes from a peripheral part of the opening toward a surface side of the infrared detection element.

In the infrared detector, preferably, the light blocking member includes a resin plate and a metal foil stacked on the resin plate.

In the infrared detector, preferably, the light blocking member is a metal plate.

An infrared type gas sensor according to the invention includes: an infrared emitting element configured to emit infrared by thermal radiation; and the infrared detection element.

The infrared type gas sensor preferably further includes: the infrared detector; a sample cell disposed between the infrared emitting element and the infrared detector; and a signal processor. The first optical filter preferably has a first transmission wavelength band for transmitting infrared having an absorption wavelength of gas as a detection object. The second optical filter preferably has a second transmission wavelength band, without overlapping with the first transmission wavelength band, for transmitting infrared having a reference wavelength as a non-absorption wavelength of the gas. The sample cell is preferably provided with a vent hole through which the gas as the detection object is introduced therein or discharged outside. The signal processor is preferably configured to calculate concentration of the gas based on a difference or a ratio between a first output signal of the first detection element and a second output signal of the second detection element.

In the infrared type gas sensor, preferably, the sample cell is shaped like a tube, an inner face of which is configured as a reflection surface for reflecting infrared emitted from the infrared emitting element. The reflection surface is preferably in a shape of a spheroid, a rotation axis of which is a major axis defined as a central axis of the sample cell, and both ends of the spheroid in a direction of the major axis are cut by two planes perpendicular to the major axis. The infrared emitting element is preferably disposed in vicinity of one focal point of the spheroid on the central axis. The infrared detector is preferably disposed at a position near another focal point of the spheroid between the infrared emitting element and the another focal point on the central axis.

In the infrared type gas sensor, preferably, in the infrared detector, a combined shape of planar shapes of the first surface electrode of the first pyroelectric element of the first detection element and the first surface electrode of the first pyroelectric element of the second detection element is along an intersection line of the surface of the single pyroelectric substrate and the spheroid.

The infrared type gas sensor preferably includes a first light receiving element and a second light receiving element. In this case, the infrared detection element is formed with two sets of the first pyroelectric element for receiving infrared light and the second pyroelectric element for compensating temperature. One set thereof constitutes a first detection element. Another set thereof constitutes a second detection element. The first detection element and the second detection element are on the single pyroelectric substrate. The first pyroelectric element of the first detection element constitutes the first light receiving element. The first pyroelectric element of the second detection element constitutes the second light receiving element. The infrared type gas sensor preferably further includes: a first optical system; a second optical system; a drive circuit; and a signal processor. The first detection element and the second detection element are preferably on the single pyroelectric substrate. The first optical system is preferably disposed between the infrared emitting element and the first light receiving element. The second optical system is preferably disposed between the infrared emitting element and the second light receiving element. The drive circuit is preferably configured to drive the infrared emitting element. The signal processor is preferably configured to calculate concentration of gas as a detection object based on a ratio between a first output signal of the first light receiving element and a second output signal of the second light receiving element. The first optical system preferably has a first transmission wavelength band for transmitting infrared having an absorption wavelength of the gas as the detection object. The second optical system preferably has a second transmission wavelength band for transmitting infrared having a reference wavelength. The first transmission wavelength band is preferably different from the second transmission wavelength band. All wavelengths in the second transmission wavelength band are preferably shorter than all wavelengths in the first transmission wavelength band. The first optical system and the second optical system preferably have a common prescribed wavelength band for compensation. All wavelengths in the common prescribed wavelength band are preferably longer than all wavelengths in the first and second transmission wavelength bands. The first optical system preferably has a first average transmittance in the common prescribed wavelength band, which is less than a second average transmittance of the second optical system in the common prescribed wavelength band. The first and second average transmittances are preferably set to compensate a change in a ratio between: a first output signal component of the first light receiving element based on infrared having the first transmission wavelength band; and a second output signal component of the second light receiving element based on infrared having the second transmission wavelength band, and the change in the ratio is caused due to a change in emission power of the infrared emitting element.

The infrared type gas sensor preferably includes a first light receiving element and a second light receiving element. In this case, the infrared detection element is formed with two sets of the first pyroelectric element for receiving infrared light and the second pyroelectric element for compensating temperature. One set thereof constitutes a first detection element. Another set thereof constitutes a second detection element. The first detection element and the second detection element are on the single pyroelectric substrate. The first pyroelectric element of the first detection element constitutes the first light receiving element. The first pyroelectric element of the second detection element constitutes the second light receiving element. The infrared type gas sensor preferably further includes: a first optical system; a second optical system; a drive circuit; and a signal processor. The first detection element and the second detection element are preferably on the single pyroelectric substrate. The first optical system is preferably disposed between the infrared emitting element and the first light receiving element. The second optical system is preferably disposed between the infrared emitting element and the second light receiving element. The drive circuit is preferably configured to drive the infrared emitting element. The signal processor is preferably configured to calculate concentration of gas as a detection object based on a ratio between a first output signal of the first light receiving element and a second output signal of the second light receiving element. The first optical system preferably has a first transmission wavelength band for transmitting infrared having an absorption wavelength of the gas as the detection object. The second optical system preferably has a second transmission wavelength band for transmitting infrared having a reference wavelength. The first transmission wavelength band is preferably different from the second transmission wavelength band. All wavelengths in the second transmission wavelength band are preferably longer than all wavelengths in the first transmission wavelength band. The first optical system and the second optical system preferably have a common prescribed wavelength band for compensation. All wavelengths in the common prescribed wavelength band are preferably longer than all wavelengths in the first and second transmission wavelength bands. The first optical system preferably has a first average transmittance in the common prescribed wavelength band, which is more than a second average transmittance of the second optical system in the common prescribed wavelength band. The first and second average transmittances are preferably set to compensate a change in a ratio between: a first output signal component of the first light receiving element based on infrared having the first transmission wavelength band; and a second output signal component of the second light receiving element based on infrared having the second transmission wavelength band, and the change in the ratio is caused due to a change in emission power of the infrared emitting element.

In the infrared type gas sensor, preferably, the drive circuit is configured to pulse-drive the infrared emitting element at a constant voltage or a constant current. The first and second average transmittances of the first and second optical systems are preferably set to meet a following formula (1).

[Mathematical 1]

$$0.97 \times \frac{Qg1}{Qr1} < \frac{Qg2}{Qr2} < 1.03 \times \frac{Qg1}{Qr1}, \qquad \text{formula (1)}$$

In the formula (1), Qg1 is energy of infrared that is incident on the first light receiving element, after passing through the first transmission wavelength band of the first optical system, in an initial state of the infrared emitting element. In the formula (1), Qr1 is energy of infrared that is incident on the second light receiving element, after passing through the second transmission wavelength band of the second optical system, in the initial state of the infrared emitting element. In the formula (1), Qg2 is energy of infrared that is incident on the first light receiving element, after passing through the first transmission wavelength band of the first optical system, in a state where the infrared emitting element has been deteriorated with time. In the formula (1), Qr2 is energy of infrared that is incident on the second light receiving element, after passing through the second transmission wavelength band of the second optical system, in a state where the infrared emitting element has been deteriorated with time.

In the infrared type gas sensor, preferably, in a case of; T [K] is absolute temperature of the infrared emitting element; λg [μm] is the absorption wavelength; λr [μm] is the reference wavelength; Qgr is light power with respect to infrared passing through the common prescribed wavelength band of the first optical system, of light power received by the first optical system; Qrs is light power with respect to infrared passing through the second transmission wavelength band of the second optical system, of light power received by the second optical system; Qrr is light power with respect to infrared passing through the common prescribed wavelength band of the second optical system, of light power received by the second optical system; and R1 is Qrr/Qrs, the first and second average transmittances are set to meet following first and second conditions. The first condition:

$$Qrs > Qrr > 0 \qquad \text{[Mathematical 2]}$$

The second condition:

[Mathematical 3]

In a case $R1 < 0.3 \times \dfrac{\lambda g - \lambda r}{0.36}$ $Qrr > Qgr$ is formed In a case $1 > R1 \geq 0.3 \times \dfrac{\lambda g - \lambda r}{0.36}$ $(x + 0.3) \times \dfrac{\lambda g - \lambda r}{0.36} \geq \dfrac{Qrr - Qgr}{Qrs} \geq x \times \dfrac{\lambda g - \lambda r}{0.36}$ is formed.

In this case, $$x = \dfrac{T - 300}{4000} \times (R1 - 0.3)$$

Here, x is a coefficient.

In the infrared type gas sensor, preferably, in a case of: T [K] is absolute temperature of the infrared emitting element; λg [μm] is the absorption wavelength; λr [μm] is the reference wavelength; Qgr is light power with respect to infrared passing through the common prescribed wavelength band of the first optical system, of light power received by the first optical system; Qrs is light power with respect to infrared passing through the second transmission wavelength band of the second optical system, of light power received by the second optical system; Qrr is light power with respect to infrared passing through the common prescribed wavelength band of the second optical system, of light power received by the second optical system; and R2 is Qgr/Qrs, the first and second average transmittances are set to meet following first and second conditions. The first condition:

$$Qrs > Qgr > 0 \qquad \text{[Mathematical 4]}$$

The second condition:

[Mathematical 5]

In a case of $R2 < 0.3 \times \dfrac{\lambda r - \lambda g}{0.36}$ $Qgr > Qrr$ is formed.

In a case of $1 > R2 \geq 0.3 \times \dfrac{\lambda r - \lambda g}{0.36}$ $(x + 0.3) \times \dfrac{\lambda r - \lambda g}{0.36} \geq \dfrac{Qgr - Qrr}{Qrs} \geq x \times \dfrac{\lambda r - \lambda g}{0.36}$ is formed.

In this case, $$x = \dfrac{T - 300}{4000} \times (R2 - 0.3)$$

Here, x is a coefficient.

In the infrared type gas sensor, preferably, the infrared emitting element includes a semiconductor substrate, a thin film part, an opening part and an infrared emitting layer. The thin film part is preferably on a surface of the semiconductor substrate. The opening part is preferably in the semiconductor substrate. The opening part is preferably for exposing partially a first surface of the thin film part facing the semiconductor substrate. The infrared emitting layer is preferably on a second surface of the thin film part, and configured to emit infrared by thermal radiation when energized.

The infrared type gas sensor preferably further includes the infrared detector. The infrared detector preferably further includes an IC element for signal processing an output signal of the infrared detection element. The infrared type gas sensor preferably further includes a sample cell, a drive circuit, a controller and a signal processing circuit. The sample cell is preferably disposed between the infrared emitting element and the infrared detector, and allows gas as a detection object to introduce therein or to discharge outside. The drive circuit is preferably configured to intermittently energize the infrared emitting element. The controller is preferably configured to control the drive circuit. The signal processing circuit is preferably configured to signal-process an output signal of the IC element to calculate concentration of the gas as the detection object.

In the infrared type gas sensor, preferably, the infrared emitting element includes a semiconductor substrate, a thin film part, an opening part, and an infrared emitting layer. The thin film part is preferably on a surface of the semiconductor substrate. The opening part is preferably in the semiconductor substrate. The opening part is preferably for exposing partially a first surface of the thin film part facing the semiconductor substrate. The infrared emitting layer is preferably on a second surface of the thin film part, and configured to emit infrared by thermal radiation when energized. The infrared emitting element is preferably configured to emit infrared even for a non-energizing during which the infrared emitting layer is de-energized after energized. The IC element preferably includes a current-voltage conversion circuit that is configured to current-voltage convert a current signal as the output signal of the infrared detection element. The current-voltage conversion circuit is preferably configured such that a gain with respect to a frequency component of an amount of infrared emitted by the infrared emitting element, which is changed with time, for the non-energizing period is more than a gain with respect to a frequency band, all frequencies of which are higher than the frequency component.

The infrared type gas sensor preferably further includes an optical system, a drive circuit, a controller and a signal processor. The optical system is preferably disposed between the infrared emitting element and the infrared detection element. The optical system preferably has respective infrared transmittances in a first transmission wavelength band for transmitting infrared having an absorption wavelength of gas as a detection object, and a second transmission wavelength band. All wavelengths in the second transmission wavelength band are preferably longer than all wavelengths in the first transmission wavelength band. The second transmission wavelength band preferably has an average transmittance that is less than that of the first transmission wavelength band. The drive circuit is preferably configured to pulse-drive the infrared emitting element. The controller is preferably configured to control the drive circuit in time series such that the drive circuit pulse-drives the infrared emitting element under a first drive condition or a second drive condition. The infrared emitting element under the first drive condition preferably has a peak wavelength in an emission energy distribution that is different from that under the second drive condition. The signal processor is preferably configured to estimate concentration of gas as a detection object based on a ratio between a first output signal of the infrared detection element under the first drive condition and a second output signal of the infrared detection element under the second drive condition.

In the infrared type gas sensor, preferably, the first drive condition is for causing the peak wavelength to be shorter than that under the second drive condition. The signal processor preferably includes a concentration estimating portion that is configured to estimate the concentration of the gas as the detection object based on a concentration conversion formula as a following formula (2).

[Mathematical 6]

$$Con1 = A1 \times R1^2 + B1 \times R1 + C1 \qquad \text{formula(2)}$$

In the formula (2), Con1 is the concentration of the gas as the detection object. In the formula (2), R1 is a value obtained by normalizing a value R obtained by dividing the first output signal by the second output signal, such that R1 is "1" when the concentration of the gas as the detection object is 0 ppm. In the formula (2), each of A1, B1 and C1 is a coefficient.

In the infrared type gas sensor, preferably, the first drive condition is for causing the peak wavelength to be shorter than that under the second drive condition. The signal processor preferably includes a concentration estimating portion that is configured to estimate the concentration of the gas as the detection object based on a concentration conversion formula as a following formula (3).

[Mathematical 7]

$$Con2 = A2 \times X^2 + B2 \times X + C2 \qquad \text{formula (3)}$$

In the formula (3), Con2 is the concentration of the gas as the detection object. In the formula (3), X is a value obtained by dividing the first output signal by a reference value. In the formula (3), each of A2, B2 and C2 is a coefficient. The reference value is an estimation value for an output signal of the infrared detection element, when it is assumed that the concentration of the gas as the detection object is 0 ppm and the infrared emitting element is pulse-driven under the first drive condition. The reference value is estimated based on Con1 and a value obtained by dividing the first output signal by the second output signal.

The infrared type gas sensor preferably further includes: an infrared light source in which the infrared emitting element is stored in a first package; and an infrared detector in which the infrared detection element is stored in a second package. The infrared detector preferably includes an optical filter that is disposed in front of the infrared detection element to face the infrared light source. The optical filter is preferably configured to adjust respective infrared transmittances in the first and second transmission wavelength bands. The first package preferably includes a first window member allowing infrared emitted from the infrared emitting element to pass through. The second package preferably includes a second window member allowing infrared emitted from the infrared emitting element to pass through. The first window member, the second window member and the optical filter are preferably defined as constituent elements of the optical system.

The infrared type gas sensor preferably further includes a sample cell that is disposed between the infrared light source and the infrared detector. The sample cell preferably allows gas as a detection object to introduce therein or to discharge outside. The sample cell is preferably shaped like a tube, an inner face of which is configured as a reflection surface for reflecting infrared emitted from the infrared emitting element. The reflection surface is preferably defined as a constituent element of the optical system.

Effect of the Invention

According to the infrared detection element of the invention, the periphery of the single pyroelectric substrate surrounding the first pyroelectric element is provided with the slit that is shaped along the outer periphery of the first pyroelectric element, the slit is formed out of regions in which the first surface wiring and the first back face wiring are disposed, and the periphery of the single pyroelectric substrate surrounding the second pyroelectric element is continuously formed over the entire circumference of the second portion. Accordingly, a difference occurs between thermal time constants of the first and second pyroelectric elements when infrared is incident. Therefore, in the infrared detection element, it is possible to reduce the influence by crosstalk of infrared by connecting the first and second pyroelectric elements in reverse parallel to or in reverse series to each other, and utilizing the first pyroelectric element as a pyroelectric element for receiving infrared light and the second pyroelectric element as a pyroelectric element for compensating temperature, thereby providing higher sensitivity.

Since the infrared detector of the invention includes the infrared detection element, it is possible to provide higher sensitivity.

Since the infrared type gas sensor of the invention includes the infrared detection element, it is possible to provide higher sensitivity.

EMBODIMENT FOR CARRYING OUT THE INVENTION

Embodiment 1

Figure 1A:
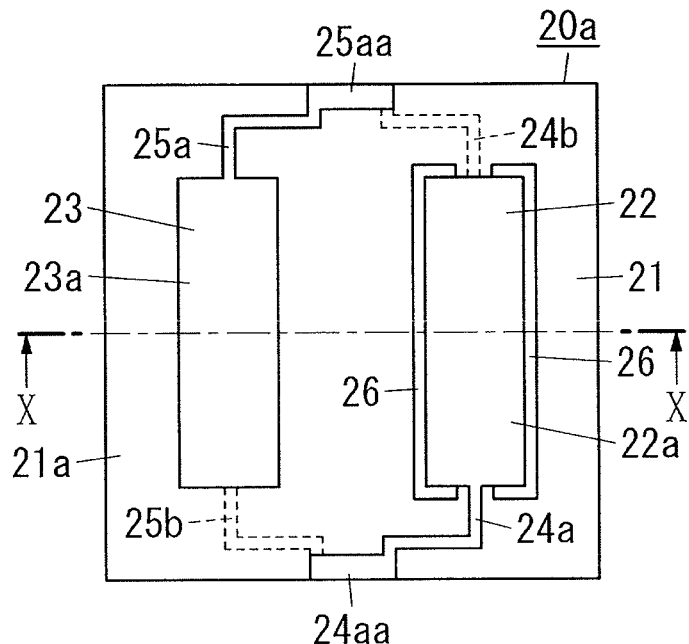
FIG. 1A is a schematic plan view of an infrared detection element according to Embodiment 1.

Hereinafter, an infrared detection element 20a of the embodiment will be described with reference to FIGS. 1A, 1B and 1C.

The infrared detection element 20a includes a first pyroelectric element 22 and a second pyroelectric element 23. The first pyroelectric element 22 and the second pyroelectric element 23 are arranged in a single pyroelectric substrate 21. The first pyroelectric element 22 includes a first surface electrode 22a, a first back face electrode 22b and a first portion 22c. The first surface electrode 22a is provided on a surface 21a of the pyroelectric substrate 21. The first back face electrode 22b is provided on a back face 21b of the pyroelectric substrate 21, and faces the first surface electrode 22a through the first portion. The first portion 22c is interposed between the first surface electrode 22a and the first back face electrode 22b, and is provided as part of the pyroelectric substrate 21. The second pyroelectric element 23 includes a second surface electrode 23a, a second back face electrode 23b and a second portion 23c. The second surface electrode 23a is provided on the surface 21a of the pyroelectric substrate 21. The second back face electrode 23b is provided on the back face 21b of the pyroelectric substrate 21, and faces the second surface electrode 23a through the second portion. The second portion 23c is interposed between the second surface electrode 23a and the second back face electrode 23b, and is provided as part of the pyroelectric substrate 21. The pyroelectric substrate 21 is provided on the surface 21a thereof with a first surface wiring 24a and a second surface wiring 25a that are electrically connected with the first surface electrode 22a and the second surface electrode 23a, respectively. The pyroelectric substrate 21 is provided on the back face 21b thereof with a first back face wiring 24b and a second back face wiring 25b that are electrically connected with the first back face electrode 22b and the second back face electrode 23b, respectively. The pyroelectric substrate 21 is provided in part thereof surrounding the first pyroelectric element 22 with a slit 26 that is shaped along an outer periphery of the first pyroelectric element 22. The slit 26 is formed out of regions in which the first surface wiring 24a and the first back face wiring 24b are disposed. Part of the pyroelectric substrate 21 surrounding the second pyroelectric element 23 is continuously formed over an entire circumference of the second portion 23c. Therefore, in the infrared detection element 20a, it is possible to reduce influence by crosstalk of infrared by connecting the first and second pyroelectric elements 22 and 23 in reverse parallel to or in reverse series to each other, and utilizing the first pyroelectric element 22 as a pyroelectric element for receiving infrared light and the second pyroelectric element 23 as a pyroelectric element for compensating temperature, thereby providing higher sensitivity Constituent elements of the infrared detection element 20a will be described below in detail.

The pyroelectric substrate 21 has a pyroelectric property. The pyroelectric substrate 21 is formed of a single crystal LiTaO$_3$ substrate. In this case, LiTaO$_3$ is employed as pyroelectric material for the pyroelectric substrate 21, however, the pyroelectric material is not limited to it. Examples of the pyroelectric material further include LiNbO$_3$, PbTiO$_3$, PZT (:Pb(Zr,Ti)O$_3$), and PZT-PMN(:Pb(Zr,Ti)O$_3$—Pb(Mn,Nb)O$_3$).

The pyroelectric substrate 21 has spontaneous polarization, a direction of which is along a thickness direction of the pyroelectric substrate 21. In a case of FIG. 1B, the direction of the spontaneous polarization of the pyroelectric substrate 21 is an upward direction.

The pyroelectric substrate 21 is shaped like a rectangle (a right-angled quadrilateral shape) in planar view. However, the shape of the pyroelectric substrate 21 in planar view is not limited in particular.

The pyroelectric substrate 21 has a thickness of 50 µm, although not limited to this value. For example, the thickness of the pyroelectric substrate 21 is preferably less in view of improving sensitivity of the infrared detection element 20a. For this reason, the thickness of the pyroelectric substrate 21 is preferably set to be in a range of about 30 µm to 150 µm. If the thickness of the pyroelectric substrate 21 is less than 30 µm, there is a concern that the pyroelectric substrate 21 is damaged due to vulnerability. On the other hand, if it is more than 150 µm, there is a concern that the sensitivity of the infrared detection element 20a is reduced.

The first surface electrode 22a, the first back face electrode 22b, the second surface electrode 23a and the second back face electrode 23b are formed of conductive films that are capable of absorbing infrared as a detection object and have electrical conductivity. The conductive films are formed of Ni films. The conductive films are not limited to the Ni films, but may be NiCr films or gold black films. While an electric resistance of a conductive film becomes smaller as the film thickness thereof is more, an absorption amount of infrared can be more enhanced as the film thickness thereof is less. Therefore, in the first pyroelectric element 22, the thickness of the first surface electrode 22a may be set less than that of the first back face electrode 22b. Similarly, in the second pyroelectric element 23, the thickness of the second surface electrode 23a may be set less than that of the second back face electrode 23b. Alternatively, in the first pyroelectric element 22, the thickness of the first surface electrode 22a may be set equal to that of the first back face electrode 22b. Similarly, in the second pyroelectric element 23, the thickness of the second surface electrode 23a may be set equal to that of the second back face electrode 23b.

In the infrared detection element 20a, the thickness of the first surface electrode 22a is set equal to that of the second surface electrode 23a. In addition, in the infrared detection element 20a, the thickness of the first back face electrode 22b is set equal to that of the second back face electrode 23b.

The first and second surface electrodes 22a and 23a each have a thickness of 30 nm, however, it is not limited to this value. It is preferable that the first and second surface electrodes 22a and 23a each have a thickness of e.g., 100 nm or less, more preferably, 40 nm or less. The first and second surface electrodes 22a and 23a may be formed by a vapor deposition method, a sputtering method or the like.

The first and second back face electrodes 22b and 23b each have a thickness of 100 nm, however, it is not limited to this value. It is preferable that the first and second back face electrodes 22b and 23b each have a thickness of 40 nm or more, more preferably, 100 nm or more. The first and second back face electrodes 22b and 23b may be formed by a vapor deposition method, a sputtering method or the like.

In the infrared detection element 20a, if the thicknesses of the first and second surface electrodes 22a and 23a are set equal to those of the first and second back face electrodes 22b and 23b, those thicknesses each may be set to be in a range of about 40 nm to 100 nm, for example.

Infrared absorptivities of the first and second surface electrodes 22a and 23a vary depending on sheet resistance values thereof. It is preferable that the infrared absorptivities of the first and second surface electrodes 22a and 23a be set to be in a range of 20% to 50%, for example. Regarding each of the infrared absorptivities of the first and second surface electrodes 22a and 23a, a theoretical maximum value thereof is 50%. Sheet resistances of the first and second surface electrodes 22a and 23a each are required to be set to 189Ω/□ (i.e., 189 Ω/sq.) in order to set to 50% each of the infrared absorptivities of the first and second surface electrodes 22a and 23a. In other words, regarding the infrared detection element 20a, it is possible to maximize the infrared absorptivities of the first and second surface electrodes 22a and 23a by setting to 189Ω/□ each of the sheet resistances of the first and second surface electrodes 22a and 23a. Regarding the infrared detection element 20a, it is preferable that the infrared absorptivity of e.g., 40% or more be secured in each of the first and second surface electrodes 22a and 23a. Accordingly, regarding the infrared detection element 20a, it is preferable that the sheet resistances of the first and second surface electrodes 22a and 23a each be set to be in a range of 73 to 493 Ω/□.

The first and second pyroelectric elements 22 and 23 each are shaped like a rectangle in planar view. In the infrared detection element 20a, it is preferable that a plane size of the first pyroelectric element 22 be set equal to that of the second pyroelectric element 23. In other words, in the infrared detection element 20a, it is preferable that the first pyroelectric element 22 be formed to have the same configuration as the second pyroelectric element 23. The shapes of the first and second pyroelectric elements 22 and 23 each in planar view is not limited to the rectangle. Examples of the shape in planar view include a square, a circle, a semicircle, an ellipse, a semi-ellipse, and a polygon except for a rectangle. In the infrared detection element 20a, when the shapes of the first and second pyroelectric elements 22 and 23 in planar view are different from each other, it is preferable that areas thereof in planar view be equal to each other.

In the first pyroelectric element 22, preferably, the shape of the first surface electrode 22a is the same as that of the first back face electrode 22b, and the first back face electrode 22b is disposed in an area, which agrees with a vertically projected area from the first surface electrode 22a. The vertically projected area from the first surface electrode 22a means a projected area from the first surface electrode 22a in a thickness direction of the first surface electrode 22a. For this reason, the shape of the first pyroelectric element 22 in planar view is determined depending on the shape of the first surface electrode 22a in planar view. In other words, the shape of the first pyroelectric element 22 in planar view is the same as the shape of the first surface electrode 22a in planar view. In the first pyroelectric element 22, the sizes of the first surface electrode 22a and the first back face electrode 22b may be different from each other.

In the second pyroelectric element 23, preferably, the shape of the second surface electrode 23a is the same as that of the second back face electrode 23b, and the second back face electrode 23b is disposed in an area, which agrees with a vertically projected area from the second surface electrode 23a. The vertically projected area from the second surface electrode 23a means a projected area from the second surface electrode 23a in a thickness direction of the second surface electrode 23a. For this reason, the shape of the second pyroelectric element 23 in planar view is determined depending on the shape of the second surface electrode 23a in planar view. In other words, the shape of the second pyroelectric element 23 in planar view is the same as the shape of the second surface electrode 23a in planar view. In the second pyroelectric element 23, the sizes of the second surface electrode 23a and the second back face electrode 23b may be different from each other.

In the infrared detection element 20a, the first and second surface wirings 24a and 25a are formed on the surface 21a of the pyroelectric substrate 21, and the first and second back face wirings 24b and 25b are formed on the back face 21b of the pyroelectric substrate 21.

It is preferable that materials and thicknesses of the first and second surface wirings 24a and 25a be the same as those of the first and second surface electrodes 22a and 23a. Accordingly, when producing the infrared detection element 20a, it is possible to simultaneously perform forming of the first and second surface wirings 24a and 25a and forming of the first and second surface electrodes 22a and 23a. Furthermore, in the infrared detection element 20a, it is possible form as a continuous film the first surface wiring 24a and the first surface electrode 22a, and similarly form as a continuous film the second surface wiring 25a and the second surface electrode 23a.

It is preferable that materials and thicknesses of the first and second back face wirings 24b and 25b be the same as those of the first and second back face electrodes 22b and 23b. Accordingly, when producing the infrared detection element 20a, it is possible to simultaneously perform forming of the first and second back face wirings 24b and 25b and forming of the first and second back face electrodes 22b and 23b. Furthermore, in the infrared detection element 20a, it is possible form as a continuous film the first back face wiring 24b and the first back face electrode 22b, and similarly form as a continuous film the second back face wiring 25b and the second back face electrode 23b.

In the infrared detection element 20a, an end of the first surface wiring 24a on an opposite side thereof from the first surface electrode 22a is configured as an output terminal 24aa. In the infrared detection element 20a, an end of the first back face wiring 24b on an opposite side thereof from the first back face electrode 22b is configured as an output terminal 24bb. In the infrared detection element 20a, an end of the second surface wiring 25a on an opposite side thereof from the second surface electrode 23a is configured as an output terminal 25aa. In the infrared detection element 20a, an end of the second back face wiring 25b on an opposite side thereof from the second back face electrode 23b is configured as an output terminal 25bb.

Each of the first and second pyroelectric elements 22 and 23 is configured to receive infrared, and generate an output signal obtained by photoelectric conversion.

In the infrared detection element 20a, the terminal 24aa (electrically connected with the first surface electrode 22a of the first pyroelectric element 22) is disposed so as to overlap in the thickness direction of the pyroelectric substrate 21 with the terminal 25bb (electrically connected with the second back face electrode 23b of the second pyroelectric element 23). In the infrared detection element 20a, the terminal 24bb (electrically connected with the first back face electrode 22b of the first pyroelectric element 22) is disposed so as to overlap in the thickness direction of the pyroelectric substrate 21 with the terminal 25aa (electrically connected with the second surface electrode 23a of the second pyroelectric element 23). In the present description, a direction in which the first and second pyroelectric elements 22 and 23 are arranged is referred to as a first direction, the thickness direction of the pyroelectric substrate 21 is referred to as a second direction, and a direction orthogonal to the first and second directions is referred to as a third direction. The terminals 24aa and 25bb are formed at one end of the infrared detection element 20a in the third direction, and the terminals 24bb and 25aa are formed at another end of the infrared detection element in the third direction.

Figure 2:
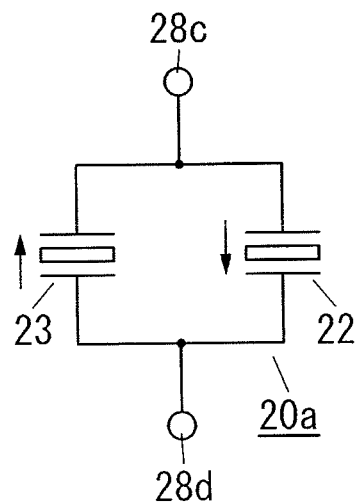
FIG. 2 is an equivalent circuit diagram in a using form of the infrared detection element according to Embodiment 1.

The infrared detection element 20a can have a configuration in which the first and second pyroelectric elements 22 and 23 are connected in reverse parallel to each other by the terminal 24aa being electrically connected with the terminal 25bb, and the terminal 24bb being electrically connected with the terminal 25aa. FIG. 2 is an equivalent circuit diagram in the case where the first and second pyroelectric elements 22 and 23 are connected in reverse parallel to each other in the infrared detection element 20a. In FIG. 2, directions of the spontaneous polarization of the pyroelectric substrate 21 are denoted by arrows.

In the equivalent circuit diagram of FIG. 2, the infrared detection element 20a is provided with a pair of output terminals 28c and 28d. In this case, in the infrared detection element 20a, the output terminal 28c as one of the pair is configured as a first connection part (not shown) for electrically connecting the terminal 24bb with the terminal 25aa, and the output terminal 28d as the other of the pair is configured as a second connection part (not shown) for electrically connecting the terminal 24aa with the terminal 25bb. In the present description, the output terminals 28c and 28d are also referred to as a first output terminal 28c and a second output terminal 28d, respectively.

The first and second connection parts may be formed of conductive paste, for example. Examples of the conductive paste include silver paste, gold paste, copper paste and the like.

The slit 26 means a hole that pierces the pyroelectric substrate 21 in the thickness thereof. The slit 26 is formed at a position out of the first surface wiring 24a and the first back face wiring 24b, in a periphery of the first pyroelectric element 22. The slit 26 is shaped along an outer periphery of the first pyroelectric element 22. In the example of FIGS. 1A and 1B, two or more slits 26 (in this case, two slits) are formed close to the outer periphery of the first pyroelectric element 22. In particular, the two slits 26 are formed close to both ends of the first pyroelectric element 22 in the first direction, respectively. In the infrared detection element 20a, the slits 26 are formed only in part of the pyroelectric substrate surrounding the first pyroelectric element 22, but not formed in part of the pyroelectric substrate surrounding the second pyroelectric element 23. Accordingly, in the infrared detection element 20a, while the slits 26 each with the shape along the outer periphery of the first pyroelectric element 22 are formed in part of the pyroelectric substrate surrounding the first pyroelectric element 22, part of the pyroelectric substrate surrounding the second pyroelectric element 23 is continuously formed over an entire circumference of the second portion 23c.

In the infrared detection element 20a, it is assumed that the first pyroelectric element 22 is used as a pyroelectric element for receiving infrared light as infrared, and the second pyroelectric element 23 is used as a pyroelectric element for compensating temperature. The pyroelectric element for receiving infrared light means a pyroelectric element for detecting infrared as a detection object to be detected by the infrared detection element 20a, and it is a pyroelectric element on which the infrared as the detection object to be detected by the infrared detection element 20a is incident. The pyroelectric element for compensating temperature means a pyroelectric element for reducing a change in an output signal, depending on a change in ambient temperature of the infrared detection element 20a, and ideally, it is a pyroelectric element on which the infrared as the detection object to be detected by the infrared detection element 20a is not incident. In other words, the pyroelectric element for compensating temperature means a pyroelectric element for removing a component depending on the ambient temperature from an output signal of the first pyroelectric element 22. Accordingly, the infrared detection element 20a is used such that while the infrared as the detection object is incident on the first pyroelectric element 22, no infrared is incident on the second pyroelectric element 23. For example when the infrared detection element 20a is used to be stored in a package, it is considered that part of the package is formed as a light blocking part for blocking infrared, in order to prevent the infrared as the detection object from being incident on the second pyroelectric element 23. In this case, it is possible to serve part of a member having light blocking property, which holds a window member of the package, transmitting the infrared as the detection object, also as the light blocking part, by defining arrangement of the window member such that the second pyroelectric element 23 is disposed outside an area which is a vertically projected area from the window member. Alternatively, it is considered that the light blocking part is configured by an infrared cut filter, a metal light blocking plate or the like.

However, the infrared detection element 20a is used in a state where a space exists on the side of an incident surface on which infrared is incident, and accordingly, a signal may be output from the second pyroelectric element 23 by crosstalk of infrared. In the infrared detection element 20a, the incident surface on which infrared is incident means a surface of the first surface electrode 22a and a surface of the second surface electrode 23a. Here, the crosstalk of infrared means that infrared, which has passed through a window member, a filter or the like (for causing infrared to be incident on the first pyroelectric element 22), is incident from an oblique direction on a surface of the second surface electrode 23a of the second pyroelectric element 23. In other words, the crosstalk of infrared means that infrared as a detection object to be detected by the first pyroelectric element 22 is incident from the oblique direction on the second surface electrode 23a of the second pyroelectric element 23 despite that the infrared is intended to be prevented from being incident on the second surface electrode.

In the infrared detection element 20a, a change in temperature of the first pyroelectric element 22 or the second pyroelectric element 23 caused by a change in environment temperature is more extremely slow, compared with a change in temperature of the first pyroelectric element 22 caused by infrared as a detection object being incident thereon, or a change in temperature of the second pyroelectric element 23 caused by the crosstalk of infrared. The environment temperature means ambient temperature of the infrared detection element 20a, and when the infrared detection element 20a is used to be stored in a package, it means ambient temperature of the package. The ambient temperature of the package corresponds to temperature of outside air.

In the infrared detection element 20a, with respect to infrared as a detection object being incident on the first pyroelectric element 22, because basically only the first pyroelectric element 22 is heated, the heat capacity and the thermal time constant are small. On the other hand, with respect to an increase in the environment temperature, because the whole of the infrared detection element 20a is heated by the increase, the heat capacity and the thermal time constant are large. In particular, because the package and the infrared detection element 20a are heated by the increase in the environment temperature when the infrared detection element 20a is used to be stored in the package, the heat capacity and the thermal time constant further become large.

Regarding the heat capacity, a relation of "H1>H2" is met, where H1 is the heat capacity of the first pyroelectric element 22 with respect to a change in the environment temperature, and H2 is the heat capacity of the first pyroelectric element 22 with respect to incidence of infrared as a detection object.

Regarding a thermal conductance, a relation of "G2>G1" is met, where G1 is the thermal conductance of the first pyroelectric element 22 with respect to a change in the environment temperature, and G2 is the thermal conductance of the first pyroelectric element 22 with respect to incidence of infrared as a detection object.

Regarding the thermal time constant, because a formula of "thermal time constant=[heat capacity]/[thermal conductance]" is met, a relation of "$\tau 1 > \tau 2$" is met, where $\tau 1$ is the thermal time constant of the first pyroelectric element 22 with respect to a change in the environment temperature, and $\tau 2$ is the thermal time constant of the first pyroelectric element 22 with respect to incidence of infrared as a detection object.

In the infrared detection element 20a, the slits 26 are formed only in a periphery of the first pyroelectric element 22, and accordingly, it is possible to generate a sensitivity difference based on a difference between the thermal time constants of the first and second pyroelectric element 22 and 23 caused by incidence of infrared as a detection object. Therefore, in the infrared detection element 20a, it is possible to reduce the influence by the crosstalk of infrared by connecting the first and second pyroelectric elements 22 and 23 in reverse parallel to each other, and utilizing the first pyroelectric element 22 as a pyroelectric element for receiving infrared light and the second pyroelectric element 23 as a pyroelectric element for compensating temperature. Thereby, the infrared detection element 20a can provide higher sensitivity.

Figure 3:
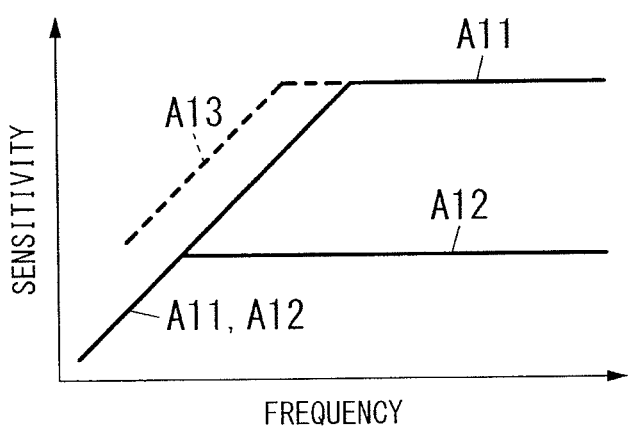
FIG. 3 is a schematic drawing showing a characteristic of the infrared detection element according to Embodiment 1.

FIG. 3 is a schematic drawing showing a characteristic of the infrared detection element 20a according to Embodiment 1. In FIG. 3, the horizontal axis represents a frequency of infrared, and the vertical axis represents sensitivity (current sensitivity). In FIG. 3, a solid line A11 represents the sensitivity of the first pyroelectric element 22 with respect to incidence of infrared as a detection object, and a solid line A12 represents the sensitivity of the first and second pyroelectric elements 22 and 23 with respect to a change in the environment temperature. FIG. 3 schematically shows that the sensitivity of the first pyroelectric element 22 is increased with a decrease in the thermal conductance of the first pyroelectric element 22 in a low frequency region, as shown by a broken line A13. and accordingly, a difference between the sensitivities of the first and second pyroelectric elements 22 and 23 is large in the low frequency region. From FIG. 3, it is found that in the infrared detection element 20a, when the sensitivity in a low frequency region is regarded as important, the thermal conductance of the first pyroelectric element 22 is preferably made to be reduced by the slits 26 being provided only in part of the pyroelectric substrate 21 surrounding the first pyroelectric element 22.

In the pyroelectric substrate 21, it is preferred that the slit 26 be at least along a side of the first pyroelectric element 22, facing the second pyroelectric element 23. Accordingly, the infrared detection element 20a can more enhance the sensitivity of the first pyroelectric element 22 in the low frequency region, compared with that of the second pyroelectric element 23, and furthermore prevent crosstalk of heat. Therefore, it is possible to more improve the sensitivity of the first pyroelectric element 22. Here, the crosstalk of heat means that heat is transmitted between the first and second pyroelectric elements 22 and 23 through the pyroelectric substrate 21.

In the infrared detection element 20a, the number of the slits 26 is not limited in particular, as long as the slits 26 are formed along the outer periphery of the first pyroelectric element 22. In the infrared detection element 20a, it is possible to enhance mechanical strength by the slits 26 being formed in a periphery of the first pyroelectric element 22 so as to be spaced from each other in a direction along the outer periphery of the first pyroelectric element 22. It is preferable that the slits 26 be arranged at equal intervals in the direction along the outer periphery of the first pyroelectric element 22.

In the infrared detection element 20a, the first surface electrode 22a may be provided such that an outer circumferential edge thereof is spaced from an aperture edge of the slit 26 facing a side of the first surface electrode 22a. Accordingly, the infrared detection element 20a can more surely prevent occurrence of short-circuit between the first surface electrode 22a and the first back face electrode 22b while providing higher sensitivity.

In the infrared detection element 20a, it is preferable that the first back face electrode 22b be provided such that an outer circumferential edge thereof is spaced from an aperture edge of the slit 26 facing a side of the first back face electrode 22b. Accordingly, the infrared detection element 20a can more surely prevent occurrence of short-circuit between the first surface electrode 22a and the first back face electrode 22b, and thereby prevent a reduction of electrical stability.

Figure 4A:
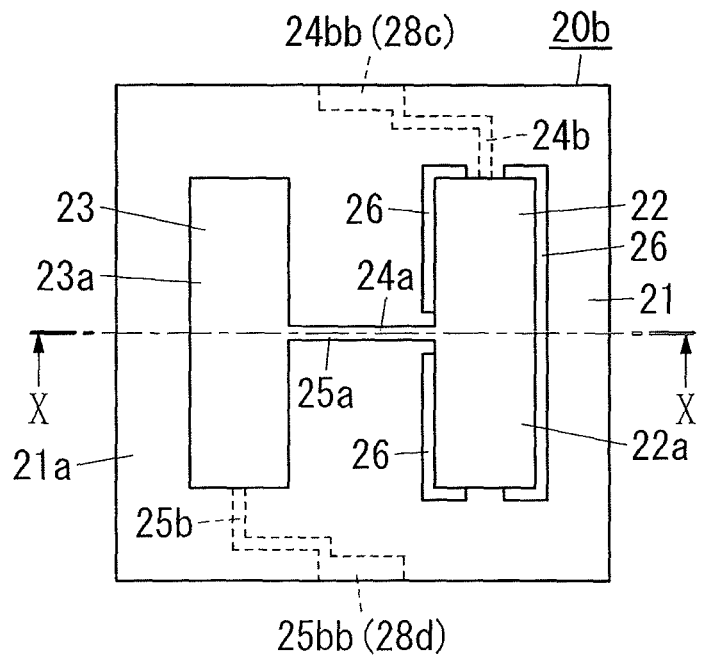
FIG. 4A is a schematic plan view of a first variation of the infrared detection element according to Embodiment 1.
Figure 4B:
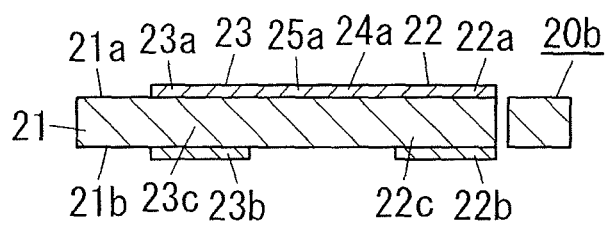
FIG. 4B is a schematic cross-sectional view taken along line X-X of FIG. 4A.
Figure 4C:
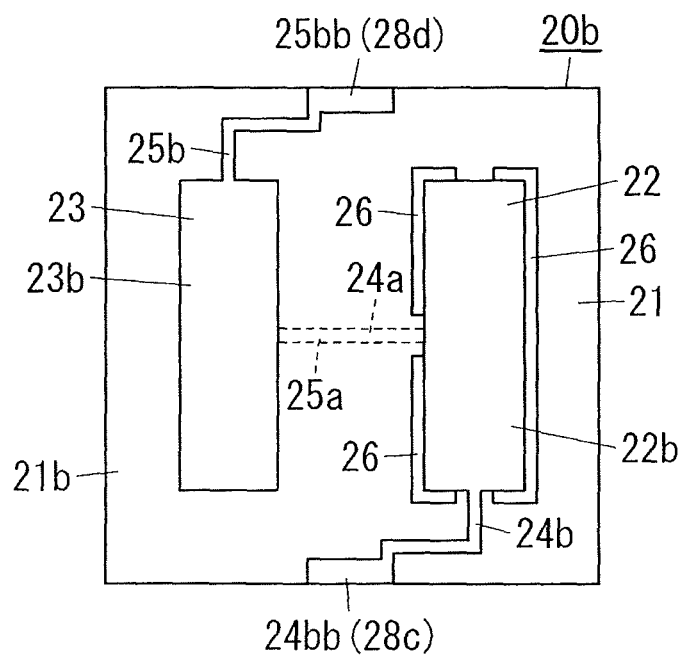
FIG. 4C is a schematic bottom view of the first variation of the infrared detection element according to Embodiment 1.

FIGS. 4A, 4B and 4C show an infrared detection element 20b, as a first variation of the infrared detection element 20a. The infrared detection element 20b is different from the infrared detection element 20a in that first and second pyroelectric elements 22 and 23 are connected in reverse series to each other. Note that, regarding the infrared detection element 20b, constituent elements similar to those of the infrared detection element 20a are assigned with same reference numerals, and explanation thereof will be properly omitted.

Figure 5:
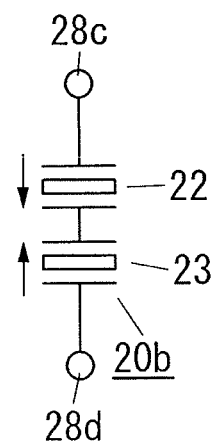
FIG. 5 is an equivalent circuit diagram in the first variation of the infrared detection element according to Embodiment 1.

In the infrared detection element 20b, a first surface electrode 22a of the first pyroelectric element 22 is electrically connected with a second surface electrode 23a of the second pyroelectric element 23 via a first surface wiring 24a and a second surface wiring 25a. In the example of FIG. 4A, the first surface wiring 24a corresponds to the right half of a surface wiring between the first and second surface electrodes 22a and 23a, and the second surface wiring 25a corresponds to the left half of the surface wiring. Thus, in the infrared detection element 20b, the first and second pyroelectric elements 22 and 23 are connected in reverse series to each other. FIG. 5 is an equivalent circuit diagram of the infrared detection element 20b as the first variation. The infrared detection element 20b is provided with a pair of output terminals 28c and 28d. In the infrared detection element 20b, the output terminal 28c (a first output terminal 28c) as one of the pair is configured by a terminal 24bb, and the output terminal 28d (a second output terminal 28d) as the other of the pair is configured by a terminal 25bb.

In the infrared detection element 20b, it is possible to reduce the influence by crosstalk of infrared by utilizing the first pyroelectric element 22 as a pyroelectric element for receiving infrared light and the second pyroelectric element 23 as a pyroelectric element for compensating temperature. Therefore, the infrared detection element 20b can provide higher sensitivity.

Figure 6A:
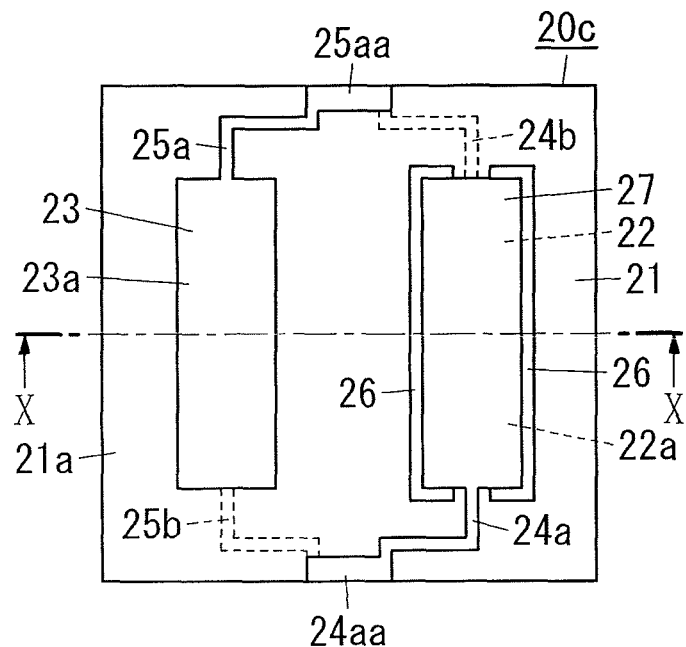
FIG. 6A is a schematic plan view of a second variation of the infrared detection element according to Embodiment 1.
Figure 6B:
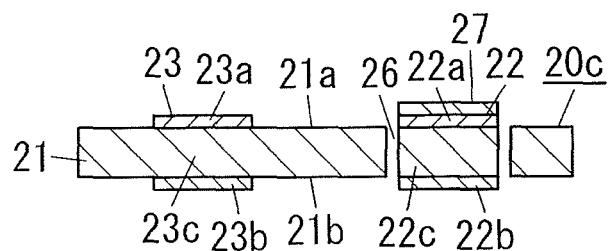
FIG. 6B is a schematic cross-sectional view taken along line X-X of FIG. 6A.
Figure 6C:
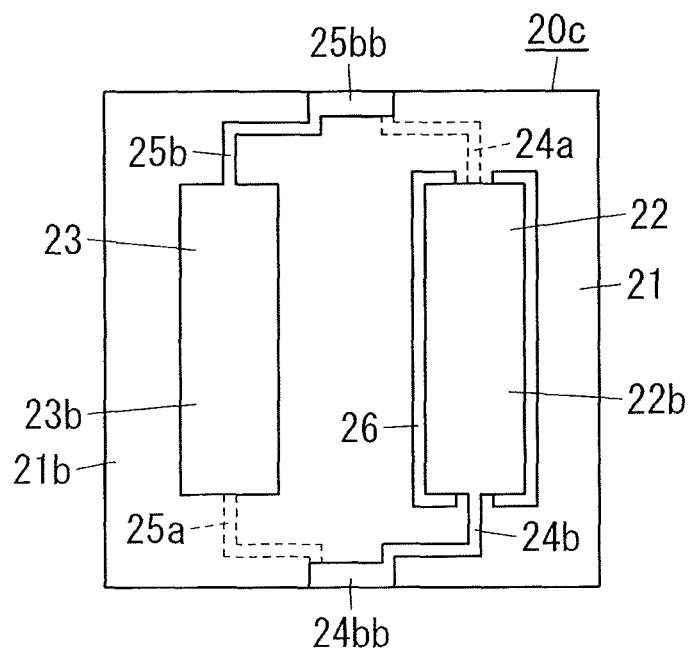
FIG. 6C is a schematic bottom view of the second variation of the infrared detection element according to Embodiment 1.

FIGS. 6A, 6B and 6C show an infrared detection element 20c, as a second variation of the infrared detection element 20a. The infrared detection element 20c has substantially the same basic configuration as the infrared detection element 20a. The infrared detection element 20c is different from the infrared detection element 20a only in that an infrared absorption layer 27 for absorbing infrared is on a first surface electrode 22a. Note that, regarding the infrared detection element 20c, constituent elements similar to those of the infrared detection element 20a are assigned with same reference numerals, and explanation thereof will be properly omitted.

The infrared detection element 20c can enhance an infrared absorptivity by installation of the infrared absorption layer 27, and therefore provide higher sensitivity.

Based on a different point of view, in the infrared detection element 20c, a surface of the first surface electrode 22a is covered with the infrared absorption layer 27 having a emissivity higher than that of the first surface electrode 22a. Thereby, in the infrared detection element 20c, an infrared absorptivity of a first pyroelectric element 22 can be improved, and accordingly, the sensitivity of the first pyroelectric element 22 can be provided higher. Note that, a value of an infrared emissivity is equal to a value of an infrared absorptivity.

It is preferable that the infrared absorption layer 27 be formed of a mixture of resin and conductive fine powder. In this case, as the infrared absorption layer 27, the conductive fine powder is dispersed in the resin. The conductive fine powder is fine powder having electrical conductivity. As the conductive fine powder, it is preferable that at least one kind of conductive fine powder be selected from a group of carbon fine powder, metal fine powder and metal oxide fine powder. In short, it is preferable that the infrared absorption layer 27 be formed of a first resin layer in which at least one kind of conductive fine powder (selected from the group of carbon fine powder, metal fine powder and metal oxide fine powder) is dispersed in the resin. Here, it is preferable that the infrared absorption layer 27 be provided so as to cover a whole region that is surrounded by the slit 26 in planar view. The infrared detection element 20c can enhance the infrared absorptivity by installation of the infrared absorption layer 27, and furthermore, the infrared absorption layer 27 together with the first surface electrode 22a can function as an electrode for collecting electric charge generated by the spontaneous polarization of the pyroelectric substrate 21. Accordingly, the infrared detection element 20c can increase a detection area with respect to a pyroelectric current. Therefore, the infrared detection element 20c can provide higher sensitivity, compared with a case where the infrared absorption layer 27 is not installed.

The conductive fine powder in the infrared absorption layer 27 has volume concentration of 17%. However, this value is merely one example, but the volume concentration is not limited in particular. The volume concentration of the conductive fine powder may be set to be in a range of about 1 to 30%, for example.

The infrared absorption layer 27 may be formed by applying, using e.g., a screen printing method or gravure printing method, paste (printing ink) obtained by dispersing the conductive fine powder in the resin and further mixing an organic solvent therein, and then by baking the paste to be cured. When the infrared absorption layer 27 is formed, it is possible to make the conductive fine powder in the infrared absorption layer 27 have volume concentration of about 17% by setting to 8.5% a composition rate of the conductive fine powder in the paste, for example.

It is desirable that the infrared absorption layer 27 having chemical and physical stability over a wider temperature range. For this reason, it is desirable that the resin in the infrared absorption layer 27 being thermosetting resin. Examples of the thermosetting resin include phenolic resin, epoxy resin, melamine resin, urea resin, unsaturated polyester resin, alkyd resin, polyurethane resin, thermosetting polyimide resin and the like. In the infrared detection element 20c, it is preferable to select, from those examples of the thermosetting resin, thermosetting resin that has a higher absorptivity with respect to infrared as a detection object to be detected by the infrared detection element 20c. Accordingly, in the infrared detection element 20c, it is possible to reduce the thickness of the infrared absorption layer 27, and provide higher sensitivity. The resin capable of absorbing infrared as a detection object preferably has an absorptivity of 30% or more with respect to infrared as the detection object, more preferably 50% or more.

When the infrared detection element 20c is used for detecting gas or the like, and a wavelength of infrared as the detection object is within a range of 3 to 8 µm, in particular a range of 3 to 5 µm, it is preferable that the resin in the infrared absorption layer 27 contain a hydroxyl group. Because in the resin containing the hydroxyl group, hydrogen bond is formed among many molecules, the resin containing the hydroxyl group has a characteristic of absorbing infrared, a wavelength of which is in a range from the vicinity of 3 µm to the longer wavelength side. As this kind of resin, phenolic resin is cited. Examples of the phenolic resin include phenol novolak resin, phenol aralkyl resin, cyclopentadiene, phenol polymer, naphthalene type phenol resin, bisphenol A, bisphenol F and the like. Note that, one of the examples may be used, or two or more of the examples may be used in combination.

When the infrared detection element 20c is used for detecting human body or the like, and a wavelength of infrared as the detection object is within a range of 8 to 13 µm, it is preferable that the resin in the infrared absorption layer 27 be aromatic resin. Examples of this kind of resin include phenolic resin, polyurethane resin, thermosetting polyimide resin and the like.

In consideration of application to both of gas detection and human body detection, the resin in the infrared absorption layer 27 is preferably aromatic resin containing a hydroxyl group, and for example phenolic resin is cited as the resin in the infrared absorption layer 27.

As the carbon fine powder, suitable is fine powder that is solid carbon material, has a high infrared absorptivity and can be dispersed in resin. Examples of this kind of carbon fine powder include carbon black, carbon fiber, graphite and the like (classified as amorphous (microcrystalline) carbon), and fullerene, nanotube, graphene and the like (classified as nanocarbon). In particular, because of having a small particle diameter and chemical stability. carbon black is preferable.

Regarding the metal fine powder, metal fine powder having a particle diameter of about 0.1 µm or less has a property of absorbing infrared, and is characterized in that an absorptivity thereof is high over a wide infrared wavelength band. This characteristic does not depend on the kind of metal. Therefore, examples of material for the metal fine powder include noble metal having chemical stability (such as Au, Pt and Ag), high melting point metal having high heat resistance (such as W and Mo), Zn, Mg, Cd, Al, Cu, Fe, Cr, Ni, Co, Sn (these can be easily made as fine powder), an alloy of two kinds or more selected from those, and the like.

The metal oxide fine powder efficiently absorbs far infrared, and also has chemical stability. Accordingly, in a case where the infrared detection element 20c is used for human body detection or the like, the metal oxide fine powder is suitable. Examples of material for the metal oxide fine powder include ITO (Indium Tin Oxide), AZO (Al-doped ZnO), GZO (Ga-doped ZnO) and the like.

Figure 7:
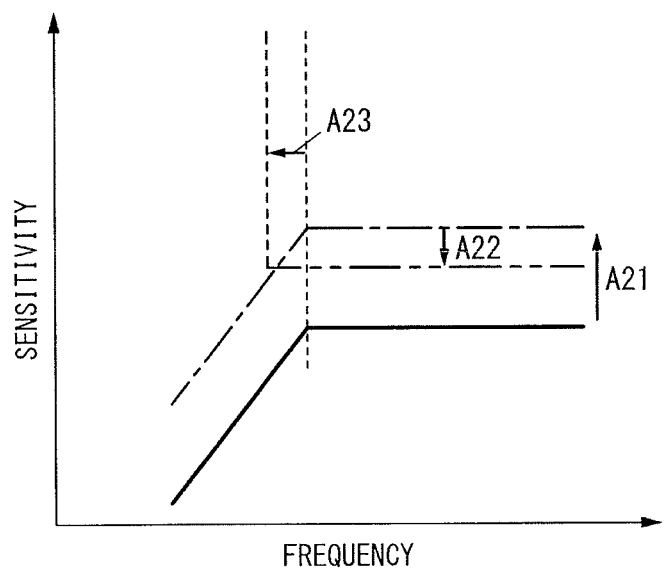
FIG. 7 is a schematic drawing showing a state of a change in sensitivity caused by providing an infrared absorption layer, regarding the second variation of the infrared detection element according to Embodiment 1.

By addition of the infrared absorption layer 27, the infrared detection element 20c can enhance the infrared absorptivity of the first pyroelectric element 22 and provide higher sensitivity. However, on the other hand, the heat capacity of the first pyroelectric element 22 is increased, and the increase causes to reduce an increase in temperature of the first pyroelectric element 22 due to infrared received by the first pyroelectric element 22, and therefore sensitivity tends to be reduced. FIG. 7 is a schematic drawing showing a direction of a change in the sensitivity caused by providing the infrared absorption layer 27, and the horizontal axis represents a frequency of infrared, and the vertical axis represents sensitivity (current sensitivity). FIG. 7 schematically shows that the sensitivity is increased, as shown by an arrow A21, with an increase in the infrared absorptivity, and the sensitivity is decreased, as shown by an arrow A22, with an increase in the heat capacity. For this reason, in the infrared detection element 20c, depending on the thickness of the infrared absorption layer 27, there is a concern that the effect of installation of the infrared absorption layer 27 cannot be obtained. Furthermore, FIG. 7 schematically shows that the frequency characteristic with respect to sensitivity is deteriorated as shown by an arrow A23, by a deterioration of thermal responsivity due to the increase in the heat capacity. From FIG. 7, it is found that in the infrared detection element 20c, when the sensitivity in a high frequency region is regarded as important, the thickness of the infrared absorption layer 27 is preferably made to be small.

Regarding the first pyroelectric element 22, when it is assumed that the heat radiating property is constant, the sensitivity is inversely proportional to the heat capacity. In addition, the sensitivity of the first pyroelectric element 22 is proportional to the infrared absorptivity. Accordingly, the rate of change in the sensitivity due to the addition of the infrared absorption layer 27 can be represented by "[the rate of change in the sensitivity]=[the rate of change in the infrared absorptivity]/[the rate of change in the heat capacity]". Here, in order to enhance the sensitivity, the rate of change in the sensitivity needs to be made to be more than "1". Also, in consideration of a heat capacity per unit area, it is possible to discuss the rate of change in the sensitivity, based on the product of a thickness and a volume heat capacity.

Here, by the installation of the infrared absorption layer 27, the heat capacity per unit area of the first pyroelectric element 22 is changed from "Sd×Sρ" to "Sd×Sρ+Ad×Aφ", where: Ad [μm] is a thickness of the infrared absorption layer 27 on the first surface electrode 22a; Aρ [J/K] is a volume heat capacity of the infrared absorption layer 27; Sd [μm] is a thickness of the pyroelectric substrate 21; and Sρ [J/K] is a volume heat capacity of the pyroelectric substrate 21. Accordingly, in this case, when it is assumed that the infrared absorptivity is increased from 20% to 40%, a condition for improving the sensitivity is represented by the following formula (4).

$$1 < (0.4/0.2)/\{(Sd \times S\rho + Ad \times A\phi)/(Sd \times S\phi)\} \quad \text{formula (4)}$$

When rearranged, the formula (4) is represented by the following formula (5).

$$0.2/(Sd \times S\phi) < 0.4/(Sd \times S\rho + Ad \times A\rho) \quad \text{formula (5)}$$

When further rearranged, the formula (5) is represented by the following formula (6).

$$Ad < (Sd \times S\rho)/A\rho \quad \text{formula (6)}$$

Furthermore, in a case where there is no change in the sensitivity due to the addition of the infrared absorption layer 27, the inequality sign is replaced with an equality sign, and accordingly, the formula (6) is represented by the following formula (7).

$$Ad = (Sd \times S\rho)/A\rho \quad \text{formula (7)}$$

Figure 8:
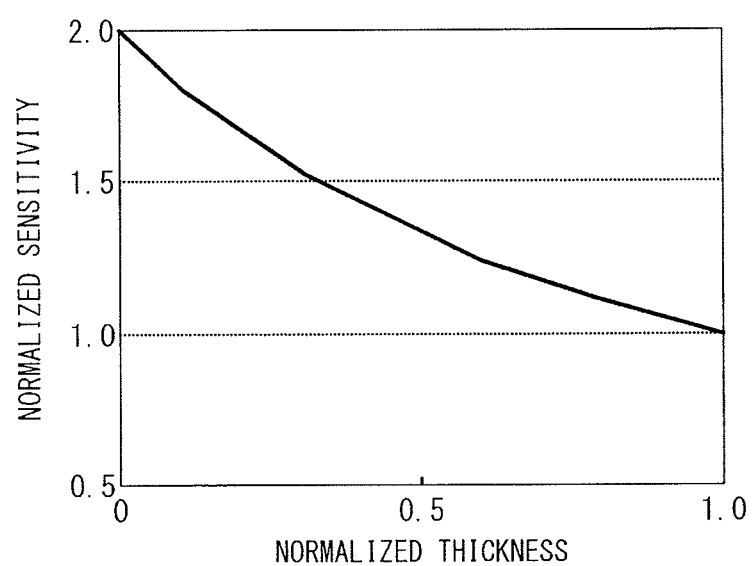
FIG. 8 is a drawing showing a relation between a normalized thickness of the infrared absorption layer and a normalized sensitivity, regarding the second variation of the infrared detection element according to Embodiment 1.

The formulas (6) and (7) mean that when the thickness Ad of the infrared absorption layer 27 is equal to "(Sd×Sρ)/Aρ", there is no change in the sensitivity, and when the thickness Ad is smaller than "(Sd×Sρ)/Aρ", the sensitivity is improved. Here, a normalized thickness for the thickness Ad of the infrared absorption layer 27 is defined as "NAd=(Sd×Sρ)/Aρ", and further a relative sensitivity that has "1" when the normalized thickness NAd is equal to "1" is defined as a normalized sensitivity. In this case, FIG. 8 shows a relation between the normalized thickness NAd of the infrared absorption layer 27 and the normalized sensitivity of the first pyroelectric element 22. As can be expected from FIG. 8, in the infrared detection element 20c, it is possible to make the normalized sensitivity have a value more than "1" by the normalized thickness NAd of the infrared absorption layer 27 being made to be less than "1".

In the infrared detection element 20c, it is preferable that a relation as the following formula (8) be met, where An is a refractive index of the infrared absorption layer 27 with respect to a wavelength of infrared as a detection object, Ad [μm] is a thickness of the infrared absorption layer 27 on the first surface electrode 22a, and λt [μm] is the wavelength of infrared as the detection object.

$$(An \times Ad) > (\lambda t/4) \quad \text{formula (8)}$$

The infrared detection element 20c can enhance the infrared absorptivity of the infrared absorption layer 27 by the relation as the formula (8) being met.

Figure 9:
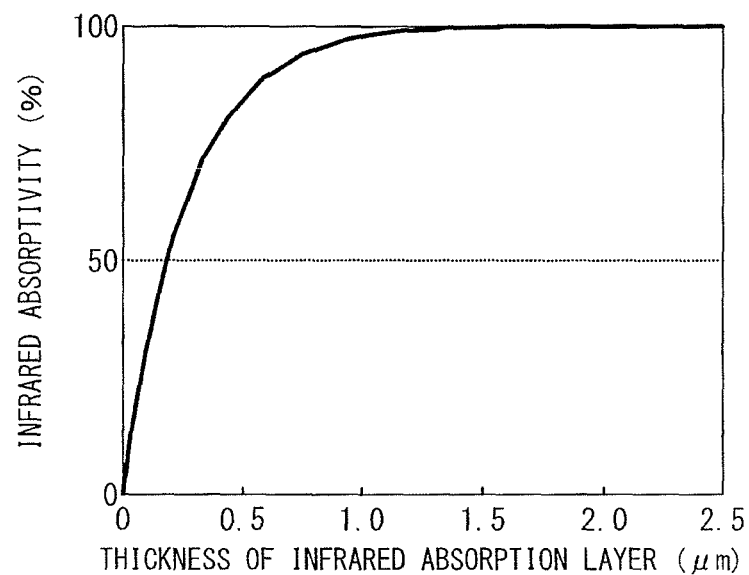
FIG. 9 is a drawing showing a relation between a thickness of the infrared absorption layer and an infrared absorptivity thereof, regarding the second variation of the infrared detection element according to Embodiment 1.

In this case, a relation between the thickness of the infrared absorption layer 27 and the infrared absorptivity of the infrared absorption layer 27 was obtained as a simulation result shown in FIG. 9.

In this simulation, it was assumed that, as a simulation condition, the infrared absorptivity of the infrared absorption layer 27 depended on the thickness of the infrared absorption layer 27 based on Lambert-Beers' law, the infrared absorption layer 27 had the infrared absorptivity of 90%, the resin in the infrared absorption layer 27 was phenol resin, the infrared absorption layer 27 had the refractive index An of 1.6 (this was a refractive index of phenol resin), and infrared as a detection object had the wavelength of 4 μm. Note that, regarding the infrared absorption layer 27, although the conductive fine powder was dispersed in the resin, the refractive index of the infrared absorption layer 27 could be defined as approximately a refractive index of the resin because of low volume concentration of the conductive fine powder. On the other hand, in a case of an infrared absorption layer as a single body (such as metal black), a refractive index thereof has a value close to 1 that is a refractive index of air, because of a high ratio of air per unit volume.

Figure 10:
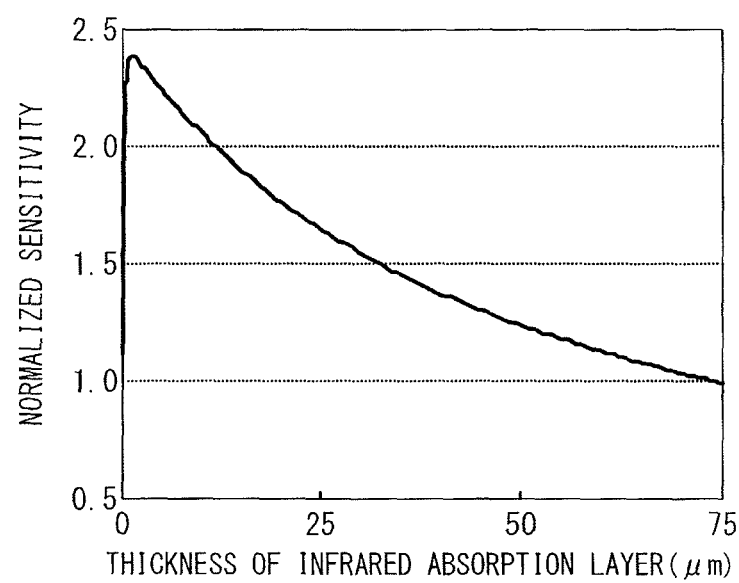
FIG. 10 is a drawing showing a relation between the thickness of the infrared absorption layer and the normalized sensitivity, regarding the second variation of the infrared detection element according to Embodiment 1.

Also, a relation between the thickness of the infrared absorption layer 27 and the normalized sensitivity was obtained as a simulation result shown in FIG. 10. In this simulation, the same simulation condition as the case of FIG. 9 was used, but the material for the pyroelectric substrate 21 was LiTaO$_3$ and the pyroelectric substrate 21 had a thickness of 50 μm.

In the example of FIG. 10, it is found that, by the installation of the infrared absorption layer 27, the normalized sensitivity can be made to be a value more than "1", that is, the sensitivity can be improved. Furthermore in the example of FIG. 10, it is found that, by the thickness of the infrared absorption layer 27 being made less than 75 μm, the normalized sensitivity can be made to be a value more than "1", that is, the sensitivity can be improved.

In the infrared detection element 20c, the first surface electrode 22a and the second surface electrode 23a preferably have sheet resistances that function as infrared reflection layers for reflecting infrared. Accordingly, the infrared detection element 20c can efficiently reflect, with the first surface electrode 22a, infrared that is incident on a surface of the first surface electrode 22a without being absorbed by the infrared absorption layer 27, and improve the infrared absorptivity of the infrared absorption layer 27. Therefore, the infrared detection element 20c can further improve the sensitivity. In addition, the infrared detection element 20c can more efficiently reflect, with the second surface electrode 23a, infrared that is incident on the second pyroelectric element 23 due to the crosstalk of infrared, and therefore, further reduce influence by the crosstalk of infrared, and improve the sensitivity.

Figure 11:
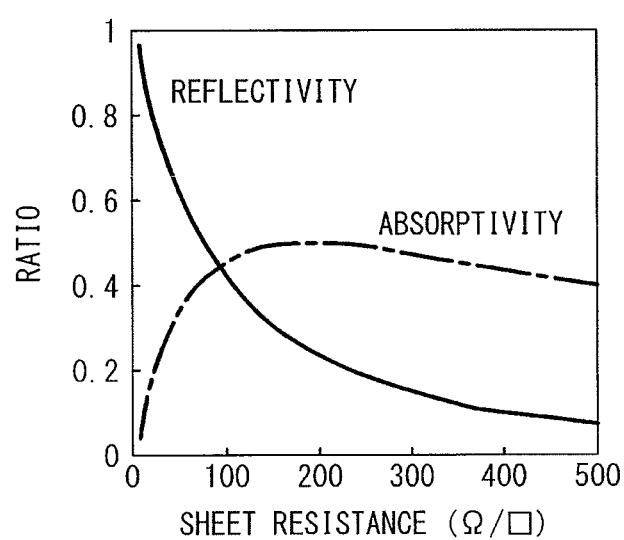
FIG. 11 is a drawing showing a relation between a reflectivity and a sheet resistance of an electrode, and a relation between an absorptivity and the sheet resistance.

FIG. 11 schematically shows a relation between an infrared reflectivity of the first surface electrode 22a and a sheet resistance of the first surface electrode 22a, and a relation between an infrared absorptivity and the sheet resistance. In FIG. 11, the horizontal axis represents the sheet resistance, and the vertical axis represents ratios of the reflectivity and the absorptivity. In the infrared detection element 20c, it is preferable that the first surface electrode 22a have the sheet resistance of 50Ω/☐ or less, more preferably 20Ω/☐ or less. The infrared detection element 20c can allow the reflectivity to be more than twice of the absorptivity, by the first surface electrode 22a having the sheet resistance of 50Ω/☐ or less. In addition, the infrared detection element 20c can allow the reflectivity to be more than 80%, by the first surface electrode 22a having the sheet resistance of 20Ω/☐ or less.

In the infrared detection element 20c, it is more preferable that the sheet resistances of the first surface electrode 22a and the second surface electrode 23a be equal to each other. Accordingly, when manufacturing the infrared detection element 20c, it is possible to simultaneously form the first and second surface electrodes 22a and 23a, and reduce the manufacturing cost. Here, the first surface electrode 22a and the second surface electrode 23a are not limited to a case of the sheet resistances thereof being completely equal to each other. The sheet resistances may have a margin of error as variation generated when manufactured.

Figure 12A:
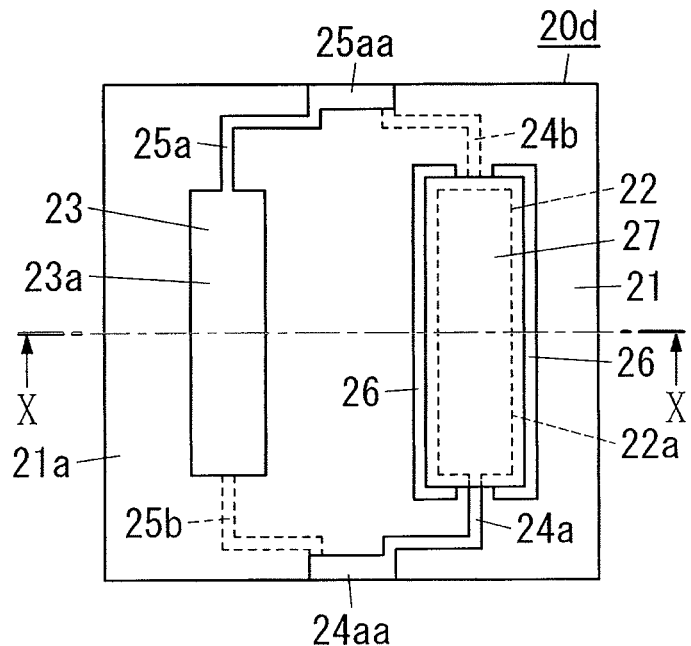
FIG. 12A is a schematic plan view of a third variation of the infrared detection element according to Embodiment 1.
Figure 12B:
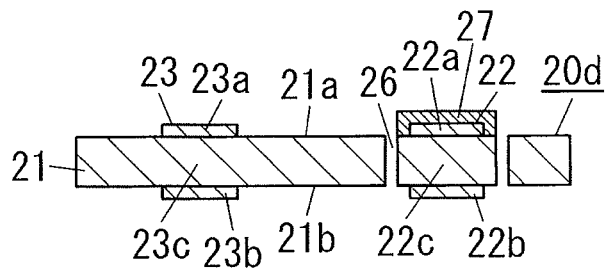
FIG. 12B is a schematic cross-sectional view taken along line X-X of FIG. 12A.
Figure 12C:
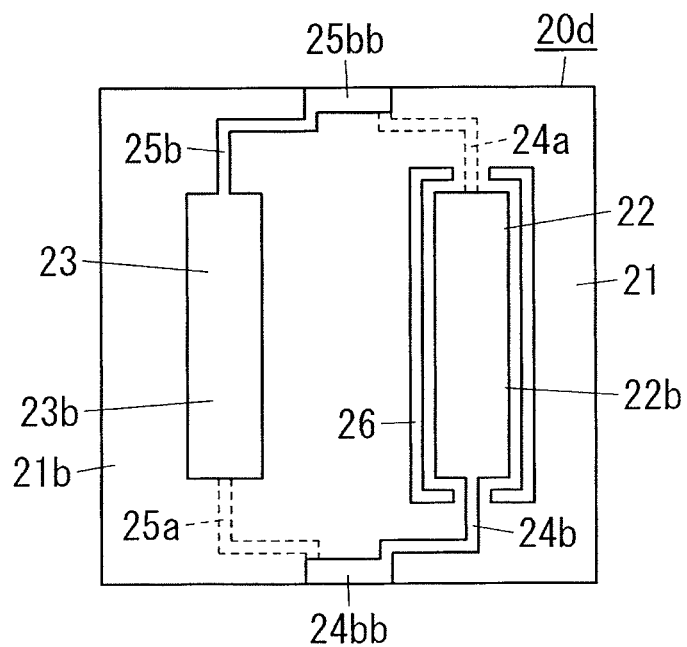
FIG. 12C is a schematic bottom view of the third variation of the infrared detection element according to Embodiment 1.

FIGS. 12A, 12B and 12C show an infrared detection element 20d, as a third variation of the infrared detection element 20a. The infrared detection element 20d has substantially the same basic configuration as the infrared detection element 20c as the second variation. Note that, regarding the infrared detection element 20d, constituent elements similar to those of the infrared detection element 20c are assigned with same reference numerals, and explanation thereof will be properly omitted.

In the infrared detection element 20d, a first surface electrode 22a is provided such that an outer circumferential edge thereof is spaced from an aperture edge of each of slits 26 (surrounding the first surface electrode 22a), facing a side of the first surface electrode 22a. Accordingly, the infrared detection element 20d can more surely prevent occurrence of short-circuit between the first surface electrode 22a and the first back face electrode 22b while providing higher sensitivity.

In the infrared detection element 20d, it is preferable that a first back face electrode 22b be provided such that an outer circumferential edge thereof is spaced from an aperture edge of each of the slits 26 (surrounding the first back face electrode 22b), facing a side of the first back face electrode 22b. More specifically, a periphery of a first portion 22c more projects in the first direction than the first surface electrode 22a and the first back face electrode 22b. Accordingly, the infrared detection element 20d can more surely prevent occurrence of short-circuit between the first surface electrode 22a and the first back face electrode 22b, and thereby prevent a reduction of electrical stability.

Figure 13A:
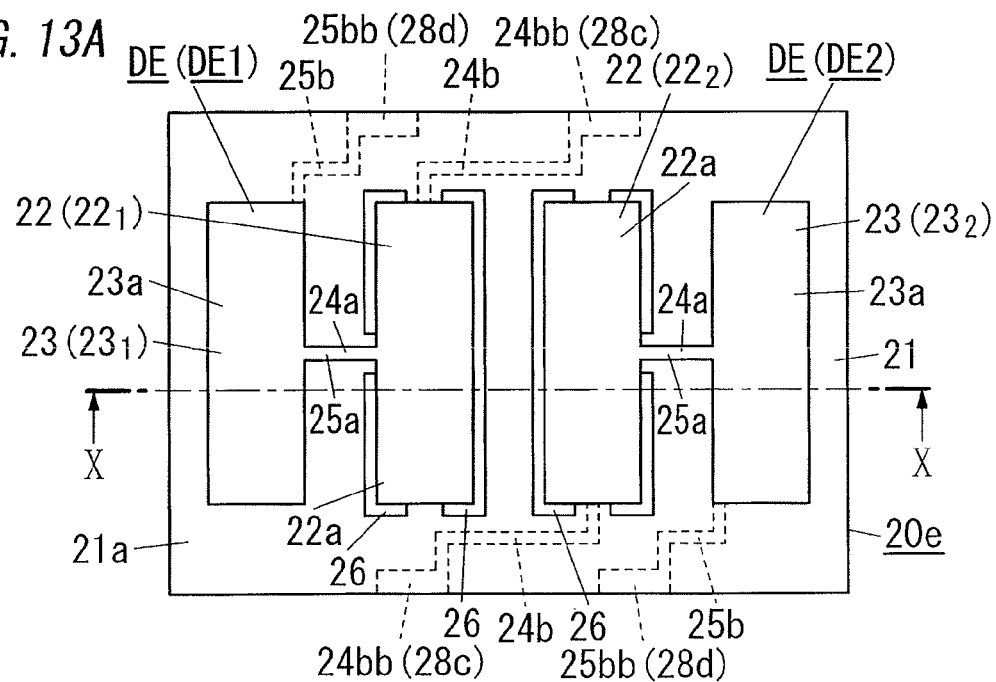
FIG. 13A is a schematic plan view of a fourth variation of the infrared detection element according to Embodiment 1.
Figure 13B:
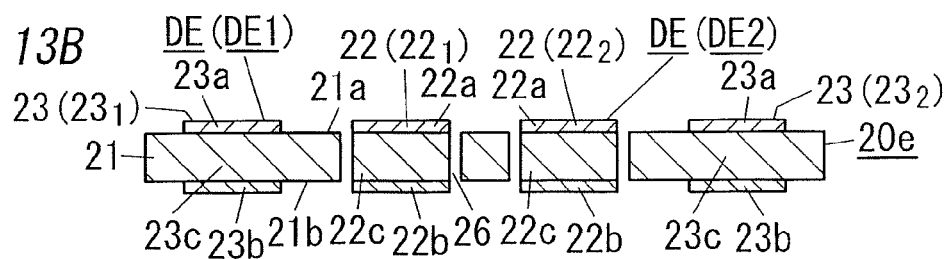
FIG. 13B is a schematic cross-sectional view taken along line X-X of FIG. 13A.
Figure 13C:
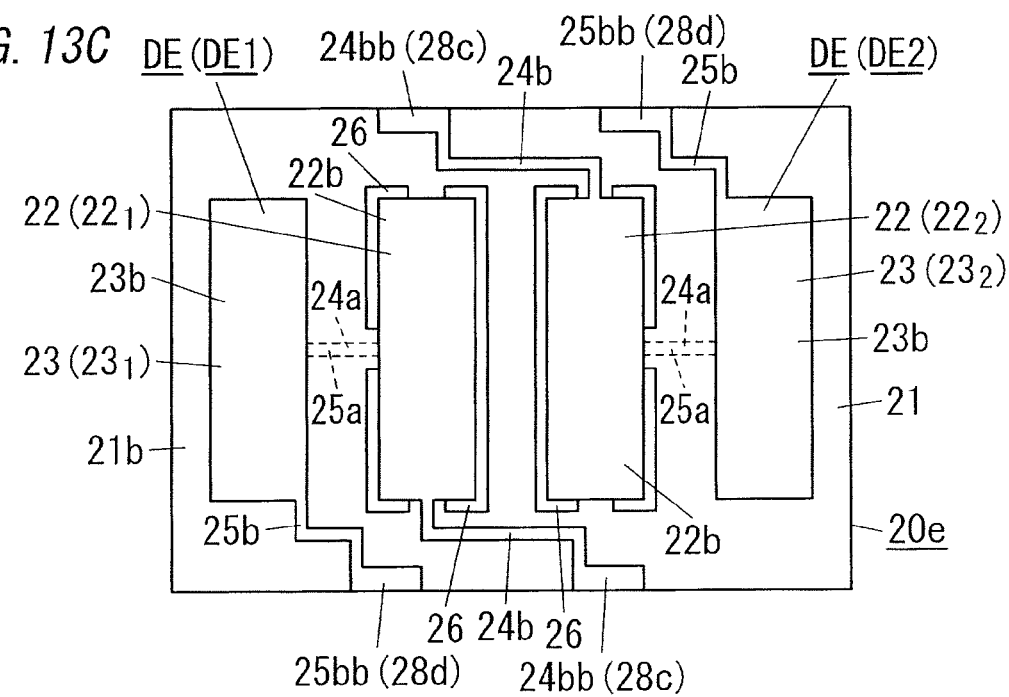
FIG. 13C is a schematic bottom view of the fourth variation of the infrared detection element according to Embodiment 1.

FIGS. 13A, 13B and 13C show an infrared detection element 20e, as a fourth variation of the infrared detection element 20a. The infrared detection element 20e has substantially the same basic configuration as the infrared detection element 20b as the first variation. However, the infrared detection element 20e includes two or more sets of a first pyroelectric element 22 and a second pyroelectric element 23. Here, a pyroelectric substrate 21 is formed with slits 26 at facing sides of two adjacent first pyroelectric elements 22. Note that, regarding the infrared detection element 20e, constituent elements similar to those of the infrared detection element 20b are assigned with same reference numerals, and explanation thereof will be properly omitted.

In a case where the infrared detection element 20e includes two sets of a first pyroelectric element 22 and a second pyroelectric element 23, it can be used as an infrared detection element that has two channels, respectively corresponding to the two sets (of the first and second pyroelectric elements 22 and 23). In other words, the infrared detection element 20e is configured to have two channels, and the two channels are configured by detection elements DE and DE, each of which includes a first pyroelectric element 22, a second pyroelectric element 23, a first surface wiring 24a, a first back face wiring 24b, a second surface wiring 25a and a second back face wiring 25b. Hereinafter, for convenience of explanation, the left detection element DE in FIG. 13A is referred to as a first detection element DE1, and the right detection element DE in FIG. 13A is referred to as a second detection element DE2.

Figure 14:
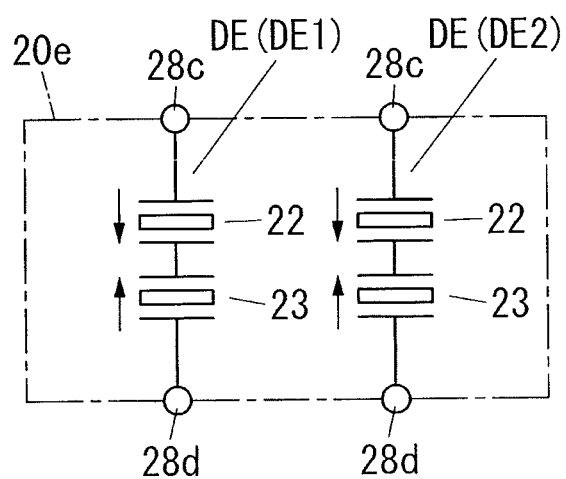
FIG. 14 is an equivalent circuit diagram in the fourth variation of the infrared detection element according to Embodiment 1.

In the infrared detection element 20e, as shown in FIG. 14, a first pyroelectric element 22 and a second pyroelectric element 23, which are paired, are connected in reverse series to each other. In FIG. 14, directions of the spontaneous polarization of the pyroelectric substrate 21 are denoted by arrows. Note that, the connection in reverse series means a first pyroelectric element 22 and a second pyroelectric element 23, which are paired, are connected in series to each other such that the first pyroelectric element has a reverse polarity to the polarity of the second pyroelectric element.

For example when the infrared detection element 20e is used for an infrared type gas sensor or the like, it is possible to set two or more wavelengths of infrared as a detection object, according to the number of sets (of the first and second pyroelectric elements 22 and 23). The wavelength of infrared as the detection object can be set with an optical filter or the like. In the infrared type gas sensor including the infrared detection element 20e, it is possible to provide a configuration having two or more channels, the number of which corresponds to the number of sets (each of which is configured by the first and second pyroelectric elements 22 and 23).

In the case where the infrared detection element 20e includes two sets (of the first and second pyroelectric elements 22 and 23), it is possible to use, for each set, the first pyroelectric element 22 as a pyroelectric element for receiving infrared light, and the second pyroelectric element 23 as a pyroelectric element for compensating temperature. Accordingly, when the infrared detection element 20e is used for an infrared type gas sensor or the like, it is possible to set the respective wavelengths of infrared as the detection object so as to correspond to the pyroelectric elements for receiving infrared light.

As described above, the infrared detection element 20e includes two sets of the first and second pyroelectric elements 22 and 23. Hereinafter, for convenience of explanation, a first pyroelectric element 22 and a second pyroelectric element 23 of the first detection element DE1 are respectively also referred to as a first light receiving element $22_1$ and a first temperature compensating element $23_1$. Also, hereinafter, for convenience of explanation, a first pyroelectric element 22 and a second pyroelectric element 23 of the second detection element DE2 are respectively also referred to as a second light receiving element $22_2$ and a second temperature compensating element $23_2$.

In the infrared detection element 20e, the slits 26 are formed at facing sides of two adjacent first pyroelectric elements 22. Therefore, it is possible to prevent heat from being transmitted between the two adjacent first pyroelectric elements 22 and 22. Thereby, the infrared detection element 20e can prevent reduction in the sensitivities of the first and second detection elements DE1 and DE2.

Figure 15A:
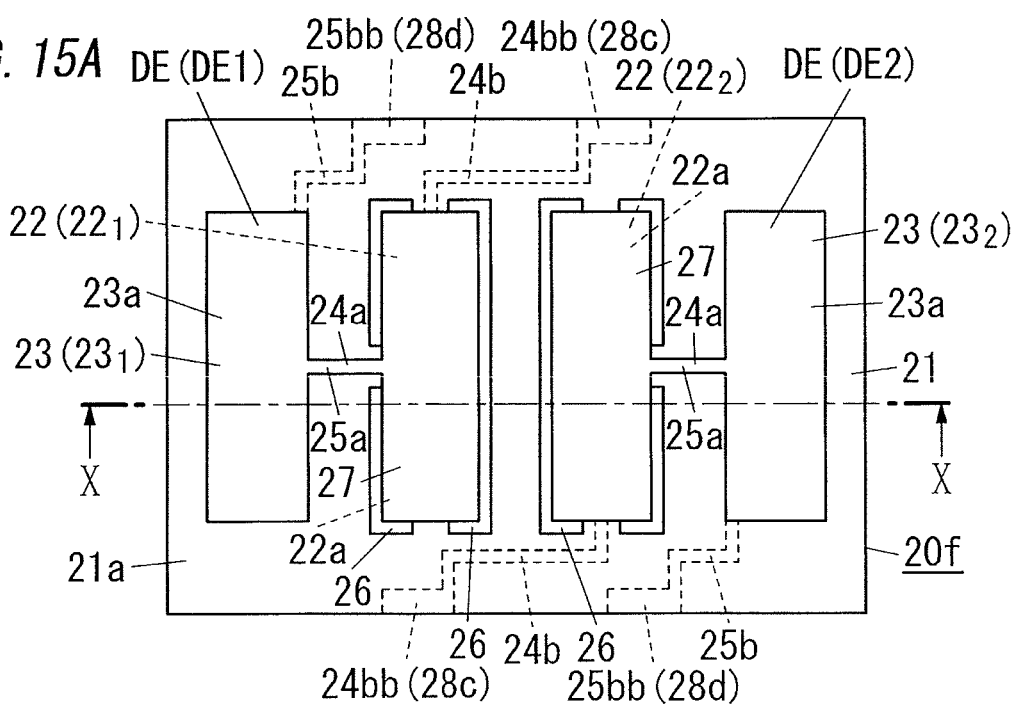
FIG. 15A is a schematic plan view of a fifth variation of the infrared detection element according to Embodiment 1.
Figure 15B:
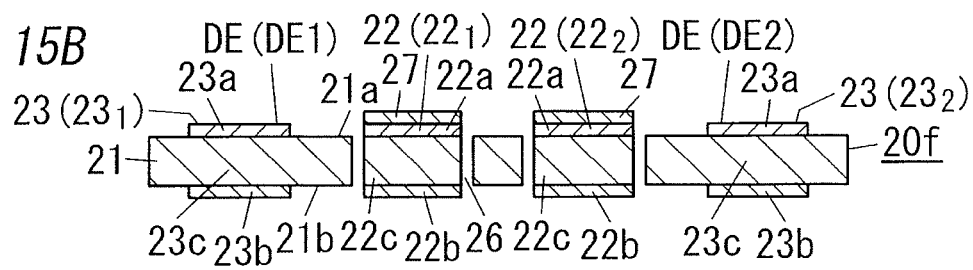
FIG. 15B is a schematic cross-sectional view taken along line X-X of FIG. 15A.
Figure 15C:
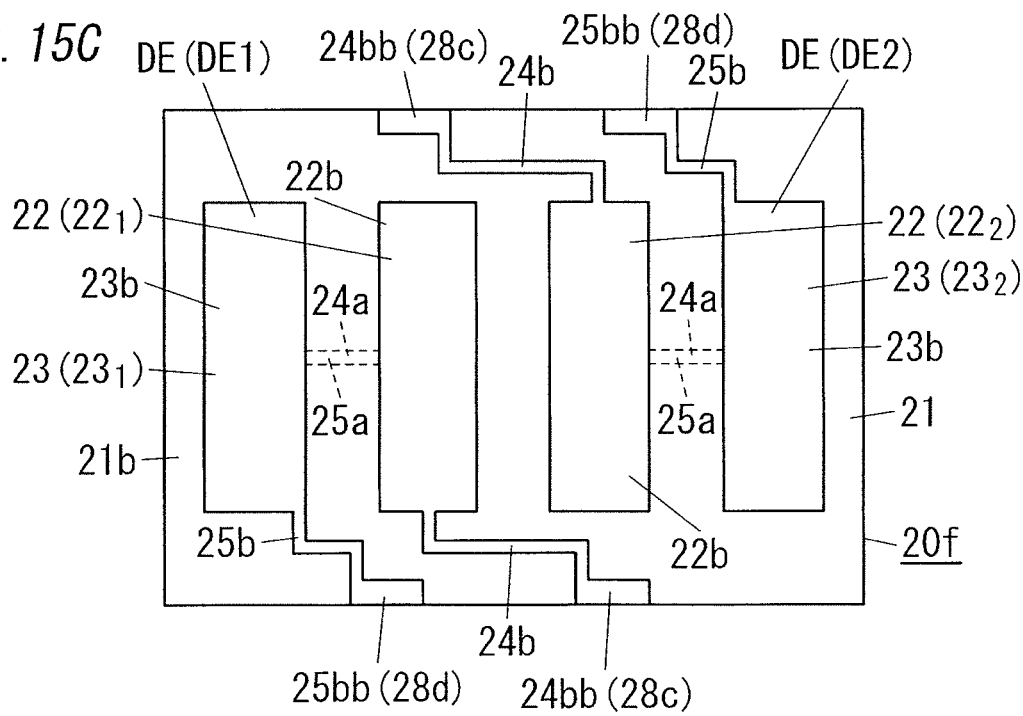
FIG. 15C is a schematic bottom view of the fifth variation of the infrared detection element according to Embodiment 1.

FIGS. 15A, 15B and 15C show an infrared detection element 20f, as a fifth variation of the infrared detection element 20a. The infrared detection element 20f has substantially the same basic configuration as the infrared detection element 20e as the fourth variation. The infrared detection element 20f is different from the infrared detection element 20e in that an infrared absorption layer 27 is provided on a first surface electrode 22a of each first pyroelectric element 22. Note that, regarding the infrared detection element 20f, constituent elements similar to those of the infrared detection element 20e are assigned with same reference numerals, and explanation thereof will be properly omitted.

In the infrared detection element 20f, a first pyroelectric element 22 and a second pyroelectric element 23 corresponding to each channel may be connected in reverse parallel to each other. In addition, on each first surface electrode 22a, an infrared absorption layer 27 similar to that of the infrared detection element 20c (FIG. 6) or the infrared detection element 20d (refer to FIG. 12) may be provided.

Embodiment 2

Hereinafter, an infrared detector 2a of the embodiment will be described with reference to FIGS. 16 to 18, 19A, 19B, 20, 21 and 22A to 22F. Note that, in the infrared detector 2a, constituent elements similar to those of the infrared detection element 20e as the fourth variation of Embodiment 1 are assigned with same reference numerals, and explanation thereof will be properly omitted.

The infrared detector 2a includes: the infrared detection element 20e; and an optical filter 30 that is disposed in front of the infrared detection element 20e, and configured to transmit infrared having a wavelength band, as a detection object to be detected by the infrared detection element 20e. The infrared detector 2a further includes: a base body 43 on which the infrared detection element 20e is mounted; and a package 29 that houses the infrared detection element 20e, the optical filter 30 and the base body 43.

The package 29 includes: a pedestal 29a that supports the base body 43; and a cap 29b that is made of metal, and fixed to the pedestal 29a so as to cover the infrared detection element 20e and the optical filter 30. The package 29 further includes: a window hole 29c that is in a top plate 29ba of the cap 29b; and a window member 29w that is disposed to close the window hole 29c, and allows infrared to pass through. Since the infrared detector 2a includes the infrared detection element 20e, it is possible to provide higher sensitivity.

The infrared detector 2a preferably further includes an IC element(s) 40 for signal processing an output signal of the infrared detection element 20e. In the infrared detector 2a, the IC element 40 is preferably mounted on the base body 43 and stored in the package 29.

The constituent elements of the infrared detector 2a will be described below in more detail.

As described above, the infrared detection element 20e includes two sets of a first pyroelectric element 22 and a second pyroelectric element 23.

The infrared detector 2a includes another optical filter in addition to the optical filter, namely two optical filters 30. In the infrared detector 2a, one of the optical filters 30 is disposed in front of a first light receiving element $22_1$, and the other of the optical filters 30 is disposed in front of a second light receiving element $22_2$.

In the infrared detector 2a, since the optical filters 30 are stored in the package 29, the optical filters 30 can be prevented from being exposed to the external air. Therefore, it is possible to prevent a change in a filter characteristic with time. Hereinafter, for convenience of explanation, the optical filter 30 disposed in front of the first light receiving element $22_1$ is also referred to as a first optical filter 31, and the optical filter 30 disposed in front of the second light receiving element $22_2$ is also referred to as a second optical filter 32.

The filter characteristics of the first and second optical filters 31 and 32 may be designed so that those optical filters have optical characteristics required for the infrared detector 2a.

Figure 21:
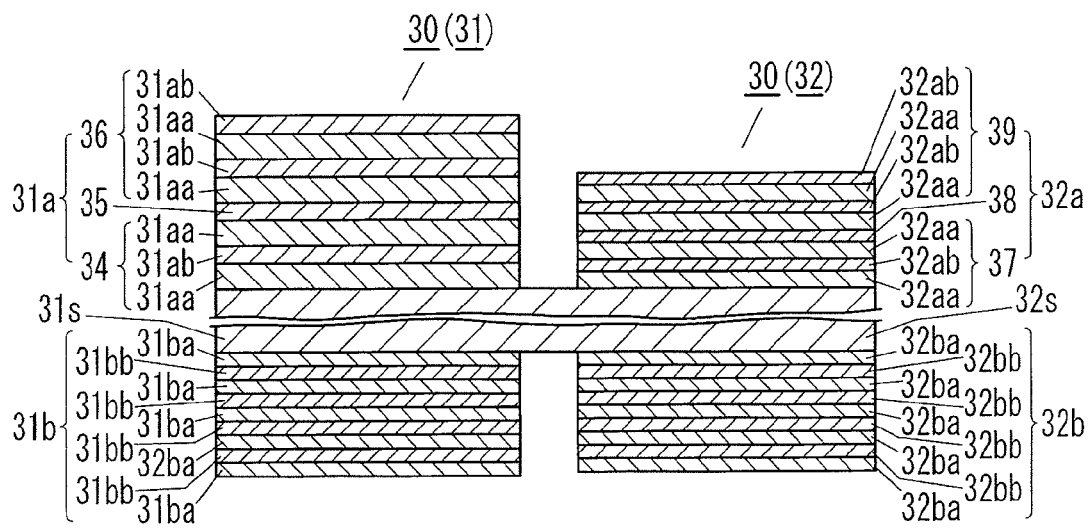
FIG. 21 is a schematic cross-sectional view of an optical filter in the infrared detector according to Embodiment 2.

For example, as shown in FIG. 21, the first optical filter 31 includes a first substrate 31s, a first filter part 31a and a second filter part 31b. Also for example, as shown in FIG. 21, the second optical filter 32 includes a second substrate 32s, a third filter part 32a and a fourth filter part 32b. The first substrate 31s and second substrate 32s allow infrared to pass through. Examples of the first and second substrates 31s and 32s include a silicon substrate, a germanium substrate, a sapphire substrate, a magnesium oxide substrate and the like. In the infrared detector 2a, the second filter part 31b and the fourth filter part 32b may have the same configurations. Accordingly, in the infrared detector 2a, it is possible to allow the spectral characteristic of the second filter part 31b to be almost equal to that of the fourth filter part 32b.

The first filter part 31a may be for example a band-pass filter that includes a $\lambda_0/4$ multilayer 34, a wavelength selecting layer 35 and a $\lambda_0/4$ multilayer 36. The $\lambda_0/4$ multilayer 34 is a multilayer in which two kinds of thin films 31aa and 31ab are alternately stacked, which have different refractive indexes and same optical film thicknesses. Each of the optical film thicknesses is set to ¼ of a set wavelength $\lambda_0$. The $\lambda_0/4$ multilayer 36 is a multilayer in which the two kinds of thin films 31aa and 31ab are alternately stacked, which have different refractive indexes and same optical film thicknesses. The wavelength selecting layer 35 is interposed between the $\lambda_0/4$ multilayers 34 and 36. An optical film thickness of the wavelength selecting layer 35 is made to be different from each optical film thickness of the thin films 31aa and 31ab, in response to a particular selective wavelength. As long as the $\lambda_0/4$ multilayers 34 and 36 each needs to have a refractive index periodic structure, three or more kinds of thin films may be stacked in each multilayer. Examples of material for each thin film include Ge, Si, MgF$_2$, Al$_2$O$_3$, SiOx, Ta$_2$O$_5$, SiNx and the like. The SiOx is SiO or SiO$_2$. Examples of the SiNx and the like include SiN, Si$_3$N$_4$ and the like.

The third filter part 32a may be for example a band-pass filter that includes a $\lambda_0/4$ multilayer 37, a wavelength selecting layer 38 and a $\lambda_0/4$ multilayer 39. The $\lambda_0/4$ multilayer 37 is a multilayer in which two kinds of thin films 32aa and 32ab are alternately stacked, which have different refractive indexes and same optical film thicknesses. The $\lambda_0/4$ multilayer 39 is a multilayer in which the two kinds of thin films 32aa and 32ab are alternately stacked, which have different refractive indexes and same optical film thicknesses. The wavelength selecting layer 38 is interposed between the $\lambda_0/4$ multilayers 37 and 39. An optical film thickness of the wavelength selecting layer 38 is made to be different from each optical film thickness of the thin films 32aa and 32ab, in response to a particular selective wavelength. As long as the $\lambda_0/4$ multilayers 37 and 39 each needs to have a refractive index periodic structure, three or more kinds of thin films may be stacked in each multilayer. Examples of material for each thin film include Ge, Si, MgF$_2$, Al$_2$O$_3$, SiOx, Ta$_2$O$_5$, SiNx and the like.

The respective thin films 31aa and 31ab of the first filter part 31a may be made of the same materials as those for the thin films 32aa and 32ab of the third filter part 32a.

In the first filter part 31a, the wavelength selecting layer 35 with an optical film thickness different from each optical film thickness of the thin films is provided in the refractive index periodic structure such that a local turbulence is introduced in the refractive index periodic structure, and accordingly, it is possible to locally put, in a reflection band, a transmission band having a spectral width narrower than a width of the reflection band. In the first filter part 31a, it is possible to change a transmission peak wavelength of the transmission wavelength band, by the optical film thickness of the wavelength selecting layer 35 being appropriately changed.

In the third filter part 32a, the wavelength selecting layer 38 with an optical film thickness different from each optical film thickness of the thin films is provided in the refractive index periodic structure such that a local turbulence is introduced in the refractive index periodic structure, and accordingly, it is possible to locally put, in a reflection band, a transmission band having a spectral width narrower than a width of the reflection band. In the third filter part 32a, it is possible to change a transmission peak wavelength of the transmission wavelength band, by the optical film thickness of the wavelength selecting layer 38 being appropriately changed.

The width of the reflection band of an optical multilayer (formed by stacking two kinds of thin films, which have different refractive indexes and same optical film thicknesses) is approximately obtained from the following formula (9).

[Mathematical 8]

$$\frac{\Delta \lambda_0}{\lambda_0} = \frac{4}{\pi} \cdot \sin^{-1}\left(\frac{\frac{n_H}{n_L} - 1}{\frac{n_H}{n_L} + 1}\right) \quad \text{formula (9)}$$

Here, $\lambda_0$ is a set wavelength that corresponds to four times a common optical film thickness of each thin film; $\Delta\lambda_0$ is the width of the reflection band; $n_H$ is a relatively high refractive index of refractive indexes of materials for the two kinds of thin films; and $n_L$ is a relatively low refractive index of refractive indexes of materials for the two kinds of thin films.

The particular selective wavelength of the first filter part 31a is a center wavelength $\lambda_1$ of the transmission wavelength band of the first filter part 31a. Also, the particular selective wavelength of the third filter part 32a is a center wavelength $\lambda_2$ of the transmission wavelength band of the third filter part 32a.

The second filter part 31b is a multilayer in which two kinds of thin films 31ba and 31bb are alternately stacked, which have different refractive indexes and same optical film thicknesses. In the second filter part 31b, examples of material for thin films with a relatively high refractive index include Ge, Si and the like, and examples of material for thin films with a relatively low refractive index include MgF$_2$, Al$_2$O$_3$, SiOx, Ta$_2$O$_5$, SiNx and the like. The SiOx is SiO or SiO$_2$. Examples of the SiNx and the like include SiN, Si$_3$N$_4$ and the like.

The fourth filter part 32b is a multilayer in which two kinds of thin films 32ba and 32bb are alternately stacked, which have different refractive indexes and same optical film thicknesses. In the fourth filter part 32b, examples of material for thin films with a relatively high refractive index include Ge, Si and the like, and examples of material for thin films with a relatively low refractive index include MgF$_2$, Al$_2$O$_3$, SiOx, Ta$_2$O$_5$, SiNx and the like.

The second filter part 31b is configured to reduce an infrared transmittance in a prescribed wavelength band, all wavelengths in which are longer than all wavelengths in the transmission wavelength band of the first filter part 31a. Also, the fourth filter part 32b is configured to reduce an infrared transmittance in a prescribed wavelength band, all wavelengths in which are longer than all wavelengths in the transmission wavelength band of the third filter part 32a. The second filter part 31b is a filter for absorbing infrared having a prescribed wavelength band to block the infrared. The fourth filter part 32b is a filter for absorbing infrared having a prescribed wavelength band to block the infrared.

Figure 22A:
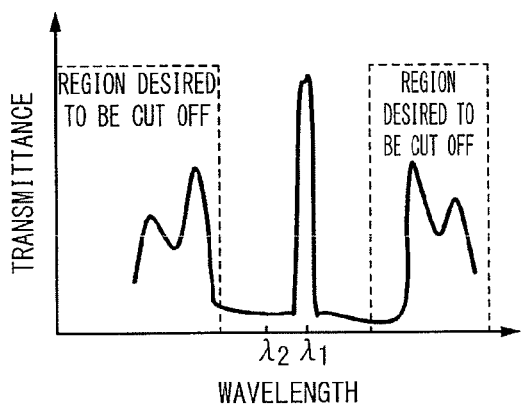
FIG. 22A is a drawing showing a filter characteristic of a first filter part in the infrared detector according to Embodiment 2.
Figure 22D:
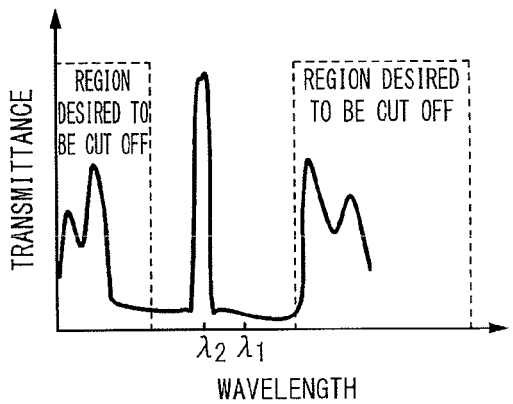
FIG. 22D is a drawing showing a filter characteristic of a third filter part in the infrared detector according to Embodiment 2.
Figure 22B:
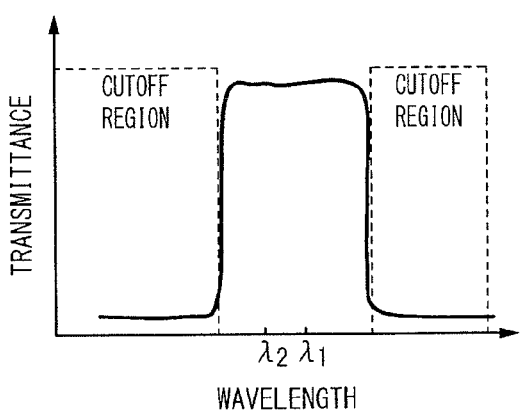
FIG. 22B is a drawing showing a filter characteristic of a second filter part in the infrared detector according to Embodiment 2.
Figure 22E:
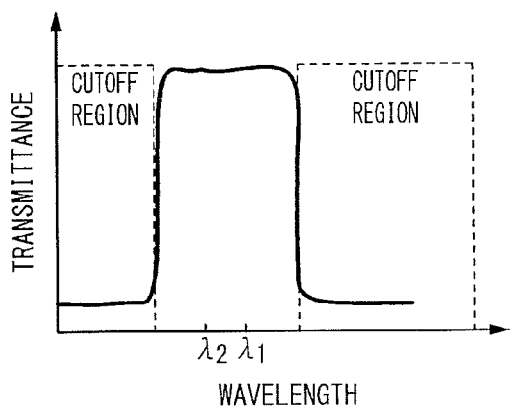
FIG. 22E is a drawing showing a filter characteristic of a fourth filter part in the infrared detector according to Embodiment 2.
Figure 22C:
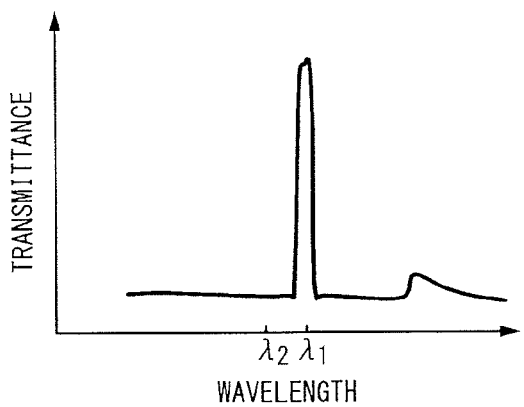
FIG. 22C is a drawing showing a filter characteristic of a first optical filter in the infrared detector according to Embodiment 2.

FIGS. 22A, 22B and 22C are schematic drawings showing transmission spectrums regarding the first optical filter 31. Here, FIG. 22C shows a transmission spectrum of the first optical filter 31 including the first filter part 31a having a transmission spectrum shown in FIG. 22A, and the second filter part 31b having a transmission spectrum shown in FIG. 22B.

Figure 22F:
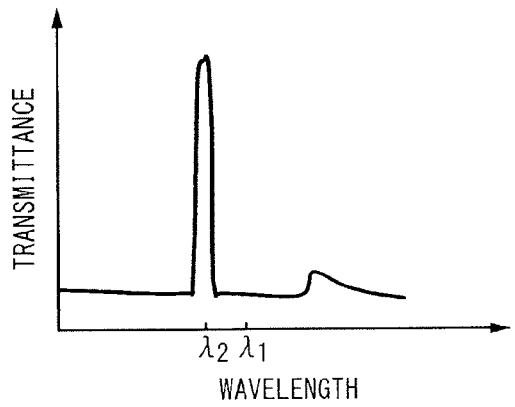
FIG. 22F is a drawing showing a filter characteristic of a second optical filter in the infrared detector according to Embodiment 2.

FIGS. 22D, 22E and 22F are schematic drawings showing transmission spectrums regarding the second optical filter 32. Here, FIG. 22F shows a transmission spectrum of the second optical filter 32 including the third filter part 32a having a transmission spectrum shown in FIG. 22D, and the fourth filter part 32b having a transmission spectrum shown in FIG. 22E.

In FIGS. 22A to 22F, $\lambda_1$ represents a center wavelength of the transmission wavelength band of the first filter part 31a. In FIGS. 22A to 22F, $\lambda_2$ represents a center wavelength of the transmission wavelength band of the third filter part 32a.

As described above, in the infrared detector 2a, the first optical filter 31 includes the first and second filter parts 31a and 31b, and the second optical filter 32 includes the third and fourth filter parts 32a and 32b. Thereby, the infrared detector 2a can reduce the infrared transmittance in the prescribed wavelength band, and improve S/N ratios of output signals of the first and second detection elements DE1 and DE2. In addition, since the second and fourth filter parts 31b and 32b each absorbs infrared having the prescribed wavelength band to reduce the transmittance, the infrared detector 2a can prevent infrared from being reflected by the first and second optical filters 31 and 32.

It is assumed that the infrared detector 2a is applied to an infrared type gas sensor. Because an infrared absorption wavelength depends on a kind of gas as a detection object, the infrared type gas sensor can enhance a gas identification property. For example, absorption wavelengths of methane (CH$_4$), carbon dioxide (CO$_2$), carbon monoxide (CO) and nitrogen monoxide (NO) are respectively in the vicinities of 3.3 μm, 4.3 μm, 4.7 μm and 5.3 μm.

When the infrared detector 2a is applied to an infrared type gas sensor, for example the center wavelength $\lambda_1$ of the first filter part 31a may be set to an absorption wavelength of gas as a detection object, and the center wavelength $\lambda_2$ of the third filter part 32a may be set to a reference wavelength. The reference wavelength means a non-absorption wavelength of gas as a detection object and other gas. When it is assumed that the gas as the detection object is $CO_2$, examples of the other gas include $H_2O$, $CH_4$, CO, NO and the like.

It is preferable that the first and third filter parts 31a and 32a be band-pass filters, a transmission spectrum of each of which has a narrow full width at half maximum. Also, it is preferable that in the infrared detector 2a, a difference between the center wavelengths $\lambda_1$ and $\lambda_2$ of the first and third filter parts 31a and 32a be small. Accordingly, the infrared detector 2a can reduce a difference between a light amount of infrared passing through the first filter part 31a and a light amount of infrared passing through the third filter part 32a, when gas as a detection object is absent. In the infrared detector 2a when gas as a detection object to be detected by an infrared type gas sensor is for example $CO_2$, the center wavelengths $\lambda_1$ and $\lambda_2$ of the first and third filter parts 31a and 32a may be set to 4.3 µm and 3.9 µm, respectively.

In the infrared detector 2a, the first and second optical filters 31 and 32 are formed as a single chip, but those may be formed as separate bodies.

The infrared detector 2a includes two IC elements 40. Hereinafter, for convenience of explanation, an IC element 40 for signal processing an output signal (first output signal) of the first detection element DE1 is referred to as a first IC element 41, and an IC element 40 for signal processing an output signal (second output signal) of the second detection element DE2 is referred to as a second IC element 42.

Figure 23A:
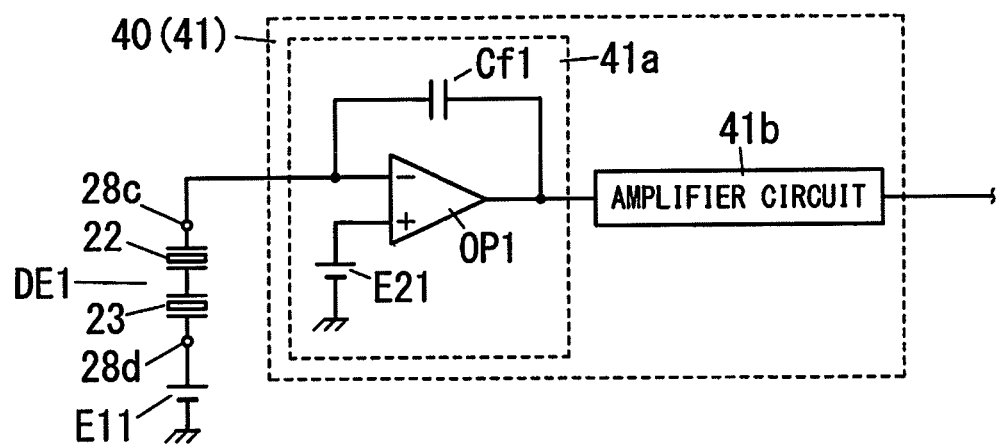
FIGS. 23A and 23B are circuit configuration diagrams, each of which illustrates a main part of the infrared detector according to Embodiment 2.

For example as shown in FIG. 23A, the first IC element 41 includes a current-voltage conversion circuit 41a and an amplifier circuit 41b. The current-voltage conversion circuit 41a is configured to current-voltage convert a current signal as the output signal of the first detection element DE1, and output the converted signal. The amplifier circuit 41b is configured to amplify an output signal of the current-voltage conversion circuit 41a.

The current-voltage conversion circuit 41a includes an operational amplifier OP1 and a capacitor Cf1. In the first detection element DE1, a second output terminal 28d of the first detection element DE1 is grounded through a reference voltage source E11, and a first output terminal 28c thereof is connected with an inversion input terminal of the operational amplifier OP1. In the current-voltage conversion circuit 41a, the capacitor Cf1 is connected between an output terminal and the inversion input terminal of the operational amplifier OP1. In the current-voltage conversion circuit 41a, a reference voltage source E21 for setting an operation point of the operational amplifier OP1 to a prescribed level is connected with a non-inversion input terminal of the operational amplifier OP1. In the current-voltage conversion circuit 41a, the output terminal of the operational amplifier OP1 is connected with the amplifier circuit 41b.

Figure 23B:
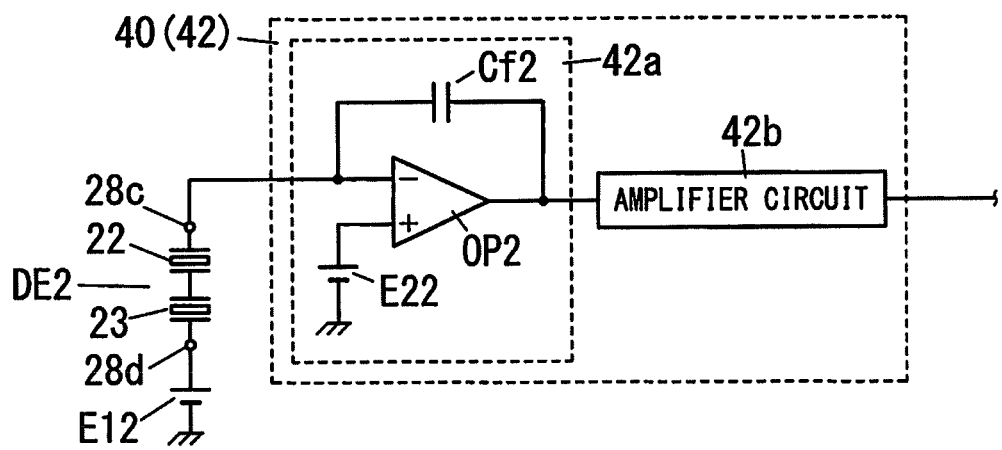

For example as shown in FIG. 23B, the second IC element 42 includes a current-voltage conversion circuit 42a and an amplifier circuit 42b. The current-voltage conversion circuit 42a is configured to current-voltage convert a current signal as the output signal of the second detection element DE2, and output the converted signal. The amplifier circuit 42b is configured to amplify an output signal of the current-voltage conversion circuit 42a.

The current-voltage conversion circuit 42a includes an operational amplifier OP2 and a capacitor Cf2. In the second detection element DE2, a second output terminal 28d of the second detection element DE2 is grounded through a reference voltage source E12, and a first output terminal 28c thereof is connected with an inversion input terminal of the operational amplifier OP2. In the current-voltage conversion circuit 42a, the capacitor Cf2 is connected between an output terminal and the inversion input terminal of the operational amplifier OP2. In the current-voltage conversion circuit 42a, a reference voltage source E22 for setting an operation point of the operational amplifier OP2 to a prescribed level is connected with a non-inversion input terminal of the operational amplifier OP2. In the current-voltage conversion circuit 42a, the output terminal of the operational amplifier OP2 is connected with the amplifier circuit 42b.

The current-voltage conversion circuits 41a and 42a may have circuit configurations other than those shown in FIGS. 23A and 23B.

In the infrared detector 2a, preferably, the circuit configuration of the first IC element 41 is the same as that of the second IC element 42. In other words, in the infrared detector 2a, the operational amplifier OP1, the capacitor Cf1, the reference voltage source E21 and the amplifier circuit 41b of the first IC element 41 preferably have the same specifications and almost the same characteristics as those of the operational amplifier OP2, the capacitor Cf2, the reference voltage source E22 and the amplifier circuit 42b of the second IC element 42, respectively. In addition, in the infrared detector 2a, the reference voltage source E11 preferably have the same specification and almost the same characteristic as those of the reference voltage source E12. Note that, in the infrared detector 2a, the current-voltage conversion circuits 41a and 42a and the amplifier circuits 41b and 42b may be integrated as a single chip.

The base body 43 may be formed of an MID (Molded Interconnect Devices) substrate, for example. In the MID substrate, two sets of two lead terminals 43j and 43k, are formed on an insulation base member 43a formed as a resin molding. In other words, the base body 43 includes an insulation base member 43a having an electric insulation property, first lead terminals 43j and second lead terminals 43k, which are formed integrally with the insulation base member 43a. The insulation base member 43a has the electric insulation property. Note that, the base body 43 is not limited to an MID substrate, but may be formed of a component built-in substrate, a ceramic substrate, a printed substrate or the like. The base body 43 may be obtained by forming of an insulation base member 43a as a resin molding to a lead frame, and then removing an unnecessary part from the lead frame.

Figure 16:
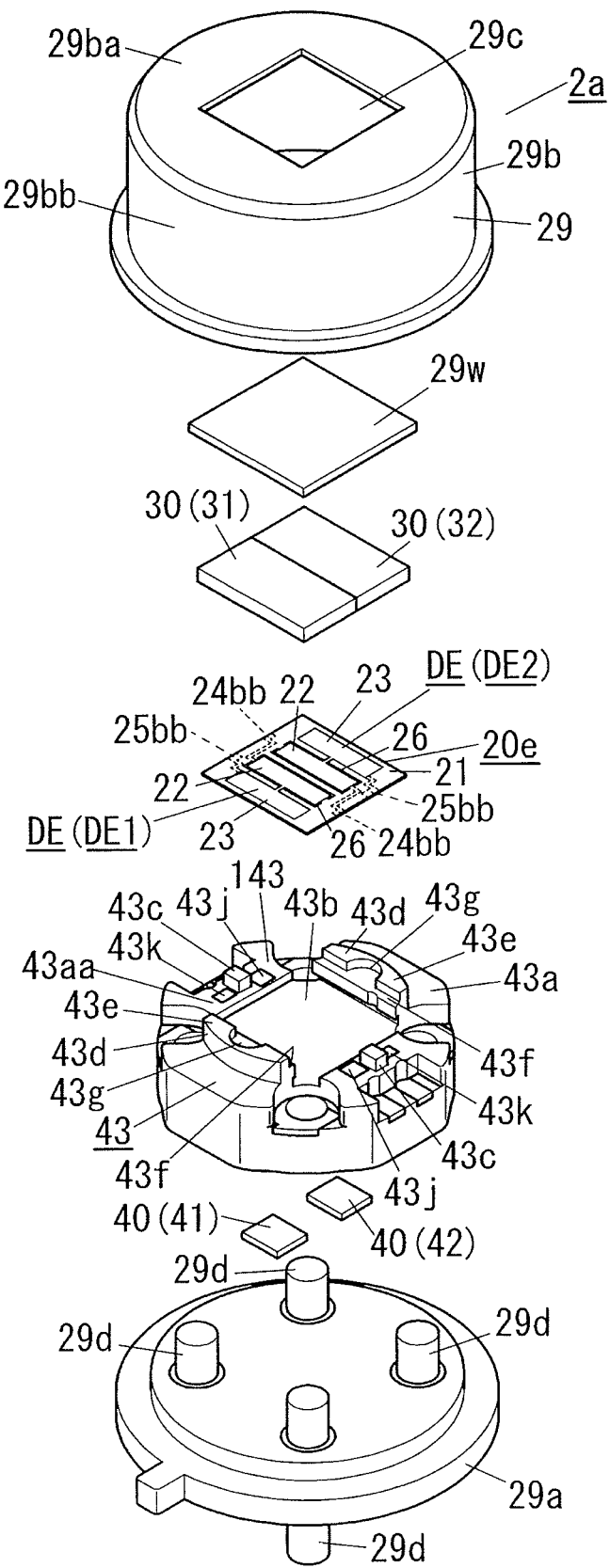
FIG. 16 is a schematic exploded perspective view of an infrared detector according to Embodiment 2.
Figure 17:
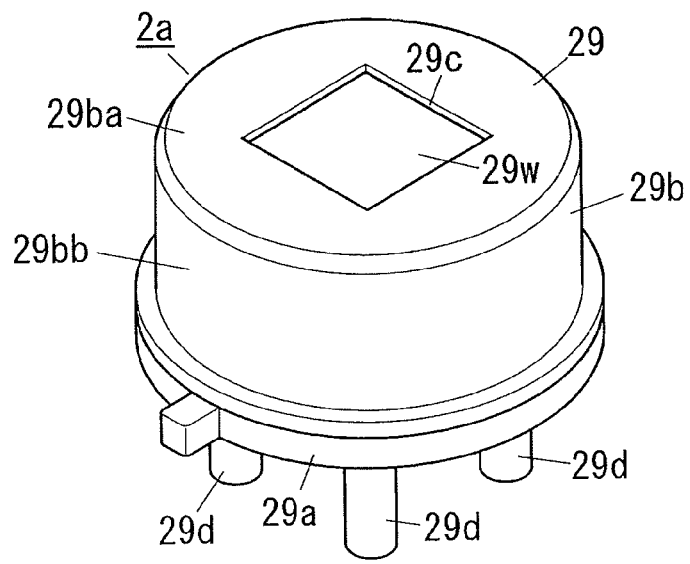
FIG. 17 is a schematic perspective view of the infrared detector according to Embodiment 2.
Figure 18:
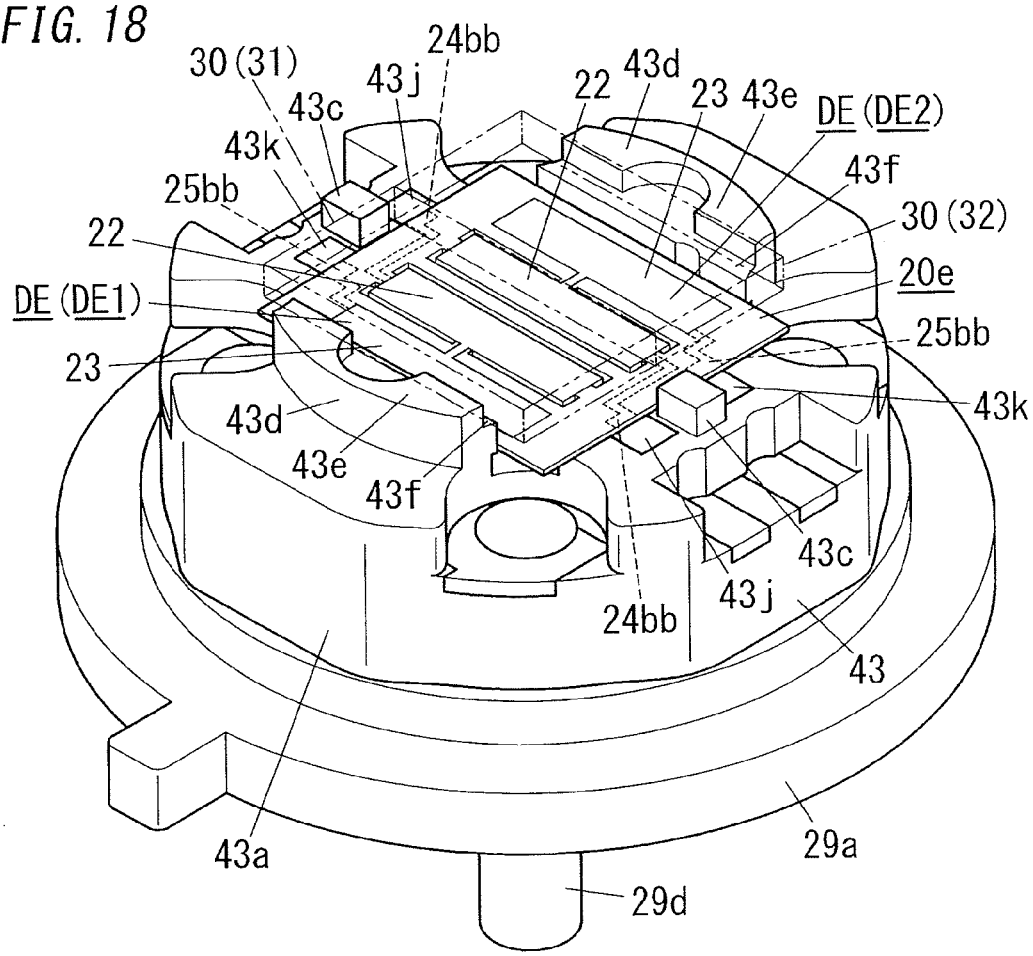
FIG. 18 is a schematic perspective view of a main part of the infrared detector according to Embodiment 2.
Figure 19A:
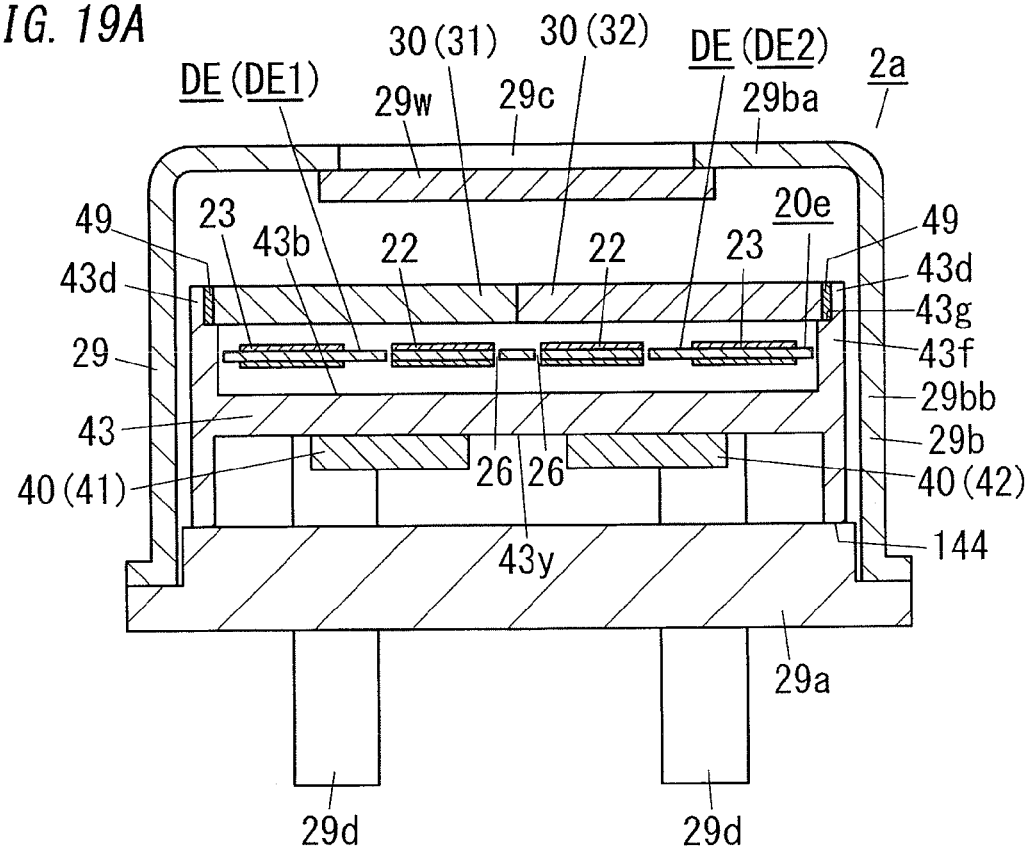
FIG. 19A is a schematic cross-sectional view of the infrared detector according to Embodiment 2.
Figure 19B:
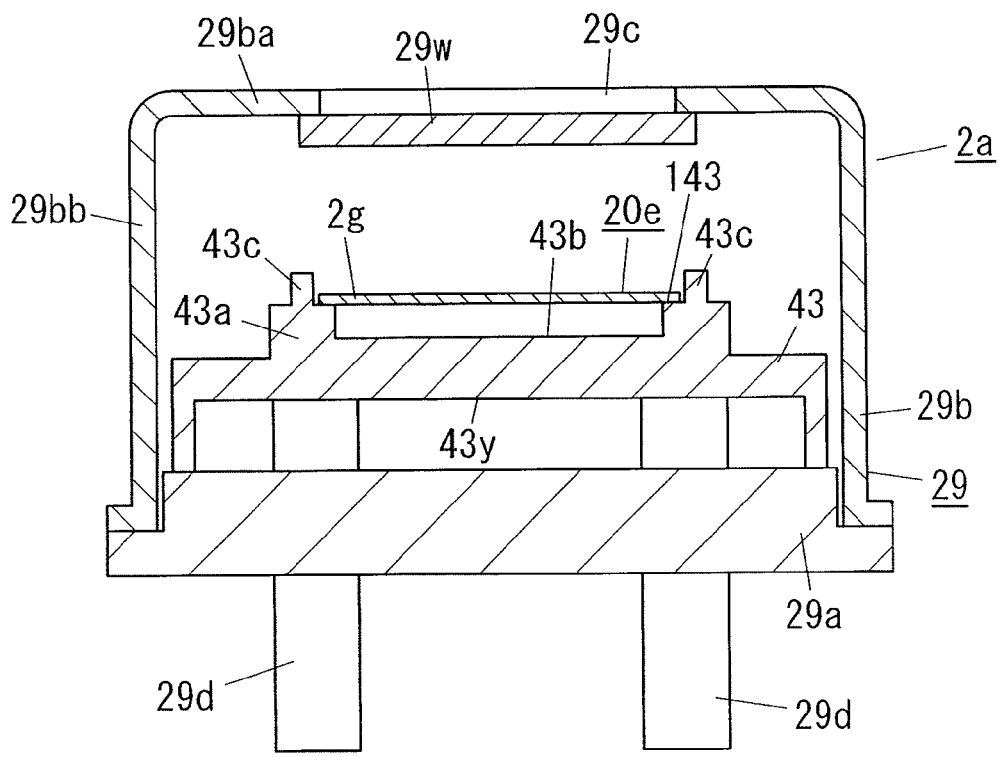
FIG. 19B is another schematic cross-sectional view of the infrared detector according to Embodiment 2.
Figure 20:
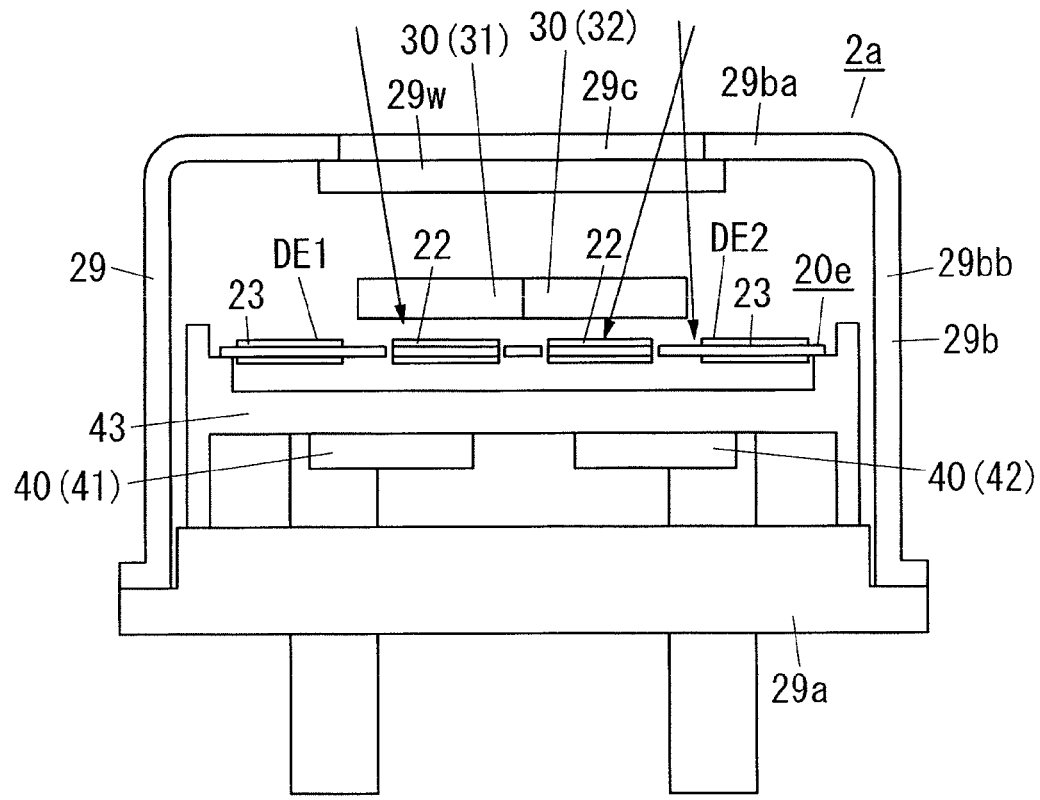
FIG. 20 is a drawing illustrating operation of the infrared detector according to Embodiment 2.

In the infrared detector 2a, the first and second output terminals 28c and 28d of the first detection element DE1 are electrically connected with the left first lead terminal 43j and the left second lead terminal 43k in FIG. 16 by bonding using conductive adhesives, respectively. Also, in the infrared detector 2a, the first and second output terminals 28c and 28d of the second detection element DE2 are electrically connected with the right first lead terminal 43j and the right second lead terminal 43k in FIG. 16 by bonding using conductive adhesives, respectively. In other words, in the infrared detector 2a, the first lead terminals 43j are respectively electrically connected with the first output terminals 28c of the first detection element DE1 and the second detection element DE2 individually via first bonding portions (not shown), each of which is made of a conductive adhesive. Also, the second lead terminals 43k are respectively electrically connected with the second output terminals 28d of the first detection element DE1 and the second detection element DE2 individually via second bonding portions (not shown), each of which is made of a conductive adhesive.

The conductive adhesive may be for example an epoxy resin adhesive or a polyimide resin adhesive, which includes Ag powder or Au powder. As the conductive adhesive, for example, conductive paste may be used. Examples of the conductive paste include silver paste, gold paste, copper paste and the like. It is preferable that as the conductive adhesive, organic resin-based conductive adhesive be used. Accordingly, the infrared detector 2a can prevent heat from being transmitted from the base body 43 to the infrared detection element 20e.

The insulation base member 43a is provided with two projections 43c for positioning the infrared detection element 20e. Each projection 43c projects from a first surface 43aa of the insulation base member 43a in a thickness direction of the insulation base member 43a. Each projection 43c is formed outside an area of the insulation base member 43a where the infrared detection element 20e is to be mounted. Each projection 43c is formed between a corresponding first lead terminal 43j and a corresponding second lead terminal 43k which are paired, to more project than the corresponding first and second lead terminals 43j and 43k. In other words, the insulation base member 43a is provided with the projections 43c each that is for positioning the infrared detection element 20e, and projects between the corresponding first and second lead terminals 43j and 43k, outside the area where the infrared detection element 20e is to be mounted, in the thickness direction of the insulation base member 43a.

In the infrared detector 2a, the infrared detection element 20e can be positioned by the two projections 43c, and accordingly, the position accuracy of the infrared detection element 20e can be enhanced. Therefore, the infrared detector 2a does not need redundant design that would be caused by the position accuracy of the infrared detection element 20e, and it is possible to downsize the infrared detector, and improve the sensitivity.

The insulation base member 43a is preferably provided in the first surface 43aa thereof with a hollow 43b that is sized to include an area which is a vertically projected area from the first pyroelectric elements 22 and the second pyroelectric elements 23. The hollow 43b is formed as a hollow for thermal insulation, in order to improve thermal insulation between the insulation base member 43a and each of the first and second pyroelectric elements 22 and 23. The first surface 43aa of the insulation base member 43a is configured as part of a first surface 143 of the base body 43. In other words, the base body 43 is provided with the hollow 43b for thermal insulation, which is disposed in an area of the first surface 143 of the base body 43, which is a vertically projected area from the first pyroelectric elements 22 and the second pyroelectric elements 23. Accordingly, the infrared detector 2a can improve the sensitivities of the first pyroelectric elements 22 and the second pyroelectric elements 23. Instead of the single hollow 43b, two or more hollows may be formed to respectively correspond to the first pyroelectric elements 22 and the second pyroelectric elements 23.

The insulation base member 43a is preferably further provided with two positioning portions 43d each that is for positioning the first optical filter 31 and the second optical filter 32, and projects from the first surface 43aa of the insulation base member 43a in a direction along a thickness direction of the infrared detection element 20e. Accordingly, in the infrared detector 2a, it is possible to position the first optical filter 31 and the second optical filter 32 on the base body 43. Therefore, in the infrared detector 2a, it is possible to enhance relative position accuracy among the first and second optical filters 31 and 32 and the first and second light receiving elements 22₁ and 22₂, thereby providing higher sensitivity.

The positioning portions 43d each preferably includes: a wall portion 43e for defining positions of the first optical filter 31 and the second optical filter 32 in a direction in which the first optical filter 31 and the second optical filter 32 are arranged in planar view; and a supporting portion 43f for supporting the first optical filter 31 and the second optical filter 32.

The first and second optical filters 31 and 32 are preferably fixed to wall portions 43e and 43e with e.g., an adhesive. Accordingly, the infrared detector 2a can more enhance the distance accuracy of the optical filters 31 and 32 to the infrared detection element 20e, compared with a case where the optical filters 31 and 32 are fixed to supporting portions 43f and 43f with an adhesive. Here, regarding the base body 43, each of the wall portions 43e is preferably provided with a recessed part 43g such that an end face of the wall portion and a face of the wall portion facing the first optical filter 31 and the second optical filter 32 are recessed. The first optical filter 31 and the second optical filter 32 are preferably fixed to the wall portions 43e with bonding parts 49 (refer to FIG. 19A) as adhesives in the recessed parts 43g. Accordingly, when the infrared detector 2a is manufactured, the coating amount of the adhesives can be stabilized and the productivity can be improved. As the adhesives for bonding parts 49, for example, epoxy resin, acrylic resin or the like may be used. The adhesives may be thermosetting adhesives, but it is more preferable that ultraviolet-curable adhesives be used.

In the infrared detector 2a, the first optical filter 31 and the second optical filter 32 are spaced from the infrared detection element 20e in the thickness direction of the infrared detection element 20e. Accordingly, the infrared detector 2a can thermally insulate the first and second optical filters 31 and 32 from the infrared detection element 20e, and therefore enhance the sensitivity of the infrared detection element 20e. In the infrared detector 2a, for example, each of the supporting portions 43f is made to have a projection dimension larger than the thickness of the infrared detection element 20e, and thereby the optical filters 31 and 32 are spaced from the infrared detection element 20e.

In the infrared detector 2a, preferably, the infrared detection element 20e is disposed on the first surface 143 side of the base body 43, and the first IC element 41 and the second IC element 42 are disposed on a second surface 144 side of the base body 43. Accordingly, the infrared detector 2a can be more downsized, compared with a case where the first and second IC elements 41 and 42 are disposed lateral to the infrared detection element 20e on the first surface 143 side of the base body 43. In addition, the infrared detector 2a can more prevent heat generated by the first and second IC elements 41 and 42 from being transmitted to the infrared detection element 20e.

The first and second IC elements 41 and 42 are bare chips, and fixed on an inner bottom face of a recess 43y (refer to FIG. 19A) provided in the second surface 144 of the base body 43 with die bonding material. As the die bonding material, for example, epoxy resin may be used. Note that, two or more conductors that are electrically connected with the first and second IC elements 41 and 42 are formed at prescribed patterns. It is preferable that the first and second IC elements 41 and 42 be covered with a sealing part (not shown) made of sealing material. As the sealing material, e.g., epoxy resin, silicone resin or the like may be used.

The package 29 includes the pedestal 29a, the cap 29b and the window member 29w, as described above.

The pedestal 29a is preferably made of metal. The pedestal 29a is shaped like a disk. The cap 29b is preferably made of metal. The cap 29b is provided with a top plate 29ba shaped like a disk on one end side of a tube part 29bb shaped like a cylinder. The top plate 29ba of the cap 29b is provided in a center thereof with a window hole 29c.

The package 29 further includes four lead pins 29d. The four lead pins 29d are supported by the pedestal 29a. The four lead pins 29d are provided to pierce the pedestal 29a in a thickness direction of the pedestal 29a. Each lead pin 29d is coupled to the base body 43. The respective four lead pins 29d are used for power feeding, for ground, for taking out an output signal of the first IC element 41, and for taking out an output signal of the second IC element 42. The lead pin 29d for ground is fixed to the pedestal 29a with a conductive sealing member to be electrically connected with the pedestal 29a. The remaining lead pins 29d is fixed to the pedestal 29a with a sealing member (e.g., glass) having an electric insulation property to be electrically insulated from the pedestal 29a. Note that, in the infrared detector 2a, the base body 43 may be provided with a shield plate or a shield layer to which the lead pin 29d for ground is electrically connected.

The shape of the pedestal 29a in planar view is a circle, but is not limited to this. The shape may be e.g., a polygon. The shape of the cap 29b may be appropriately changed, according to the shape of the pedestal 29a. For example, when the shape of the pedestal 29a in planar view is a rectangle, the shape of the cap 29b in planar view may be a circle or a rectangle.

The window hole 29c has an opening size slightly larger than the total size of the first light receiving element $22_1$ and the second light receiving element $22_2$. The opening shape of the window hole 29c is a rectangle, but is not limited to this. The opening shape may be e.g., a circle, a polygon except for a rectangle, or the like.

The window member 29w closing the window hole 29c has a function that allows infrared to pass through. The window member 29w is configured by a silicon substrate shaped like a flat plate. The window member 29w is formed as a rectangle plate slightly larger than the opening size of the window hole 29c. The window member 29w is preferably fixed to the cap 29b with conductive material (such as solder or a conductive adhesive). Accordingly, the window member 29w can be made to have almost the same potential as that of the cap 29b, and therefore, there is an advantage that the infrared detector 2a is hardly influenced by external electromagnetic noise. The window member 29w is not limited to a silicon substrate, but may be e.g., a germanium substrate, a zinc sulfide substrate or the like. However, the use of the silicon substrate is advantageous in view of reducing the cost. Alternatively, a lens may be used as the window member 29w. In this case, the lens may be configured by a semiconductor lens (such as a silicon lens).

When the semiconductor lens is manufactured, e.g., a semiconductor substrate (such as silicon substrate) is prepared. After that a positive electrode, in which a contact pattern with the semiconductor substrate has been designed according to a desired lens shape, is formed on one surface of the semiconductor substrate such that the positive electrode is in ohmic contact with the semiconductor substrate. Another surface of the semiconductor substrate is then subjected to anodic oxidation in electrolyte solution that is formed of solution for removing by etching an oxide as a constitutional element of the semiconductor substrate, and thereby, a porous portion to be removed is formed. Then by removing the porous portion, the semiconductor lens is formed. Note that, a lens as the above-mentioned semiconductor lens may be obtained by forming two or more lenses with e.g., a semiconductor wafer (such as a silicon wafer) as a semiconductor substrate, and then separating the two or more lenses individually.

It is preferable that the lens be a semiconductor lens in which a lens portion and a flange portion surrounding the whole circumference of the lens portion are formed continuously integrally with each other. When the flange portion has substantially a constant thickness and both surfaces of the flange portion in a thickness direction thereof are flat, the infrared detector 2a can enhance the accuracy of a distance between the lens and the infrared detection element 20e in an optical axis direction of the lens.

The window hole 29c of the package 29 is preferably provided such that the first pyroelectric elements 22 are disposed in an area of the infrared detection element 20e, which is a vertically projected area from the window hole 29c, and the second pyroelectric elements 23 are disposed outside the vertically projected area. Accordingly, in the infrared detector 2a the package 29 can prevent infrared as a detection object from being incident on the second pyroelectric elements 23. Therefore, the number of components can be reduced, thereby the cost being also reduced. Arrows in FIG. 20 each schematically shows a progression direction of infrared that is incident through the window hole 29c. The infrared detector 2a can reduce variation in the sensitivity, compared with a case where a light guide mirror is disposed inside or outside the package 29 so as to prevent infrared as a detection object from being incident on each second pyroelectric element 23.

Figure 24:
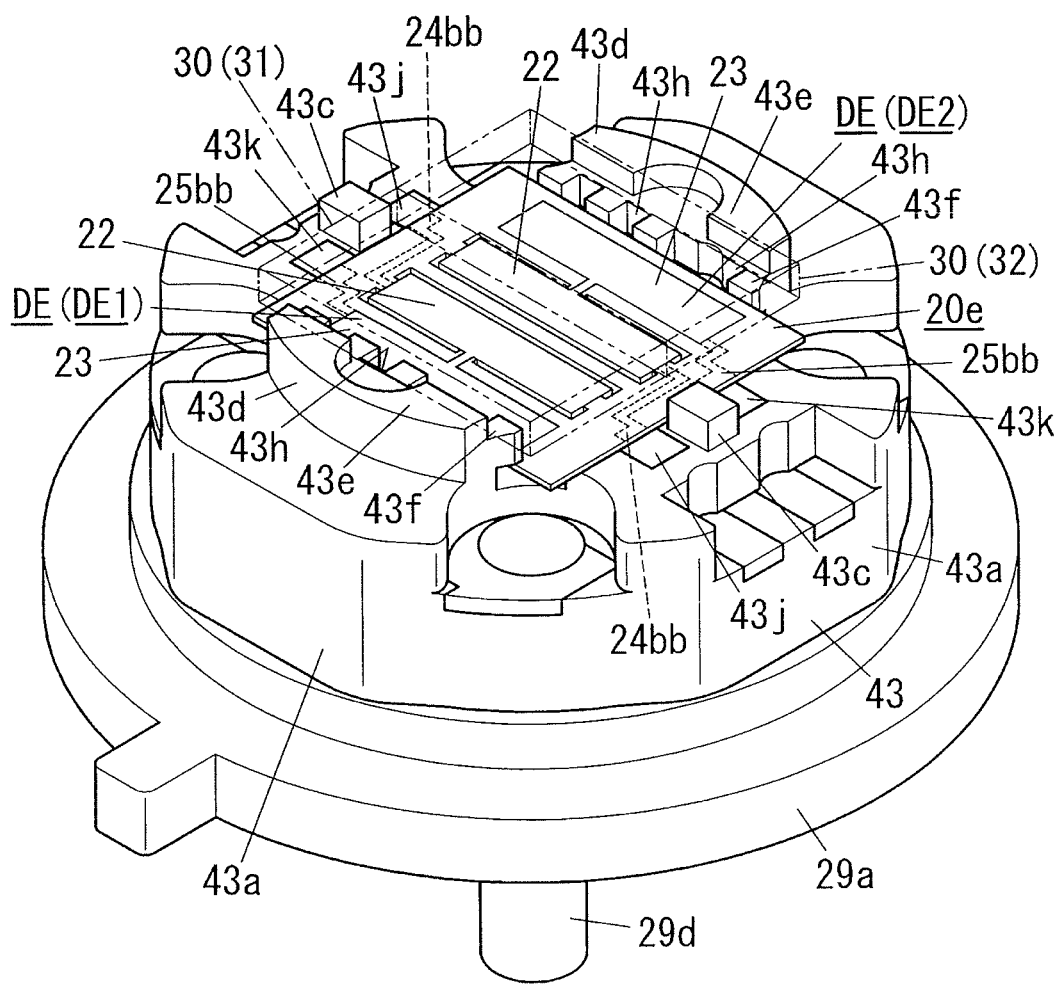
FIG. 24 is a schematic perspective view of a main part in a first variation of the infrared detector according to Embodiment 2.

FIG. 24 shows a main part in a first variation of the infrared detector 2a. In the first variation of the infrared detector 2a, two or more recesses 43h are formed in a face of each supporting portion 43f facing a lateral side of the infrared detection element 20e. Accordingly, the first variation of the infrared detector 2a can more prevent heat from being transmitted from the first and second optical filters 31 and 32 to the infrared detection element 20e, and more enhance the sensitivity of the infrared detection element 20e.

Figure 25:
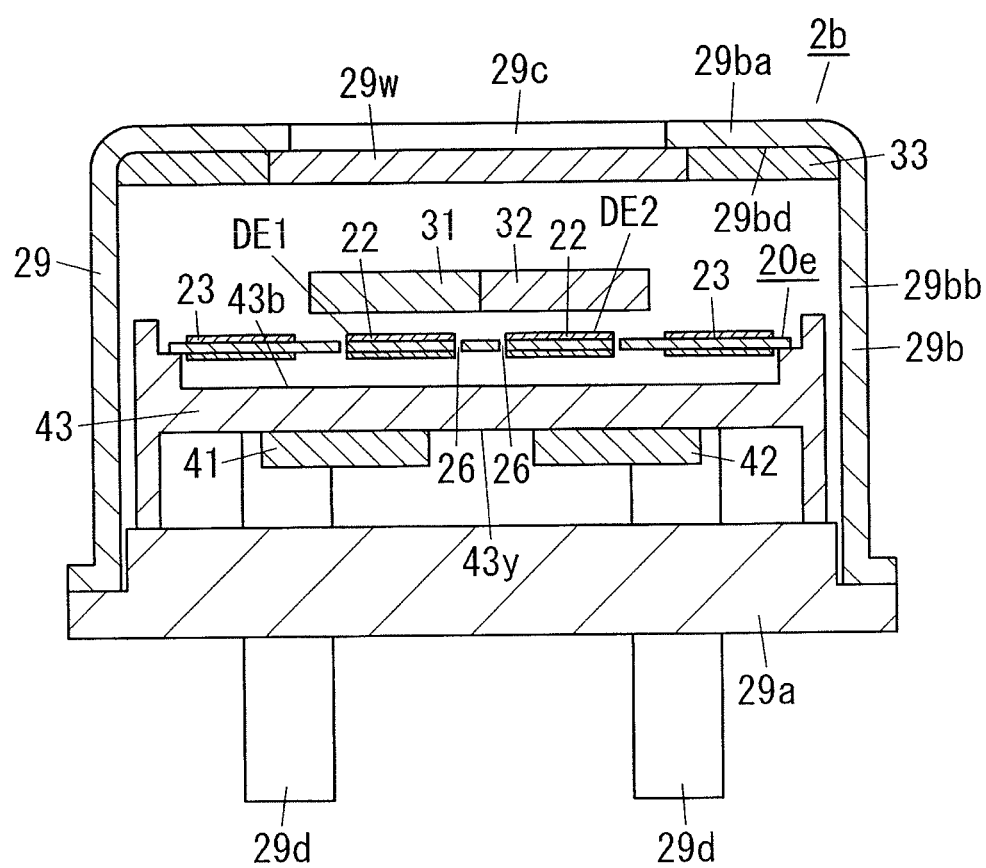
FIG. 25 is a schematic cross-sectional view of a second variation of the infrared detector according to Embodiment 2.
Figure 26:
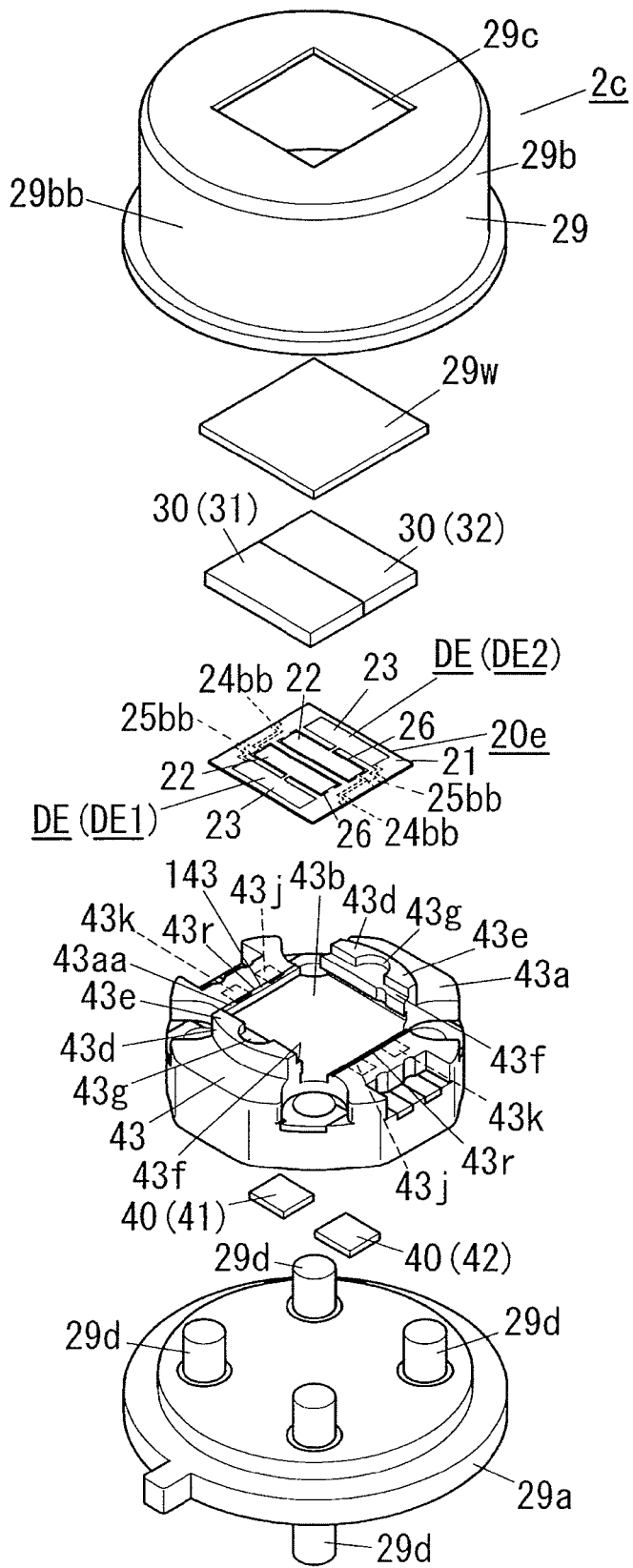
FIG. 26 is a schematic exploded perspective view of a third variation of the infrared detector according to Embodiment 2.
Figure 27A:
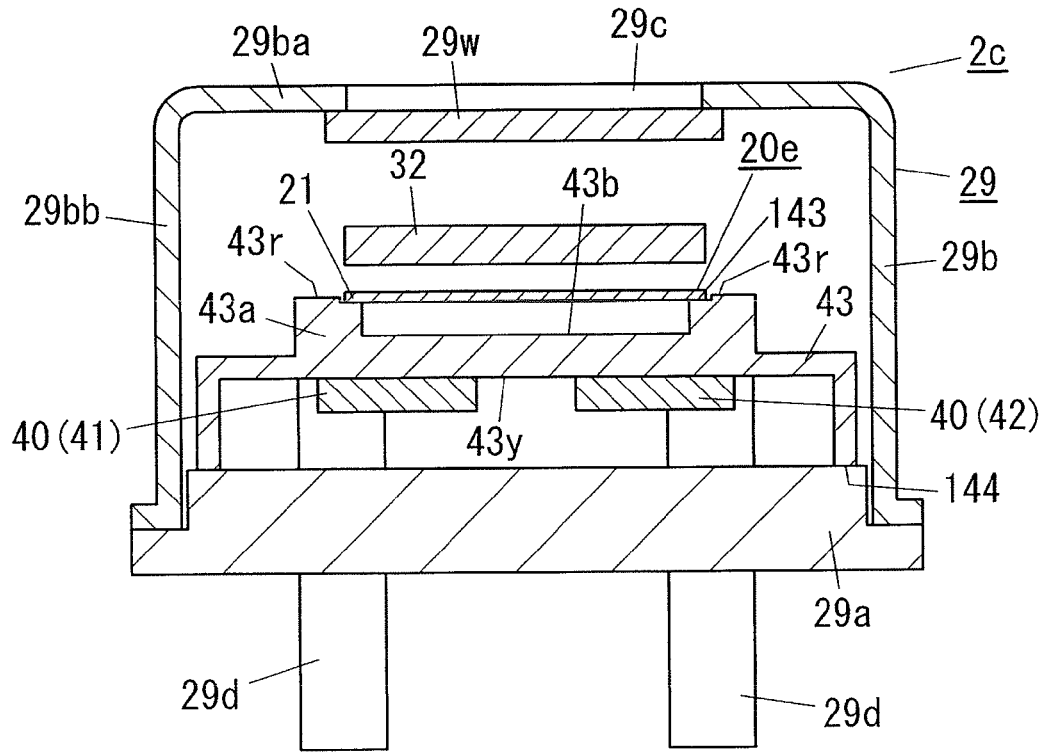
FIG. 27A is a schematic cross-sectional view of the third variation of the infrared detector according to Embodiment 2.
Figure 27B:
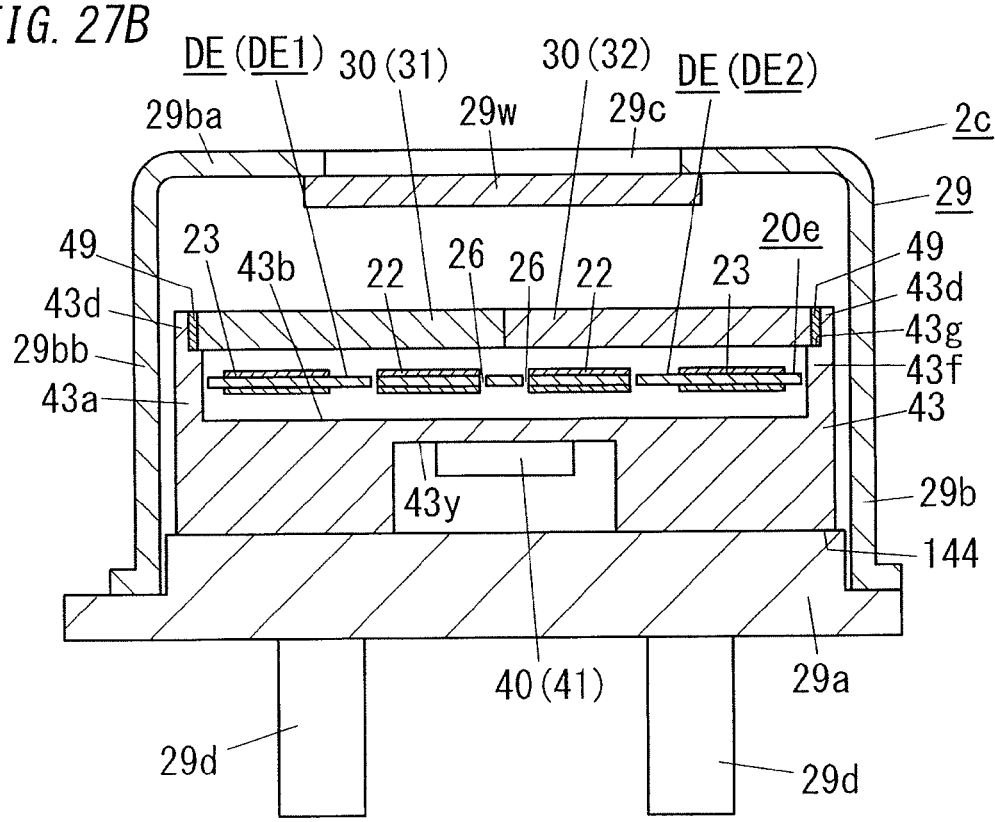
FIG. 27B is another schematic cross-sectional view of the third variation of the infrared detector according to Embodiment 2.
Figure 28:
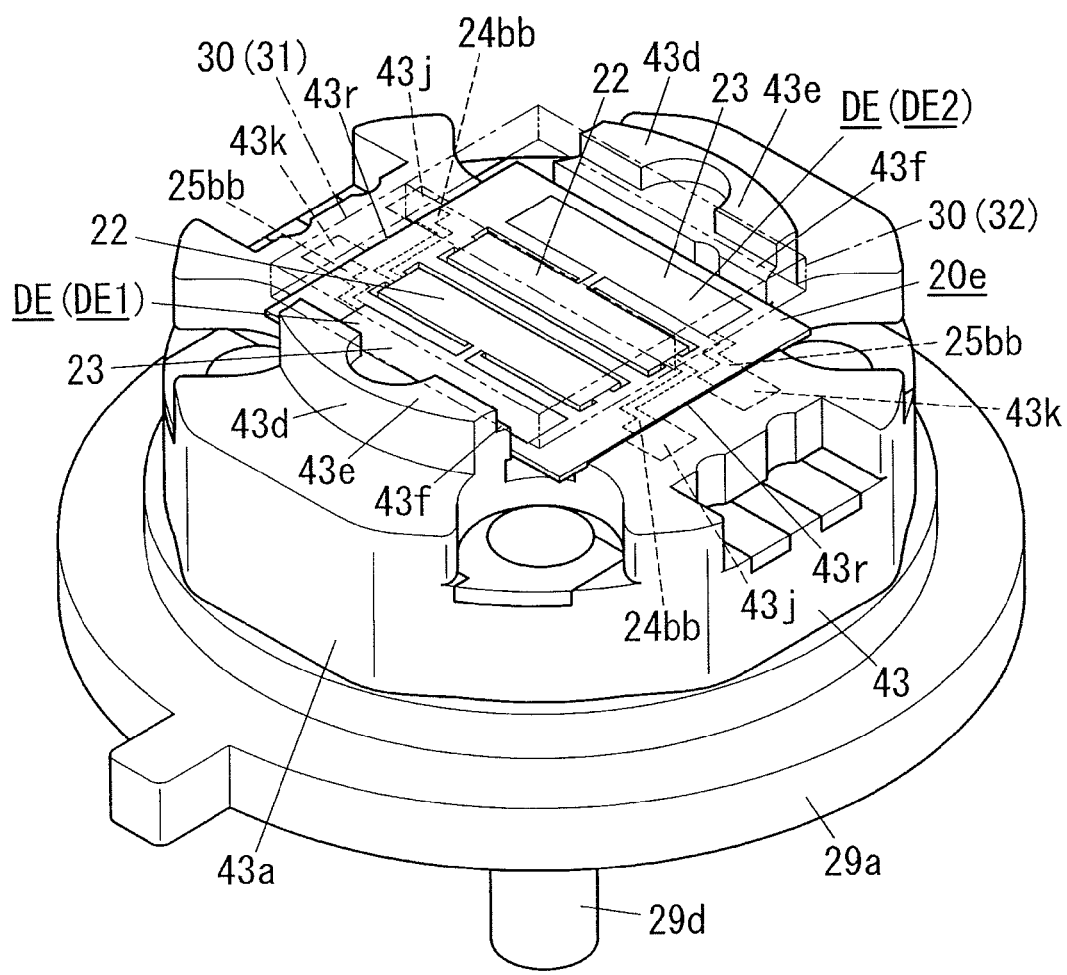
FIG. 28 is a schematic perspective view of a main part in the third variation of the infrared detector according to Embodiment 2.

FIG. 25 shows an infrared detector 2b, as a second variation of the infrared detector 2a. The infrared detector 2b has substantially the same basic configuration as the infrared detector 2a. The infrared detector 2b is different from the infrared detector 2a in that the infrared detector 2b includes a second resin layer 33 that is on a bottom surface 29bd of a top plate 29ba facing an infrared detection element 20e, and the second resin layer 33 is formed to cover the whole of an area of the bottom surface 29bd, with which a window member 29w does not overlap. Note that, regarding the infrared detector 2b, constituent elements similar to those of the infrared detector 2a are assigned with same reference numerals, and explanation thereof will be properly omitted.

As material for the second resin layer 33, e.g., epoxy resin or the like may be used.

In the infrared detector 2b, since the second resin layer 33 covers the whole of the area of the bottom surface 29bd of the top plate 29ba, with which the window member 29w does not overlap, the second resin layer 33 can absorb part of stray light caused due to scattering, reflection or the like of infrared entering a package 29. Accordingly, the infrared detector 2b can prevent infrared as the stray light from being incident on each second pyroelectric element 23, and improve an S/N ratio.

Hereinafter, an infrared detector 2c as a third variation of the infrared detector 2a will be explained with reference to FIGS. 26, 27A, 27B, 28, 29A, 29B, 29C and 30. Note that, regarding the infrared detector 2c, constituent elements similar to those of the infrared detector 2a are assigned with same reference numerals, and explanation thereof will be properly omitted.

Similarly to the infrared detector 2a, the infrared detector 2c includes an infrared detection element 20e, an optical filter 30 and a base body 43. Accordingly, the infrared detector 2c can provide higher sensitivity, similarly to the infrared detector 2a.

The base body 43 includes an insulation base member 43a having an electric insulation property, two first lead terminals 43j and two second lead terminals 43k. The first lead terminals 43j and the second lead terminals 43k are formed integrally with the insulation base member 43a. The respective first lead terminals 43j are electrically connected with respective first output terminals 28c of first and second detection elements DE1 and DE2 via first bonding portions 7j (refer to FIG. 29B) made of conductive adhesives, individually. The respective second lead terminals 43k are electrically connected with respective second output terminals 28d of the first and second detection elements DE1 and DE2 via second bonding portions 7k (refer to FIG. 29C) made of conductive adhesives, individually.

The conductive adhesive may be for example an epoxy resin adhesive or a polyimide resin adhesive, which includes Ag powder or Au powder. As the conductive adhesive, for example, conductive paste may be used. Examples of the conductive paste include silver paste, gold paste, copper paste and the like.

It is preferable that as the conductive adhesive, organic resin-based conductive adhesive be used. Accordingly, the infrared detector 2c can prevent heat from being transmitted from the base body 43 to the infrared detection element 20e.

Figure 29A:
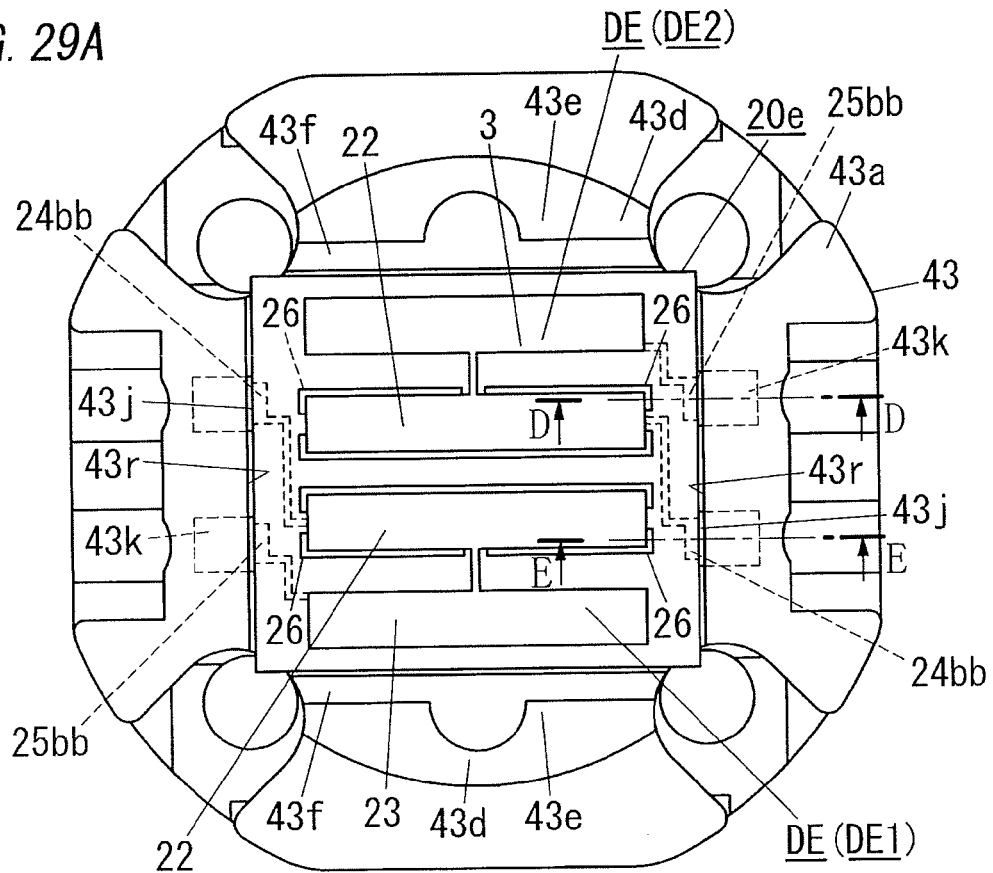
FIG. 29A is a schematic plan view of the main part in the third variation of the infrared detector according to Embodiment 2.
Figure 29B:
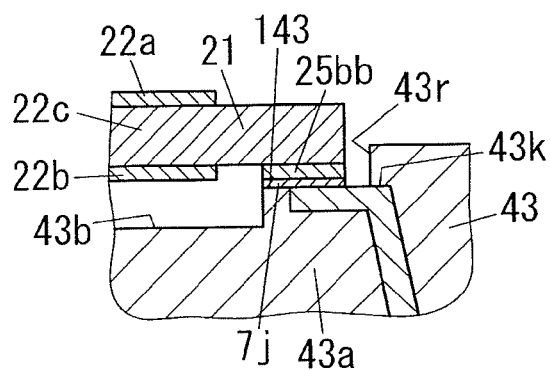
FIG. 29B is a schematic cross-sectional view taken along line D-D of FIG. 29A.
Figure 29C:
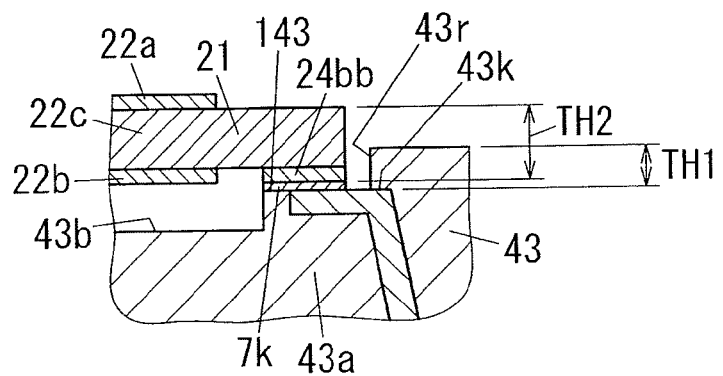
FIG. 29C is a schematic cross-sectional view taken along line E-E of FIG. 29A.

The insulation base member 43a of the base body 43 is provided on a first surface 43aa thereof with walls 43r for positioning the infrared detection element 20e. The walls 43r each projects, outside an area where the infrared detection element 20e is to be mounted, in a thickness direction of the infrared detection element 20e. As shown in FIG. 29C, a height TH1 of each of the walls 43r is smaller than a thickness of the infrared detection element 20e.

Thus, in the infrared detector 2c, the infrared detection element 20e can be positioned by the walls 43r. Accordingly, the position accuracy of the infrared detection element 20e can be enhanced, and therefore, the infrared detector 2c does not need redundant design that would be caused by the position accuracy of the infrared detection element 20e, and it is possible to downsize the infrared detector, and improve the sensitivity. During manufacturing of the infrared detector 2c, when the infrared detection element 20e is mounted on the base body 43, the infrared detection element 20e can be positioned to the base body 43, in a state where a pickup tool such as a collet holds the infrared detection element 20e without coming into contact with a surface of the infrared detection element 20e. Accordingly, during manufacturing of the infrared detector 2c, it is possible to shorten a tact time of a process of mounting the infrared detection element 20e on the base body 43, thereby improving the productivity and reducing the cost. Note that, the height TH1 of each of the walls 43r is smaller than a total TH2 of a thickness of a pyroelectric substrate 21 and a thickness of a terminal 24bb of the infrared detection element 20e.

In each of the first and second detection elements DE1 and DE2, the first output terminal 28c is disposed so as not to overlap with the second output terminal 28d in a thickness direction of the pyroelectric substrate 21. Accordingly, the infrared detection element 20e can prevent generation of parasitic capacity between the first output terminal 28c and the second output terminal 28d in each of the first and second detection elements DE1 and DE2, and prevent occurrence of short-circuit between the first output terminal 28c and the second output terminal 28d.

Therefore, the infrared detector 2c can prevent occurrence of short-circuit between a first surface electrode 22a and a first back face electrode 22b, and improve the reliability. In addition, the infrared detector 2c can prevent occurrence of noise due to floating charges caused by leakage between the first surface electrode 22a and the first back face electrode 22b, thereby improving an S/N ratio and providing higher sensitivity.

Similarly to the infrared detector 2a, in the infrared detector 2c, positioning portions 43d for positioning a first optical filter 31 and a second optical filter 32 are formed. The positioning portions 43d project in a direction along a thickness direction of the infrared detection element 20e. Accordingly, in the infrared detector 2c, it is possible to position the first and second optical filters 31 and 32 on the base body 43. Therefore, in the infrared detector 2c, it is possible to enhance relative position accuracy among the first and second optical filters 31 and 32 and first and second light receiving elements $22_1$ and $22_2$, and accordingly the first and second optical filters 31 and 32 can be downsized. In the infrared detector 2c, the cost can be reduced by downsizing of the first and second optical filters 31 and 32.

In the infrared detector 2c, it is possible to reduce planar sizes of the first and second optical filters 31 and 32 without downsizing the first and second light receiving elements $22_1$ and $22_2$. Accordingly, the infrared detector 2c can prevent a reduction in sensitivity, while reducing the cost.

Note that, a first IC element 41 and a second IC element 42 each may be configured by appropriately connecting more discrete components.

Figure 30:
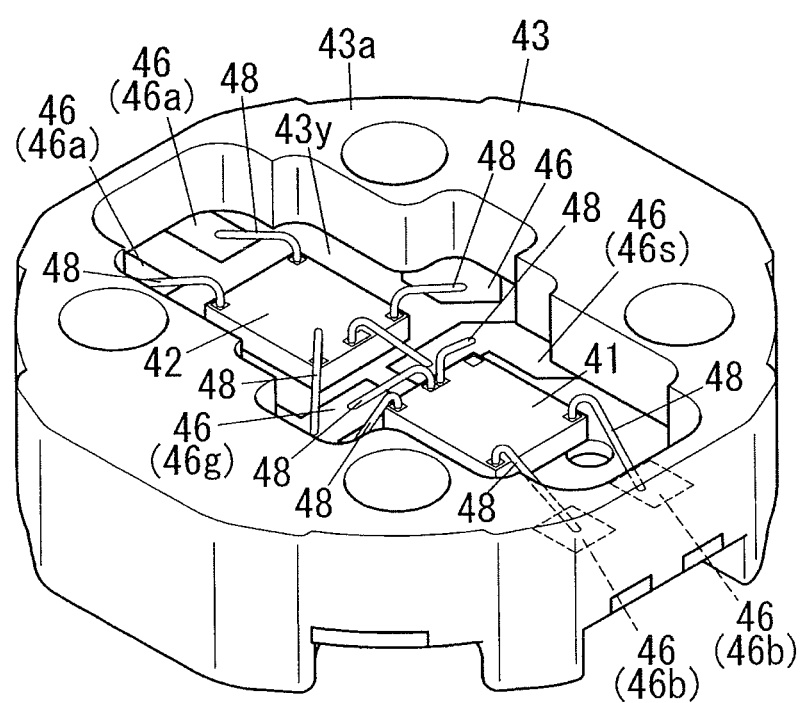
FIG. 30 is a schematic perspective view of the main part when viewed from a back face side thereof in the third variation of the infrared detector according to Embodiment 2.

As shown in FIG. 30, the base body 43 is provided with two or more conductors 46 that are disposed on an inner bottom face of a recess 43y of the base body 43. The first and second IC elements 41 and 42 are electrically connected with the conductors 46 via metal fine wires 48 having electrical conductivities. Examples of material for the metal fine wires 48 include gold, aluminum, copper and the like. The conductors 46 include: conductors 46s that are electrically connected with a lead pin 29d for power feeding to the first and second IC elements 41 and 42; and conductors 46g that are electrically connected with a lead pin 29d for ground. The conductors 46 further include: conductors 46a that are electrically connected with a first output lead pin 29d for taking out a first output signal of the first IC element 41; and conductors 46b that are electrically connected with a second lead pin 29d for taking out a second output signal of the second IC element 42.

It is preferable that the first and second IC elements 41 and 42 and each metal fine wire 48 be covered with a sealing part (not shown) made of sealing material. Accordingly, in the infrared detector 2c, it is possible to prevent disconnection of each metal fine wire 48, and prevent those from being in contact with the package 29. As the sealing material, e.g., epoxy resin, silicone resin or the like may be used.

By installation of the sealing part, the infrared detector 2c has an advantage that heat generated by each of the first and second IC elements 41 and 42 is hardly transmitted to the infrared detection element 20e side.

Figure 31:
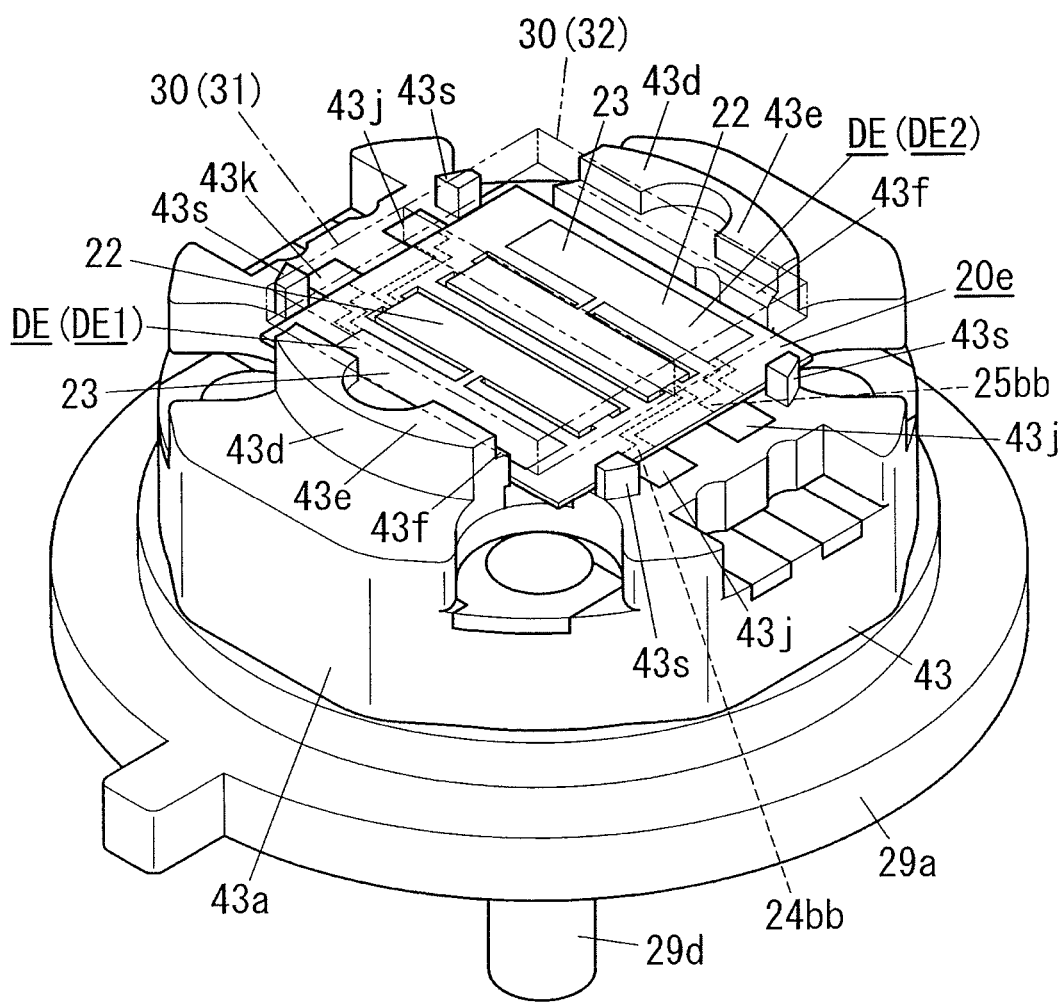
FIG. 31 is a schematic perspective view of a main part in a fourth variation of the infrared detector according to Embodiment 2.

An area of the insulation base member 43a, where the infrared detection element 20e is to be mounted, corresponds to an area with which the infrared detection element 20e overlaps in planar view. The walls 43r for positioning the infrared detection element 20e project from parts of the insulation base member 43a, outside the area where the infrared detection element 20e is to be mounted, in a direction (upward in FIG. 27A) parallel to the thickness direction of the infrared detection element 20e. Thus, the respective walls 43r are formed on both sides of the insulation base member 43a in a direction orthogonal to a direction in which the first and second detection elements DE1 and DE2 are arranged. Thereby, in the infrared detector 2c, the infrared detection element 20e can be positioned by the two walls 43r, and the position accuracy of the infrared detection element 20e can be enhanced in the direction in which the first and second detection elements DE1 and DE2 are arranged. Therefore, the infrared detector 2c does not need redundant design that would be caused by the position accuracy of the infrared detection element 20e, and it is possible to downsize the infrared detector, and improve the sensitivity. Furthermore, the infrared detector 2c can more prevent occurrence of short-circuit between the first surface electrode 22a and the first back face electrode 22b, thereby improving the reliability. compared with a case where the walls 43r are not installed, or a fourth variation of the infrared detector 2a, a main part of which is shown in FIG. 31 for example. In the fourth-variation of the infrared detector 2a, projections 43s are formed at positions of the insulation base member 43a, near four corners of the infrared detection element 20e, respectively. Each of the projections 43s has a height larger than a thickness of the infrared detection element 20e.

On the other hand, in the infrared detector 2c, since the first output terminals 28c are disposed so as not to overlap with the second output terminals 28d in a thickness direction of the infrared detection element 20e, and the infrared detection element 20e is positioned by the walls 43r, the infrared detector 2c can prevent occurrence of noise due to floating charges caused by leakage between the first surface electrode 22a and the first back face electrode 22b, thereby improving an S/N ratio and providing higher sensitivity.

Similarly to the infrared detector 2a, in the infrared detector 2c, the positioning portions 43d each preferably includes a wall portion 43e and a supporting portion 43f. The wall portion 43e is for defining positions of the first and second optical filters 31 and 32 in a direction in which the first and second optical filters 31 and 32 are arranged in planar view. The first and second optical filters 31 and 32 are installed between the supporting portions 43f. The wall portion 43e and the supporting portion 43f are formed on each of both sides of the base body 43, in a direction in which the first and second optical filters 31 and 32 are arranged in planar view. Therefore, in the infrared detector 2c, it is possible to enhance relative position accuracy among the first and second optical filters 31 and 32 and the infrared detection element 20e. Accordingly, in the infrared detector 2c, it is possible to downsize the infrared detector, and improve the sensitivity. The height of each wall portion 43e from the corresponding supporting portion 43f is not limited in particular, but may be smaller than a thickness of each of the first and second optical filters 31 and 32.

The first and second optical filters 31 and 32 are preferably fixed to the wall portions 43e with e.g., an adhesive. Accordingly, the infrared detector 2c can more enhance the distance accuracy of the first and second optical filters 31 and 32 to the infrared detection element 20e, compared with a case where the first and second optical filters 31 and 32 are fixed to the supporting portions 43f with an adhesive. In the infrared detector 2c, preferably, each of the supporting portions 43f is made to have a projection dimension larger than the thickness of the infrared detection element 20e, and the first and second optical filters 31 and 32 are spaced from the infrared detection element 20e in the thickness direction of the infrared detection element 20e. Accordingly, the infrared detector 2c can thermally insulate the first and second optical filters 31 and 32 from the infrared detection element 20e, and therefore enhance the sensitivity of the infrared detection element 20e.

In the infrared detector 2c, each of the wall portions 43e is preferably provided with a recessed part 43g such that an end face of the wall portion and a face of the wall portion facing the first and second optical filters 31 and 32 are recessed. The first and second optical filters 31 and 32 are preferably fixed to the wall portions 43e with bonding parts 49 as adhesives in the recessed parts 43g. Accordingly, when the infrared detector 2c is manufactured, the coating amount of the adhesives can be stabilized and the productivity can be improved. An internal surface of each recessed part 43g may be formed so as to be smoothly continued, or in combination of two or more plane surfaces. Alternatively, the internal surface of each recessed part 43g may be formed like an R-chamfered portion, or a C-chamfered portion. As the adhesives for the bonding parts 49, for example, epoxy resin, acrylic resin or the like may be used. The adhesives may be thermosetting adhesives, but it is more preferable that ultraviolet-curable adhesives be used.

Figure 32A:
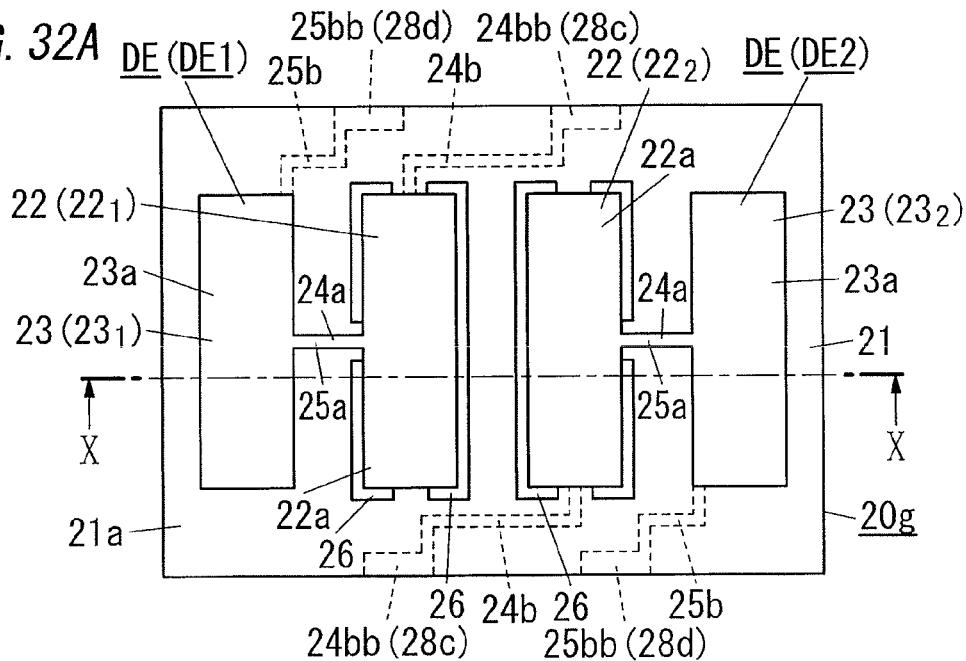
FIG. 32A is a schematic plan view of an infrared detection element in a fifth variation of the infrared detector according to Embodiment 2.
Figure 32B:
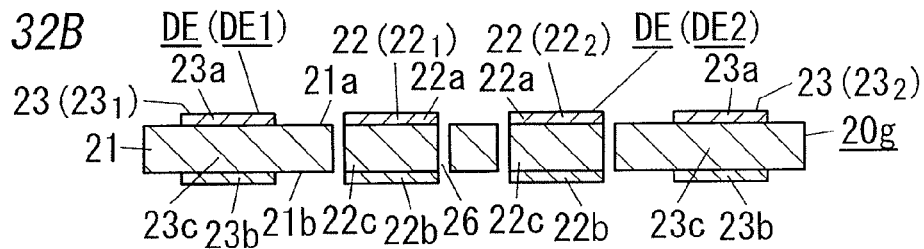
FIG. 32B is a schematic cross-sectional view taken along line X-X of FIG. 32A.
Figure 32C:
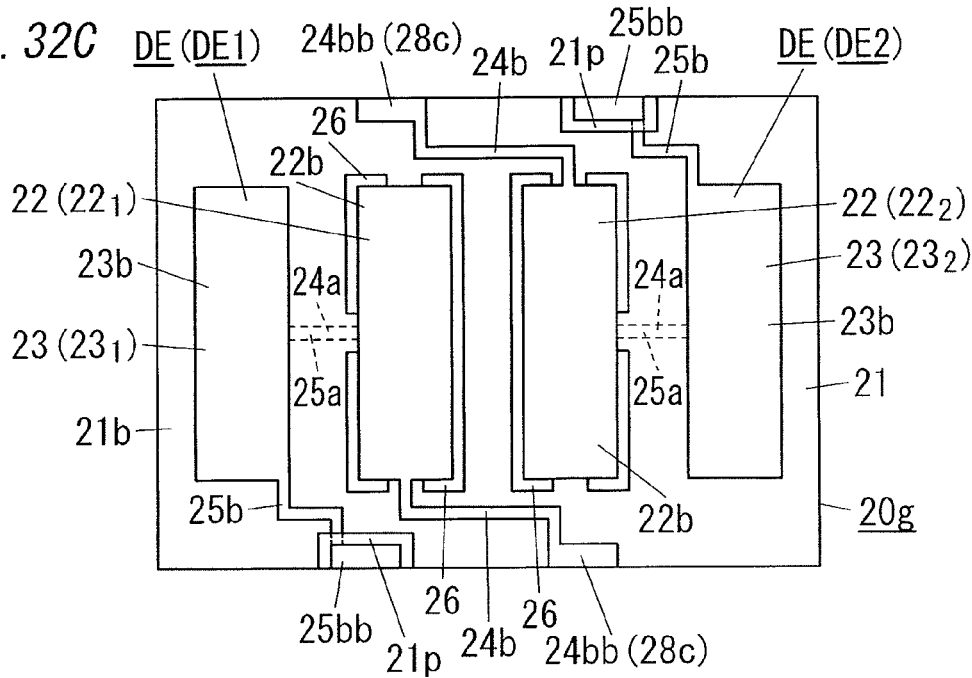
FIG. 32C is a schematic bottom view of the infrared detection element in the fifth variation of the infrared detector according to Embodiment 2.

A fifth variation of the infrared detector 2a includes an infrared detection element 20g that has a configuration shown in FIGS. 32A, 32B and 32C, instead of the infrared detection element 20e. In the infrared detection element 20g, a first detection element DE1 and a second detection element DE2 include respective electric insulation layers 21p that are provided on a back face 21b of a pyroelectric substrate 21 so as to surround outer circumferential surfaces of second output terminals 28d except for surfaces thereof parallel to lateral sides of the pyroelectric substrate 21. The electric insulation layers 21p are made of material (such as epoxy resin or acrylic resin) that has less wettability to the conductive adhesive than that of the pyroelectric substrate 21. Accordingly, when the fifth variation of the infrared detector 2a is manufactured, it is possible to more prevent the occurrence of a defective product in which short-circuit occurs between a first output terminal 28c and the second output terminal 28d, thereby reducing the manufacturing cost. Furthermore, in the fifth variation of the infrared detector 2a, it is possible to more improve electric insulation between the first and second output terminals 28c and 28d.

Figure 33:
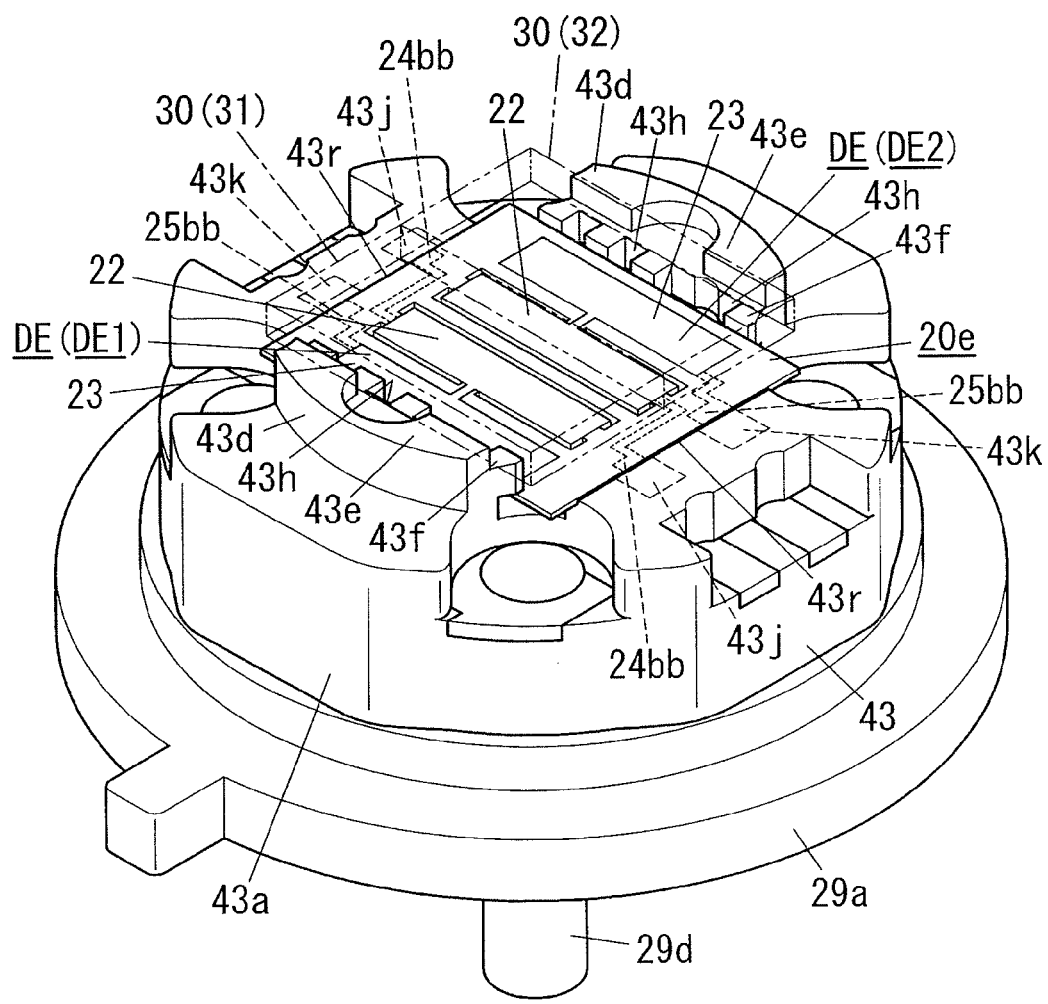
FIG. 33 is a schematic perspective view of a main part in a sixth variation of the infrared detector according to Embodiment 2.

As a sixth variation of the infrared detector 2a, part of which is shown in FIG. 33 for example, supporting portions 43f each may be provided with two or more recesses 43h in a face thereof facing a lateral side of the infrared detection element 20e. Accordingly, the sixth variation of the infrared detector 2a can more prevent heat from being transmitted from the first and second optical filters 31 and 32 to the infrared detection element 20e, thereby more providing higher sensitivity.

The infrared detector 2a may be applied in appropriate combination of two or more of the first to sixth variations and another configuration example.

The infrared detectors 2a, 2b and 2c each may include one or more infrared detection elements, a kind of which is any one of the infrared detection elements 20a, 20b, 20c, 20d, 20f and 20g, instead of the infrared detection element 20e.

Hereinafter, an infrared detector 2h as a seventh variation of the infrared detector 2a will be described with reference to FIGS. 34 to 42.

Figure 34:
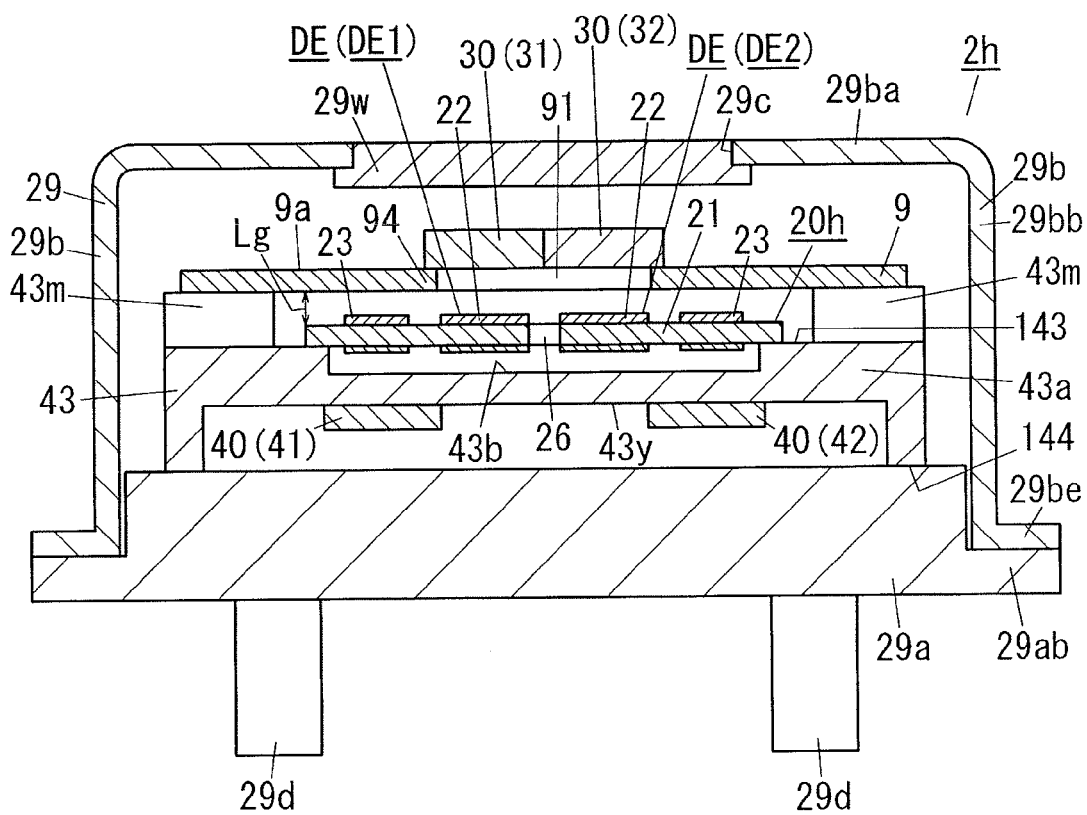
FIG. 34 is a schematic longitudinal-sectional view of a seventh variation of the infrared detector according to Embodiment 2.
Figure 35:
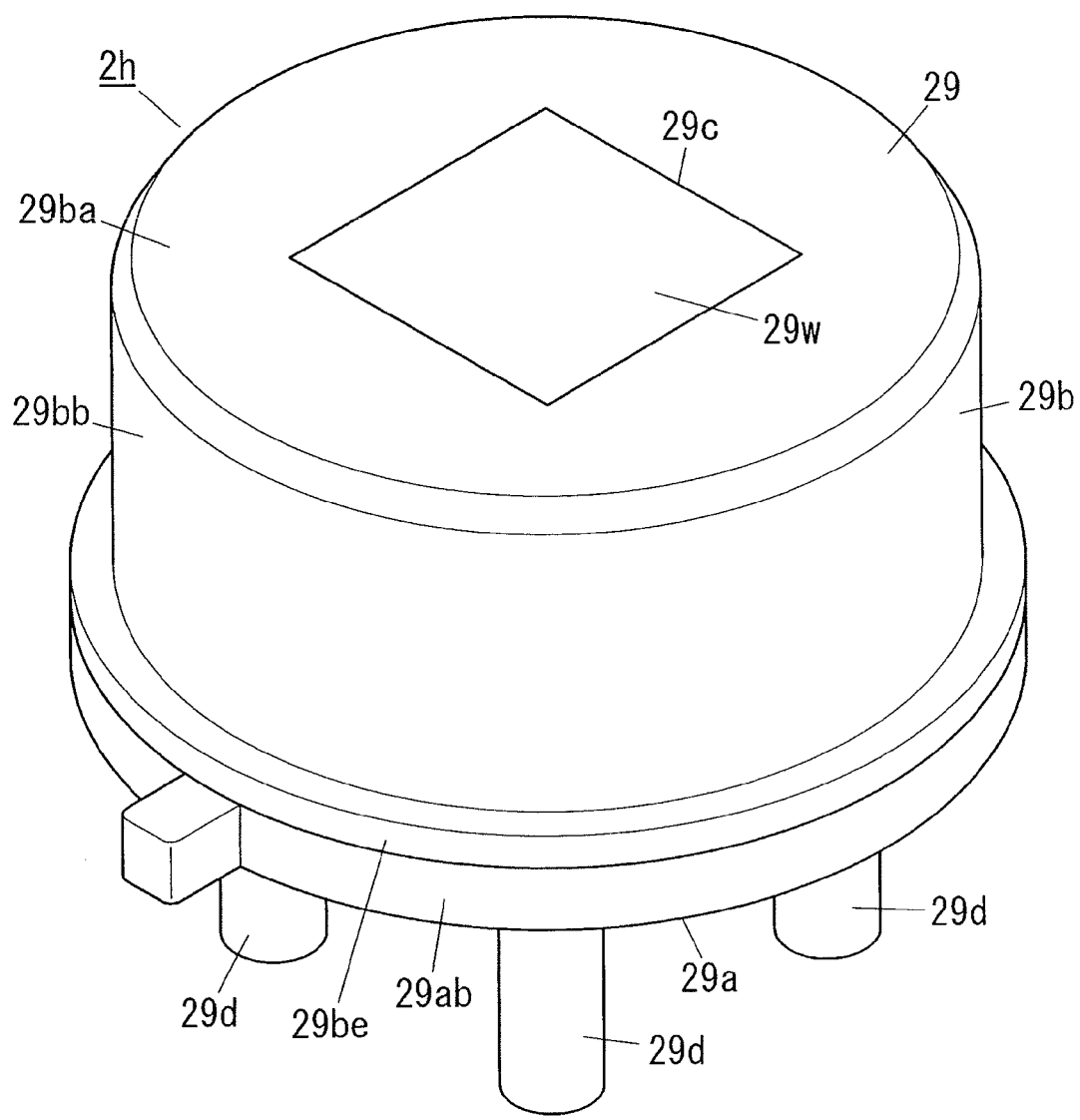
FIG. 35 is a schematic longitudinal-perspective view of the seventh variation of the infrared detector according to Embodiment 2.

The infrared detector 2h includes: an infrared detection element 20h; an optical filter 30 that is configured to transmit infrared having a particular wavelength; a base body 43 on which the infrared detection element 20h is mounted; and a package 29 that houses the infrared detection element 20h, the optical filter 30 and the base body 43. The package 29 includes: a pedestal 29a that supports the base body 43; a cap 29b that is fixed to the pedestal 29a so as to cover the infrared detection element 20h and the optical filter 30; and a window member 29w that is disposed to close a window hole 29c that is in a top plate 29ba of the cap 29b, and allows infrared to pass through. In the infrared detection element 20h, a first pyroelectric element 22 for receiving infrared light and a second pyroelectric element 23 for compensating temperature, which are paired, are arranged in a single pyroelectric substrate 21. In the infrared detector 2h, the first and second pyroelectric elements 22 and 23, which are paired, are connected in reverse parallel to each other. The infrared detection element 20h is disposed such that the first pyroelectric element 22 is positioned in an area of the infrared detection element 20h, which is a vertically projected area from the window hole 29c. In the example of FIG. 34, two first pyroelectric elements 22 and 22 are disposed in an area, which is a vertically projected area from two optical filters 30 and 30. The optical filters 30 are disposed between the window member 29w and the first pyroelectric elements 22. The infrared detector 2h further includes a light blocking member 9 that is disposed between the window member 29w and the infrared detection element 20h, and configured to block infrared that is directed toward second pyroelectric elements 23, after passing through the window member 29w from an outside of the package 29 and entering the package 29. The light blocking member 9 is held by the base body 43. The light blocking member 9 is provided with an opening 91. Only the first pyroelectric elements 22 and 22 are disposed in an area, which is a vertically projected area from the opening 91, and the whole of the second pyroelectric elements 23 and 23 is covered with the light blocking member 9. Accordingly, in the infrared detector 2h, it is possible to enhance relative position accuracy among the light blocking member 9 and the second pyroelectric elements 23, thereby providing higher sensitivity.

The infrared detection element 20h includes in the single pyroelectric substrate 21 two sets of a first pyroelectric element 22 for receiving infrared light and a second pyroelectric element 23 for compensating temperature. The infrared detector 2h includes: an optical filter 30 (hereinafter, also referred to as a "first optical filter 31") disposed in front of a first pyroelectric element 22 of one set; and an optical filter 30 (hereinafter, also referred to as a "second optical filter 32") disposed in front of a first pyroelectric element 22 of another set. A particular wavelength (hereinafter, referred to as a "first particular wavelength") of the first optical filter 31 and a particular wavelength (hereinafter, referred to as a "second particular wavelength") of the second optical filter 32 can be set individually, and may be different from or equal to each other.

Constituent elements of the infrared detector 2h will be described below, but explanation of constituent elements similar to those of the infrared detector 2a will be properly omitted.

Figure 39A:
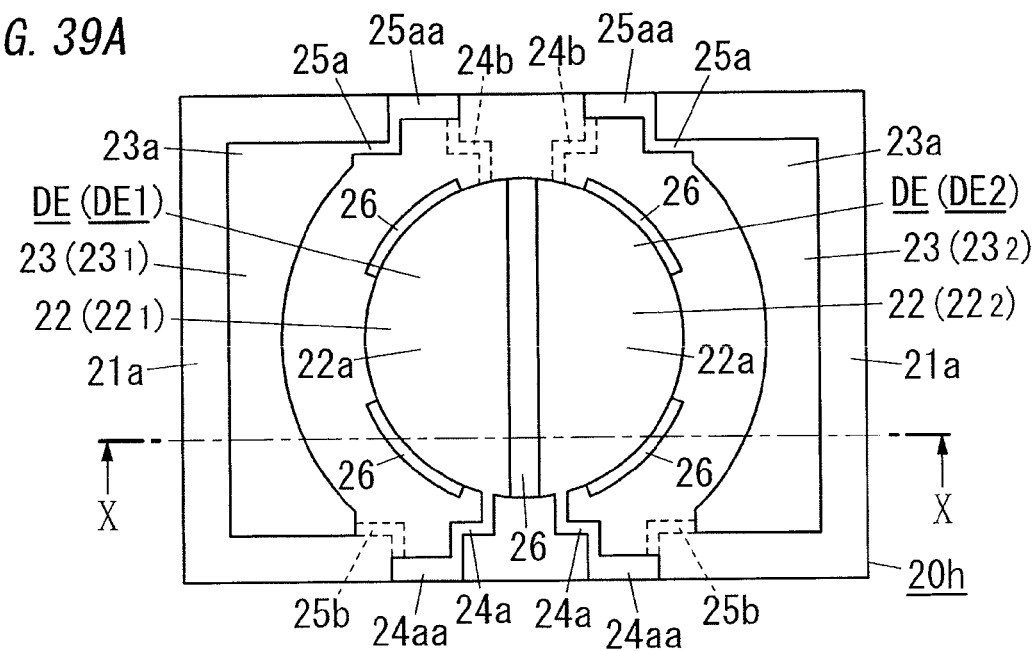
FIG. 39A is a schematic plan view of an infrared detection element in the seventh variation of the infrared detector according to Embodiment 2.
Figure 39B:
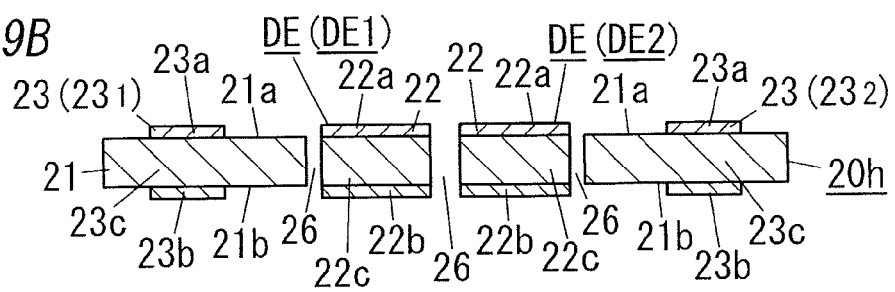
FIG. 39B is a schematic cross-sectional view taken along line X-X of FIG. 39A.
Figure 39C:
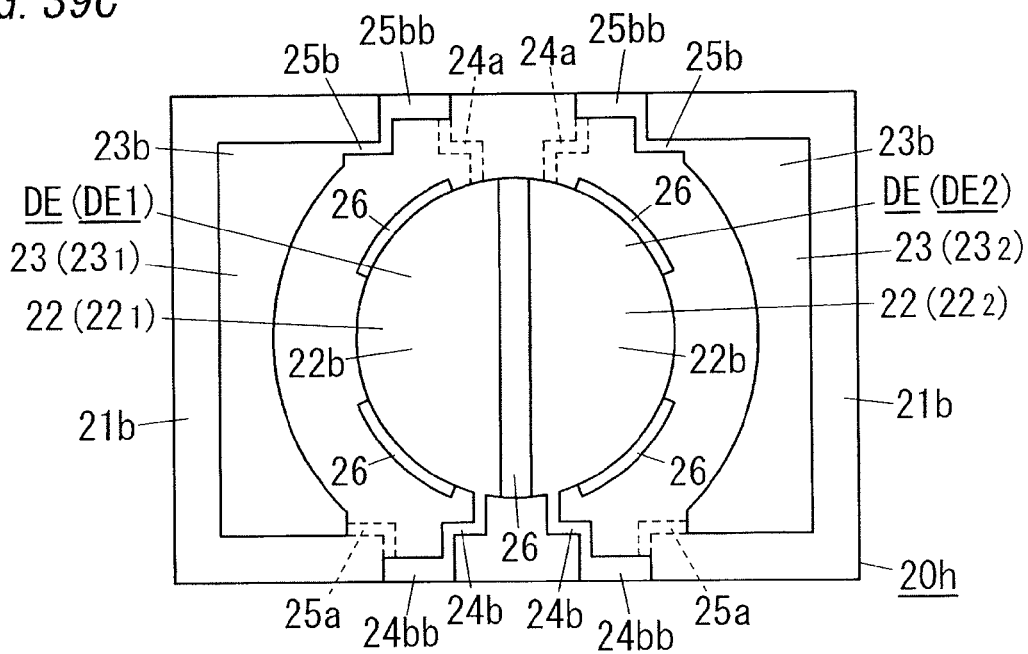
FIG. 39C is a schematic bottom view of the infrared detection element in the seventh variation of the infrared detector according to Embodiment 2.

The infrared detection element 20h has a configuration as shown in FIGS. 39A, 39B and 39C.

The first pyroelectric elements 22 each includes a first surface electrode 22a, a first back face electrode 22b and a first portion 22c. The first surface electrode 22a is provided on a surface 21a of the pyroelectric substrate 21. The first back face electrode 22b is provided on a back face 21b of the pyroelectric substrate 21. The first portion 22c is interposed between the first surface electrode 22a and the first back face electrode 22b, and is provided as part of the pyroelectric substrate 21. In each first pyroelectric element 22, the first surface electrode 22a faces the first back face electrode 22b through the first portion.

The second pyroelectric elements 23 each includes a second surface electrode 23a, a second back face electrode 23b and a second portion 23c. The second surface electrode 23a is provided on the surface 21a of the pyroelectric substrate 21. The second back face electrode 23b is provided on the back face 21b of the pyroelectric substrate 21. The second portion 23c is interposed between the second surface electrode 23a and the second back face electrode 23b, and is provided as part of the pyroelectric substrate 21. In each second pyroelectric element 23, the second surface electrode 23a faces the second back face electrode 23b through the second portion.

The pyroelectric substrate 21 is provided on the surface 21a thereof with first surface wirings 24a that are electrically connected with the first surface electrodes 22a, respectively. The pyroelectric substrate 21 is also provided on the surface 21a thereof with second surface wirings 25a that are electrically connected with the second surface electrodes 23a, respectively.

The pyroelectric substrate 21 is provided on the back face 21b thereof with first back face wirings 24b that are electrically connected with the first back face electrodes 22b, respectively. The pyroelectric substrate 21 is also provided on the back face 21b thereof with second back face wirings 25b that are electrically connected with the second back face electrodes 23b, respectively.

In the infrared detection element 20h, the pyroelectric substrate 21 is provided in part thereof surrounding each first pyroelectric element 22 with slits 26 each having a shape along an outer periphery of the first pyroelectric element 22. The slits 26 are formed out of regions in which the first surface wirings 24a and the first back face wirings 24b are disposed. Also in the infrared detection element 20h, part of the pyroelectric substrate 21 surrounding each second pyroelectric element 23 is continuously formed over an entire circumference of a corresponding second portion 23c. In other words, in the infrared detection element 20h, the slits 26 are formed only in part of the pyroelectric substrate surrounding each first pyroelectric element 22, but not formed in part of the pyroelectric substrate surrounding each second pyroelectric element 23. Therefore, in the infrared detection element 20h, it is possible to reduce the influence by crosstalk of infrared in each set of the first and second pyroelectric elements 22 and 23, thereby providing higher sensitivity.

The first pyroelectric elements 22 each are shaped like a semicircle in planar view. The second pyroelectric elements 23 each are shaped like a rectangular, and one facing a corresponding first pyroelectric element 22, of two long sides of the rectangular, is further shaped like a circular arc, except for both ends of the one long side. The shape of each first pyroelectric element 22 in planar view is not limited to a semi-circular, but may be e.g., a semi-ellipse, a circle, an ellipse, a polygon or the like. The shape of each second pyroelectric element 23 in planar view is not limited to the above-mentioned shape, but may be e.g., a semicircle, a semi-ellipse, a circle, an ellipse, a polygon or the like.

In the infrared detection element 20h, it is preferable that a surface area of each first pyroelectric element 22 be made to be equal to that of a corresponding second pyroelectric element 23. The surface area means an area in planar view. In the infrared detection element 20h, the shape of each first pyroelectric element 22 in planar view is different from that of a corresponding second pyroelectric element 23 in planar view, but the shapes of those elements 22 and 23 may be the same as each other.

In each first pyroelectric element 22, preferably, the shape of the first surface electrode 22a is the same as that of the first back face electrode 22b, and the first back face electrode 22b is disposed in an area, which agrees with a vertically projected area from the first surface electrode 22a.

In each second pyroelectric element 23, preferably, the shape of the second surface electrode 23a is the same as that of the second back face electrode 23b, and the second back face electrode 23b is disposed in an area, which agrees with a vertically projected area from the second surface electrode 23a.

In the infrared detection element 20h, an end of each first surface wiring 24a on an opposite side thereof from a corresponding first surface electrode 22a is configured as an output terminal 24aa. Also in the infrared detection element 20h, an end of each first back face wiring 24b on an opposite side thereof from a corresponding first back face electrode 22b is configured as an output terminal 24bb. Also in the infrared detection element 20h, an end of each second surface wiring 25a on an opposite side thereof from a corresponding second surface electrode 23a is configured as an output terminal 25aa. Also in the infrared detection element 20h, an end of each second back face wiring 25b on an opposite side thereof from a corresponding second back face electrode 23b is configured as an output terminal 25bb.

In the infrared detection element 20h, the terminal 24aa (electrically connected with the first surface electrode 22a of each first pyroelectric element 22) is disposed so as to overlap in the thickness direction of the pyroelectric substrate 21 with the terminal 25bb (electrically connected with the second back face electrode 23b of a corresponding second pyroelectric element 23). In the infrared detection element 20h, the terminal 24bb (electrically connected with the first back face electrode 22b of each first pyroelectric element 22) is disposed so as to overlap in the thickness direction of the pyroelectric substrate 21 with the terminal 25aa (electrically connected with the second surface electrode 23a of a corresponding second pyroelectric element 23). The terminals 24aa and the terminals 25bb are formed at one end of the infrared detection element 20h in the third direction, and the terminals 24bb and terminals 25aa are formed at another end of the infrared detection element in the third direction.

The infrared detection element 20h can have a configuration in which each first pyroelectric element 22 and a corresponding second pyroelectric element 23 are connected in reverse parallel to each other by the terminal 24aa being electrically connected with the terminal 25bb, and the terminal 24bb being electrically connected with the terminal 25aa (42A and 42B).

A first connection part (not shown) for electrically connecting the terminal 24aa with the terminal 25bb may be formed of conductive paste, for example. A second connection part (not shown) for electrically connecting the terminal 24bb with the terminal 25aa may be formed of conductive paste, for example. In the infrared detector 2h, the first and second connection parts constitute a pair of output terminals of the infrared detection element 20h. In the infrared detector 2h, the first connection part is configured as one (first output terminal) of the pair of output terminals, and the second connection part is configured as the other (second output terminal) of the pair of output terminals.

In the infrared detection element 20h, it is assumed that the first pyroelectric elements 22 each are used as a pyroelectric element for receiving infrared light, and the second pyroelectric elements 23 each are used as a pyroelectric element for compensating temperature. The pyroelectric element for receiving infrared light means a pyroelectric element for detecting infrared as a detection object to be detected by the infrared detection element 20h, and it is a pyroelectric element on which the infrared as the detection object to be detected by the infrared detection element 20h is incident. The pyroelectric element for compensating temperature means a pyroelectric element for reducing a change in an output signal, depending on a change in ambient temperature of the infrared detection element 20h, and ideally, it is a pyroelectric element on which the infrared as the detection object to be detected by the infrared detection element 20h is not incident. In other words, the pyroelectric element for compensating temperature means a pyroelectric element for removing a component depending on the ambient temperature from an output signal of the first pyroelectric element 22. Accordingly, the infrared detection element 20h is used such that while the infrared as the detection object is incident on the first pyroelectric element 22, no infrared is incident on the second pyroelectric element 23.

However, the infrared detection element 20h is used in a state where a space exists on the side of an incident surface on which infrared is incident, and accordingly, a signal may be output from second pyroelectric element(s) 23 by crosstalk of infrared. In the infrared detection element 20h, the incident surface on which infrared is incident means surfaces of the first surface electrodes 22a and surfaces of the second surface electrodes 23a. Here, the crosstalk of infrared means that infrared, which has passed through a window member 29w, first and second optical filter 31 and 32 or the like (for causing infrared to be incident on the first pyroelectric elements 22), is incident from an oblique direction on a surface of the second surface electrode 23a of the second pyroelectric element(s) 23. In other words, the crosstalk of infrared means that infrared as a detection object to be detected by the first pyroelectric element(s) 22 is incident from the oblique direction on the second surface electrode 23a of the second pyroelectric element(s) 23 despite that the infrared is intended to be prevented from being incident on the second surface electrodes. In the infrared detection element 20h, when infrared is incident obliquely on the second surface electrode 23a of a second pyroelectric element 23, the second pyroelectric element 23 outputs a signal with a phase reverse to that of a corresponding first pyroelectric element 22, and it results in that the sensitivity is reduced. Also, in the infrared detection element 20h, there is a possibility that infrared to be incident on the first light receiving element $22_1$ may be incident on the second light receiving element $22_2$, or reversely, infrared to be incident on the second light receiving element $22_2$ may be incident on the first light receiving element $22_1$.

However, in the infrared detection element 20h, the slits 26 are formed only in part of the pyroelectric substrate surrounding each first pyroelectric element 22. Accordingly, it is possible to generate a sensitivity difference based on a difference between thermal time constants of each first pyroelectric element 22 and a corresponding second pyroelectric element 23 caused by incidence of infrared as a detection object. Therefore, in the infrared detection element 20h, it is possible to reduce the influence by the crosstalk of infrared by connecting each first pyroelectric element 22 and a corresponding second pyroelectric element 23 in reverse parallel to each other, and utilizing the first pyroelectric elements 22 each as a pyroelectric element for receiving infrared light and the second pyroelectric elements 23 each as a pyroelectric element for compensating temperature. Thereby, the infrared detection element 20h can provide higher sensitivity.

In the pyroelectric substrate 21, it is preferred that slits 26 be at least along a side of each first pyroelectric element 22, facing a corresponding second pyroelectric element 23. Accordingly, the infrared detection element 20h can more enhance the sensitivity of each first pyroelectric element 22 in the low frequency region, compared with that of a corresponding second pyroelectric element 23, and furthermore prevent crosstalk of heat. Therefore, it is possible to more improve the sensitivities of the first pyroelectric elements 22.

In the infrared detection element 20h, the first surface electrodes 22a each may be provided such that an outer circumferential edge thereof is spaced from an aperture edge of each of corresponding slits 26, facing a side of the first surface electrode 22a. Accordingly, the infrared detection element 20h can more surely prevent occurrence of short-circuit between each first surface electrode 22a and a corresponding first back face electrode 22b while providing higher sensitivity.

In the infrared detection element 20h, each of the first back face electrodes 22b is preferably provided such that an outer circumferential edge thereof is spaced from an aperture edge of each of corresponding slits 26, facing a side of the first back face electrode 22b. Accordingly, the infrared detection element 20h can more surely prevent occurrence of short-circuit between each first surface electrode 22a and a corresponding first back face electrode 22b, thereby preventing a reduction of electrical stability.

The infrared detection element 20h preferably includes two or more sets of a first pyroelectric element 22 and a second pyroelectric element 23. In this case, preferably, a slit 26 is formed at facing sides of two adjacent first pyroelectric elements 22.

In a case where the infrared detection element 20h includes two sets of a first pyroelectric element 22 and a second pyroelectric element 23, the infrared detection element 20h can have two channels. That is, the infrared detection element 20h can be used as an infrared detection element configured to have two channels respectively corresponding to the two sets of a first pyroelectric element 22 and a second pyroelectric element 23. The infrared detection element 20a is configured to have two channels, and each channel is configured by a detection element DE that includes a first pyroelectric element 22, a second pyroelectric element 23, a first surface wiring 24a, a first back face wiring 24b, a second surface wiring 25a, and a second back face wiring 25b. Hereinafter, for convenience of explanation, the left detection element DE in FIG. 34 is referred to as a first detection element DE1, and the right detection element DE in FIG. 34 is referred to as a second detection element DE2.

As described above, the infrared detection element 20h includes two sets of a first pyroelectric element 22 and a second pyroelectric element 23. Hereinafter, for convenience of explanation, a first pyroelectric element 22 and a second pyroelectric element 23 of the first detection element DE1 are respectively also referred to as a first light receiving element $22_1$ and a first temperature compensating element $23_1$. Also, hereinafter, a first pyroelectric element 22 and a second pyroelectric element 23 of the second detection element DE2 are respectively also referred to as a second light receiving element $22_2$ and a second temperature compensating element $23_2$.

In the infrared detection element 20h, the slit 26 is formed at facing sides of two adjacent first pyroelectric elements 22. Therefore, it is possible to prevent heat from being transmitted between the two adjacent first pyroelectric elements 22. Thereby, the infrared detection element 20h can prevent reduction in the sensitivities of the first and second detection elements DE1 and DE2.

Note that, the infrared detection element 20h may include an infrared absorption layer (not shown) on the first surface electrode 22a of each first surface electrode 22.

In the infrared detector 2h, the first optical filter 31 is disposed in front of the first light receiving element $22_1$, and the second optical filter 32 is disposed in front of the second light receiving element $22_2$.

In the infrared detector 2h, the first and second optical filters 31 and 32 are stored in the package 29. Accordingly, in the infrared detector 2h, the first and second optical filters 31 and 32 can be prevented from being exposed to the external air. Therefore, it is possible to prevent a change in the filter characteristic with time. The particular wavelengths and the filter characteristics of the first and second optical filters 31 and 32 may be designed so that those optical filters have optical characteristics required for application of the infrared detector 2h.

Figure 40:
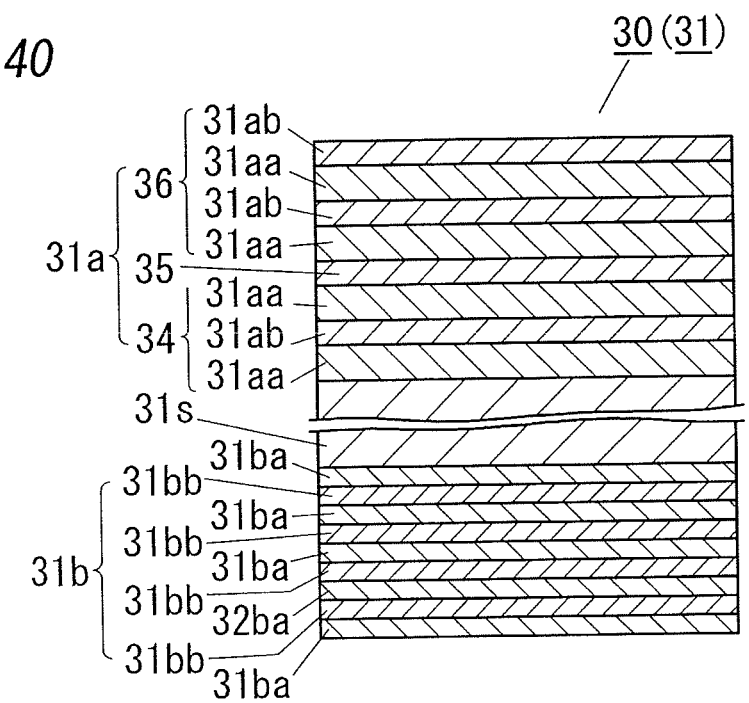
FIG. 40 is a schematic cross-sectional view of a first optical filter in the seventh variation of the infrared detector according to Embodiment 2.
Figure 41:
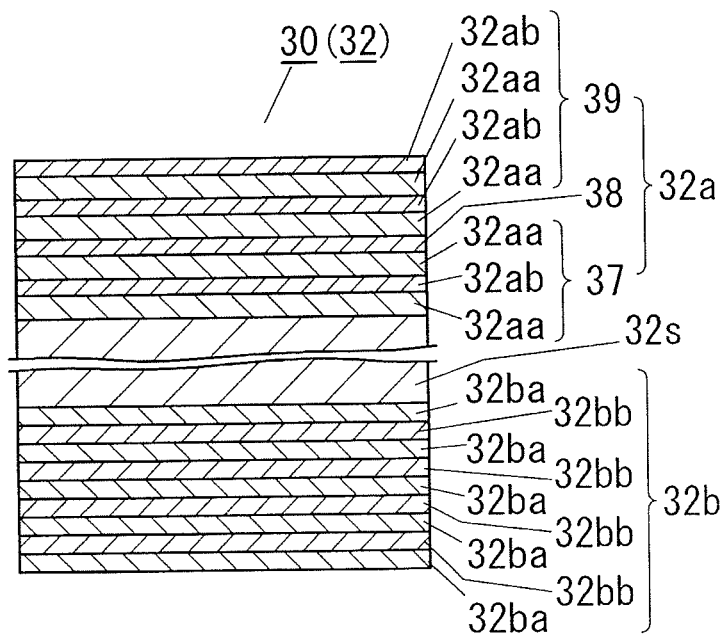
FIG. 41 is a schematic cross-sectional view of a second optical filter in the seventh variation of the infrared detector according to Embodiment 2.

For example, as shown in FIG. 40, the first optical filter 31 may include a first substrate 31s, a first filter part 31a and a second filter part 31b. Also for example, as shown in FIG. 41, the second optical filter 32 may include a second substrate 32s, a third filter part 32a and a fourth filter part 32b. The first substrate 31s and the second substrate 32s allow infrared to pass through. Examples of the first and second substrates 31s and 32s include a silicon substrate, a germanium substrate, a sapphire substrate, a magnesium oxide substrate and the like.

The infrared detector 2h can be applied to an infrared type gas sensor, for example. In the infrared detector 2h, a center wavelength of the first filter part 31a may be set to a first particular wavelength of the first optical filter 31, and a center wavelength of the third filter part 32a may be set to a second particular wavelength of the second optical filter 32.

When the infrared detector 2h is applied to an infrared type gas sensor, for example the center wavelength of the first filter part 31a may be set to an absorption wavelength of gas as a detection object, and the center wavelength of the third filter part 32a may be set to a reference wavelength.

In the infrared detector 2h, the first and second optical filters 31 and 32 are formed as separate bodies, but are not limited this. The first and second optical filters 31 and 32 may be formed as a single chip for example.

The infrared detector 20h preferably includes an IC element 40 for signal processing an output signal of the infrared detection element 20h. The IC element 40 is preferably mounted on the base body 43, and stored in the package 29. In a case where the infrared detection element 20h includes two detection elements DE, the infrared detection element 20h preferably includes two IC elements 40 for the detection elements DE, respectively. The infrared detector 2h preferably includes: an IC element 40 (first IC element 41) for signal processing an output signal of the first detection element DE1; and an IC element 40 (second IC element 42) for signal processing an output signal of the second detection element DE2.

Figure 42A:
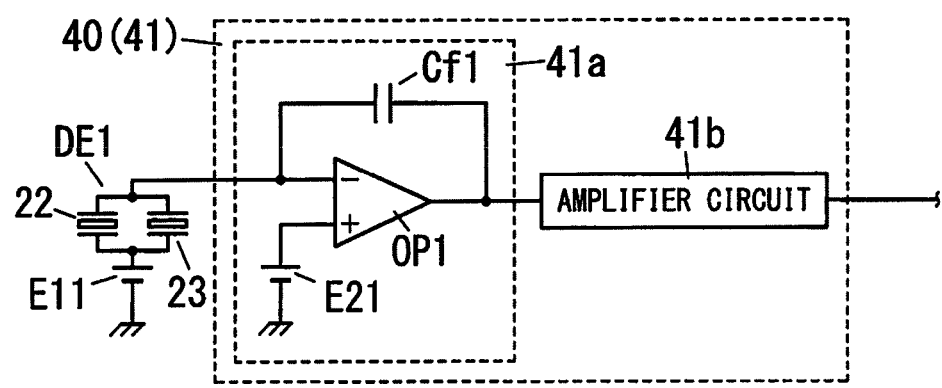
FIGS. 42A and 42B are schematic circuit diagrams, each of which illustrates the seventh variation of the infrared detector according to Embodiment 2.

For example as shown in FIG. 42A, the first IC element 41 includes a current-voltage conversion circuit 41a and an amplifier circuit 41b.

Figure 42B:
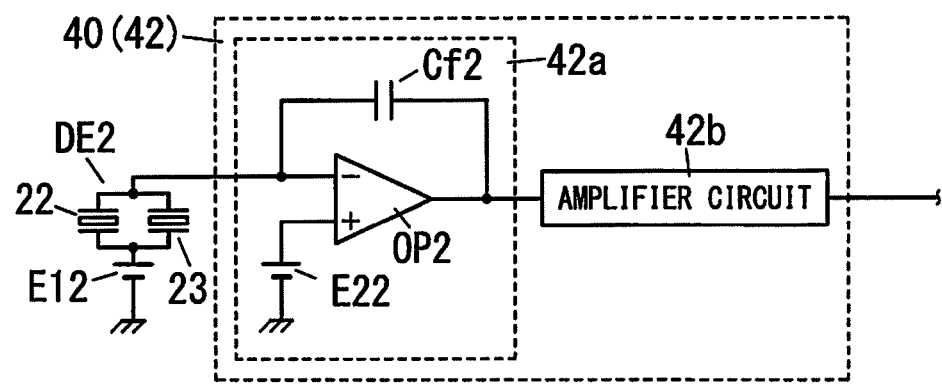

For example as shown in FIG. 42B, the second IC element 42 includes a current-voltage conversion circuit 42a and an amplifier circuit 42b.

The current-voltage conversion circuits 41a and 42a may have circuit configurations other than those in FIGS. 42A and 42B.

In the infrared detector 2h, the first and second output terminals of each detection element DE are respectively electrically connected with a first lead terminal 43j (refer to FIG. 36) and a second lead terminal (not shown) of the base body 43. The first lead terminal 43j and the second lead terminal are respectively configured as parts of wirings on the base body 43, which are different from each other. In the infrared detector 2h, when the first and second output terminals of each detection element DE are configured by the above-mentioned first and second connection parts, respectively, the first and second output terminals serve also as bonding portions for bonding the infrared detection element 20h and the base body 43.

The base body 43 has a first surface 143 and a second surface 144, which are orthogonal to a thickness direction of the base body 43. The base body 43 is disposed such that the thickness direction of the base body 43 is parallel to a thickness direction of the pedestal 29a, and fixed to pedestal 29a.

Figure 36:
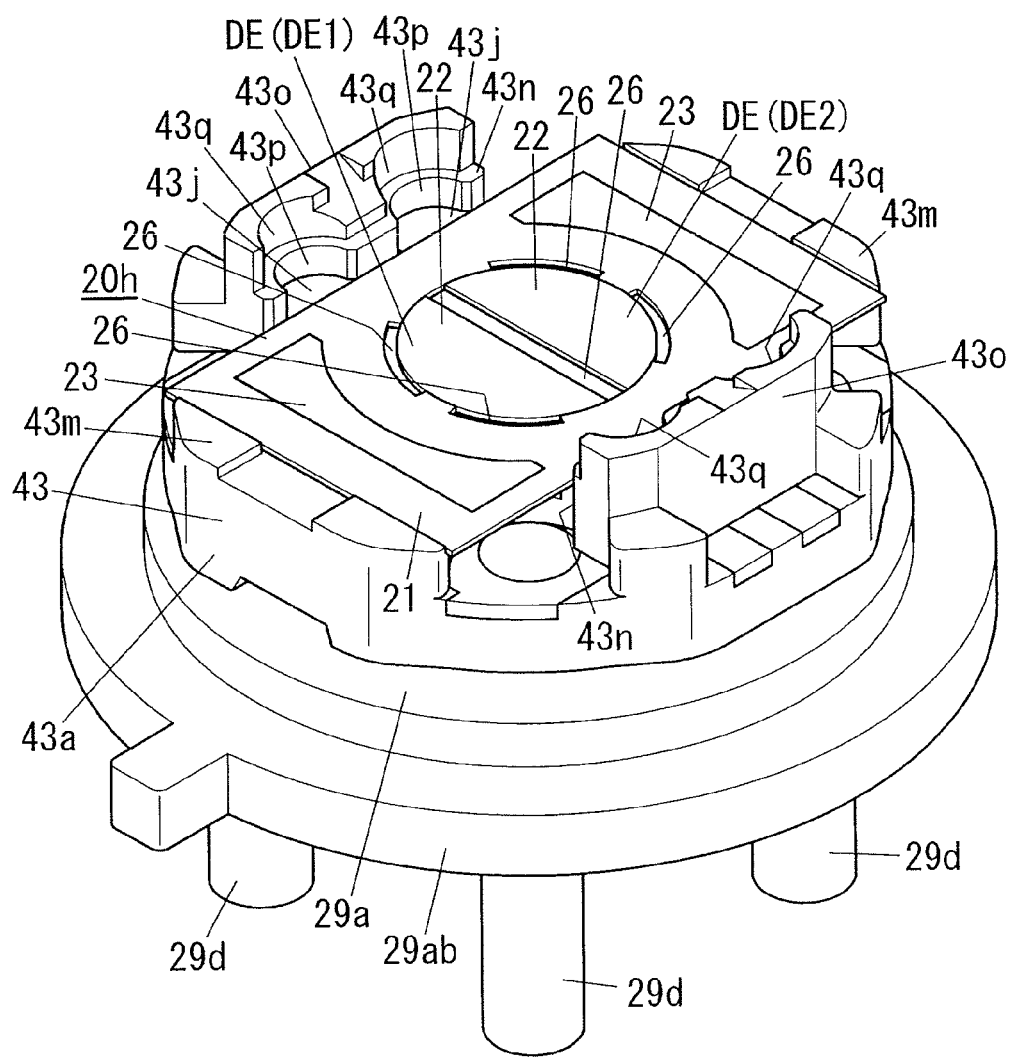
FIG. 36 is a perspective view of the seventh variation of the infrared detector according to Embodiment 2 in a state where a cap, a window member, an optical filter and a light blocking member are removed.
Figure 37:
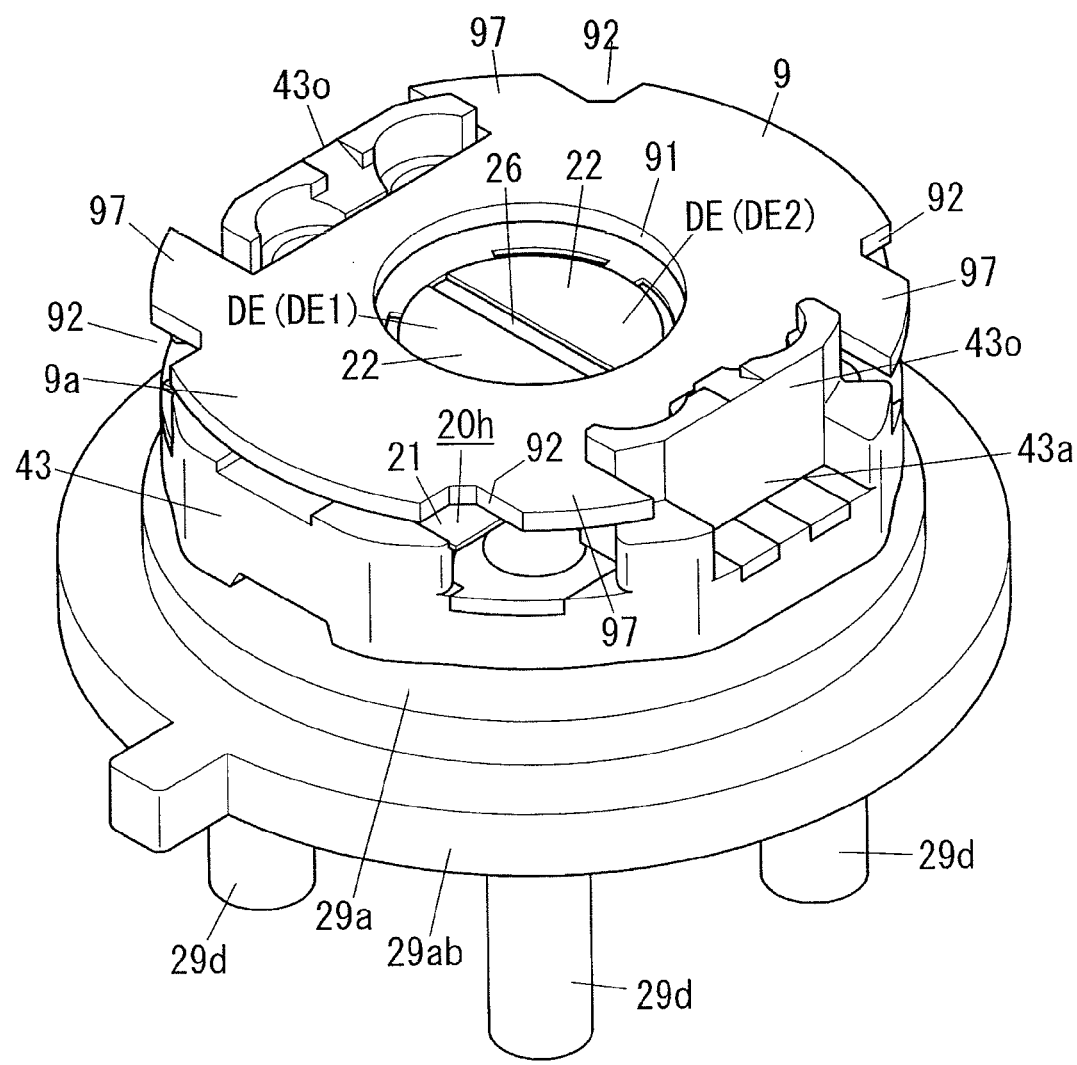
FIG. 37 is a perspective view of the seventh variation of the infrared detector according to Embodiment 2 in a state where the cap, the window member ant the optical filter are removed.
Figure 38:
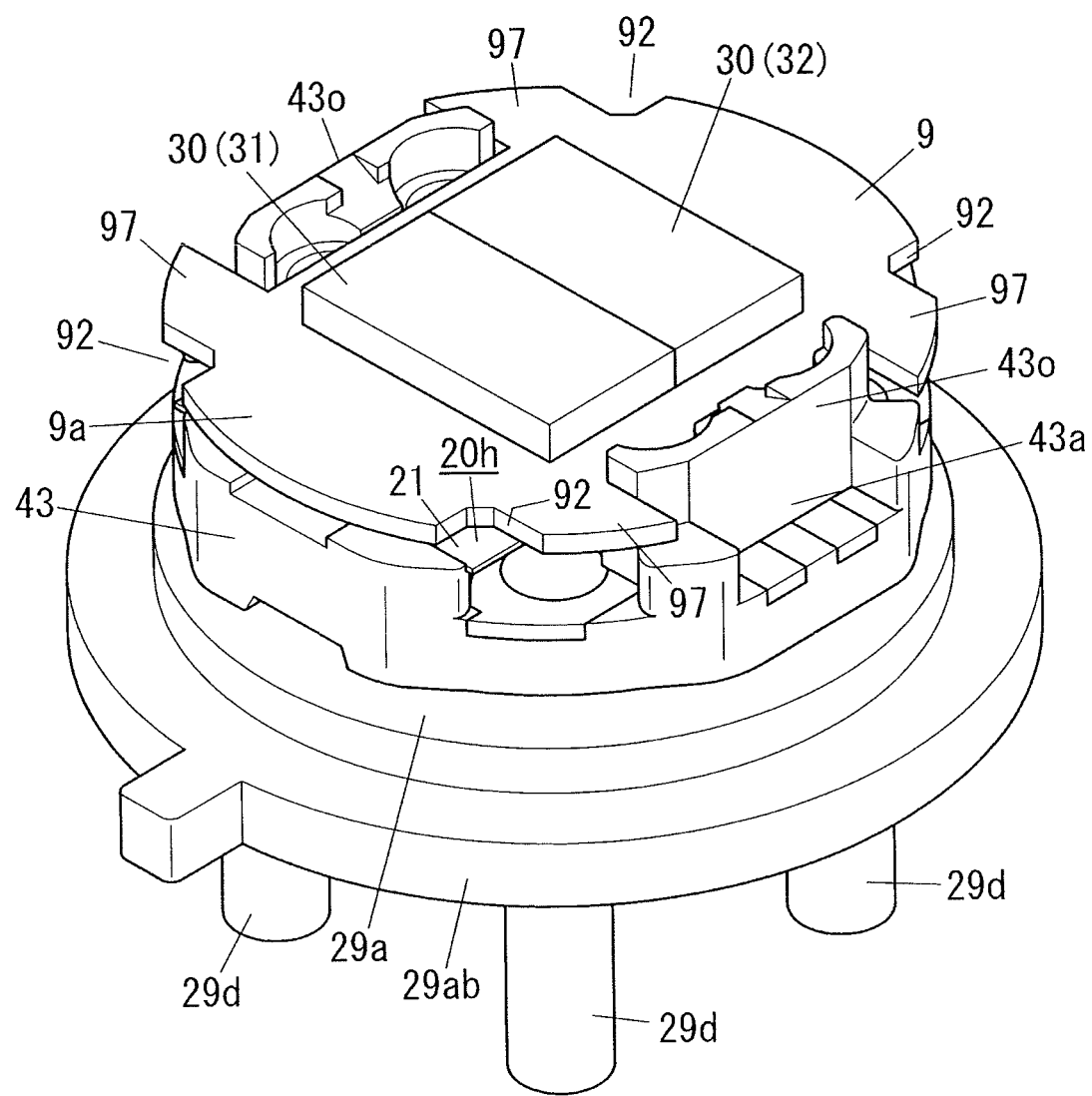
FIG. 38 is a perspective view of the seventh variation of the infrared detector according to Embodiment 2 in a state where the cap and the window member are removed.

As shown in FIG. 36, the base body 43 is preferably provided with two first projection parts 43m and two second projection parts 43n, which are for positioning the infrared detection element 20h, and projected from the first surface 143. The two first projection parts 43m and the two second projection parts 43n are formed outside an area of the base body 43, where the infrared detection element 20h is to be mounted. The two first projection parts 43m are disposed near both ends of the infrared detection element 20h in the first direction. The two second projection parts 43n are disposed near both ends of the infrared detection element 20h in the third direction. Each of the two second projection parts 43n is provided in a surface thereof facing the infrared detection element 20h with two recesses 43p for respectively exposing the first lead terminal 43j and the second lead terminal. Accordingly, in the infrared detector 2h, it is possible to bond the infrared detection element 20h and each of the first lead terminal 43j and the second lead terminal with a conductive adhesive, thereby electrically connecting those.

In the infrared detector 2h, it is possible to position the infrared detection element 20h with the two first projection parts 43m and the two second projection parts 43n, and further enhance the position accuracy of the infrared detection element 20h into a plane orthogonal to the thickness direction of the base body 43. Therefore, the infrared detector 2h does not need redundant design that would be caused by the position accuracy of the infrared detection element 20h, and it is possible to downsize the infrared detector, and improve the sensitivity.

The base body 43 is preferably provided in the first surface 143 thereof with a hollow 43b that is sized to include an area, which is a vertically projected area from the first pyroelectric elements 22 and the second pyroelectric elements 23.

In the infrared detector 2h, it is preferable that the infrared detection element 20h be disposed on the first surface 143 side of the base body 43, and the first and second IC elements 41 and 42 being disposed on the second surface 144 side of the base body 43.

The first and second IC elements 41 and 42 are bare chips, and fixed on an inner bottom face of a recess 43y provided in the second surface 144 of the base body 43 with die bonding material.

As described above, the package 29 includes the pedestal 29a, the cap 29b and the window member 29w.

The pedestal 29a is preferably made of metal. The pedestal 29a is shaped like a disk. The pedestal 29a is provided integrally with a first flange 29ab that projects outward from an outer periphery. The cap 29b is preferably made of metal. The cap 29b is provided with: a top plate 29ba shaped like a disk on one end side of a tube part 29bb shaped like a cylinder; and a second flange 29be that is formed on the other end side of the tube part. The top plate 29ba of the cap 29b is provided in a center thereof with a window hole 29c.

In the package 29, the first flange 29ab of the pedestal 29a is bonded to the second flange 29be of the cap 29b by welding or the like.

The window hole 29c has an opening size larger than the total size of the first light receiving element $22_1$ and the second light receiving element $22_2$. The opening shape of the window hole 29c is a rectangle, but is not limited to this. The opening shape may be e.g., a circle, a polygon except for a rectangle, or the like.

The window member 29w is preferably fixed to the cap 29b with conductive material. Accordingly, in the infrared detector 2h, the window member 29w can be made to have almost the same potential as that of the cap 29b, and therefore, there is an advantage that the infrared detector is hardly influenced by external electromagnetic noise. The window member 29w is not limited to a silicon substrate, but may be e.g., a germanium substrate, a zinc sulfide substrate or the like. However, the use of the silicon substrate is advantageous in view of reducing the cost. As the conductive material, e.g., solder, a conductive adhesive or the like may be used.

The window hole 29c of the package 29 is provided such that the first pyroelectric elements 22 are disposed in an area of the infrared detection element 20h, which is a vertically projected area from the window hole 29c. The window hole 29c of the package 29 may be provided such that the second pyroelectric elements 23 are disposed outside the area of the infrared detection element 20h, which is a vertically projected area from the window hole 29c. In this case, the package 29 of the infrared detector 2h can more prevent infrared as a detection object to be detected by each first pyroelectric element 22 from being incident on the second pyroelectric elements 23.

Incidentally, in the infrared detection element 20h, preferably the first pyroelectric elements 22 are formed in a central part of the pyroelectric substrate 21, and the second pyroelectric elements 23 are formed in a peripheral part of the pyroelectric substrate 21. The light blocking member 9 is preferably shaped like a plate, and provided in the central part thereof with an opening 91 that is sized larger than an area, which is a vertically projected area from the first pyroelectric elements 22 in the thickness direction of the first pyroelectric element 22. Accordingly, the infrared detector 2h can prevent infrared as a detection object directed toward the first pyroelectric element 22 after passing through the window member 29w from being blocked by the light blocking member 9. The size of the opening 91 may be appropriately set according to the number of first pyroelectric elements 22. When the number of first pyroelectric elements 22 is two, the size may be set larger than the total of respective areas which are vertically projected areas from the two first pyroelectric elements 22 and 22.

The light blocking member 9 is fixed to the base body 43. The light blocking member 9 is disposed on the two first projection parts 43m and the two second projection parts 43n of the base body 43. The base body 43 is provided on the respective two second projection parts 43n with two third projection parts 43o for positioning the light blocking member 9 in the first and third directions. The light blocking member 9 is provided integrally with two sets of two projection pieces 97 (refer to FIGS. 37 and 38) that are projected from each of both end surfaces of the light blocking member in the third direction, and the two projection pieces 97 are respectively disposed on both sides of a corresponding third projection part 43o. Accordingly, the infrared detector 2h can enhance the position accuracy of the light blocking member 9 into a plane orthogonal to the thickness direction of the base body 43.

Further, two recesses 43q are formed in each of surfaces of the two third projection parts 43o facing each other. The recesses 43q of each third projection part 43o are formed at positions corresponding to the recesses 43p of a corresponding second projection part 43n, respectively. The light blocking member 9 is preferably fixed to the base body 43 with adhesives introduced into the recesses 43q of each third projection part 43o. Accordingly, the infrared detector 2h can enhance relative position accuracy between the light blocking member 9 and the infrared detection element 20h.

In the base body 43, the two first projection parts 43m and 43m each are set to have a height larger than the thickness of the infrared detection element 20h, and also the two second projection parts 43n and 43n each are set to have a height larger than the thickness of the infrared detection element. Accordingly, the infrared detector 2h can enhance the relative position accuracy between the light blocking member 9 and the infrared detection element 20h in the thickness direction of the base body 43, and also enhance accuracy of a gap length Lg between the light blocking member 9 and the infrared detection element 20h.

Since the infrared detection element 20h and the light blocking member 9 are fixed to the same base body 43, the infrared detector 2h can enhance the relative position accuracy between the light blocking member 9 and the infrared detection element 20h, thereby providing higher sensitivity.

The first and second optical filters 31 and 32 are fixed to the light blocking member 9. The first and second optical filters 31 and 32 may be fixed to the light blocking member 9 with adhesives or the like. In the infrared detector 2h, the first and second optical filters 31 and 32 are preferably disposed such that the opening 91 is closed with the first and second optical filters 31 and 32. The first and second optical filters 31 and 32 are preferably fixed to a peripheral part 94 of the opening 91 on a first surface 9a of the light blocking member 9. Accordingly, in the infrared detector 2h, the first and second optical filters 31 and 32 can be spaced from the infrared detection element 20h.

The light blocking member 9 is preferably provided with two or more window parts 92, each of which part of the infrared detection element 20h is visible from the first surface 9a of the light blocking member 9 through. Accordingly, when the infrared detector 2h is manufactured, it is possible to perform an inspection process for confirming the presence or absence of the infrared detection element 20h or displacement thereof, even after fixing to the base body 43 the light blocking member 9 to which the first and second optical filters 31 and 32 are previously fixed. In addition, when the infrared detector 2h is manufactured, it is possible to evaluate by visual inspection the relative position accuracy between the light blocking member 9 and the infrared detection element 20h, even after fixing to the base body 43 the light blocking member 9. The window parts 92 are preferably formed in a peripheral part of the light blocking member 9 so as to correspond to four corners of the infrared detection element 20h, respectively. Each of the window parts 92 is configured as a cutout part formed in an outer circumferential surface of the light blocking member 9. The window parts 92 each may be a through-hole that pierces the light blocking member 9 in a thickness direction thereof, or a transparent member allowing visible light to pass through.

The light blocking member 9 may include a resin plate and a metal foil stacked on the resin plate, for example. Accordingly, in the infrared detector 2h, the light blocking member 9 can be formed of e.g., a printed wiring substrate or the like. In this case, the resin plate is configured by a resin base member of the printed wiring substrate, and the metal foil is configured by a copper foil of the printed wiring substrate. Examples of the resin base member include a phenol resin substrate, a glass epoxy resin substrate in which epoxy resin is impregnated in glass fiber, and the like. As long as the metal foil is formed of material capable of blocking infrared by reflection or the like, it is not limited to a copper foil. For example, an aluminum foil, gold foil or the like may be used. When the light blocking member 9 is formed of the printed wiring substrate, the printed wiring substrate may be cut to a prescribed shape to be used. In this case, there is an advantage that it is not necessary to form the resin plate by resin molding.

The light blocking member 9 may be e.g., a metal plate. Accordingly, the infrared detector 2h can more reduce heat capacity of the light blocking member 9. The metal plate may be formed of material capable of blocking infrared by reflection or the like. The metal plate is preferably formed of material having small heat capacity, and for example, aluminum may be used. The material for the metal plate may be stainless steel or the like.

Figure 43A:
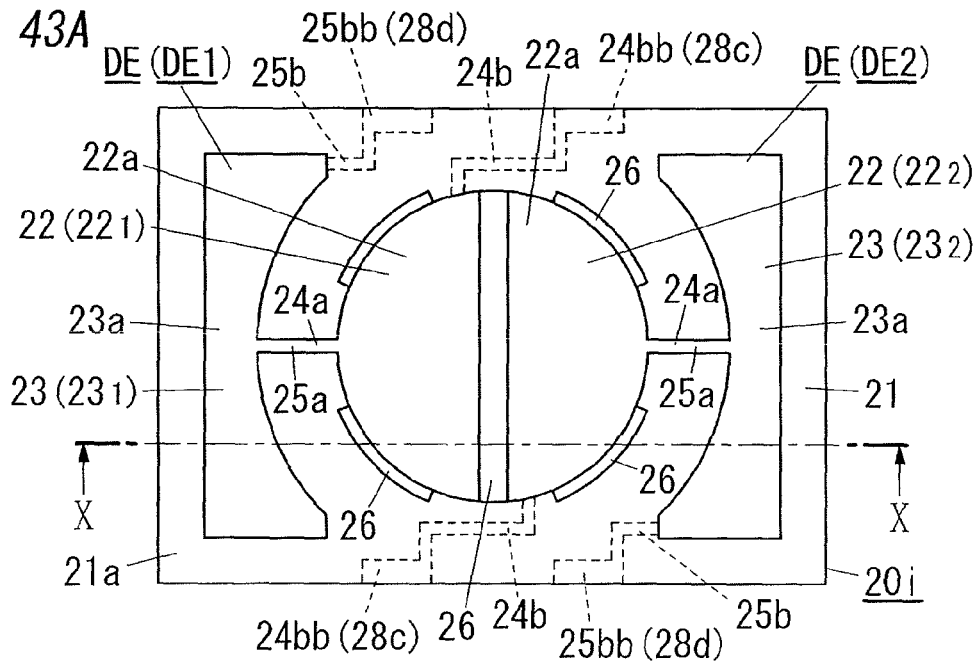
FIG. 43A is a schematic plan view of an infrared detection element in an eighth variation of the infrared detector according to Embodiment 2.
Figure 43B:
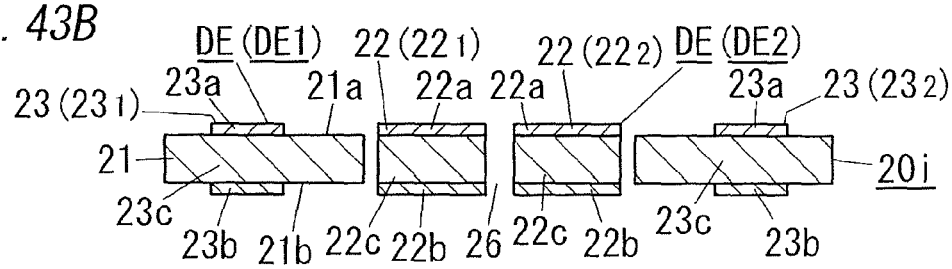
FIG. 43B is a schematic cross-sectional view taken along line X-X of FIG. 43A.
Figure 43C:
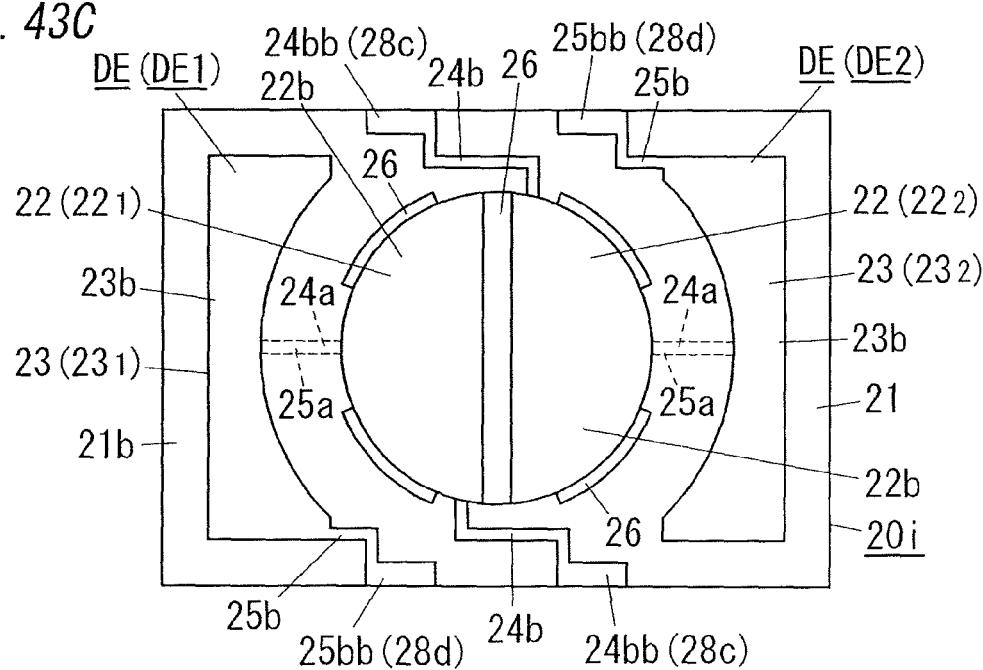
FIG. 43C is a schematic bottom view of the infrared detection element in the eighth variation of the infrared detector according to Embodiment 2.

As an eighth variation of the infrared detector 2a, e.g., an infrared detection element 20i with a configuration shown in FIGS. 43A, 43B and 43C may be adopted, instead of the infrared detection element 20h of the infrared detector 2h.

The infrared detection element 20i is different from the infrared detection element 20h in that each first pyroelectric element 22 and a corresponding second pyroelectric element 23 are connected in reverse series to each other. Note that, regarding the infrared detection element 20i, constituent elements similar to those of the infrared detection element 20h are assigned with same reference numerals, and explanation thereof will be properly omitted.

In the infrared detection element 20i, a first surface electrode 22a of a first pyroelectric element 22 and a second surface electrode 23a of a second pyroelectric element 23, which are paired, are electrically connected with each other via a first surface wiring 24a and a second surface wiring 25a. Thus, in the infrared detection element 20i, the first pyroelectric element 22 and the second pyroelectric element 23, which are paired, are connected in reverse series to each other. In other words, in each of first and second detection elements DE1 and DE2 in the infrared detection element as the eighth variation, the first pyroelectric element 22 and the second pyroelectric element 23 are connected in reverse series to each other. The infrared detection element 20i includes a pair of output terminals 28c and 28d for each set that is configured by a first pyroelectric element 22 and a second pyroelectric element 23. In the infrared detection element 20*i*, the output terminal 28*c* (first output terminal 28*c*) as one of the pair is configured as a terminal 24*bb*, and the output terminal 28*d* (second output terminal 28*d*) as the other of the pair is configured as a terminal 25*bb*.

In the infrared detection element 20*i*, each first pyroelectric element 22 is used for receiving infrared light, and each second pyroelectric element 23 is used for compensating temperature, and accordingly, it is possible to reduce the influence by crosstalk of infrared. Therefore, the infrared detection element 20*i* can provide higher sensitivity.

The infrared detection element 20*i* includes two sets of a first pyroelectric element 22 and a second pyroelectric element 23. Thus, regarding each of the two set in the infrared detection element 20*i*, a first pyroelectric element 22 and a second pyroelectric element 23 are connected in reverse series to each other.

Figure 44:
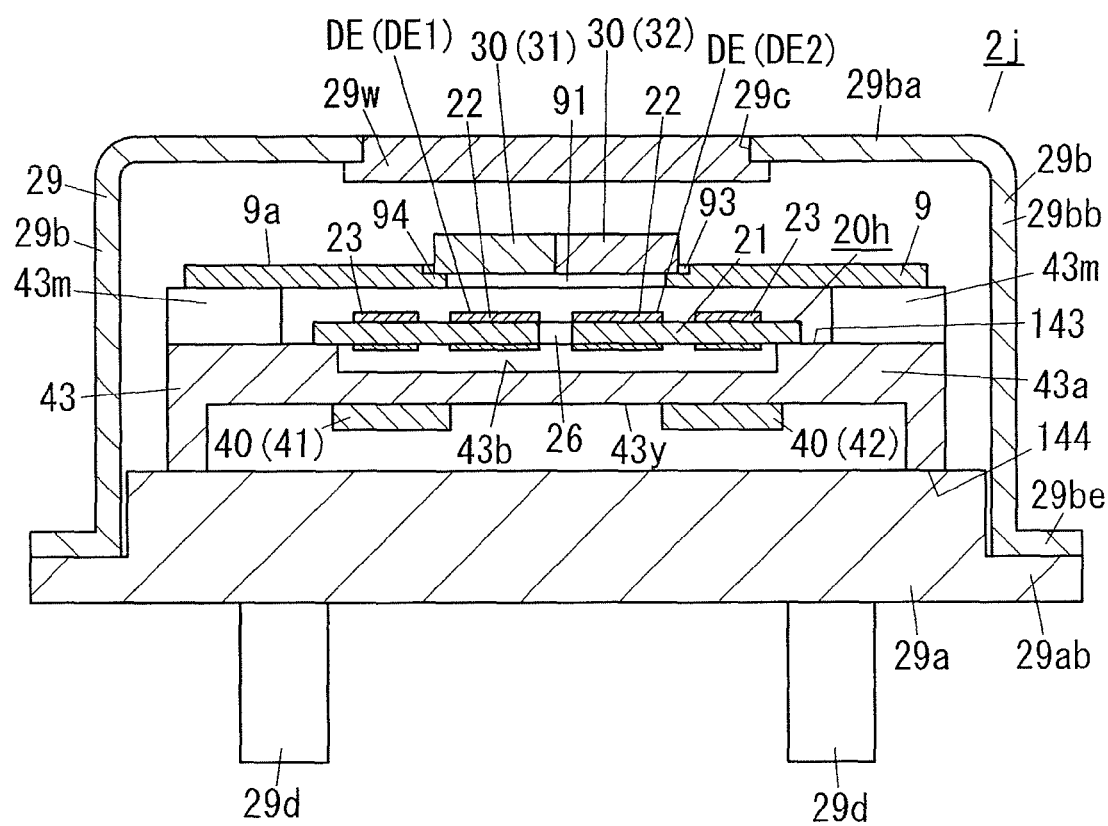
FIG. 44 is a schematic longitudinal-sectional view of a ninth variation of the infrared detector according to Embodiment 2.

FIG. 44 shows an infrared detector 2*j* as a ninth variation of the infrared detector 2*a*. The infrared detector 2*j* has substantially the same basic configuration as the infrared detector 2*h*, but is different from it in a shape of a light blocking member 9. Note that, regarding the infrared detector 2*j*, constituent elements similar to those of the infrared detector 2*h* are assigned with same reference numerals, and explanation thereof will be properly omitted.

The light blocking member 9 of the infrared detector 2*j* is provided with a depression 93 that is formed in a peripheral part 94 of an opening 91 such that end faces of the peripheral part 94 facing a window member 29*w* and the opening 91 are recessed. Similarly to the case of the infrared detector 2*h*, the light blocking member 9 is also provided with two or more window parts 92, each of which part of the infrared detection element 20*h* is visible from a first surface 9*a* of the light blocking member through. In the light blocking member 9, the window parts 92 are formed out of: an area, which is a vertically projected area from second pyroelectric elements 23 in a thickness direction thereof; the opening 91; and the depression 93. Optical filters 30 are disposed to close the opening 91, and a periphery of the optical filters 30 is placed on the depression 93, thereby being positioned to the light blocking member 9. Accordingly, in the infrared detector 2*j*, it is possible to enhance the relative position accuracy among the optical filters 30 and the infrared detection element 20*h*. In particular, in the infrared detector 2*j*, it is possible to enhance the relative position accuracy among the first and second optical filters 31 and 32 and the first and second light receiving elements 22₁ and 22₂, thereby providing higher sensitivity.

Figure 45:
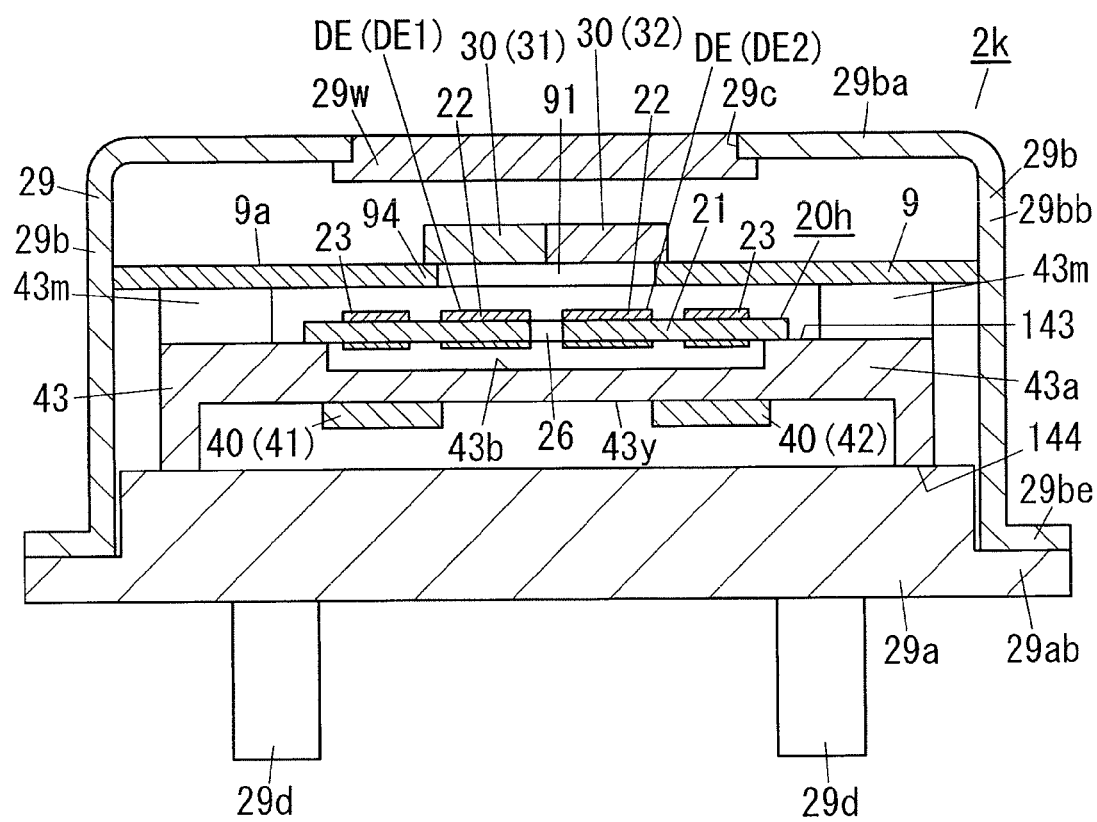
FIG. 45 is a schematic longitudinal-sectional view of a tenth variation of the infrared detector according to Embodiment 2.
Figure 46:
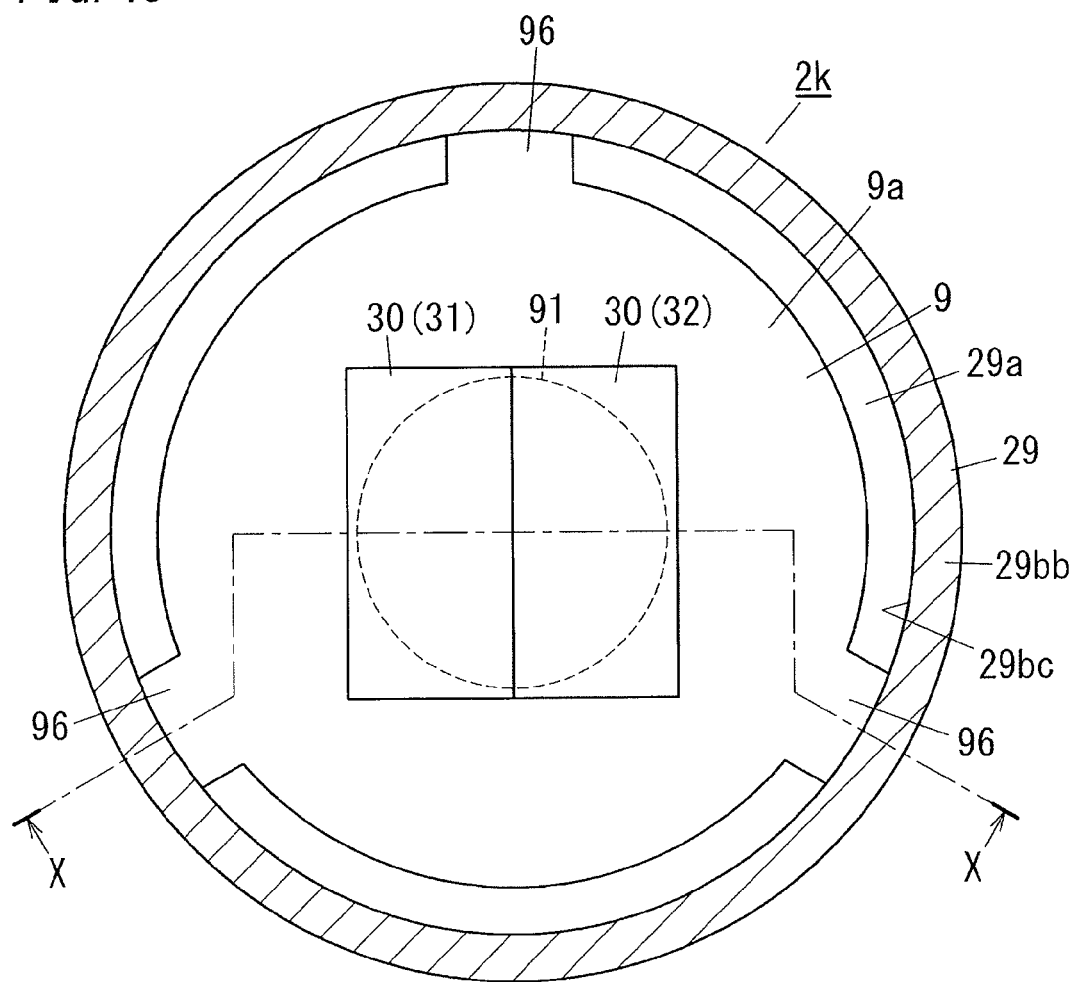
FIG. 46 is a schematic cross-sectional view of the tenth variation of the infrared detector according to Embodiment 2.

FIGS. 45 and 46 show an infrared detector 2*k* as a tenth variation of the infrared detector 2*a*. The infrared detector 2*k* has substantially the same basic configuration as the infrared detector 2*h*, but is different from it in a shape of a light blocking member 9. Note that, regarding the infrared detector 2*k*, constituent elements similar to those of the infrared detector 2*h* are assigned with same reference numerals, and explanation thereof will be properly omitted. FIG. 45 is a schematic longitudinal-sectional view taken along line X-X of FIG. 46.

The light blocking member 9 of the infrared detector 2*k* has a shape so as to be in contact with an inner circumference surface 29*bc* of a cap 29*b*. The cap 29 is positioned into a plane orthogonal to a thickness direction of a pedestal 29*a* by the light blocking member 9. Accordingly, in the infrared detector 2*k*, it is possible to enhance the relative position accuracy between a window member 29*w* and the light blocking member 9. Therefore, in the infrared detector 2*k*, it is possible to more enhance the relative position accuracy among the window member 29*w*, optical filters 30 and the infrared detection element 20*h*, thereby providing higher sensitivity. The light blocking member 9 is shaped like a circular plate, and provided with two or more protrusion pieces 96 protruded from an outer circumference surface thereof. An end surface of each protrusion piece 96 is in contact with the inner circumference surface 29*bc* of a tube part 29*bb* of the cap 29*b*. In the blocking member 9, it is preferable that the protrusion pieces 96 be formed at equal intervals in a direction along a circumference direction of the inner circumference surface 29*bc* of the cap 29*b*. Accordingly, in the infrared detector 2*k*, it is possible to enhance the position accuracy of the cap 29*b* to the pedestal 29*a*.

Figure 47:
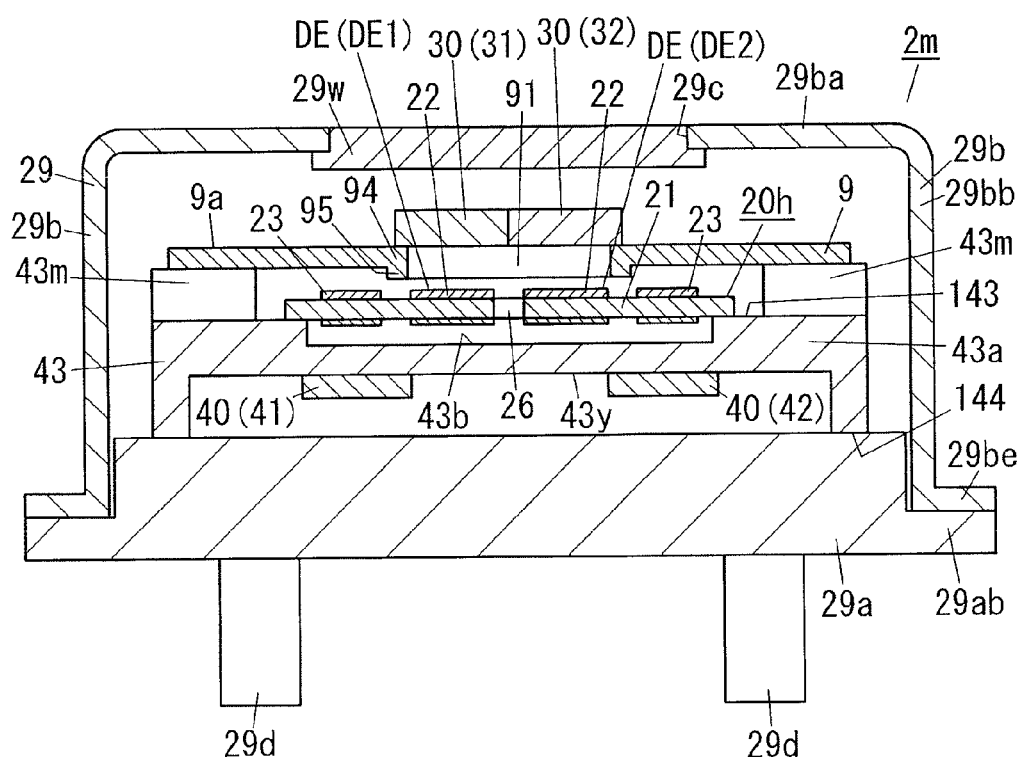
FIG. 47 is a schematic longitudinal-sectional view of an eleventh variation of the infrared detector according to Embodiment 2.
Figure 48:
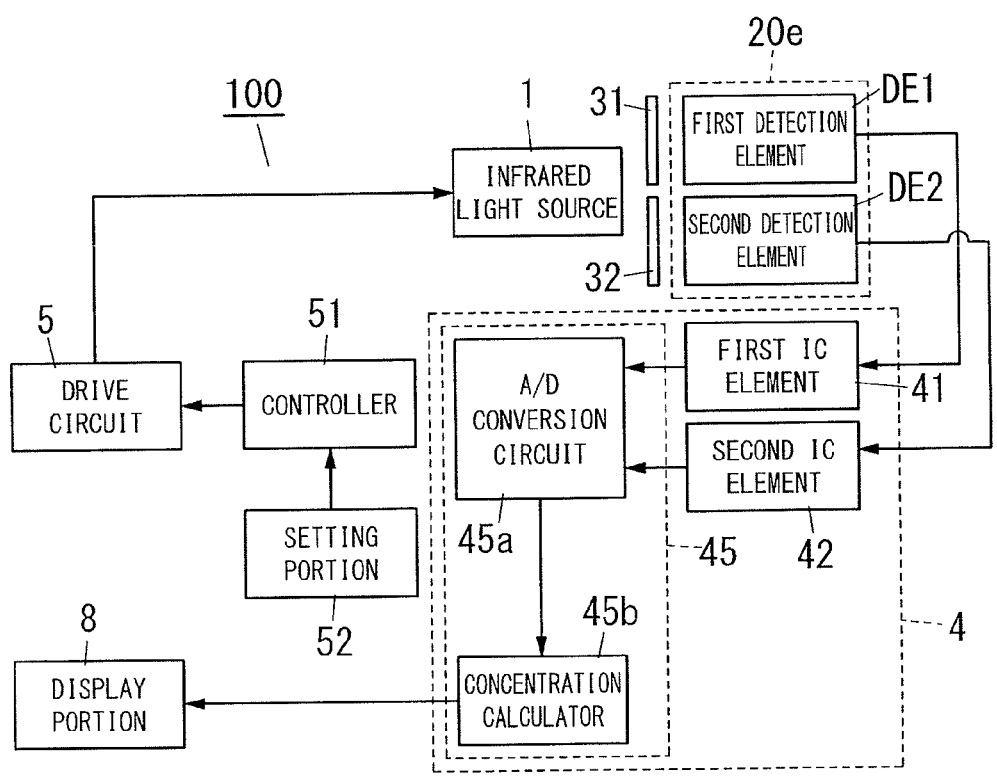
FIG. 48 is a schematic configuration diagram illustrating an infrared type gas sensor according to Embodiment 3.
Figure 49:
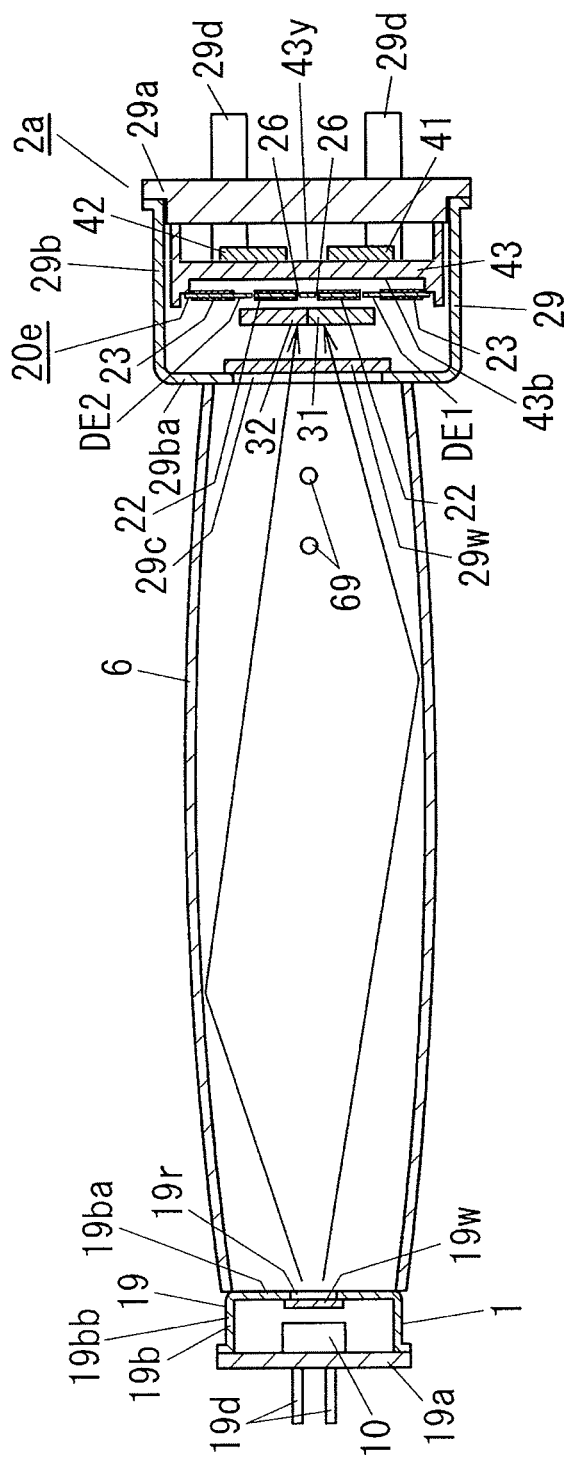
FIG. 49 is a schematic configuration diagram illustrating a main part of the infrared type gas sensor according to Embodiment 3.
Figure 50:
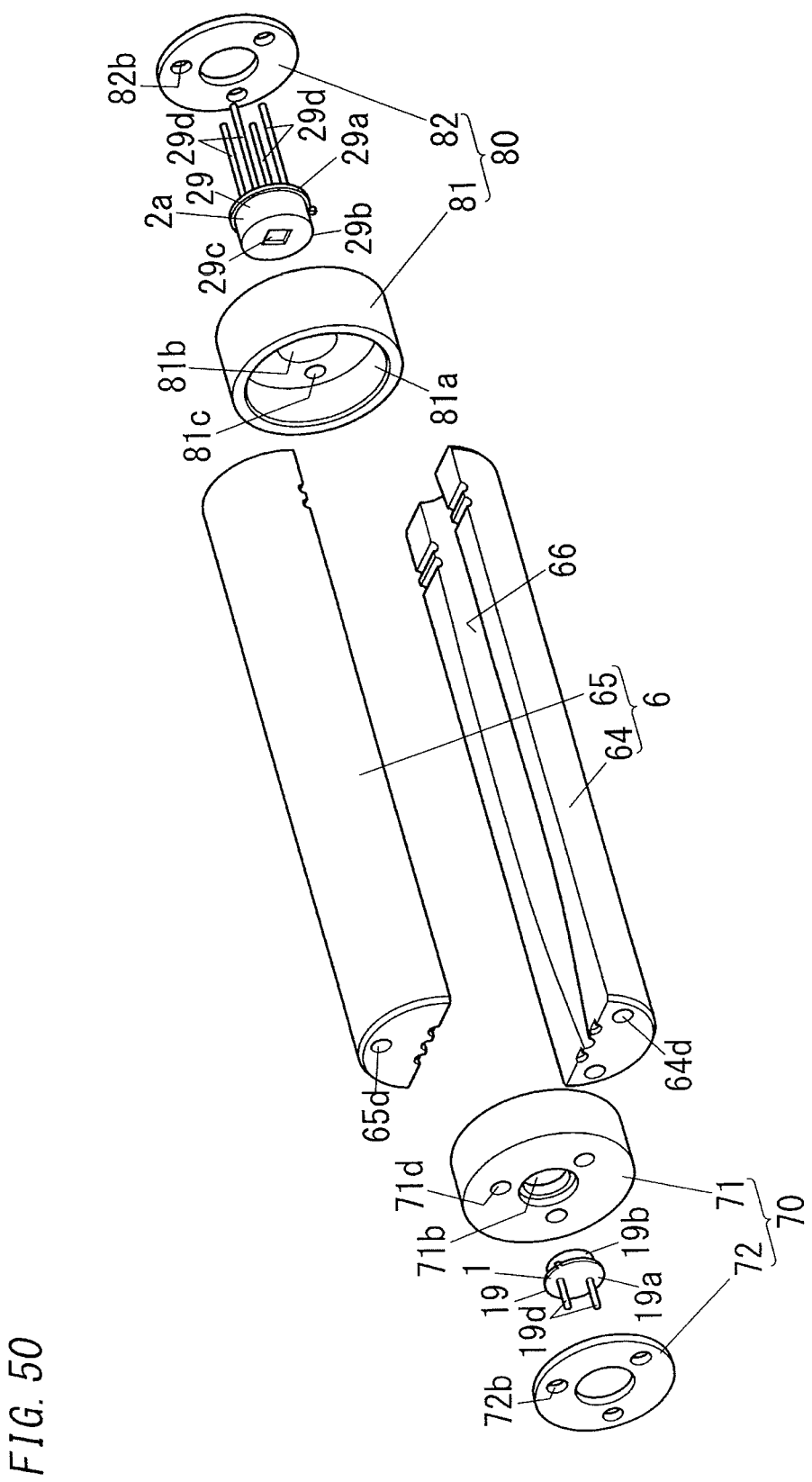
FIG. 50 is a schematic exploded perspective view of the main part of the infrared type gas sensor according to Embodiment 3.
Figure 51:
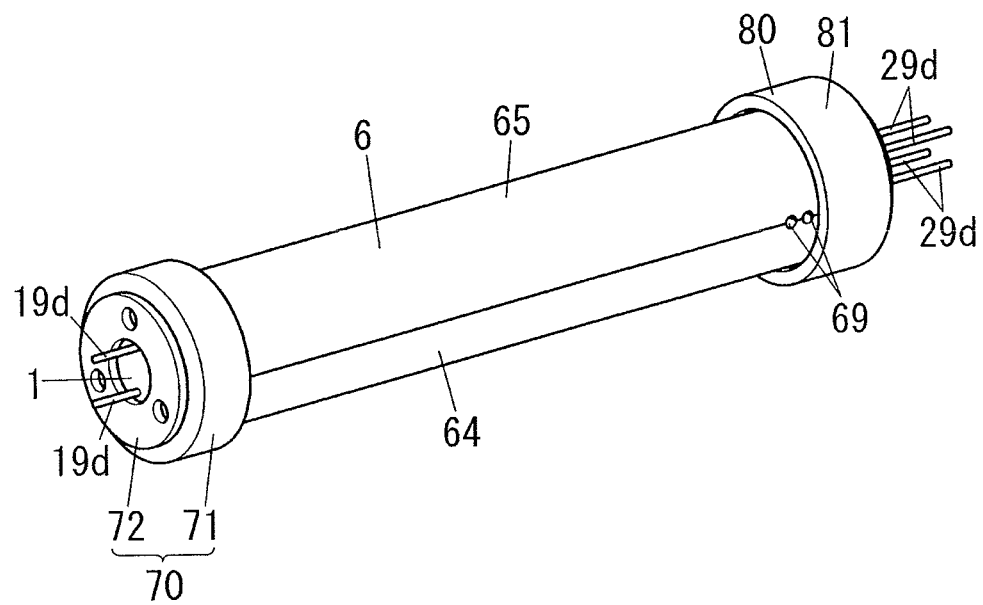
FIG. 51 is a schematic perspective view of the main part of the infrared type gas sensor according to Embodiment 3.
Figure 52:
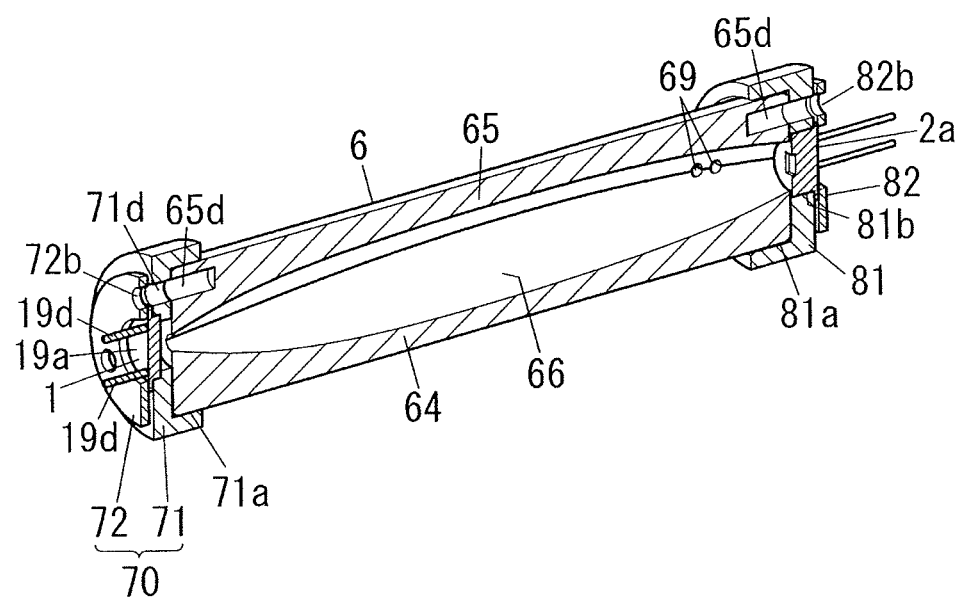
FIG. 52 is a schematic perspective view partially broken of the main part of the infrared type gas sensor according to Embodiment 3.

FIG. 47 shows an infrared detector 2*m* as an eleventh variation of the infrared detector 2*a*. The infrared detector 2*m* has substantially the same basic configuration as the infrared detector 2*h*, but is different from it in a shape of a light blocking member 9. Note that, regarding the infrared detector 2*m*, constituent elements similar to those of the infrared detector 2*h* are assigned with same reference numerals, and explanation thereof will be properly omitted.

The light blocking member 9 of the infrared detector 2*m* is provided with a protrusion 95 that protrudes from a peripheral part 94 of an opening 91 toward a surface side of the infrared detection element 20*h*. Accordingly, the infrared detector 2*m* can prevent infrared obliquely incident on optical filters 30, infrared as stray light or the like from being incident on second pyroelectric elements 23 and 23, and an S/N ratio is improved, thereby more providing higher sensitivity.

The infrared detectors 2*j*, 2*k* and 2*m* each may include any one of the infrared detection elements 20*a*, 20*b*, 20*c*, 20*d*, 20*e*, 20*f*, 20*g* and 20*i*, instead of the infrared detection element 20*h*. In addition, the infrared detector 2*a* may be configured in appropriate combination of two or more of the first to eleventh variations.

Embodiment 3

Hereinafter, an infrared type gas sensor 100 of the embodiment will be described with reference to FIGS. 48 to 53, 54A, 54B, 55 and 56.

The infrared type gas sensor 100 includes an infrared emitting element 10 configured to emit infrared by thermal radiation; and an infrared detection element 20*e*. Accordingly, the infrared type gas sensor 100 can provide higher sensitivity. Regarding the infrared type gas sensor 100, constituent elements similar to those of the infrared detector 2*a* of Embodiment 2 are assigned with same reference numerals, and explanation thereof will be properly omitted.

Because the infrared type gas sensor 100 (hereinafter, also referred to as a "gas sensor 100") detects gas by using that an infrared absorption wavelength depends on a kind of gas as a detection object, it is possible to enhance a gas identification property.

The gas sensor 100 includes the infrared emitting element 10 (refer to FIG. 49), an infrared detector 2*a*, a sample cell 6 (FIGS. 49 to 52) disposed between the infrared emitting element 10 and the infrared detector 2*a*, and a signal processor 4. A first optical filter 31 has a first transmission wavelength band for transmitting infrared having an absorption wavelength of gas as a detection object. A second optical filter 32 has a second transmission wavelength band, without overlapping with the first transmission wavelength band, for transmitting infrared having a reference wavelength as a non-absorption wavelength of the gas. The signal processor 4 is preferably configured to calculate concentration of gas based on a ratio between a first output signal of a first detection element DE1 and a second output signal of a second detection element DE2. Accordingly, the gas sensor 100 can improve measurement accuracy. The signal processor 4 may be configured to calculate concentration of gas based on a difference between the first output signal of the first detection element DE1 and the second output signal of the second detection element DE2. The first transmission wavelength band is a transmission wavelength band of the above-mentioned first filter part 31a (refer to FIG. 21). The second transmission wavelength band is a transmission wavelength band of the above-mentioned third filter part 32a (refer to FIG. 21).

The gas sensor 100 further includes a drive circuit 5 configured to intermittently energize the infrared emitting element 10, and a controller 51 configured to control the drive circuit 5. The signal processor 4 includes a signal processing circuit 45 configured to signal-process a first output signal of a first IC element 41 and a second output signal of a second IC element 42 to calculate concentration of the gas as the detection object.

The signal processing circuit 45 is configured to calculate concentration of gas as a detection object, based on a ratio between the first output signal of the first IC element 41 and the second output signal of the second IC element 42, and generate an output signal corresponding to this concentration. The first output signal of the first IC element 41 is an analog voltage signal obtained by current-voltage converting the output signal of the first detection element DE1 with a current-voltage conversion circuit 41a, and then amplifying the converted signal with an amplifier circuit 41b to be output. The second output signal of the second IC element 42 is an analog voltage signal obtained by current-voltage converting the output signal of the second detection element DE2 with a current-voltage conversion circuit 42a, and then amplifying the converted signal with an amplifier circuit 42b to be output. The signal processing circuit 45 may be configured to calculate concentration of gas as a detection object, based on a difference between the output signal of the first IC element 41 and the output signal of the second IC element 42, and generate an output signal corresponding to this concentration. The gas sensor 100 preferably further includes an infrared light source 1 in which the infrared emitting element 10 is stored in a package 19.

Constituent elements of the gas sensor 100 will be described below in detail.

The infrared emitting element 10 is configured to emit infrared by thermal radiation. Accordingly, the infrared emitting element 10 can emit infrared having a wavelength band wider than that of an infrared light emitting diode. The infrared emitting element 10 can emit infrared having a wide band that includes a center wavelength of the first transmission wavelength band and a center wavelength of the second transmission wavelength band. In other words, the infrared emitting element 10 can emit infrared having a wavelength band that includes the first transmission wavelength band of the first optical filter 31 and the second transmission wavelength band of the second optical filter 32.

The infrared light source 1 includes the infrared emitting element 10 and the package 19 storing therein the infrared emitting element 10. Arrows in FIG. 49 each schematically shows a progression path of infrared emitted from the infrared light source 1 in the gas sensor 100. The infrared emitted from the infrared light source 1 means infrared emitted from the package 19 after emitted from the infrared emitting element 10.

Figure 54A:
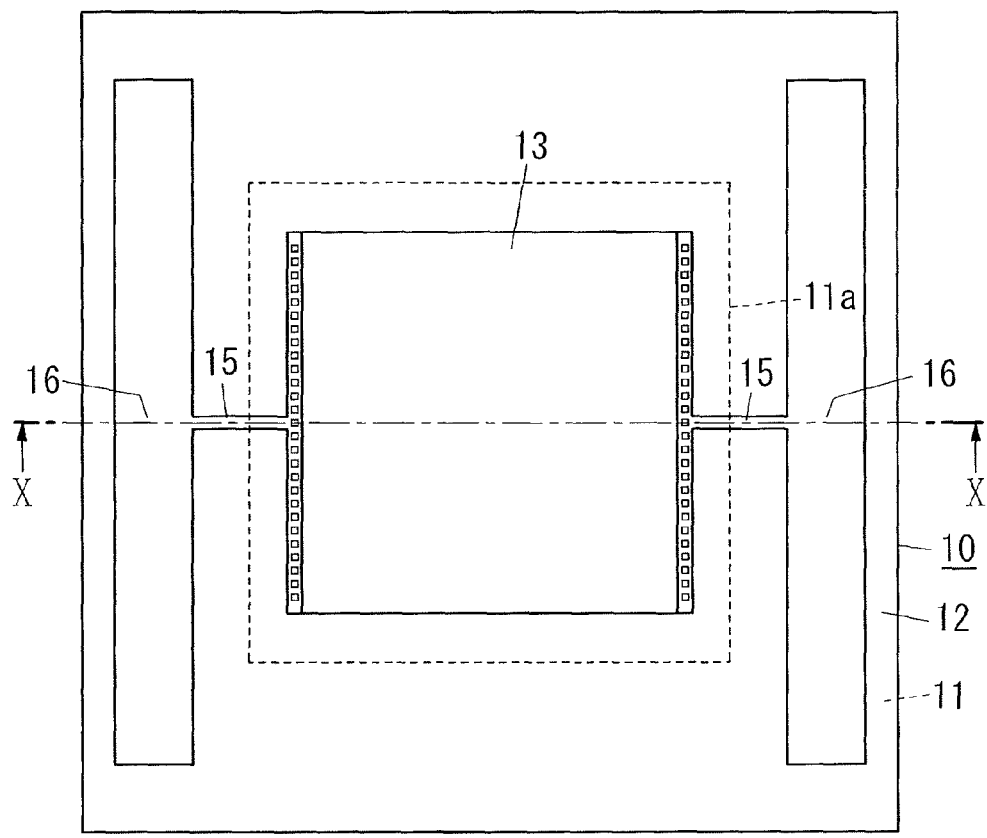
FIG. 54A is a schematic plan view of an infrared emitting element in the infrared type gas sensor according to Embodiment 3.
Figure 54B:
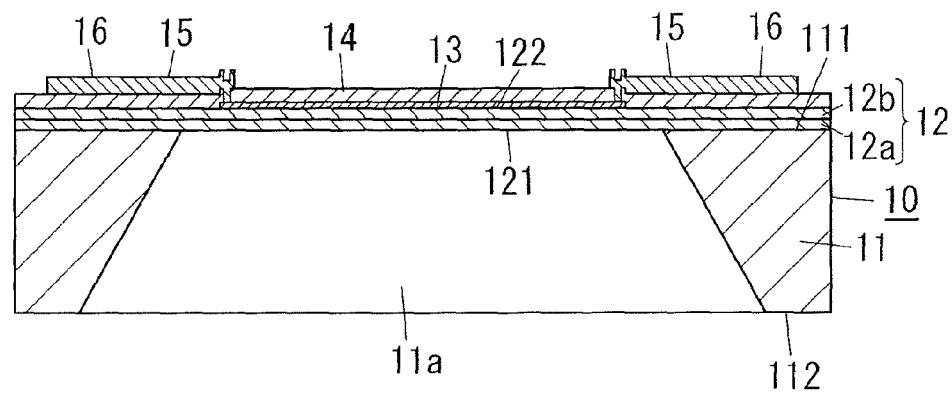
FIG. 54B is a schematic cross-sectional view taken along line X-X of FIG. 54A.

As shown in FIGS. 54A and 54B, the infrared emitting element 10 includes: a semiconductor substrate 11; a thin film part 12 on a surface 111 of the semiconductor substrate 11; and an opening part 11a in the semiconductor substrate 11, which is for exposing partially a first surface 121 of the thin film part 12 facing the semiconductor substrate 11. The infrared emitting element 10 further includes an infrared emitting layer 13 on a second surface 122 of the thin film part 12, which is configured to emit infrared by thermal radiation when energized. The infrared emitting layer 13 emits infrared by thermal radiation when energized by the drive circuit 5.

The infrared emitting element 10 further includes a protective layer 14, and two or more terminals 16 electrically connected with the infrared emitting layer 13. The protective layer 14 is configured to cover the infrared emitting layer 13 on the second surface 122 side of the thin film part 12. The protective layer 14 is formed of material allowing infrared emitted from the infrared emitting layer 13 to pass through. The infrared emitting layer 13 and each terminal 16 are electrically connected with each other via a wiring 15.

The infrared emitting element 10 may be manufactured by using a manufacturing technique such as MEMS (micro electro mechanical systems).

In the infrared emitting element 10, the infrared emitting layer 13 generates heat when energized, and accordingly, infrared is emitted by thermal radiation from the infrared emitting layer 13. The infrared emitting layer 13 of the infrared emitting element 10 is configured as a heating element in the infrared light source 1.

As the semiconductor substrate 11, a single crystal silicon substrate is used. The semiconductor substrate 11 is not limited to the single crystal silicon substrate, but may be e.g., a polycrystalline silicon substrate.

The thin film part 12 may be configured by a laminated film of: a silicon oxide film 12a facing the semiconductor substrate 11; and a silicon nitride film 12b that is stacked on an opposite side of the silicon oxide film 12a from the semiconductor substrate 11. The thin film part 12 may have a single layer structure such as a silicon oxide film or a silicon nitride film.

The infrared emitting layer 13 is formed of tantalum nitride. That is, the infrared emitting layer 13 is configured by a tantalum nitride layer. The material for the infrared emitting layer 13 is not limited to tantalum nitride. Examples of the material include titanium nitride, nickel chromium, tungsten, titanium, thorium, platinum, zirconium, chromium, vanadium, rhodium, hafnium, ruthenium, boron, iridium, niobium, molybdenum, tantalum, osmium, rhenium, nickel, holmium, cobalt, erbium, yttrium, iron, scandium, thulium, palladium and lutetium. As the material for the infrared emitting layer 13, conductive polysilicon may be used. That is, the infrared emitting layer 13 may be configured by a conductive polysilicon layer. As the infrared emitting layer 13, it is preferable that a tantalum nitride layer, a titanium nitride layer, a conductive polysilicon layer or the like be adopted, in view of chemical stability at high temperature, and easiness in design of a sheet resistance. Regarding each of the tantalum nitride layer and the titanium nitride layer, the sheet resistance thereof can be adjusted by changing the composition thereof. Regarding the conductive polysilicon layer, the sheet resistance thereof can be adjusted by changing the impurity concentration thereof.

The opening part 11a is formed as a hole that pierces the semiconductor substrate 11 in a thickness direction thereof. The opening part 11a is formed by etching part of the semiconductor substrate 11 from a back face 112 of the semiconductor substrate 11 to a surface 111 of the semiconductor substrate 11. The opening part 11a is not limited to the hole piercing the semiconductor substrate 11 in the thickness direction thereof, but may be formed as a recess in the surface 111 of the semiconductor substrate 11.

The protective layer 14 is formed of a silicon nitride film. The protective layer 14 is not limited to the silicon nitride film, but may be formed of e.g., a silicon oxide film, or have a lamination structure of a silicon oxide film and a silicon nitride film. The protective layer 14 is a passivation film for securing reliability of moisture resistance or the like. The protective layer 14 preferably has a high transmittance with respect to infrared with a desired wavelength band, which is emitted from the infrared emitting layer 13 when the infrared emitting layer 13 is energized. However, the transmittance is not required to be 100%.

The thickness of the infrared emitting layer 13 is preferably 0.2 µm or less, in view of reducing heat capacity of the infrared emitting layer 13.

The total size of the thicknesses of the thin film part 12, the infrared emitting layer 13 and the protective layer 14 is preferably set to be in a range of e.g., about 0.1 to 1 µm, more preferably to 0.7 µm or less, in view of reducing heat capacity of a lamination structure of the thin film part 12, the infrared emitting layer 13 and the protective layer 14.

As material for the wirings 15, aluminum alloy (Al—Si) is used. The material for the wirings 15 is not limited in particular, but may be e.g., gold, copper or the like. As long as each wiring 15 is formed of material such that a contact part thereof with the infrared emitting layer 13 is in ohmic contact with the infrared emitting layer 13, the structure of each wiring 15 is not limited to a single layer structure, but may be a multilayer structure. For example, the wirings 15 each may have a three-layer structure in which a first layer, a second layer and a third layer are stacked in this order from the infrared emitting layer 13 side in the thickness direction of the wiring. In this case, material for the first layer that is in contact with the infrared emitting layer 13 may be a high melting point metal, material for the second layer may be nickel, and material for the third layer may be gold. The high melting point metal may be e.g., chromium or the like.

Each of the terminals 16 is configured as a pad electrode. As material for the terminals 16, aluminum alloy (Al—Si) is used. The material for the terminals 16 is the same as the material for the wirings 15, but may be different from it.

In the gas sensor 100, the drive circuit 5 adjusts an input voltage to be applied between the terminals 16 of the infrared emitting element 10, and accordingly, it is possible to change Joule heat that is generated in the infrared emitting layer 13, thereby changing temperature of the infrared emitting layer 13. Thus, in the infrared emitting element 10, it is possible to change a peak wavelength of infrared that is emitted from the infrared emitting layer 13 by changing the temperature of the infrared emitting layer 13.

The package 19 includes: a pedestal 19a on which the infrared emitting element 10 is mounted; and a cap 19b that is fixed to the pedestal 19a so as to cover the infrared emitting element 10. The package 19 further includes: a window hole 19r formed in part, in front of the infrared emitting element 10, of the cap 19b; and a window member 19w that is disposed to close the window hole 19r, and allows infrared to pass through.

The pedestal 19a is preferably made of metal. The pedestal 19a is shaped like a disk. The cap 19b is preferably made of metal. The cap 19b is provided with a top plate 19ba shaped like a disk on one end side of a tube part 19bb shaped like a cylinder. The top plate 19ba of the cap 29b is provided in a center thereof with the window hole 19r.

The shape of the pedestal 19a in planar view is a circle, but is not limited to this. The shape may be e.g., a polygon. The shape of the cap 19b may be appropriately changed, according to the shape of the pedestal 19a. For example, when the shape of the pedestal 19a in planar view is a rectangle, the shape of the cap 19b in planar view may be a circle or a rectangle.

The package 19 further includes two lead pins 19d as terminals for power feeding to the infrared emitting element 10. The respective terminals 16 of the infrared emitting element 10 are electrically connected with the lead pins 19d via metal fine wires (not shown).

The two lead pins 19d are supported by the pedestal 19a. The two lead pins 19d are installed to pierce the pedestal 19a in a thickness direction of the pedestal 19a. The two lead pins 19d are fixed to the pedestal 19a with a sealing member (e.g., glass) having an electric insulation property to be electrically insulated from the pedestal 19a.

The window member 19w has a function that allows infrared to pass through. The window member 19w is configured by a silicon substrate shaped like a flat plate. The window member 19w is not limited to a silicon substrate, but may be e.g., a germanium substrate, a zinc sulfide substrate or the like. However, the use of the silicon substrate is advantageous in view of reducing the cost. Alternatively, a lens may be used as the window member 19w.

In the gas sensor 100, by adjusting an input voltage to be applied from the drive circuit 5 to the infrared emitting layer 13 of the infrared emitting element 10, it is possible to change Joule heat to be generated in the infrared emitting layer 13, thereby changing temperature of the infrared emitting layer 13. Thus, in the gas sensor 100, it is possible to change a peak wavelength of infrared that is emitted from the infrared emitting layer 13 by changing the temperature of the infrared emitting layer 13.

The drive circuit 5 is configured to intermittently drive the infrared emitting element 10. The drive circuit 5 is configured to apply to the infrared emitting element 10 a voltage having a prescribed pulse width (hereinafter, also referred to as a "pulse voltage") at constant time intervals. Accordingly, in the gas sensor 100, the pulse voltage is applied periodically from the drive circuit 5 to the infrared emitting element 10. In the infrared emitting element 10, a time period during which the pulse voltage is applied corresponds to an energizing period, and a time period during which no pulse voltage is applied corresponds to a non-energizing period. Note that, driving of the infrared emitting element 10 has the same meaning as driving of the infrared light source 1.

The sample cell 6 is shaped like a tube. The sample cell 6 is provided with two or more vent holes 69 through which an internal space thereof communicates with the outside. Accordingly, in the sample cell 6, gas as a detection object can be introduced therein or discharged outside. The vent holes 69 are preferably formed to pierce the sample cell 6 in a direction orthogonal to an axis direction of the sample cell 6. In a case where the sample cell 6 is shaped like a cylinder, the vent holes 69 are preferably formed to pierce the sample cell 6 in a radial direction of the sample cell 6. In the sample cell 6, through the vent holes 69, the external gas is introduced therein or gas in the internal space is discharged outside.

In the gas sensor 100, the infrared light source 1 is disposed on one end side of the sample cell 6 in the axis direction thereof, and the infrared detector 2a is disposed on the other end side of the sample cell 6 in the axis direction thereof. In the gas sensor 100, e.g., gas as a detection object, or gas including the gas as the detection object is introduced from the outside into the internal space of the sample cell 6 through the vent holes 69. In the gas sensor 100, when concentration of gas as a detection object in the internal space of the sample cell 6 is increased, the light amount of infrared entering the infrared detector 2a is decreased. On the other hand, when concentration of gas as a detection object in the internal space of the sample cell 6 is decreased, the light amount of infrared entering the infrared detector 2a is increased.

In the gas sensor 100, since an infrared absorption wavelength depends on a kind of gas as a detection object, the gas identification property can be enhanced. For example, absorption wavelengths of $CH_4$, $CO_2$, CO and NO are 3.3 μm, 4.3 μm, 4.7 μm and 5.3 μm, respectively. For this reason, in the infrared detector 2a, for example, a center wavelength $\lambda_1$ of a first filter part 31a (refer to FIG. 21) may be set to an absorption wavelength of gas as a detection object, and a center wavelength $\lambda_2$ of a third filter part 32a may be set to a non-absorption wavelength of gas as a detection object and other gas ($H_2O$, $CH_4$, CO, NO and the like). It is preferable that the first and third filter parts 31a and 32a be band-pass filters, a transmission spectrum of each of which has a narrow full width at half maximum. Also, it is preferable that in the gas sensor 100, a difference between the center wavelengths $\lambda_1$ and $\lambda_2$ of the first and third filter parts 31a and 32a be small. Accordingly, the gas sensor 100 can reduce a difference between the light amount of infrared passing through the first filter part 31a and the light amount of infrared passing through the third filter part 32a, when gas as a detection object is absent.

In the first optical filter 31, the center wavelength $\lambda_1$ of the first filter part 31a is preferably set to an absorption wavelength of gas as a detection object. Accordingly, the first optical filter 31 allows infrared having an absorption wavelength of gas as a detection object to pass through at a higher transmittance. In the first filter part 31a, the transmittance with respect to infrared having the center wavelength $\lambda_1$ is preferably 50% or more, more preferably 70% or more, and yet more preferably 90% or more. In the second optical filter 32, the center wavelength $\lambda_2$ of the third filter part 32a is preferably set to a non-absorption wavelength (also referred to as a "reference wavelength") of gas as a detection object and other gas. It is preferable that the transmission wavelength band of the third filter part 32a do not overlap with the transmission wavelength band of the first filter part 31a. In the third filter part 32a, the transmittance with respect to infrared having the center wavelength $\lambda_2$ is preferably 50% or more, more preferably 70% or more, and yet more preferably 90% or more. A difference between the transmittances with respect to infrareds having the center wavelengths $\lambda_1$ and $\lambda_2$ of the first and third filter parts 31a and 32a is preferably small.

In the gas sensor 100, when gas as a detection object is e.g., carbon dioxide, the center wavelength $\lambda_1$ of the first filter part 31a may be set to 4.3 μm, and the center wavelength $\lambda_2$ of the third filter part 32a may be set to 3.9 μm.

The sample cell 6 is formed by combining a pair of half bodies 64 and 65 (refer to FIGS. 50 to 52) divided along a plane including a central axis of the sample cell 6. The half bodies 64 and 65 can be combined together by a technology selected from the group consisting of fitting, ultrasonic welding and glueing.

The sample cell 6 preferably serves also as an optical component for reflecting infrared emitted from the infrared emitting element 10 toward the infrared detector 2a. When made of e.g., synthetic resin, the sample cell 6 is preferably provided on an inner face thereof with a reflection layer for reflecting infrared. The material for the sample cell 6 is not limited to synthetic resin, but may be metal for example.

In other words, it is preferable that the sample cell 6 be shaped like a tube, an inner face of which be configured as a reflection surface 66 (refer to FIGS. 50 and 52) for reflecting infrared emitted from the infrared emitting element 10. When the reflection layer is installed, a surface of the reflection layer may be configured as the reflection surface 66.

The gas sensor 100 includes a holding member 70 (refer to FIGS. 50 to 52) that holds the infrared light source 1, and the holding member 70 is attached to the sample cell 6. The gas sensor 100 further includes a holding member 80 that holds the infrared detector 2a, and the holding member 80 is attached to the sample cell 6.

The holding member 70 includes a cap 71 and a presser plate 72. The cap 71 is shaped like a disk, and provided in an end surface thereof facing the sample cell 6 with a recess 71a into which one end of the sample cell 6 is inserted. The cap 71 is further provided in a center of the bottom of the recess 71a with a through-hole 71b into which the infrared light source 1 is inserted. The presser plate 72 is for pressing the infrared light source 1 against the cap 71.

The holding member 70 is attached to the sample cell 6 by two or more screws (not shown) being inserted into holes 72b of the presser plate 72 and holes 71d of the cap 71 and then screwed in threaded holes 64d and 65d in the one end of the sample cell 6.

The holding member 80 includes a cap 81 and a presser plate 82. The cap 81 is shaped like a disk, and provided in an end surface thereof facing the sample cell 6 with a recess 81a into which another end of the sample cell 6 is inserted. The cap 81 is further provided in a center of the bottom of the recess 81a with a through-hole 81b into which the infrared detector 2a is inserted. The presser plate 82 is for pressing the infrared detector 2a against the cap 81.

The holding member 80 is attached to the sample cell 6 by two or more screws (not shown) being inserted into holes 82b of the presser plate 82 and holes 81c of the cap 81 and then screwed in threaded holes (not shown) in the another end of the sample cell 6.

The structures of the holding members 70 and 80 are not limited in particular. Also, the attachment structures of the holding members 70 and 80 to the sample cell 6 are not limited in particular.

Figure 53:
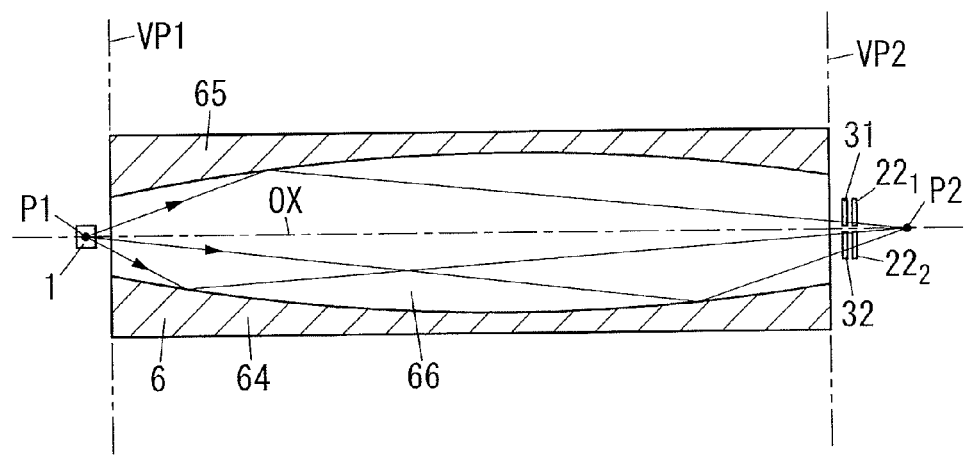
FIG. 53 is a schematic drawing illustrating the infrared type gas sensor according to Embodiment 3.

As shown in FIG. 53, the reflection surface 66 of the sample cell 6 is in a shape of a spheroid a rotation axis of which is a major axis defined as a central axis of the sample cell 6 where both ends of the spheroid in a direction of the major axis are cut by two planes VP1 and VP2 perpendicular to the major axis. Thus, the sample cell 6 has the internal space corresponding to part of the spheroid (long ellipsoid).

As shown in FIG. 53, in the gas sensor 100, it is preferable that the infrared light source 1 be disposed at one focal point P1 (hereinafter, referred to as a "first focal point P1") of the spheroid on the central axis of the sample cell 6, and that the infrared detector 2a be disposed at a position near another focal point P2 (hereinafter, referred to as a "second focal point P2") of the spheroid between the infrared light source 1 and the another focal point P2, on the central axis of the sample cell 6.

In the gas sensor 100, the infrared emitting element 10 is disposed in the vicinity of the first focal point P1 of the spheroid. The "vicinity" means a subset formed of all points in which a distance between the infrared light source 1 and each of the all points in the vicinity of the first focal point P1 is smaller than a prescribed value, and includes a point corresponding to the first focal point P1. The prescribed value may be varied according to a distance between the first focal point P1 and the second focal point P2 of the spheroid. In other words, the infrared emitting element 10 is not required to be exactly disposed at the first focal point P1, but may be at a position that is regarded as substantially the first focal point P1. Rays of infrared emitted obliquely from the infrared emitting element 10 are to be reflected by the reflection surface 66 to be guided and concentrated on the second focal point P2. However, in a case where the infrared detector 2a is disposed at the second focal point P2, infrared is liable to have a large angle of incidence when infrared is reflected in the reflection surface 66 on the another end of the sample cell 6 to enter the first optical filter 31 and the second optical filter 32. In the first optical filter 31 and the second optical filter 32, as the angle of incidence becomes larger, a shift of a transmission spectrum (transmittance-wavelength characteristic) to a small wavelength side becomes larger. As a result, an infrared transmittance in a particular wavelength band containing a selective wavelength may be reduced. Furthermore, in the gas sensor 100, a longer distance between the sample cell 6 and the infrared detector 2a in a direction of the central axis OX of the sample cell 6 causes a larger loss of infrared.

In order to resolve this, in the gas sensor 100, the infrared detector 2a is disposed at a position near the second focal point P2 between the infrared light source 1 and the second focal point P2, on the central axis OX of the sample cell 6. That is, the first and second optical filters 31 and 32, and the first and second light receiving elements $22_1$ and $22_2$ are at a position near the second focal point P2 between the infrared light source 1 and the second focal point P2 in a direction of the central axis OX of the sample cell 6, and the infrared detector 2a is disposed between the sample cell 6 and the second focal point P2. Accordingly, in the gas sensor 100, it is possible to more decrease an angle of incidence of infrared entering the first and second optical filters 31 and 32 following reflection by the reflection surface 66 on the another end of the sample cell 6, compared with a case where a distance between the sample cell 6 and the infrared detector 2a in the direction of the central axis OX of the sample cell 6 is made to be the same as a distance between the sample cell 6 and the infrared detector 2a when the infrared detector 2a is disposed at the second focal point P2. Therefore, the gas sensor 100 can prevent infrared transmittance in the particular wavelength band (a transmission wavelength band in design for each of the first and second optical filters 31 and 32) from decreasing to improve an S/N ratio. It is also possible to prevent infrared passing through the first and second optical filters 31 and 32 from entering not first and second light receiving elements $22_1$ and $22_2$ facing the first and second optical filters 31 and 32 but the first and second temperature compensating elements $23_1$ and $23_2$, thereby preventing occurrence of crosstalk. Therefore, measurement accuracy can be improved. The distance between the sample cell 6 and the infrared detector 2a in the direction of the central axis OX of the sample cell 6 is preferably short, more preferably zero.

Note that, in the gas sensor 100, the shapes, the number and the arrangements of members (the sample cell 6 and the like) disposed between the infrared light source 1 and the infrared detector 2a are not limited in particular.

The signal processor 4 preferably includes a first IC element 41, a second IC element 42 and a signal processing circuit 45.

The signal processing circuit 45 includes an A/D conversion circuit 45a and a concentration calculator 45b. The A/D conversion circuit 45a is configured to perform an analog/digital conversion for each of a first output signal of the first IC element 41 and a second output signal of the second IC element 42, and output the converted signal. The concentration calculator 45b is configured to calculate concentration of gas as a detection object (hereinafter, also referred to as a "measuring object") based on a ratio between the digital first and second output signals digitized by the A/D conversion circuit 45a.

The concentration calculator 45b is configured to calculate the concentration based on a ratio between the first output signal of the first IC element 41 and the second output signal of the second IC element 42. In the concentration calculator 45b, a larger value of "[first output signal of first IC element 41]/[second output signal of second IC element 42]" indicates larger concentration.

The concentration calculator 45b may be configured to calculate concentration of gas as a measuring object, based on a difference between the digital first and second output signals digitized by the A/D conversion circuit 45a. In this case, in the concentration calculator 45b, a larger value of "|[first output signal of first IC element 41]−[second output signal of second IC element 42]|" indicates larger concentration.

In the gas sensor 100, an arithmetic section including the controller 51 and the concentration calculator 45b is configured by a microcomputer with appropriate programs. The arithmetic section may be configured by e.g., a custom-designed chip or the like.

The gas sensor 100 includes a display portion 8 for displaying concentration obtained by calculation in the concentration calculator 45b. The display portion 8 may be configured by e.g., a liquid crystal display, an organic EL display, a display with light-emitting diodes or the like.

In the gas sensor 100, the controller 51 is preferably connected with a setting portion 52 configured to set a resistance value of the infrared light source 1. The controller 51 is configured to determine a prescribed pulse width such that input power from the drive circuit 5 to the infrared light source 1 has a defined value, based on the resistance value set with the setting portion 52.

A measured value of a resistance of the infrared light source 1 means a value obtained by measuring a current flowing through the infrared light source 1 when a voltage is applied in the infrared light source 1 at room temperature (e.g., 25° C.), and further using Ohm's law and the measured current value. The resistance of the infrared light source 1 may be previously measured during manufacturing of the gas sensor 100 or before manufacturing of the gas sensor 100. The measured value of the resistance of the infrared light source 1 is a combined resistance value of: a resistance of the infrared emitting layer 13 of the infrared emitting element 10; and a resistance of an electric circuit between the lead pins 19d of the package 19 and the infrared emitting layer 13. In the infrared light source 1, it is preferable that the resistance value of the infrared emitting layer 13 be sufficiently larger than that of the electric circuit, in view of increasing Joule heat that is generated in the infrared emitting layer 13, in order to allow the infrared emitting layer 13 to efficiently emit infrared. In other words, it is preferable that the resistance value of the electric circuit be small in such an extent that the measured value of the resistance of the infrared light source 1 can be regarded as the resistance value of the infrared emitting layer 13.

The drive circuit 5 is configured to supply, to the infrared emitting element 10, a voltage with a prescribed pulse width determined by the controller 51. Accordingly, even when variation in resistances among infrared emitting elements 10 occurs due to manufacturing irregularities of the infrared emitting elements 10 or the like, it is possible to prevent variation in input powers to the infrared emitting elements 10 by setting, as resistance values, previously-measured values of resistances of infrared light sources 1 with setting portions 52 thereof, when gas sensors 100 are manufactured. It is therefore possible to enhance measurement accuracy.

Incidentally, in the gas sensor 100, the prescribed pulse width of the voltage to be supplied from the drive circuit 5 to the infrared emitting layer 13 is set to be shorter than a response time during which a current is output according to a change in the amount of infrared received by the first pyroelectric element 22 with time.

Figure 55:
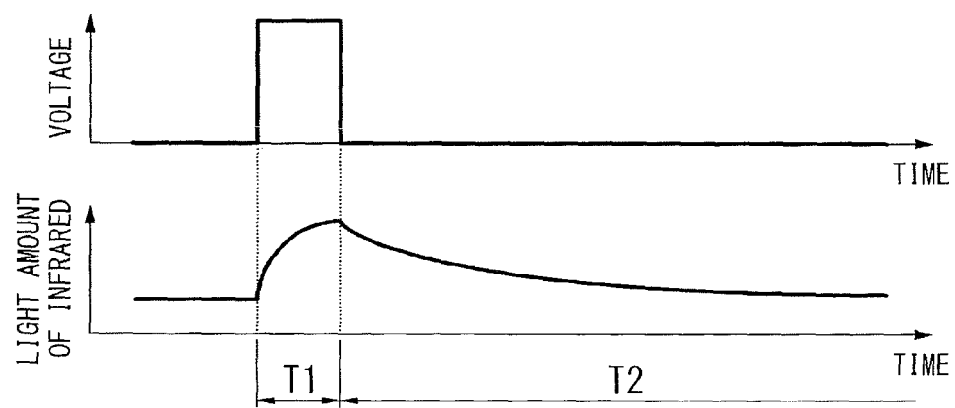
FIG. 55 is a drawing illustrating operation of the infrared emitting element in the infrared type gas sensor according to Embodiment 3.

FIG. 55 schematically shows a relation between a waveform of the pulse voltage applied in the infrared emitting layer 13 and the amount of infrared emitted by the infrared emitting layer 13. The infrared emitting layer 13 is energized only for a time period during which the pulse voltage is applied, and the infrared emitting layer is de-energized for a time period during which no pulse voltage is applied. In FIGS. 55, T1 and T2 respectively represent an energizing period during which the infrared emitting layer 13 is energized and a non-energizing period during which the infrared emitting layer 13 is de-energized after energized.

In the infrared light source 1, gas existing in the opening part 11a of the infrared emitting element 10 is configured as a gas layer. It is preferable that gas configured as the gas layer be inert gas. Examples of the inert gas include $N_2$ gas, Ar gas and the like.

By including the gas layer, the infrared light source 1 can efficiently increase temperature of the infrared emitting layer 13 during the energizing period T1. It is therefore possible to shorten the prescribed pulse width, and further secure a desired amount of infrared. Furthermore, by including the gas layer, the infrared light source 1 can emit infrared during a time period longer than the energizing period T1, also in the non-energizing period T2 following the energizing period. The gas sensor 100 can shorten the prescribed pulse width, thereby reducing power consumption.

When the energizing to the infrared emitting layer 13 is started, the temperature thereof is increased with time. In the infrared emitting layer 13, the amount of infrared is increased in a curved line, depending on the increase in the temperature. When the infrared emitting layer 13 is de-energized, the temperature is decreased. In the infrared emitting layer 13, the amount of infrared is gradually decreased, depending on the decrease in the temperature. A frequency component of the amount of infrared emitted by the infrared emitting layer 13, which is changed with time, for the non-energizing period T2 is determined by the structural thermal time constant of the infrared light source 1 having the gas layer. The non-energizing period T2 is set as a time period sufficiently longer than the energizing period T1. In the gas sensor 100, for example, the energizing period T may be set to be in a range of about 5 ms to 30 ms, and the non-energizing period T2 may be set to be in a range of about 5 sec to 30 sec. The frequency component of the amount of infrared, which is changed with time, for the non-energizing period T2 has a frequency lower than that of a frequency component of the amount of infrared, which is changed with time, for the energizing period T1. Since the gas sensor 100 can emit infrared during a time period longer than the energizing period T1 also in the non-energizing period T2 following the energizing period, it is possible to perform a low frequency response of utilizing infrared with a low frequency decreasing during the non-energizing period T2.

The current-voltage conversion circuit 41a is configured to current-voltage convert a current signal as an output signal of the first detection element DE1, using impedance of the capacitor Cf1 as a capacitive element. Impedance (hereinafter, referred to as "conversion impedance") viewed from the first detection element DE1 can be represented by the following formula (10).

$$Z=1/(2 \cdot \pi \cdot f \cdot C) \quad \text{formula (10)}$$

In the formula (10), Z [Ω] is the conversion impedance, f [Hz] is a frequency, and C [F] is a capacitance of the capacitor Cf1.

Figure 56:
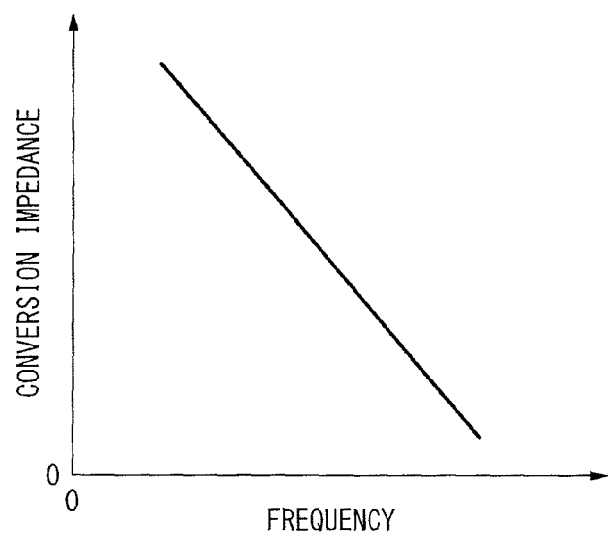
FIG. 56 is a schematic drawing showing a characteristic of an IC element in the infrared type gas sensor according to Embodiment 3.

FIG. 56 schematically shows a frequency characteristic of the conversion impedance Z. FIG. 56 is a semilog graph, and the vertical axis has a logarithmic scale. In FIG. 56, the scale of the horizontal axis and the vertical axis are omitted. As shown in FIG. 56, the conversion impedance Z tends to be linearly increased together with a decrease in a frequency.

In the gas sensor 100, the frequency component of the amount of infrared emitted from the infrared light source 1, which is changed with time, for the non-energizing period T2 of the infrared light source 1 has a frequency lower than that in a case of the infrared light source 1 without the gas layer. As a result, the current-voltage conversion circuit 41a operates in a region of a high conversion impedance Z (gain) with respect to a current signal with a low frequency, which is output from the first detection element DE1, and accordingly, an S/N ratio of the output signal can be improved. Therefore, in the first IC element 41, it is possible to improve an S/N ratio of an output signal of the amplifier circuit 41b that amplifies an output signal of the current-voltage conversion circuit 41a. The first output signal of the first IC element 41 is configured by the output signal of the amplifier circuit 41b.

Regarding the second IC element 42, the current-voltage conversion circuit 42a has the same circuit configuration as that of the current-voltage conversion circuit 41a, and the amplifier circuit 42b has the same circuit configuration as that of the amplifier circuit 41b. Accordingly, an S/N ratio of the second output signal can be also improved.

As described above, the infrared emitting element 10 includes: the semiconductor substrate 11; the thin film part 12 on the surface 111 of the semiconductor substrate 11; and the opening part 11a in the semiconductor substrate 11. The opening part 11a is for exposing partially the first surface 121 of the thin film part 12 facing the semiconductor substrate 11. The infrared emitting element 10 further includes the infrared emitting layer 13 on the second surface 122 of the thin film part 12. The infrared emitting layer 13 is configured to emit infrared by thermal radiation when energized. The infrared emitting element 10 is configured to emit infrared even for the non-energizing period during which the infrared emitting layer 13 is de-energized after energized. The first IC element 41 includes the current-voltage conversion circuit 41a that is configured to current-voltage convert a current signal as the first output signal of the first detection element DE1 of the infrared detection element 20*e*. Also, the second IC element 42 includes the current-voltage conversion circuit 42*a* that is configured to current-voltage convert a current signal as the second output signal of the second detection element DE2 of the infrared detection element 20*e*. Each of the current-voltage conversion circuits 41*a* and 42*a* is preferably configured such that a gain with respect to a frequency component of the amount of infrared emitted by the infrared emitting element 10, which is changed with time, for the non-energizing period of the infrared emitting element 10 is more than a gain with respect to a frequency band, all frequencies of which are higher than the frequency component. The gain of each of the current-voltage conversion circuits 41*a* and 42*a* means the above mentioned conversion impedance Z. The gas sensor 100 can shorten the energizing period during which the infrared emitting layer 13 is energized, thereby reducing electric power for driving the infrared emitting element 10. In addition, since the gain with respect to a frequency component of the amount of infrared emitted by the infrared emitting element 10, which is changed with time, for the non-energizing period of the infrared emitting element 10 is more than a gain with respect to a frequency band, all frequencies of which are higher than the frequency component, the gas sensor 100 can improve an S/N ratio.

The current-voltage conversion circuits 41*a* and 42*a* may have a configuration that each of the capacitors Cf1 and Cf2 is connected in parallel with a switch element, such as a MOSFET, in order to allow a reset operation for periodically performing discharging of electric charges in the capacitors Cf1 and Cf2. In this case, the current-voltage conversion circuits 41*a* and 42*a* can periodically perform discharging of electric charges in the capacitors Cf1 and Cf2 by periodically turning on the switch elements for a prescribed period, respectively. Accordingly, the gas sensor 100 can prevent saturation of the output signals of the current-voltage conversion circuits 41*a* and 42*a*.

The drive circuit 5 is configured to boost a control signal received from the controller 51 to generate a pulse voltage. The drive circuit 5 has a boosting function that boosts an input voltage applied as the control signal. The control signal is a signal for indicating the prescribed pulse width.

In the gas sensors 100, even when the pulse voltage supplied from the drive circuit 5 to the infrared emitting element 10 is the same, temperature of the infrared emitting layer 13 is different, depending on difference in the resistance value of the infrared emitting element 10.

In order to resolve this, in the gas sensor 100, the controller 51 is configured to determine a prescribed pulse width, based on a resistance value that is set with the setting portion 52, such that input power from the drive circuit 5 to the infrared emitting element 10 has a defined value. The setting portion 52 may be configured by e.g., a nonvolatile memory element. A measured value of a resistance of the infrared light source 1 measured separately is set and stored, as a resistance value of the infrared light source 1, into the setting portion 52 in e.g., shipping inspection of the gas sensor 100 or the like. When determining a prescribed pulse width, the controller 51 reads out the resistance value of the infrared light source 1 from the setting portion 52, and substitute the resistance value for a prescribed arithmetic expression to calculate the prescribed pulse width. In addition, in the gas sensor 100, the drive circuit 5 is configured to intermittently supply a pulse voltage having the prescribed pulse width determined by the controller 51 to the infrared emitting element 10. Accordingly, even when variation in resistances among infrared emitting elements 10 occurs due to manufacturing irregularities of the infrared emitting elements 10 or the like, it is possible to prevent variation in input powers to the infrared emitting elements 10 by setting, as resistance values, previously-measured values of resistances of infrared light sources 1 with setting portions 52 in manufacturing of gas sensors 100. It is therefore possible to enhance measurement accuracy. In short, the gas sensor 100 has a function that performs an initial adjustment for a prescribed pulse width, based on a measured value of a resistance of the infrared light source 1, in manufacturing, and it is therefore possible to enhance measurement accuracy.

In the gas sensor 100, since a ratio or a difference between the first and second output signals of the first and second detection elements DE1 and DE2 becomes a value corresponding to concentration of gas (e.g., carbon dioxide) as a detection object, it is possible to precisely calculate, with the signal processor 4, the concentration of gas as a detection object. In view of expanding a dynamic range, it is preferable that the gas sensor 100 be configured to calculate concentration of gas based on a difference between the first and second output signals of the first and second detection elements DE1 and DE2. On the other hand, in view of preventing secular change, it is preferable that the gas sensor 100 be configured to calculate concentration of gas based on a ratio between the first and second output signals of the first and second detection elements DE1 and DE2.

Instead of the infrared detector 2*a*, the gas sensor 100 may include any one of the infrared detector 2*b* as the first variation, the infrared detector 2*c* as the second variation, and the third to sixth variations of the infrared detector 2*a*, described in Embodiment 2. In addition, instead of the infrared detection element 20*e* in the infrared detector 2*a*, the gas sensor 100 may include two infrared detection elements, a kind of which is any one of the infrared detection elements 20*a*, 20*b*, 20*c*, 20*d*, 20*f* and 20*g*.

The gas sensor 100 includes only one set of the first and second detection elements DE1 and DE2, but is not limited to this. The gas sensor 100 may include two or more sets of the first and second detection elements DE1 and DE2. Accordingly, the gas sensor 100 can measure respective concentrations of two or more kinds of gases, corresponding to the number of the two or more sets of the first and second detection elements DE1 and DE2. That is, in the gas sensor 100, the number of kinds of gases as measuring objects is not limited to one, but may be two or more.

The infrared light source 1 is not limited to the configuration with the infrared emitting element 10 and the package 19, but e.g., a halogen lamp or the like may be used.

Figure 57:
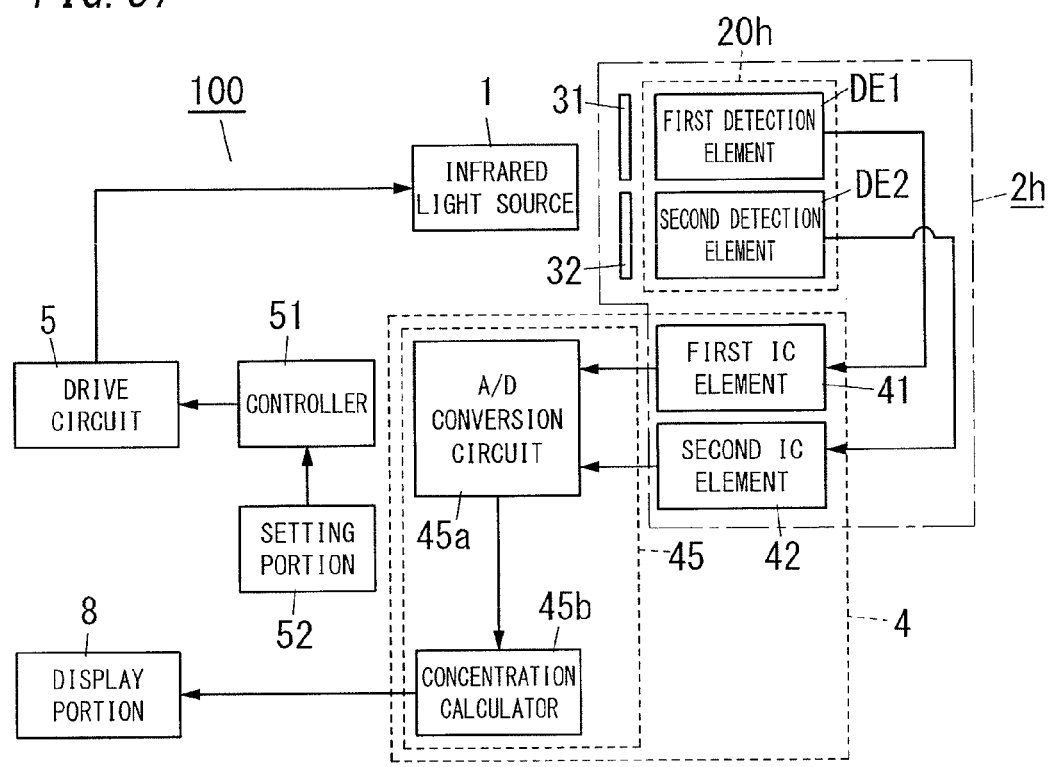
FIG. 57 is a schematic configuration diagram illustrating a first variation of the infrared type gas sensor according to Embodiment 3.
Figure 58:
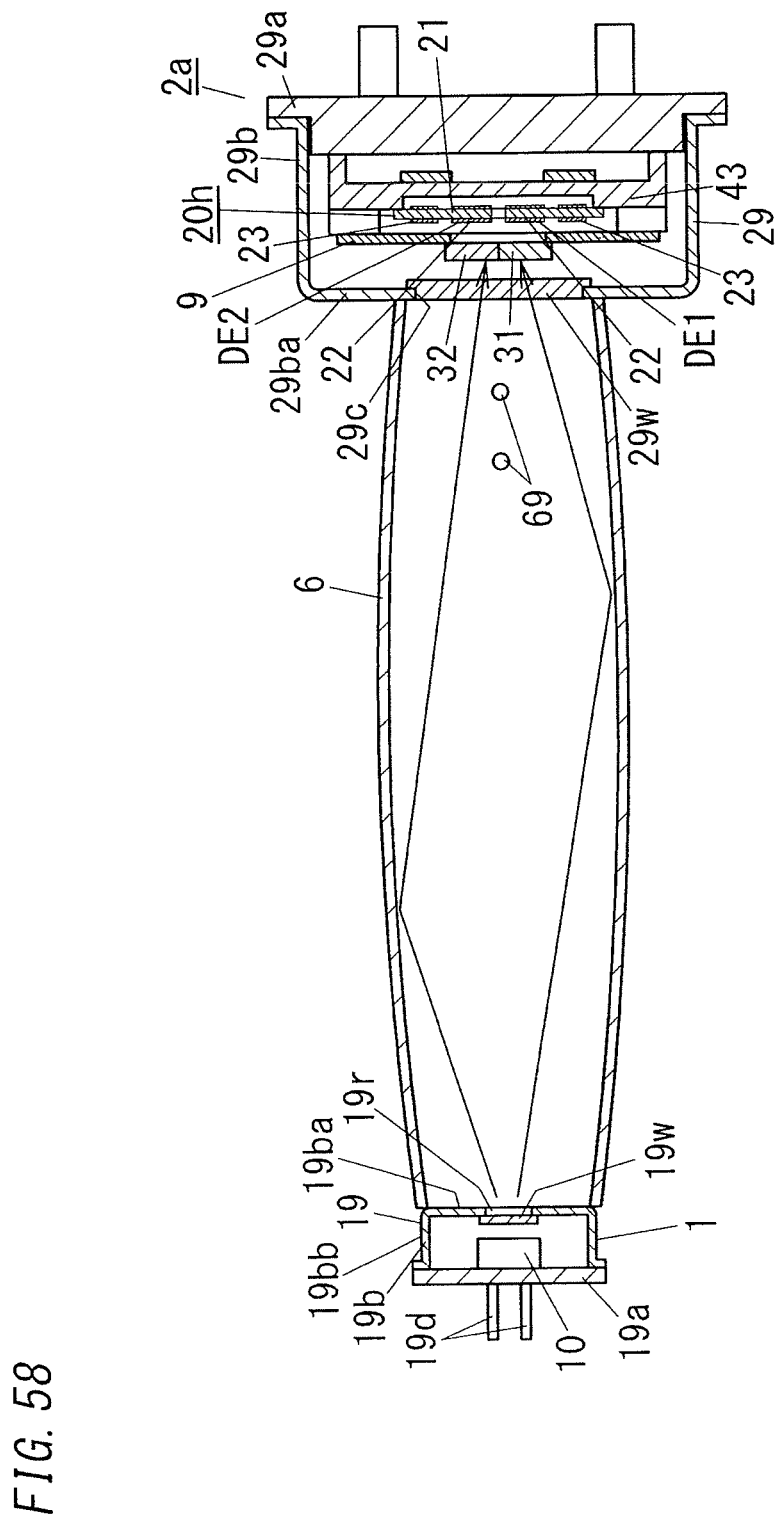
FIG. 58 is a schematic cross-sectional view of a main part in the first variation of the infrared type gas sensor according to Embodiment 3.

Hereinafter, an infrared type gas sensor 101 as a first variation including an infrared detector 2*h* will be described with reference to FIGS. 57 and 58. Note that, regarding the infrared type gas sensor 101 (hereinafter, referred to as a "gas sensor 101"), constituent elements similar to those of the gas sensor 101 are assigned with same reference numerals, and explanation thereof will be properly omitted.

The gas sensor 101 includes an infrared emitting element 10 and an infrared detection element 20*h*. Accordingly, the gas sensor 101 can provide higher sensitivity.

The gas sensor 101 includes an infrared emitting element 10, an infrared detector 2*h*, a sample cell 6 disposed between the infrared emitting element 10 and the infrared detector 2*h*, and a signal processor 4. The gas sensor 101 further includes a drive circuit 5 configured to intermittently energize the infrared emitting element 10, and a controller 51 configured to control the drive circuit 5. The signal processor 4 includes a first IC element 41, a second IC element 42 and a signal processing circuit 45. The signal processing circuit 45 is configured to signal-process a first output signal of the first IC element 41 and a second output signal of the second IC element 42 to calculate concentration of the gas as a detection object.

A first optical filter 31 in the infrared detector 2h has a first transmission wavelength band for transmitting infrared having an absorption wavelength of gas as a measuring object. The first transmission wavelength band is a transmission wavelength band of the above-mentioned first filter part 31a (refer to FIG. 40). In the first optical filter 31, the absorption wavelength of gas as a measuring object is set to a first particular wavelength.

A second optical filter 32 in the infrared detector 2h has a second transmission wavelength band, without overlapping with the first transmission wavelength band, for transmitting infrared having a reference wavelength as a non-absorption wavelength of gas as a measuring object. The second transmission wavelength band is a transmission wavelength band of the above-mentioned third filter part 32a (refer to FIG. 41). In the second optical filter 32, the reference wavelength is set to a second particular wavelength.

The signal processing circuit 45 is configured to calculate concentration of gas as a detection object, based on a ratio between the first output signal of the first IC element 41 and the second output signal of the second IC element 42, and generate an output signal corresponding to this concentration. The first output signal of the first IC element 41 is an analog voltage signal obtained by current-voltage converting a first output signal of a first detection element DE1 with a current-voltage conversion circuit 41a, and then amplifying the converted signal with an amplifier circuit 41b to be output. The second output signal of the second IC element 42 is an analog voltage signal obtained by current-voltage converting a second output signal of a second detection element DE2 with a current-voltage conversion circuit 42a, and then amplifying the converted signal with an amplifier circuit 42b to be output. The signal processing circuit 45 may be configured to calculate concentration of gas as a detection object, based on a difference between the first output signal of the first IC element 41 and the second output signal of the second IC element 42, and generate an output signal corresponding to this concentration.

The infrared light source 1 includes an infrared emitting element 10 configured to emit infrared by thermal radiation, and a package 19 storing therein the infrared emitting element 10. Note that, arrows in FIG. 58 each schematically shows a progression path of infrared emitted from the infrared light source 1 in the gas sensor 101.

In the infrared detector 2h, it is preferable that a combined shape of planar shapes of a first surface electrode 22a of a first pyroelectric element 22 of the first detection element DE1 and a first surface electrode 22a of a first pyroelectric element 22 of the second detection element DE2 be along an intersection line of a surface 21a of a pyroelectric substrate 21 and the above mentioned spheroid. Accordingly, in the gas sensor 101, it is possible to reduce areas of the first pyroelectric elements 22 and 22, which do not contribute to the light receiving of infrared. It is therefore possible to reduce the heat capacity of each of the first pyroelectric elements 22 and 22, thereby providing higher sensitivity.

Instead of the infrared detection element 20h, the gas sensor 101 may include any one of the infrared detection elements 20d, 20e, 20f, 20g, 20i and the like.

Instead of the infrared detector 2h, the gas sensor 101 may include any one of the infrared detector as the eighth variation, the infrared detector 2j as the ninth variation, the infrared detector 2k as the tenth variation, the infrared detector 2m as the eleventh variation, and the like.

The gas sensor 101 includes only one set of the first and second detection elements DE1 and DE2, but is not limited to this. The gas sensor 101 may include two or more sets of the first and second detection elements DE1 and DE2.

Figure 59:
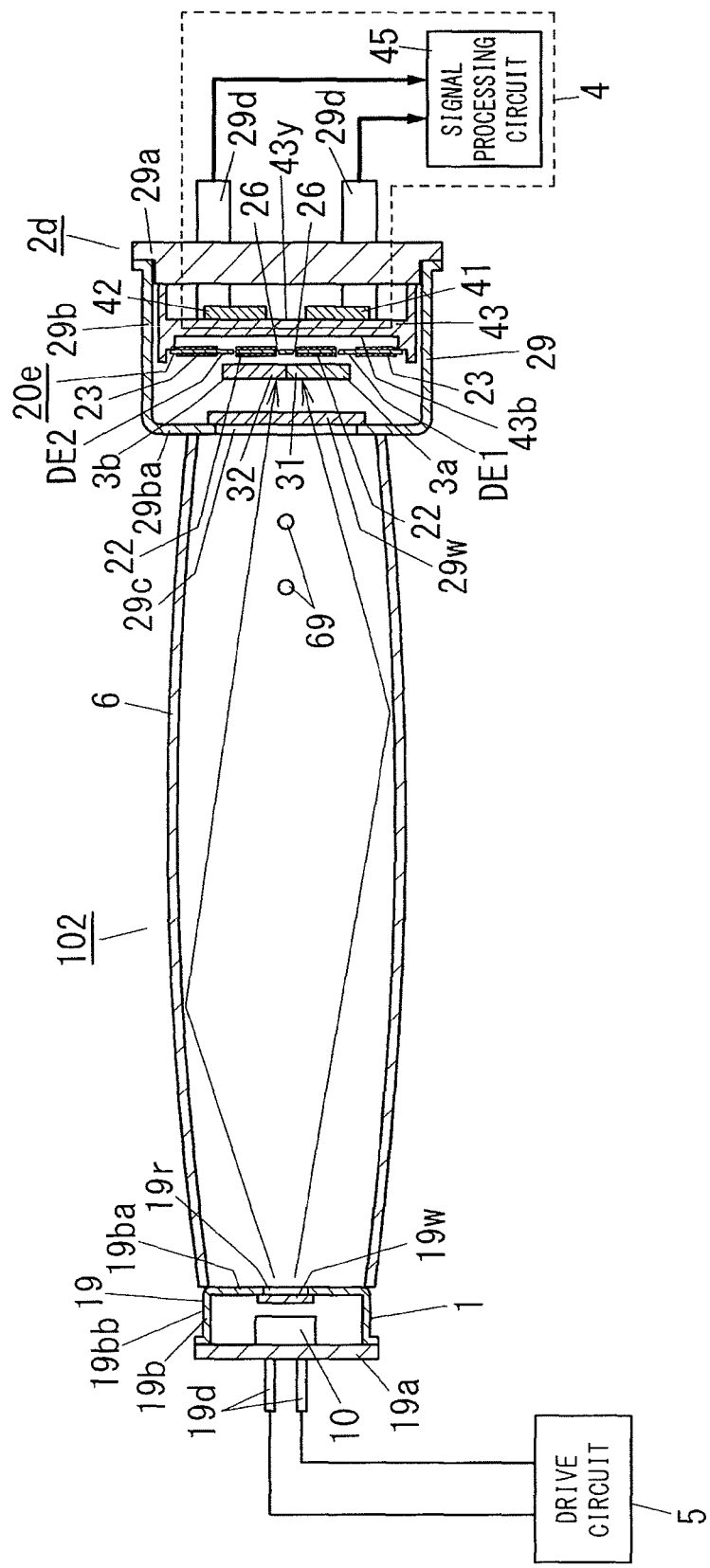
FIG. 59 is a schematic configuration diagram illustrating a second variation of the infrared type gas sensor according to Embodiment 3.
Figure 60:
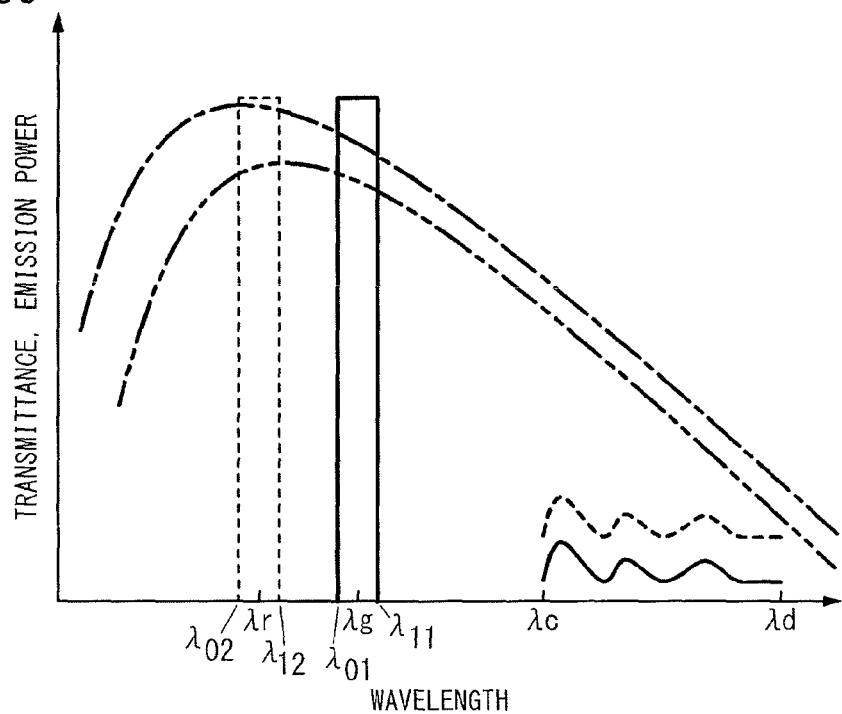
FIG. 60 is a schematic drawing showing a characteristic of the second variation of the infrared type gas sensor according to Embodiment 3.

Hereinafter, an infrared type gas sensor 102 as a second variation will be described with reference to FIGS. 59 and 60. Note that, regarding the infrared type gas sensor 102, constituent elements similar to those of the gas sensor 100 are assigned with same reference numerals, and explanation thereof will be properly omitted.

The infrared type gas sensor 102 includes an infrared emitting element 10 configured to emit infrared by thermal radiation, and an infrared detection element 20e (refer to FIG. 13). Accordingly, the infrared type gas sensor 102 can provide higher sensitivity.

The infrared type gas sensor 102 includes a first light receiving element $22_1$, a second light receiving element $22_2$, a first optical system 3a, a second optical system 3b, a drive circuit 5, and a signal processor 4. The infrared detection element 20e is formed with two sets of a first pyroelectric element 22 for receiving infrared light and a second pyroelectric element 23 for compensating temperature. One set thereof constitutes a first detection element DE1, and another set thereof constitutes a second detection element DE2, and the first and second detection elements DE1 and DE2 are on the single pyroelectric substrate 21. In the infrared detection element 20e, the first pyroelectric element 22 of the first detection element DE1 constitutes the first light receiving element $22_1$, and the first pyroelectric element 22 of the second detection element DE2 constitutes the second light receiving element $22_2$. The drive circuit 5 is configured to drive the infrared emitting element 10. The first optical system 3a is disposed between the infrared emitting element 10 and the first light receiving element $22_1$. The second optical system 3b is disposed between the infrared emitting element 10 and the second light receiving element $22_2$. The signal processor 4 is configured to calculate concentration of gas as a detection object based on a ratio between a first output signal of the first light receiving element $22_1$ and a second output signal of the second light receiving element $22_2$. The first optical system 3a has a first transmission wavelength band $\lambda_{01}$~$\lambda_{11}$ (refer to FIG. 60) for transmitting infrared having an absorption wavelength $\lambda g$ (refer to FIG. 60) of gas as a detection object. The second optical system 3b has a second transmission wavelength band $\lambda_{02}$~$\lambda_{12}$ (refer to FIG. 60) for transmitting infrared having a reference wavelength $\lambda r$ (refer to FIG. 60). The first transmission wavelength band $\lambda_{01}$~$\lambda_{11}$ is different from the second transmission wavelength band $\lambda_{02}$~$\lambda_{12}$. All wavelengths in the second transmission wavelength band $\lambda_{02}$~$\lambda_{12}$ are shorter than all wavelengths in the first transmission wavelength band $\lambda_{01}$~$\lambda_{11}$. In the infrared type gas sensor 102, the first optical system 3a and the second optical system 3b have a common prescribed wavelength band $\lambda c$~$\lambda d$ for compensation (refer to FIG. 60). All wavelengths in the prescribed wavelength band $\lambda c$~$\lambda d$ are longer than all wavelengths in the first and second transmission wavelength bands $\lambda_{01}$~$\lambda_{11}$ and $\lambda_{02}$~$\lambda_{12}$. In the infrared type gas sensor 102, the first optical system 3a has a first average transmittance in the prescribed wavelength band $\lambda c$~$\lambda d$, which is less than a second average transmittance of the second optical system 3b in the prescribed wavelength band $\lambda c$~$\lambda d$. In the infrared type gas sensor 102, the first and second average transmittances are set to compensate a change in a ratio between: a first output signal component of the first light receiving element $22_1$ based on infrared having the first transmission wavelength band $\lambda_{01}$~$\lambda_{11}$; and a second output signal component of the second light receiving element $22_2$ based on infrared having the second transmission wavelength band $\lambda_{02}$~$\lambda_{12}$. The change in the ratio is caused due to a change in emission power of the infrared emitting element 10. Accordingly, the infrared type gas sensor 102 can improve long term stability of measurement accuracy.

It is preferable that the infrared type gas sensor 102 include an infrared detector 2d where the first and second light receiving elements $22_1$ and $22_2$ are stored in a package 29. The infrared detector 2d has the same basic configuration as the infrared detector 2a, and therefore, the constituent elements thereof are assigned with the same reference numerals as those of the infrared detector 2a, and explanation thereof will be properly omitted.

It is preferable that the infrared type gas sensor 102 include a sample cell 6 that is disposed between the infrared emitting element 10 and the infrared detector 2d. Arrows in FIG. 59 each schematically shows a progression path of infrared emitted from an infrared light source 1.

The constituent elements of the infrared type gas sensor 102 (hereinafter, also referred to as a "gas sensor 102") will be described below in more detail. However, explanation of constituent elements similar to those of the gas sensor 100 will be properly omitted.

The infrared emitting element 10 is configured to emit infrared having a wide band that includes the first transmission wavelength band $\lambda_{01}$~$\lambda_{11}$, the second transmission wavelength band $\lambda_{02}$~$\lambda_{12}$, and the prescribed wavelength band $\lambda c$~$\lambda d$.

The drive circuit 5 is preferably configured to intermittently drive the infrared emitting element 10. The drive circuit 5 is preferably configured to pulse-drive the infrared emitting element 10 at a constant voltage or a constant current. For example in the case of pulse-driving the infrared emitting element 10 at a constant voltage, the drive circuit 5 is configured to apply a voltage with a prescribed pulse width (hereinafter, also referred to as a "pulse voltage") to the infrared emitting element 10 at defined time intervals. Accordingly, in the gas sensor 102, the pulse voltage is periodically applied from the drive circuit 5 to the infrared emitting element 10. In the infrared emitting element 10, a time period during which the pulse voltage is applied is an energizing period, and a time period during which no pulse voltage is applied is a non-energizing period. In the case of pulse-driving the infrared emitting element 10 at a constant current, the drive circuit 5 is configured to supply a current with a prescribed pulse width (hereinafter, also referred to as a "pulse current") to the infrared emitting element 10 at defined time intervals.

The first optical system 3a is involved in a propagation path through which infrared is incident on the first light receiving element $22_1$ after emitted from the infrared emitting element 10. The second optical system 3b is involved in a propagation path through which infrared is incident on the second light receiving element $22_2$ after emitted from the infrared emitting element 10.

The first optical system 3a preferably includes a first optical filter 31 as shown in FIG. 40, for example. The second optical system 3b preferably includes a second optical filter 32 as shown in FIG. 41, for example. In the gas sensor 102, in addition to the first optical filter 31, the following elements are defined as constituent elements of the first optical system 3a: a window hole 19r of the infrared light source 1; a window member 19w of the infrared light source 1; a reflection surface 66 of the sample cell 6; a window hole 29c of the infrared detector 2d; and a window member 29w of the infrared detector 2d. Also in the gas sensor 102, in addition to the second optical filter 32, the following elements are defined as constituent elements of the second optical system 3b: the window hole 19r of the infrared light source 1; the window member 19w of the infrared light source 1; the reflection surface 66 of the sample cell 6; the window hole 29c of the infrared detector 2d; and the window member 29w of the infrared detector 2d.

The first optical filter 31 includes a first substrate 31s, a first filter part 31a and a second filter part 31b. Hereinafter, the first filter part 31a is also referred to as a "first narrow-band transmission filter part 31a", and the second filter part 31b is also referred to as a "first wide-band blocking filter part 31b".

The filter characteristic of the first narrow-band transmission filter part 31a is designed so as to define the first transmission wavelength band $\lambda_{01}$~$\lambda_{11}$ of the first optical system 3a. The first wide-band blocking filter part 31b is designed such that an infrared transmittance of the first optical filter 31 in the prescribed wavelength band $\lambda c$~$\lambda d$ is smaller than that in a case of only the first narrow-band transmission filter part 31a. The first wide-band blocking filter part 31b is a filter for absorbing infrared having the prescribed wavelength band $\lambda c$~$\lambda d$ to block the infrared.

The first narrow-band transmission filter part 31a may be for example a band-pass filter that includes a $\lambda_0/4$ multilayer 34, a wavelength selecting layer 35 and a $\lambda_0/4$ multilayer 36.

The $\lambda_0/4$ multilayer 34 is a multilayer in which two kinds of thin films 31aa and 31ab are alternately stacked, which have different refractive indexes and same optical film thicknesses. Each of the optical film thicknesses of the two kinds of thin films 31aa and 31ab in the $\lambda_0/4$ multilayer 34 is set to ¼ of a set wavelength $\lambda_0$ of the $\lambda_0/4$ multilayer 34.

The $\lambda_0/4$ multilayer 36 is a multilayer in which the two kinds of thin films 31aa and 31ab are alternately stacked, which have different refractive indexes and same optical film thicknesses. Each of the optical film thicknesses of the two kinds of thin films 31aa and 31ab in the $\lambda_0/4$ multilayer 36 is set to ¼ of a set wavelength $\lambda_0$ of the $\lambda_0/4$ multilayer 36.

The wavelength selecting layer 35 is interposed between the $\lambda_0/4$ multilayers 34 and 36. An optical film thickness of the wavelength selecting layer 35 is made to be different from each optical film thickness of the thin films 31aa and 31ab, in response to a particular selective wavelength of the wavelength selecting layer 35. The selective wavelength of the wavelength selecting layer 35 is an absorption wavelength $\lambda g$. In the first narrow-band transmission filter part 31a, the transmittance with respect to infrared having the absorption wavelength $\lambda g$ is preferably 50% or more, more preferably 70% or more, and yet more preferably 90% or more.

The second optical filter 32 includes a second substrate 32s, a third filter part 32a and a fourth filter part 32b. Hereinafter, the third filter part 32a is also referred to as a "second narrow-band transmission filter part 32a", and the fourth filter part 32b is also referred to as a "second wide-band blocking filter part 32b".

The filter characteristic of the second narrow-band transmission filter part 32a is designed so as to define the second transmission wavelength band $\lambda_{02}$~$\lambda_{12}$ of the second optical system 3b. The second wide-band blocking filter part 32b is designed such that an infrared transmittance of the second optical filter 32 in the prescribed wavelength band $\lambda c$~$\lambda d$ is smaller than that in a case of only the second narrow-band transmission filter part 32a. The second wide-band blocking filter part 32b is a filter for absorbing infrared having the prescribed wavelength band λc~λd to block the infrared.

The second narrow-band transmission filter part 32a may be for example a band-pass filter that includes a $\lambda_0/4$ multilayer 37, a wavelength selecting layer 38 and a $\lambda_0/4$ multilayer 39. Set wavelengths $\lambda_0$ of the $\lambda_0/4$ multilayers 37 and 38 are the same as each other.

The $\lambda_0/4$ multilayer 37 is a multilayer in which two kinds of thin films 32aa and 32ab are alternately stacked, which have different refractive indexes and same optical film thicknesses. Each of the optical film thicknesses of the two kinds of thin films 32aa and 32ab in the $\lambda_0/4$ multilayer 37 is set to ¼ of a set wavelength $\lambda_0$ of the $\lambda_0/4$ multilayer 37.

The $\lambda_0/4$ multilayer 39 is a multilayer in which the two kinds of thin films 32aa and 32ab are alternately stacked, which have different refractive indexes and same optical film thicknesses. Each of the optical film thicknesses of the two kinds of thin films 32aa and 32ab in the $\lambda_0/4$ multilayer 39 is set to ¼ of a set wavelength $\lambda_0$ of the $\lambda_0/4$ multilayer 39.

The wavelength selecting layer 38 is interposed between the $\lambda_0/4$ multilayers 37 and 39. An optical film thickness of the wavelength selecting layer 38 is made to be different from each optical film thickness of the thin films 32aa and 32ab, in response to a particular selective wavelength of the wavelength selecting layer 38. The selective wavelength of the wavelength selecting layer 38 is a reference wavelength λr. The reference wavelength λr means a non-absorption wavelength of gas as a detection object and other gas. When it is assumed that the gas as the detection object is $CO_2$, examples of the other gas include $H_2O$, $CH_4$, CO, NO and the like. In the second narrow-band transmission filter part 32a, the transmittance with respect to infrared having the reference wavelength λr is preferably 50% or more, more preferably 70% or more, and yet more preferably 90% or more.

Since the second narrow-band transmission filter part 32a includes the wavelength selecting layer 38 between the $\lambda_0/4$ multilayers 37 and 39, it is possible to locally put, in a reflection band, a second transmission wavelength band λr−Δλr~λr+Δλr having a transmission spectral width narrower than a width of the reflection band.

The second wide-band blocking filter part 32b is a multilayer in which two kinds of thin films 32ba and 32bb are alternately stacked, which have different refractive indexes and same optical film thicknesses.

In the first optical filter 31, the center wavelength of the first narrow-band transmission filter part 31a is preferably set to the absorption wavelength λg of gas as a detection object. In the second optical filter 32, the center wavelength of the second narrow-band transmission filter part 32a is preferably set to the reference wavelength λr. In the gas sensor 102, a difference between the absorption wavelength λg and the reference wavelength λr is small. Accordingly, the gas sensor 102 can reduce a difference between a light amount of infrared passing through the first narrow-band transmission filter part 31a and a light amount of infrared passing through the second narrow-band transmission filter part 32a, when gas as a detection object is absent. In the gas sensor 102, when gas as a detection object is e.g., carbon dioxide, the absorption wavelength λg may be set to 4.3 µm, and the reference wavelength λr may be set to 3.9 µm.

The signal processor 4 includes a first IC element 41 for signal-processing the first output signal of the first light receiving element $22_1$ and a second IC element 42 for signal-processing the second output signal of the second light receiving element $22_2$.

The signal processor 4 includes a signal processing circuit 45 configured to generate an output signal, based on a ratio between a first output signal amplified by a first amplifier circuit and a second output signal amplified by a second amplifier circuit. Specifically, the signal processing circuit 45 is configured to calculate concentration of gas as a detection object, based on a ratio between the first output signal amplified by the first amplifier circuit and the second output signal amplified by the second amplifier circuit, and generate an output signal corresponding to this concentration.

Note that, the whole of the signal processor 4 may be installed in the package 29 of the infrared detector 2d. The signal processor 4 may be installed in the package 29 by integrating, as a single-chip IC element, the first and second current-voltage conversion circuits, the first and second amplifier circuits, and the signal processing circuit 45. Alternatively, the signal processor 4 may be configured by appropriately connecting two or more discrete components. The whole of the signal processor 4 may be installed separately from the infrared detector 2d.

Incidentally, in the infrared emitting element 10 configured to emit infrared by thermal radiation, when a reaching temperature of the infrared light source 1 with a same input power is decreased due to a characteristic change of the infrared emitting element 10 with time for example, a radiation spectrum (wavelength dependency of radiant energy) is changed. In FIG. 60 as a schematic drawing, the radiation spectrum of the infrared emitting element 10 at a temperature $T_1$ (e.g., 700 K) is represented by an alternate long and short dashes line, and the radiation spectrum of the infrared emitting element 10 at a temperature $T_2$ ($<T_1$) is represented by an alternate long and two short dashes line. Also in FIG. 60, a transmission spectrum (wavelength dependency of a transmittance) of the first optical system 3a is represented by a solid line, and a transmission spectrum of the second optical system 3b is represented by a broken line. From FIG. 60, it is found that a change in emission power of the infrared emitting element 10 causes a change in a ratio between: a first output signal component of the first light receiving element $22_1$ based on infrared having the first transmission wavelength band $\lambda_{01}$~$\lambda_{11}$; and a second output signal component of the second light receiving element $22_2$ based on infrared having the second transmission wavelength band $\lambda_{02}$~$\lambda_{12}$.

It is preferable that the prescribed wavelength band λc~λd for compensation be appropriately set based on the radiation spectrum of the infrared emitting element 10, and a wavelength region in which infrared leakage occurs due to the filter characteristics of the first and second optical systems 3a and 3b, or the like. The prescribed wavelength band λc~λd may be e.g., a range of 5 µm to 30 µm, but not limited in particular. It may be e.g., a range of 10 µm to 25 µm.

In the gas sensor 102, the first optical system 3a has a first average transmittance in the prescribed wavelength band λc~λd, which is less than a second average transmittance of the second optical system 3b in the prescribed wavelength band λc~λd.

The "first average transmittance" is an average value of transmittances in the prescribed wavelength band λc~λd regarding the first optical system 3a. The "first average transmittance" is obtained by a calculation formula as S2/S1. In this case, Si is an area obtained by integrating a virtual transmission spectrum at which a transmittance is 100% between the shortest wavelength λc and the longest wavelength λd of the prescribed wavelength band λc~λd in the infrared wavelength band. In other words, the area S1 is an area of a region surrounded by a virtual transmission spectrum and the horizontal axis (wavelength axis) of the virtual transmission spectrum. For example when the shortest wavelength λc is 10 μm and the longest wavelength λd is 25 μm, the S1 is "100×(25−10)". S2 is an area obtained by integrating a transmission spectrum of the first optical system 3a, measured by a spectroscope or the like. In other words, the area S2 is an area of a region surrounded by a measured transmission spectrum and the horizontal axis (wavelength axis) of the measured transmission spectrum.

In the gas sensor 102, the first average transmittance is smaller than the second average transmittance. The first average transmittance can be adjusted by changing the number of stacked layers, optical film thicknesses, combination of materials and the like, of the two kinds of the thin films 31ba and 31bb in the first wide-band blocking filter part 31b of the first optical filter 31, for example. The second average transmittance can be adjusted by changing the number of stacked layers, optical film thicknesses, combination of materials and the like, of the two kinds of the thin films 32ba and 32bb in the second wide-band blocking filter part 32b of the second optical filter 32, for example.

In the gas sensor 102, the first and second average transmittances are set to compensate a change in a ratio between: a first output signal component of the first light receiving element $22_1$ based on infrared having first transmission wavelength band $\lambda_{01} \sim \lambda_{11}$; and a second output signal component of the second light receiving element $22_2$ based on infrared having the second transmission wavelength band $\lambda_{02} \sim \lambda_{12}$. The change in the ratio is caused due to a change in emission power of the infrared emitting element 10. Accordingly, the gas sensor 102 can reduce the influence of characteristic deterioration of the infrared emitting element 10 with time on long term stability. In other words, even when a reaching temperature of the infrared emitting element 10 with a same input power thereto is decreased and accordingly S/N ratios of the first and second light receiving element $22_1$ and $22_2$ are changed, the gas sensor 102 can prevent a change in a relative ratio between the S/N ratios of the first and second light receiving element $22_1$ and $22_2$. It is therefore possible to prevent a change in measurement accuracy. Accordingly, the gas sensor 102 can improve long term stability of the measurement accuracy Since a ratio between the first and second output signals of the first and second light receiving element $22_1$ and $22_2$ becomes a value corresponding to concentration of gas (e.g., carbon dioxide) as a detection object, the gas sensor 102 can precisely obtain the concentration of gas as a detection object.

In the gas sensor 102, the drive circuit 5 is preferably configured to pulse-drive the infrared emitting element 10 at a constant voltage or a constant current. The first and second average transmittances of the first and second optical systems 3a and 3b are preferably set to meet the condition of the following formula (11).

[Mathematical 9]

$$0.97 \times \frac{Qg1}{Qr1} < \frac{Qg2}{Qr2} < 1.03 \times \frac{Qg1}{Qr1} \quad \text{formula (11)}$$

Here, Qg1 is energy of infrared that is incident on the first light receiving element $22_1$, after passing through the first transmission wavelength band $\lambda_{01} \sim \lambda_{11}$ of the first optical system 3a, in an initial state of the infrared emitting element 10. Hereinafter, it is regarded that "$\lambda_{01} = \lambda g - \Delta\lambda g$" and "$\lambda_{11} = \lambda g + \Delta\lambda g$". Qr1 is energy of infrared that is incident on the second light receiving element $22_2$, after passing through the second transmission wavelength band $\lambda_{02} \sim \lambda_{12}$ of the second optical system 3b, in the initial state of the infrared emitting element 10. Hereinafter, it is regarded that "$\lambda_{02} = \lambda r - \Delta\lambda r$" and "$\lambda_{12} = \lambda r + \Delta\lambda r$". Qg2 is energy of infrared that is incident on the first light receiving element $22_1$, after passing through the first transmission wavelength band $\lambda g - \Delta\lambda g \sim \lambda g + \Delta\lambda g$ of the first optical system 3a, in a state where the infrared emitting element 10 has been changed with time. Qr2 is energy of infrared that is incident on the second light receiving element $22_2$, after passing through the second transmission wavelength band $\lambda r - \Delta\lambda r \sim \lambda r + \Delta\lambda r$ of the second optical system 3b, in a state where the infrared emitting element 10 has been changed with time.

The formula (11) is a condition determined such that a change in measurement accuracy of the gas sensor 102 is equal to ±3% or less, when a resistance value of the infrared emitting element 10 has been changed by ±10%. Accordingly, the gas sensor 102 can improve long term stability of measurement accuracy.

When the infrared light source 1 includes the above-mentioned infrared emitting element 10 and package 19, the resistance value of the infrared light source 1 is a combined resistance value of: a resistance of the infrared emitting layer 13 of the infrared emitting element 10; and a resistance of an electric circuit between the lead pins 19d of the package 19 and the infrared emitting layer 13. In the infrared light source 1, it is preferable that the resistance value of the infrared emitting layer 13 be sufficiently larger than that of the electric circuit, in view of increasing Joule heat that is generated in the infrared emitting layer 13, in order to allow the infrared emitting layer 13 to efficiently emit infrared. In other words, in the infrared light source 1, it is preferable that the resistance value of the electric circuit be small in such an extent that the resistance value of the infrared light source 1 can be regarded as the resistance value of the infrared emitting layer 13. The resistance value of the infrared emitting element 10 means a resistance value of a resistor part as the infrared emitting layer 13 that emits infrared by heat generation.

Incidentally, the first and second average transmittances of the first and second optical systems 3a and 3b may be set based on the following ideas.

The energy of infrared passing through the first optical system 3a can be represented by the following formula (12).

[Mathematical 10]

$$Pg_1 = \int_{\lambda g - \Delta\lambda g}^{\lambda g + \Delta\lambda g} P(\lambda, T_1) \cdot Tg(\lambda) d\lambda + \int_{\lambda c}^{\lambda d} P(\lambda, T_1) \cdot Tg(\lambda) d\lambda \quad \text{formula (12)}$$

Here, $Pg_1$ is the energy of infrared passing through the first optical system 3a, $T_1$ is absolute temperature [K] of the infrared emitting element 10, and λ is a wavelength [μm]. $P(\lambda, T_1)$ is spectral radiation power [W] of the infrared emitting element 10 according to the Planck's radiation law. $Tg(\lambda)$ is a spectral transmittance [%] of the first optical system 3a. The formula (12) is a formula when transmittances in wavelength bands except for the first transmission wavelength band $\lambda g - \Delta\lambda g \sim \lambda g + \Delta\lambda g$ and the prescribed wavelength band $\lambda c \sim \lambda d$ are regarded as 0%.

A relation between the energy of infrared passing through the first optical system 3a and the first output signal of the first light receiving element $22_1$ can be represented by the following formula (13).

[Mathematical 11]

$$Dg_1 \propto Pg_1 \quad \text{formula (13)}$$

Here, $Dg_1$ is the first output signal of the first light receiving element $22_1$.

The energy of infrared passing through the second optical system $3b$ can be represented by the following formula (14).

[Mathematical 12]

$$Pr_1 = \int_{\lambda r - \Delta \lambda r}^{\lambda r + \Delta \lambda r} P(\lambda, T_1) \cdot Tr(\lambda) d\lambda + \int_{\lambda c}^{\lambda d} P(\lambda, T_1) \cdot Tr(\lambda) d\lambda \quad \text{formula(14)}$$

Here, $Pr_1$ is the energy of infrared passing through the second optical system $3b$, $T_1$ is absolute temperature [K] of the infrared light source 1, and $\lambda$ is a wavelength [µm]. $P(\lambda, T_1)$ is spectral radiation power [W] of the infrared emitting element 10 according to the Planck's radiation law. $Tr(\lambda)$ is a spectral transmittance [%] of the second optical system $3b$. The formula (14) is a formula when transmittances in wavelength bands except for the second transmission wavelength band $\lambda r - \Delta \lambda r \sim \lambda r + \Delta \lambda r$ and the prescribed wavelength band $\lambda c \sim \lambda d$ are regarded as 0%.

A relation between the energy of infrared passing through the second optical system $3b$ and the second output signal of the second light receiving element $22_2$ can be represented by the following formula (15).

[Mathematical 13]

$$Dr_1 \propto Pr_1 \quad \text{formula(15)}$$

Here, $Dr_1$ is the second output signal of the second light receiving element $22_2$.

In the gas sensor 102, when concentration of gas as a detection object is 0 [ppm], the first output signal of the first light receiving element $22_1$ can be represented by the following formula (16).

[Mathematical 14]

$$Dg_1 \propto \int_{\lambda g - \Delta \lambda g}^{\lambda g + \Delta \lambda g} P(\lambda, T_1) \cdot Tg(\lambda) d\lambda + \int_{\lambda c}^{\lambda d} P(\lambda, T_1) \cdot Tg(\lambda) d\lambda = Pg_1 \quad \text{formula(16)}$$

Here, $Dg_1$ is the first output signal of the first light receiving element $22_1$.

In the gas sensor 102, when concentration of gas as a detection object is 0 [ppm], the second output signal of the second light receiving element $22_2$ can be represented by the following formula (17).

[Mathematical 15]

$$Dr_1 \propto \int_{\lambda r - \Delta \lambda r}^{\lambda r + \Delta \lambda r} P(\lambda, T_1) \cdot Tr(\lambda) d\lambda + \int_{\lambda c}^{\lambda d} P(\lambda, T_1) \cdot Tr(\lambda) d\lambda = Pr_1 \quad \text{formula(17)}$$

When absolute temperature of the infrared emitting element 10 is changed from $T_1$ to $T_2$ due to the change of the infrared emitting element 10 with time, the first output signal of the first light receiving element $22_1$ can be represented by the following formula (18).

[Mathematical 16]

$$Dg_1 \propto \int_{\lambda g - \Delta \lambda g}^{\lambda g + \Delta \lambda g} P(\lambda, T_1) \cdot Tg(\lambda) d\lambda + \int_{\lambda c}^{\lambda d} P(\lambda, T_1) \cdot Tg(\lambda) d\lambda = Pg_2 \quad \text{formula(18)}$$

Here, $Dg_2$ is the first output signal of the first light receiving element $22_1$.

Also when the absolute temperature of the infrared emitting element 10 is changed from $T_1$ to $T_2$ due to the change of the infrared emitting element 10 with time, the second output signal of the second light receiving element $22_2$ can be represented by the following formula (19).

[Mathematical 17]

$$Dr_2 \propto \int_{\lambda r - \Delta \lambda r}^{\lambda r + \Delta \lambda r} P(\lambda, T_2) \cdot Tr(\lambda) d\lambda + \int_{\lambda c}^{\lambda d} P(\lambda, T_2) \cdot Tr(\lambda) d\lambda = Pr_2 \quad \text{formula(19)}$$

An ideal condition for eliminating an error depending on the change from $T_1$ to $T_2$ in the absolute temperature of the infrared emitting element 10 can be represented by the following formula (20).

[Mathematical 18]

$$\frac{Dg_1}{Dr_1} = \frac{Dg_2}{Dr_2} \quad \text{formula (20)}$$

The formula (20) can be deformed as the following formula (21) by using the formulas (16) to (19).

[Mathematical 19]

formula (21)

$$\frac{\int_{\lambda g - \Delta \lambda g}^{\lambda g + \Delta \lambda g} P(\lambda, T_1) \cdot Tg(\lambda) d\lambda + \int_{\lambda c}^{\lambda d} P(\lambda, T_1) \cdot Tg(\lambda) d\lambda}{\int_{\lambda r - \Delta \lambda r}^{\lambda r + \Delta \lambda r} P(\lambda, T_1) \cdot Tr(\lambda) d\lambda + \int_{\lambda c}^{\lambda d} P(\lambda, T_1) \cdot Tr(\lambda) d\lambda} =$$

$$\frac{\int_{\lambda g - \Delta \lambda g}^{\lambda g + \Delta \lambda g} P(\lambda, T_2) \cdot Tg(\lambda) d\lambda + \int_{\lambda c}^{\lambda d} P(\lambda, T_2) \cdot Tg(\lambda) d\lambda}{\int_{\lambda r - \Delta \lambda r}^{\lambda r + \Delta \lambda r} P(\lambda, T_2) \cdot Tr(\lambda) d\lambda + \int_{\lambda c}^{\lambda d} P(\lambda, T_2) \cdot Tr(\lambda) d\lambda} =$$

$$\frac{\left[\int_{\lambda g - \Delta \lambda g}^{\lambda g + \Delta \lambda g} P(\lambda, T_2) \cdot Tg(\lambda) d\lambda + \int_{\lambda c}^{\lambda d} P(\lambda, T_2) \cdot Tg(\lambda) d\lambda\right] - \left[\int_{\lambda g - \Delta \lambda g}^{\lambda g + \Delta \lambda g} P(\lambda, T_1) \cdot Tg(\lambda) d\lambda + \int_{\lambda c}^{\lambda d} P(\lambda, T_1) \cdot Tg(\lambda) d\lambda\right]}{\left[\int_{\lambda r - \Delta \lambda r}^{\lambda r + \Delta \lambda r} P(\lambda, T_2) \cdot Tr(\lambda) d\lambda + \int_{\lambda c}^{\lambda d} P(\lambda, T_2) \cdot Tr(\lambda) d\lambda\right] - \left[\int_{\lambda r - \Delta \lambda r}^{\lambda r + \Delta \lambda r} P(\lambda, T_1) \cdot Tr(\lambda) d\lambda + \int_{\lambda c}^{\lambda d} P(\lambda, T_1) \cdot Tr(\lambda) d\lambda\right]} =$$

$$\frac{\int_{\lambda g - \Delta \lambda g}^{\lambda g + \Delta \lambda g} (P(\lambda, T_2) - P(\lambda, T_1)) \cdot Tg(\lambda) d\lambda + \int_{\lambda c}^{\lambda d} (P(\lambda, T_2) - P(\lambda, T_1)) \cdot Tg(\lambda) d\lambda}{\int_{\lambda r - \Delta \lambda r}^{\lambda r + \Delta \lambda r} (P(\lambda, T_2) - P(\lambda, T_1)) \cdot Tr(\lambda) d\lambda + \int_{\lambda c}^{\lambda d} (P(\lambda, T_2) - P(\lambda, T_1)) \cdot Tr(\lambda) d\lambda}$$

In the gas sensor 102, it is preferable to set the transmittance $Tg(\lambda)$ of the first optical system $3a$ in the first transmission wavelength band $\lambda g - \Delta \lambda g \sim \lambda g + \Delta \lambda g$ and the transmittance $Tg(\lambda)$ of the first optical system $3a$ in the prescribed wavelength band $\lambda c \sim \lambda d$ so as to meet the formula (21). Also in the gas sensor 102, it is preferable to set the transmittance $Tr(\lambda)$ of the second optical system $3b$ in the second transmission wavelength band $\lambda r - \Delta \lambda r \sim \lambda r + \Delta \lambda r$ and the transmittance $Tr(\lambda)$ of the second optical system $3b$ in the prescribed wavelength band $\lambda c \sim \lambda d$ so as to meet the formula (21).

The transmittance $Tg(\lambda)$ of the first optical system $3a$ in the first transmission wavelength band $\lambda g - \Delta \lambda g \sim \lambda g + \Delta \lambda g$ is preferably set such that an S/N ratio of the first output signal becomes larger when gas as a detection object is present. The transmittance $Tr(\lambda)$ of the second optical system $3b$ in the second transmission wavelength band $\lambda r - \Delta \lambda r \sim \lambda r + \Delta \lambda r$ is preferably set such that an error in the signal processor 4 becomes smaller.

The transmittances $Tg(\lambda)$ and $Tr(\lambda)$ (of the first and second optical systems $3a$ and $3b$ in the prescribed wavelength band $\lambda c \sim \lambda d$) are preferably set so as to meet the formula (11). Note that, the transmittances Tg(λ) and Tr(λ) (of the first and second optical systems 3a and 3b in the prescribed wavelength band λc~λd) may be set in a range in which an aging stability of measurement accuracy of the gas sensor 102 can be obtained, when the transmittances are 0% or equal to each other.

In the gas sensor 102, when it is assumed that there is no infrared that passes through the first optical system 3a in the prescribed wavelength band λc~λd in a case where concentration of gas as a detection object is 0 [ppm], the first output signal of the first light receiving element $22_1$ can be represented by the following formula (22).

[Mathematical 20]

$$Dg_{01} \propto \int_{\lambda g - \Delta \lambda g}^{\lambda g + \Delta \lambda g} P(\lambda, T_1) \cdot Tg(\lambda) d\lambda = Pg_{01} \qquad \text{formula(22)}$$

Here, $Dg_{01}$ is the first output signal of the first light receiving element $22_1$. $Pg_{01}$ is energy of infrared that passes through the first optical system 3a.

Also in the gas sensor 102, when it is assumed that there is no infrared that passes through the second optical system 3b in the prescribed wavelength band λc~λd in a case where concentration of gas as a detection object is 0 [ppm], the second output signal of the second light receiving element $22_2$ can be represented by the following formula (23).

[Mathematical 21]

$$Dr_{01} \propto \int_{\lambda r - \Delta \lambda r}^{\lambda r + \Delta \lambda r} P(\lambda, T_1) \cdot Tr(\lambda) d\lambda = Pr_{01} \qquad \text{formula(23)}$$

Here, $Dr_{01}$ is the second output signal of the second light receiving element $22_2$. $Pr_{01}$ is energy of infrared that passes through the second optical system 3b.

In the gas sensor 102, when setting an infrared transmittance of the first optical system 3a in the prescribed wavelength band λc~λd in a case where concentration of gas as a detection object is 0 [ppm], the first output signal of the first light receiving element $22_1$ can be represented by the following formula (24).

[Mathematical 22]

$$Dg_{11} \propto \int_{\lambda g - \Delta \lambda g}^{\lambda g + \Delta \lambda g} P(\lambda, T_1) \cdot Tg(\lambda) d\lambda + \int_{\lambda c}^{\lambda d} P(\lambda, T_1) \cdot Tg(\lambda) d\lambda = Pg_{11} \qquad \text{formula(24)}$$

Here, $Dg_{11}$ is the first output signal of the first light receiving element $22_1$. $Pg_{11}$ is energy of infrared that passes through the first optical system 3a.

Also in the gas sensor 102, when setting an infrared transmittance of the second optical system 3b in the prescribed wavelength band λc~λd in a case where concentration of gas as a detection object is 0 [ppm], the second output signal of the second light receiving element $22_2$ can be represented by the following formula (25).

[Mathematical 23]

$$Dr_{11} \propto \int_{\lambda r - \Delta \lambda r}^{\lambda r + \Delta \lambda r} P(\lambda, T_1) \cdot Tr(\lambda) d\lambda + \int_{\lambda c}^{\lambda d} P(\lambda, T_1) \cdot Tr(\lambda) d\lambda = Pr_{11} \qquad \text{formula(25)}$$

Here, $Dr_{11}$ is the second output signal of the second light receiving element $22_2$. $Pr_{11}$ is energy of infrared that passes through the second optical system 3b.

In the gas sensor 102, when it is assumed that there is no infrared that passes through the first optical system 3a in the prescribed wavelength band λc~λd in a case where concentration of gas as a detection object is 0 [ppm] and the infrared emitting element 10 has been changed with time, the first output signal of the first light receiving element $22_1$ can be represented by the following formula (26).

[Mathematical 24]

$$Dg_{02} \propto \int_{\lambda g - \Delta \lambda g}^{\lambda g + \Delta \lambda g} P(\lambda, T_2) \cdot Tg(\lambda) d\lambda = Pg_{01} \qquad \text{formula(26)}$$

Here, $Dg_{02}$ is the first output signal of the first light receiving element $22_1$. $Pg_{02}$ is energy of infrared that passes through the first optical system 3a.

In the gas sensor 102, when it is assumed that there is no infrared that passes through the second optical system 3b in the prescribed wavelength band λc~λd in a case where concentration of gas as a detection object is 0 [ppm] and the infrared emitting element 10 has been changed with time, the second output signal of the second light receiving element $22_2$ can be represented by the following formula (27).

[Mathematical 25]

$$Dr_{02} \propto \int_{\lambda r - \Delta \lambda r}^{\lambda r + \Delta \lambda r} P(\lambda, T_2) \cdot Tr(\lambda) d\lambda = Pr_{02} \qquad \text{formula(27)}$$

Here, $Dr_{02}$ is the second output signal of the second light receiving element $22_2$. $Pr_{02}$ is energy of infrared that passes through the second optical system 3b.

In the gas sensor 102, when setting an infrared transmittance of the first optical system 3a in the prescribed wavelength band λc~λd in a case where concentration of gas as a detection object is 0 [ppm] and the infrared emitting element 10 has been changed with time, the first output signal of the first light receiving element $22_1$ can be represented by the following formula (28).

[Mathematical 26]

$$Dg_{12} \propto \int_{\lambda g - \Delta \lambda g}^{\lambda g + \Delta \lambda g} P(\lambda, T_2) \cdot Tg(\lambda) d\lambda + \int_{\lambda c}^{\lambda d} P(\lambda, T_2) \cdot Tg(\lambda) d\lambda = Pg_{12} \qquad \text{formula(28)}$$

Here, $Dg_{12}$ is the first output signal of the first light receiving element $22_1$. $Pg_{12}$ is energy of infrared that passes through the first optical system 3a.

In the gas sensor 102, when setting an infrared transmittance of the second optical system 3b in the prescribed wavelength band λc~λd in a case where concentration of gas as a detection object is 0 [ppm] and the infrared emitting element 10 has been changed with time, the second output signal of the second light receiving element $22_2$ can be represented by the following formula (29).

[Mathematical 27]

$$Dr_{12} \propto \int_{\lambda r - \Delta \lambda r}^{\lambda r + \Delta \lambda r} P(\lambda, T_2) \cdot Tr(\lambda) d\lambda + \int_{\lambda c}^{\lambda d} P(\lambda, T_2) \cdot Tr(\lambda) d\lambda = Pr_{12} \qquad \text{formula(29)}$$

Here, $Dr_{12}$ is the second output signal of the second light receiving element $22_2$. $Pr_{12}$ is energy of infrared that passes through the second optical system 3b.

An ideal condition for eliminating an error depending on the change from $T_1$ to $T_2$ in the absolute temperature of the infrared emitting element 10 can be represented by the following formula (31) with the following formula (30) as an assumption.

[Mathematical 28]

$$\frac{Dg_{01}}{Dr_{01}} - \frac{Dg_{02}}{Dr_{02}} = \frac{\int_{\lambda g - \Delta \lambda g}^{\lambda g + \Delta \lambda g} (P(\lambda, T_2) - P(\lambda, T_1)) \cdot Tg(\lambda) d\lambda}{\int_{\lambda r - \Delta \lambda r}^{\lambda r + \Delta \lambda r} (P(\lambda, T_2) - P(\lambda, T_1)) \cdot Tr(\lambda) d\lambda} \qquad \text{formula (30)}$$

[Mathematical 29]

$$\frac{Dg_{11}}{Dr_{11}} - \frac{Dg_{12}}{Dr_{12}} = \frac{\int_{\lambda g-\Delta\lambda g}^{\lambda g+\Delta\lambda g} P(\lambda, T_1) \cdot Tg(\lambda)d\lambda + \int_{\lambda c}^{\lambda d} P(\lambda, T_1) \cdot Tg(\lambda)d\lambda}{\int_{\lambda r-\Delta\lambda r}^{\lambda r+\Delta\lambda r} P(\lambda, T_1) \cdot Tr(\lambda)d\lambda + \int_{\lambda c}^{\lambda d} P(\lambda, T_1) \cdot Tr(\lambda)d\lambda} \quad \text{formula (31)}$$

$$\frac{\int_{\lambda g-\Delta\lambda g}^{\lambda g+\Delta\lambda g} P(\lambda, T_2) \cdot Tg(\lambda)d\lambda + \int_{\lambda c}^{\lambda d} P(\lambda, T_2) \cdot Tg(\lambda)d\lambda}{\int_{\lambda r-\Delta\lambda r}^{\lambda r+\Delta\lambda r} P(\lambda, T_2) \cdot Tr(\lambda)d\lambda + \int_{\lambda c}^{\lambda d} P(\lambda, T_2) \cdot Tr(\lambda)d\lambda} = 0$$

Accordingly, in the gas sensor 102, the transmittance of the first optical system 3a in the prescribed wavelength band λc~λd and the transmittance of the second optical system 3b in the prescribed wavelength band λc~λd may be set so as to meet the following formula (32).

[Mathematical 30]

$$\left| \frac{Dg_{01}}{Dr_{01}} - \frac{Dg_{02}}{Dr_{02}} \right| > \left| \frac{Dg_{11}}{Dr_{11}} - \frac{Dg_{12}}{Dr_{12}} \right| \quad \text{formula (32)}$$

Incidentally, when concentration of gas as a detection object is 0 [ppm], the light power of infrared having the first transmission wavelength band λg−Δλg~λg+Δλg, which is received by the first light receiving element $22_1$, can be represented by the following formula (33).

[Mathematical 31]

$$Qgs = \int_{\lambda g-\Delta\lambda g}^{\lambda g+\Delta\lambda g} P(\lambda, T_1) \cdot Tg(\lambda)d\lambda \quad \text{formula (33)}$$

Here, Qgs is light power with respect to infrared passing through the first transmission wavelength band λg−Δλg~λg+Δλg of the first optical system 3a, of light power received by the first light receiving element $22_1$.

Also when concentration of gas as a detection object is 0 [ppm], the light power of infrared having the second transmission wavelength band λr~Δλr~λr+Δλr, which is received by the second light receiving element $22_2$, can be represented by the following formula (34).

[Mathematical 32]

$$Qrs = \int_{\lambda r-\Delta\lambda r}^{\lambda r+\Delta\lambda r} P(\lambda, T_1) \cdot Tr(\lambda)d\lambda \quad \text{formula (34)}$$

Here, Qrs is light power with respect to infrared passing through the second transmission wavelength band λr−Δλr~λr+Δλr of the second optical system 3b.

Also when concentration of gas as a detection object is 0 [ppm], the light power of infrared having the prescribed wavelength band λc~λd, which is received by the first light receiving element $22_1$, can be represented by the following formula (35).

[Mathematical 33]

$$Qgr = \int_{\lambda c}^{\lambda d} P(\lambda, T_1) \cdot Tg(\lambda)d\lambda \quad \text{formula (35)}$$

Here, Qgr is light power with respect to infrared passing through the prescribed wavelength band λc~λd of the first optical system 3a.

Also when concentration of gas as a detection object is 0 [ppm], the light power of infrared having the prescribed wavelength band λc~λd, which is received by the second light receiving element $22_2$, can be represented by the following formula (36).

[Mathematical 34]

$$Qrr = \int_{\lambda c}^{\lambda d} P(\lambda, T_1) \cdot Tr(\lambda)d\lambda \quad \text{formula (36)}$$

Here, Qrr is light power with respect to infrared passing through the prescribed wavelength band λc~λd of the second optical system 3b.

In the gas sensor 102, it is preferable that the first and second average transmittances be set to meet the following first and second conditions, when the absolute temperature of the infrared emitting element 10, the absorption wavelength and the reference wavelength are respectively represented as T [K], λg [μm] and λr [μm]; Qgr, Qrs and Qrr are defined as above; and R1 is Qrr/Qrs.

The first condition:

$$Qrs > Qrr > 0 \quad \text{[Mathematical 35]}$$

The second condition:

[Mathematical 36]

In a case of $R1 < 0.3 \times \frac{\lambda g - \lambda r}{0.36}$ $Qrr > Qgr$ is formed.

In a case of $1 > R1 \geq 0.3 \times \frac{\lambda g - \lambda r}{0.36}$ $(x + 0.3) \times \frac{\lambda g - \lambda r}{0.36} \geq \frac{Qrr - Qgr}{Qrs} \geq x \times \frac{\lambda g - \lambda r}{0.36}$ is formed.

In this case, $$x = \frac{T - 300}{4000} \times (R1 - 0.3)$$

Here, x is a coefficient.

Thus, it is possible to improve the aging stability of measurement accuracy of the gas sensor 102.

The inventors of the present application performed various analyses of the characteristics of the gas sensor 102, and then derived the above mentioned first and second conditions based on the analyzed results. The preconditions in the various analyses are as follows.

It was assumed that the radiation temperature of the infrared emitting element 10 was about 600 to 2500 K, based on that the emission energy distribution of the infrared emitting element 10 was subject to the Planck's radiation law, and based on the transmittances of the first and second optical systems 3a and 3b. The first transmission wavelength band λg−Δλg~λg+Δλg was set within a range of about 3 to 6 μm, as a practical range in the case of an infrared type gas sensor. The prescribed wavelength band λc~λd was set to 10 to 25 μm, in which infrared is hardly absorbed by steam. In addition, it was assumed that an allowable ratio of a change in the resistance value of the infrared emitting element 10 due to the change of the infrared emitting element 10 with time was ±3%. It was assumed that the infrared light source 1 was pulse-driven at a constant voltage or a constant current.

A gas sensor as a third variation of the gas sensor 100 has the same basic configuration as that of the gas sensor 102 that is the second variation, for example. However, the gas sensor is different from the gas sensor 102 in that a window member 19w of an infrared light source 1 is configured by a third optical filter for adjusting a cut-off rate with respect to infrared having a prescribed wavelength band λc~λd. The third optical filter may be provided as a non-reflection coating filter obtained by coating a third substrate with an antireflection film for reducing a reflectivity with respect to infrared having a first transmission wavelength band λg−Δλg~λg+Δλg and a second transmission wavelength band λr−Δλr~λr+Δλr. For example, the third optical filter can adjust, to almost 0%, a reflectivity with respect to infrared having an absorption wavelength λg and a reference wavelength λr, and further, to 40~80%, a reflectivity with respect to infrared having the prescribed wavelength band λc~λd. Examples of the third substrate include a silicon substrate, a germanium substrate, a sapphire substrate and the like.

In the gas sensor as the third variation, the third optical filter is configured as parts of first and second optical systems 3a and 3b. Thus, in the gas sensor as the third variation, it is possible to more reduce a transmittance with respect to infrared having the prescribed wavelength band λc~λd for each of the first and second optical systems 3a and 3b, compared with the gas sensor 102 as the second variation.

Figure 61:
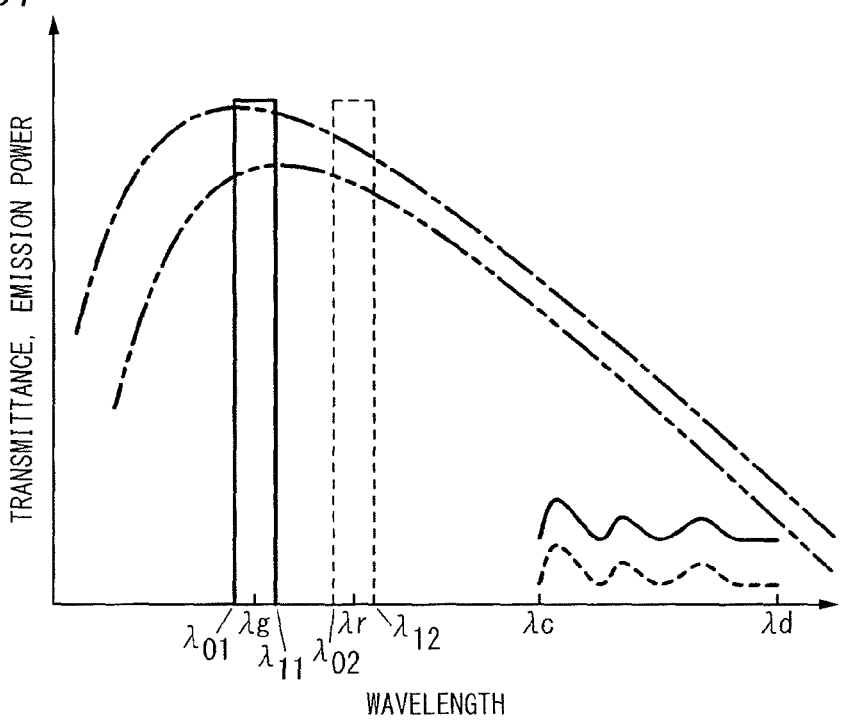
FIG. 61 is a schematic drawing showing a characteristic of a third variation of the infrared type gas sensor according to Embodiment 3.
Figure 62:
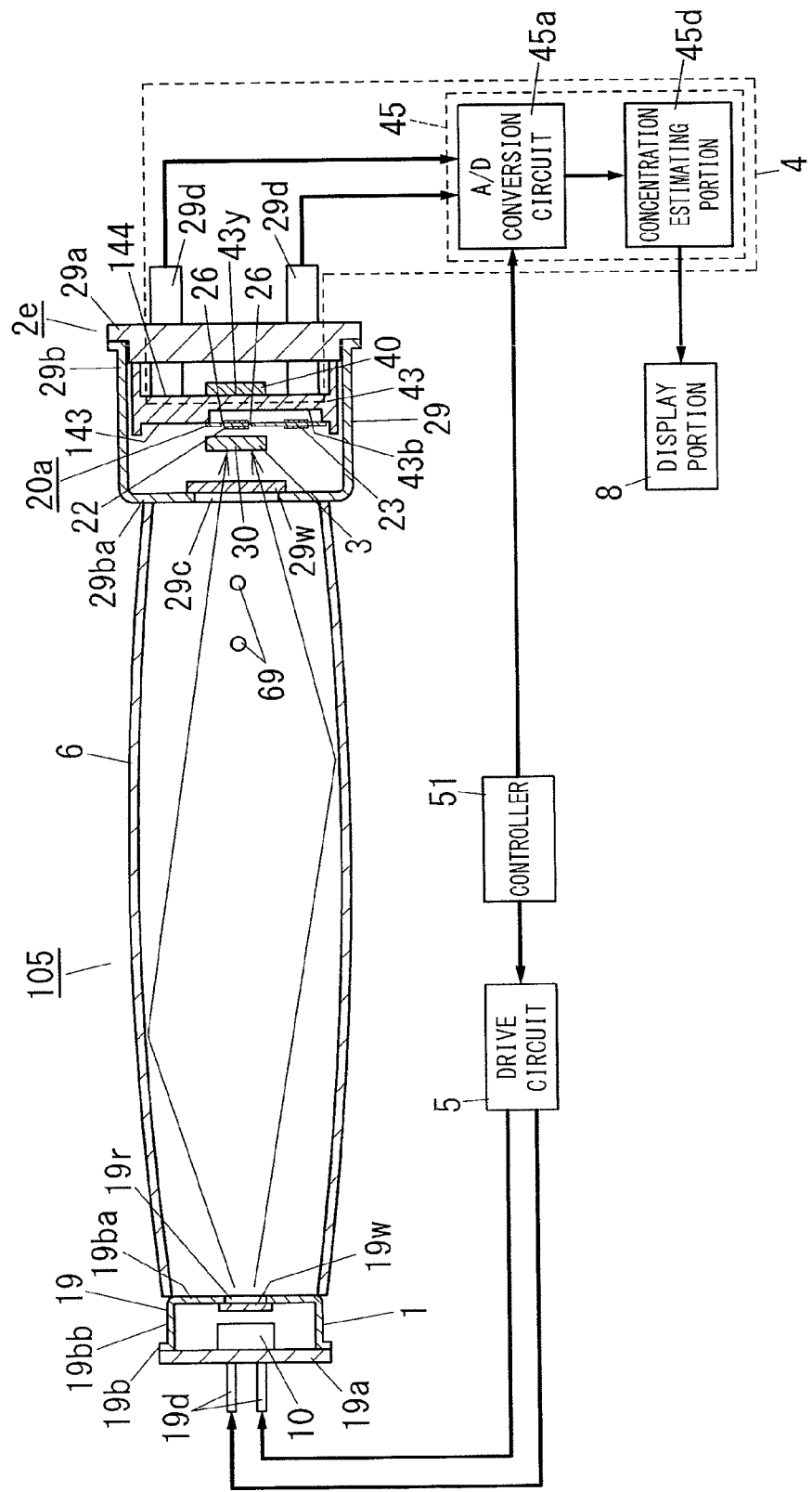
FIG. 62 is a schematic configuration diagram illustrating a fourth variation of the infrared type gas sensor according to Embodiment 3.

An infrared type gas sensor 102 as a fourth variation will be described below with reference to FIGS. 59 and 61. The infrared type gas sensor 102 as the fourth variation has the same basic configuration as that of the infrared type gas sensor 102 as the second variation.

The infrared type gas sensor 102 as the fourth variation includes an infrared emitting element 10 that is configured to emit infrared by thermal radiation; and an infrared detection element 20e (refer to FIG. 13). Accordingly, the infrared type gas sensor 102 as the fourth variation can provide higher sensitivity.

The infrared type gas sensor 102 as the fourth variation includes a first light receiving element $22_1$, a second light receiving element $22_2$, a first optical system 3a, a second optical system 3b, a drive circuit 5 and a signal processor 4. The infrared detection element 20e is formed with two sets of a first pyroelectric element 22 for receiving infrared light and a second pyroelectric element 23 for compensating temperature. One set thereof constitutes a first detection element DE1, and another set thereof constitutes a second detection element DE2. The first detection element DE1 and the second detection element DE2 are on a single pyroelectric substrate 21. In the infrared detection element 20e, the first pyroelectric element 22 of the first detection element DE1 constitutes the first light receiving element $22_1$, and the first pyroelectric element 22 of the second detection element DE2 constitutes the second light receiving element $22_2$. The drive circuit 5 is configured to drive the infrared emitting element 10. The first optical system 3a is disposed between the infrared emitting element 10 and the first light receiving element $22_1$. The second optical system 3b is disposed between the infrared emitting element 10 and the second light receiving element $22_2$. The signal processor 4 is configured to calculate concentration of gas as a detection object based on a ratio between a first output signal of the first light receiving element $22_1$ and a second output signal of the second light receiving element $22_2$. The first optical system 3a has a first transmission wavelength band $\lambda_{01}$~$\lambda_{11}$ (refer to FIG. 61) for transmitting infrared having an absorption wavelength λg (refer to FIG. 61) of gas as a detection object. The second optical system 3b has a second transmission wavelength band $\lambda_{02}$~$\lambda_{12}$ (refer to FIG. 61) for transmitting infrared having a reference wavelength λr (refer to FIG. 61). The first transmission wavelength band $\lambda_{01}$~$\lambda_{11}$ is different from the second transmission wavelength band $\lambda_{02}$~$\lambda_{12}$. All wavelengths in the second transmission wavelength band $\lambda_{02}$~$\lambda_{12}$ are longer than all wavelengths in the first transmission wavelength band $\lambda_{01}$~$\lambda_{11}$. In the infrared type gas sensor 102 as the fourth variation, the first optical system 3a and the second optical system 3b have a common prescribed wavelength band λc~λd (refer to FIG. 61) for compensation. All wavelengths in the prescribed wavelength band λc~λd are longer than all wavelengths in the first and second transmission wavelength bands $\lambda_{01}$~$\lambda_{11}$ and $\lambda_{02}$~$\lambda_{12}$. In the infrared type gas sensor 102 as the fourth variation, the first optical system 3a has a first average transmittance in the prescribed Wavelength band λc~λd, which is more than a second average transmittance of the second optical system 3b in the prescribed wavelength band λc~λd. In the infrared type gas sensor 102 as the fourth variation, the first and second average transmittances are set to compensate a change in a ratio between: a first output signal component of the first light receiving element $22_1$ based on infrared having the first transmission wavelength band $\lambda_{01}$~$\lambda_{11}$; and a second output signal component of the second light receiving element $22_2$ based on infrared having the second transmission wavelength band $\lambda_{02}$~$\lambda_{12}$. The change in the ratio is caused due to a change in emission power of the infrared emitting element 10. Accordingly, the infrared type gas sensor 102 as the fourth variation can improve long term stability of measurement accuracy.

In the infrared type gas sensor 102 (hereinafter also referred to as a "gas sensor 102"), the drive circuit 5 is preferably configured to pulse-drive the infrared emitting element 10 at a constant voltage or a constant current. The first and second average transmittances of the first and second optical systems 3a and 3b are preferably set to meet the condition of the following formula (37).

[Mathematical 37]

$$0.97 \times \frac{Qg1}{Qr1} < \frac{Qg2}{Qr2} < 1.03 \times \frac{Qg1}{Qr1} \qquad \text{formula (37)}$$

Here, Qg1 is energy of infrared that is incident on the first light receiving element $22_1$, after passing through the first transmission wavelength band $\lambda_{01}$~$\lambda_{11}$ of the first optical system 3a, in an initial state of the infrared emitting element 10. Hereinafter, it is regarded that "$\lambda_{01}$=λg−Δλg" and "$\lambda_{11}$=λg+Δλg". Qr1 is energy of infrared that is incident on the second light receiving element $22_2$, after passing through the second transmission wavelength band $\lambda_{02}$~$\lambda_{12}$ of the second optical system 3b, in the initial state of the infrared emitting element 10. Hereinafter, it is regarded that "$\lambda_{02}$=λr−Δλr" and "$\lambda_{12}$=λr+Δλr". Qg2 is energy of infrared that is incident on the first light receiving element $22_1$, after passing through the first transmission wavelength band λg−Δλg~λg+Δλg of the first optical system 3a, in a state where the infrared emitting element 10 has been changed with time. Qr2 is energy of infrared that is incident on the second light receiving element $22_2$, after passing through the second transmission wavelength band λr−Δλr~λr+Δλr of the second optical system 3b, in a state where the infrared emitting element 10 has been changed with time.

The formula (37) is a condition determined such that a change in measurement accuracy of the gas sensor 102 as the fourth variation is equal to ±3% or less, when a resistance value of the infrared emitting element 10 has been changed by ±10%. Accordingly, the gas sensor 102 as the fourth variation can improve long term stability of measurement accuracy.

Incidentally, the first and second average transmittances of the first and second optical systems 3a and 3b may be set based on the following ideas.

In the gas sensor 102 as the fourth variation, it is preferable that the first and second average transmittances be set to meet the following first and second conditions, when the absolute temperature of the infrared emitting element 10, the absorption wavelength and the reference wavelength are respectively represented as T [K], λg [μm] and λr [μm]; Qgr, Qrs and Qrr are defined as described in the explanation of the gas sensor 102 as the second variation; and R2 is Qgr/Qrs.

The first condition:

$$Qrs > Qgr > 0 \quad \text{[Mathematical 38]}$$

The second condition:

[Mathematical 39]

In a case of $R2 < 0.3 \times \dfrac{\lambda r - \lambda g}{0.36}$ $Qgr > Qrr$ is formed.

In a case of $1 > R2 \geq 0.3 \times \dfrac{\lambda r - \lambda g}{0.36}$ $(x + 0.3) \times \dfrac{\lambda r - \lambda g}{0.36} \geq \dfrac{Qgr - Qrr}{Qrs} \geq x \times \dfrac{\lambda r - \lambda g}{0.36}$ is formed.

In this case, $$x = \dfrac{T - 300}{4000} \times (R2 - 0.3)$$

Here, x is a coefficient.

Thus, it is possible to improve the aging stability of measurement accuracy of the gas sensor 102 as the fourth variation.

The inventors of the present application performed various analyses of the characteristics of the gas sensor 102 as the fourth variation, and then derived the above mentioned first and second conditions based on the analyzed results. The preconditions in the various analyses are as follows.

It was assumed that the radiation temperature of the infrared emitting element 10 was about 600 to 2500 K, based on that the emission energy distribution of the infrared emitting element 10 was subject to the Planck's radiation law, and based on the transmittances of the first and second optical systems 3a and 3b. The first transmission wavelength band λg−Δλg~λg+Δλg was set within a range of about 3 to 6 μm, as a practical range in the case of an infrared type gas sensor. The prescribed wavelength band λc~λd was set to 10 to 25 μm, in which infrared is hardly absorbed by steam. In addition, it was assumed that an allowable ratio of a change in the resistance value of the infrared emitting element 10 due to the change of the infrared emitting element 10 with time was ±3%. It was assumed that the infrared emitting element 10 was pulse-driven at a constant voltage or a constant current.

An infrared type gas sensor 105 as a fifth variation will be described below with reference to FIGS. 62 to 69. Note that, regarding the infrared type gas sensor 105, constituent elements similar to those of the infrared type gas sensor 100 are assigned with same reference numerals, and explanation thereof will be properly omitted.

The infrared type gas sensor 105 includes an infrared emitting element 10 that is configured to emit infrared by thermal radiation; and an infrared detection element 20a (refer to FIG. 1). Accordingly, the infrared type gas sensor 105 can provide higher sensitivity.

The infrared type gas sensor 105 includes an optical system 3, a drive circuit 5, a controller 51, and a signal processor 4. The optical system 3 is disposed between the infrared emitting element 10 and the infrared detection element 20a. The optical system 3 has respective infrared transmittances in a first transmission wavelength band λa~λb (refer to FIG. 63) for transmitting infrared having an absorption wavelength λg (refer to FIG. 63) of gas as a detection object; and a second transmission wavelength band λc~λd (refer to FIG. 63). All wavelengths in the second transmission wavelength band λc~λd are longer than all wavelengths in the first transmission wavelength band λa~λb. In the optical system 3, the second transmission wavelength band λc~λd has an average transmittance that is less than that of the first transmission wavelength band λa~λb. The drive circuit 5 is configured to pulse-drive the infrared emitting element 10. The controller 51 is configured to control the drive circuit 5 in time series such that the drive circuit 5 pulse-drives the infrared emitting element 10 under a first drive condition or a second drive condition. In this case, the infrared emitting element 10 under the first drive condition has a peak wavelength in an emission energy distribution that is different from that under the second drive condition. The signal processor 4 is configured to estimate concentration of gas as a detection object based on a ratio between a first output signal of the infrared detection element 20a under the first drive condition and a second output signal of the infrared detection element 20a under the second drive condition. Accordingly, in the infrared type gas sensor 105, even when there is a change in the characteristics of the infrared emitting element 10 with time or the like, the first and second output signals are changed at the same ratio, which can improve the long term stability of measurement accuracy. In addition, the infrared type gas sensor 105 can more reduce the number of components and therefore the cost, compared with a case of including two or more optical systems, optical axes of which are different from each other. Note that, the controller 51 allows the peak wavelengths in the emission energy distributions under the first and second drive conditions, of the infrared emitting element 10, to be different from each other, by controlling such that temperature of the infrared emitting element 10 under the first drive condition is different from that under the second drive condition, based on the Planck's radiation law The infrared type gas sensor 105 includes: an infrared light source 1 in which the infrared emitting element 10 is stored in a package 19 (hereinafter, also referred to as a "first package 19"); and an infrared detector 2e in which the infrared detection element 20a is stored in a package 29 (hereinafter, also referred to as a "second package 29"). The infrared detector 2e includes an optical filter 30 that is disposed in front of the infrared detection element 20a to face the infrared light source 1. The optical filter 30 is configured to adjust respective infrared transmittances in the first and second transmission wavelength bands λa~λb and λc~λd. The first package 19 includes a window member 19w (hereinafter, also referred to as a "first window member 19w") allowing infrared emitted from the infrared emitting element 10 to pass through. The second package 29 includes a window member 29w (hereinafter, also referred to as a "second window member 29w") allowing infrared emitted from the infrared emitting element 10 to pass through. The first window member 19w, the second window member 29w and the optical filter 30 are preferably defined as constituent elements of the optical system 3. Accordingly, the infrared type gas sensor 105 can prevent the infrared emitting element 10 from being deteriorated with time. In addition, since the first and second output signals are changed at the same ratio even when there is dirt or the like on the first window member 19w of the infrared light source 1 or the second window member 29w of the infrared detector 2e, it is possible to improve the long term stability of measurement accuracy.

The infrared detection element 20a includes only one set of a first pyroelectric element 22 and a second pyroelectric element 23. In short, the infrared detection element 20a has only one channel.

It is preferable that the infrared type gas sensor 105 further include a sample cell 6, which is disposed between the infrared light source 1 and the infrared detector 2e, and allows gas as a detection object to introduce therein or to discharge outside. The sample cell 6 is shaped like a tube. In the infrared type gas sensor 105, it is preferable that an inner face of the sample cell 6 be configured as a reflection surface 66 for reflecting infrared emitted from the infrared emitting element 10. The reflection surface 66 is defined as a constituent element of the optical system 3. In this case, in the infrared type gas sensor 105, even when a change in an optical axis with time or the like occurs due to deformation of the sample cell 6, the first and second output signals are changed at the same ratio, which can improve the long term stability of measurement accuracy. Note that, arrows in FIG. 62 each schematically shows a progression path of infrared emitted from the infrared emitting element 10.

The sample cell 6 is a cell in which gas as a detection object, or gas containing the gas as the detection object is introduced. The sample cell 6 is disposed between the infrared emitting element 10 and the infrared detection element 20a, and preferably disposed between the infrared light source 1 and the infrared detector 2e. The infrared type gas sensor 105 can detect gas, utilizing that an infrared absorption wavelength λg depends on a kind of gas. For example, absorption wavelengths λg of $CH_4$, $CO_2$, CO and NO are in the vicinities of 3.3 μm, 4.3 μm, 4.7 μm and 5.3 μm, respectively.

Constituent elements of the infrared type gas sensor 105 (hereinafter, also referred to as the "gas sensor 105") will be described below in more detail.

The infrared emitting element 10 is configured to emit infrared by thermal radiation. Accordingly, the infrared emitting element 10 can emit infrared having a wavelength band wider than that of an infrared light emitting diode. The infrared emitting element 10 can emit infrared having a wide band that includes the first transmission wavelength band λa~λb and the second transmission wavelength band λc~λd.

The infrared light source 1 may include, for example, the infrared emitting element 10 and the package 19 storing the infrared emitting element 10.

The package 19 includes: a pedestal 19a on which infrared emitting element 10 is mounted; and a cap 19b that is fixed to the pedestal 19a so as to cover the infrared emitting element 10. The package 19 further includes: a window hole 19r formed in part, in front of the infrared emitting element 10, of the cap 19b; and a window member 19w that is disposed to close the window hole 19r, and allows infrared to pass through.

The package 19 further includes two lead pins 19d as terminals for power feeding to the infrared emitting element 10. The respective terminals 16 of the infrared emitting element 10 are electrically connected with the lead pins 19d via metal fine wires (not shown).

The window member 19w has a function that allows infrared to pass through. The window member 19w is configured by a silicon substrate shaped like a flat plate. The window member 19w is not limited to a silicon substrate, but may be e.g., a germanium substrate, a zinc sulfide substrate or the like. However, the use of the silicon substrate is advantageous in view of reducing the cost. Alternatively, a lens may be used as the window member 19w.

The sample cell 6 is shaped like a tube. The sample cell 6 is preferably provided with two or more vent holes 69 through which an internal space thereof communicates with the outside. In this case, the vent holes 69 are preferably formed to pierce the sample cell 6 in a direction orthogonal to an axis direction of the sample cell 6. In the sample cell 6, through the vent holes 69, the external gas is introduced therein or gas in the internal space is discharged outside.

In the gas sensor 105, the infrared light source 1 is disposed on one end side of the sample cell 6 in the axis direction thereof, and the infrared detector 2e is disposed on the other end side of the sample cell 6 in the axis direction thereof. In the gas sensor 105, e.g., gas as a detection object, or gas including the gas as the detection object is introduced from the outside into the internal space of the sample cell 6 through the vent holes 69. In the gas sensor 105, when concentration of gas as a detection object in the internal space of the sample cell 6 is increased, the light amount of infrared entering the infrared detector 2e is decreased. On the other hand, when concentration of gas as a detection object in the internal space of the sample cell 6 is decreased, the light amount of infrared entering the infrared detector 2e is increased.

The sample cell 6 is formed by combining a pair of half bodies 64 and 65 (refer to FIGS. 65 to 67) divided along a plane including a central axis of the sample cell 6. The half bodies 64 and 65 can be combined together by a technology selected from the group consisting of fitting, ultrasonic welding and glueing.

It is preferable that the sample cell 6 be shaped like a tube, an inner face of which be configured as a reflection surface 66 (refer to FIGS. 65 and 67) for reflecting infrared emitted from the infrared light source 1.

The gas sensor 105 includes a holding member 70 (refer to FIGS. 65 to 67) that holds the infrared light source 1, and the holding member 70 is attached to the sample cell 6. The gas sensor 105 further includes a holding member 80 that holds the infrared detector 2e, and the holding member 80 is attached to the sample cell 6.

The holding member 70 includes a cap 71 and a presser plate 72. The cap 71 is shaped like a disk, and provided in an end surface thereof facing the sample cell 6 with a recess 71a (refer to FIG. 67) into which one end of the sample cell 6 is inserted. The cap 71 is further provided in a center of the bottom of the recess 71a with a through-hole 71b into which the infrared light source 1 is inserted. The presser plate 72 is for pressing the infrared light source 1 against the cap 71.

The holding member 70 is attached to the sample cell 6 by two or more screws (not shown) being inserted into holes 72b of the presser plate 72 and holes 71d of the cap 71 and then screwed in threaded holes 64d and 65d in the one end of the sample cell 6.

The holding member 80 includes a cap 81 and a presser plate 82. The cap 81 is shaped like a disk, and provided in an end surface thereof facing the sample cell 6 with a recess 81a into which another end of the sample cell 6 is inserted. The cap 81 is further provided in a center of the bottom of the recess 81a with a through-hole 81b into which the infrared detector 2e is inserted. The presser plate 82 is for pressing the infrared detector 2e against the cap 81.

The holding member 80 is attached to the sample cell 6 by two or more screws (not shown) being inserted into holes 82b of the presser plate 82 and holes 81c of the cap 81 and then screwed in threaded holes (not shown) in the another end of the sample cell 6.

The reflection surface 66 of the sample cell 6 is in a shape of a spheroid a rotation axis of which is a major axis defined as a central axis of the sample cell 6 where both ends of the spheroid in a direction of the major axis are cut by two planes perpendicular to the major axis. Thus, the sample cell 6 has the internal space corresponding to part of the spheroid (long ellipsoid).

In the gas sensor 105, it is preferable that the infrared light source 1 be disposed at one focal point of the spheroid on the central axis of the sample cell 6, and that the infrared detector 2e be disposed at a position near another focal point of the spheroid between the infrared light source 1 and the another focal point, on the central axis of the sample cell 6.

Note that, in the gas sensor 105, the shapes, the number and the arrangements of members (the sample cell 6 and the like) disposed between the infrared light source 1 and the infrared detector 2e are not limited in particular.

The optical system 3 is involved in a propagation path through which infrared is incident on the infrared detection element 20a after emitted from the infrared emitting element 10.

Figure 68:
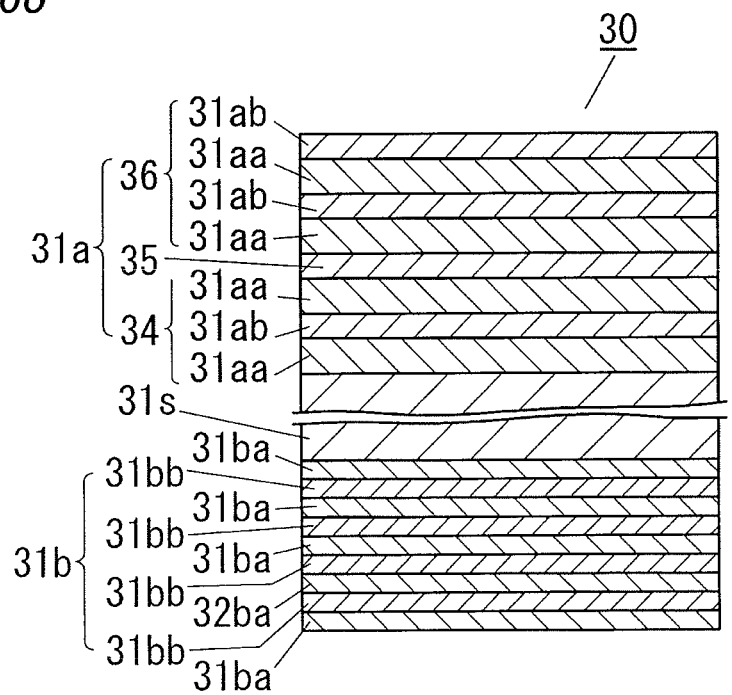
FIG. 68 is a schematic cross-sectional view of an optical filter in the fourth variation of the infrared type gas sensor according to Embodiment 3.
Figure 69:
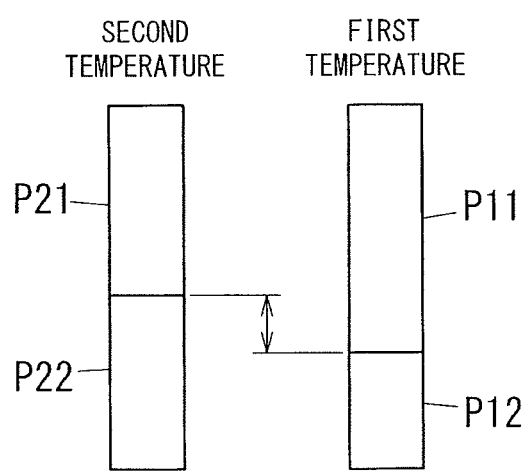
FIG. 69 is a drawing illustrating operation of the fourth variation of the infrared type gas sensor according to Embodiment 3.

It is preferable that the optical system 3 include an optical filter 30 as shown in FIG. 68, for example. In addition to the optical filter 30, the following elements are defined as constituent elements of the optical system 3 of the gas sensor 105: a window hole 19r of the infrared light source 1; a window member 19w of the infrared light source 1; a reflection surface 66 of the sample cell 6; a window hole 29c of the infrared detector 2e; and a window member 29w of the infrared detector 2e.

For example, the optical filter 30 may include a first substrate 31s, a first filter part 31a and a second filter part 31b. The first substrate 31s allows infrared to pass through. Examples of the first substrate 31s include a silicon substrate, a germanium substrate, a sapphire substrate, a magnesium oxide substrate and the like.

The filter characteristic of the first filter part 31a is designed so as to define the first transmission wavelength band $\lambda a \sim \lambda b$ of the optical system 3. The second filter part 31b is designed such that an infrared transmittance of the optical filter 30 in the second transmission wavelength band $\lambda c \sim \lambda d$ is smaller than that in a case of only the first filter part 31a. The second filter part 31b is a filter of adjusting an infrared cut-off rate in a combination of a function that absorbs infrared having the second transmission wavelength band $\lambda c \sim \lambda d$ and a function that reflects the infrared.

The first filter part 31a may be for example a band-pass filter that includes a $\lambda_0/4$ multilayer 34, a wavelength selecting layer 35 and a $\lambda_0/4$ multilayer 36. The optical filter 30 has the same configuration as that of the first optical filter 31 of the infrared type gas sensor 100 for example, and therefore, the detailed explanation thereof will be omitted.

In the optical filter 30, it is preferable that the center wavelength of the first filter part 31a be set to an absorption wavelength $\lambda g$ of gas as a detection object. In the gas sensor 105, when gas as a detection object is e.g., carbon dioxide, it is preferable that the absorption wavelength $\lambda g$ be set to 4.3 μm.

It is preferable that the second transmission wavelength band $\lambda c \sim \lambda d$ be appropriately set based on: the radiation spectrum of the infrared emitting element 10: and a wavelength region in which infrared leakage occurs due to the spectral transmission characteristics or the like in design. of the optical filter 30 of the optical system 3. The second transmission wavelength band $\lambda c \sim \lambda d$ may be e.g., a range of 10 μm to 25 μm.

In the optical system 3, an average transmittance in the second transmission wavelength band $\lambda c \sim \lambda d$ is less than a transmittance in the first transmission wavelength band $\lambda a \sim \lambda b$.

The average transmittance is an average value of transmittances in the second transmission wavelength band $\lambda c \sim \lambda d$ regarding the optical system 3. The average transmittance is obtained by a calculation formula as S2/S1. In this case, S1 is an area obtained by integrating a virtual transmission spectrum at which a transmittance is 100% between the shortest wavelength $\lambda c$ and the longest wavelength $\lambda d$ of the second transmission wavelength band $\lambda c \sim \lambda d$ in the infrared wavelength band. In other words, S1 is an area of a region surrounded by a virtual transmission spectrum and the horizontal axis (wavelength axis) of the virtual transmission spectrum. For example when the shortest wavelength $\lambda c$ is 10 μm and the longest wavelength $\lambda d$ is 25 μm, the Si is "100×(25−10)". S2 is an area obtained by integrating a transmission spectrum of the optical system 3, measured by a spectroscope or the like. In other words, S2 is an area of a region surrounded by a measured transmission spectrum and the horizontal axis (wavelength axis) of the measured transmission spectrum.

The average transmittance can be adjusted by changing the number of stacked layers, optical film thicknesses, combination of materials and the like, of two kinds of thin films 31ba and 31bb in the second filter part 31b of the optical filter 30, for example.

Since the infrared detection element 20a is similar to the infrared detection element 20a of Embodiment 1, the explanation thereof will be omitted.

In the infrared detector 2e, the arrangement of the window member 29w is defined such that the second pyroelectric element 23 is disposed outside an area of the infrared detection element, which is a vertically projected area from the window member 29w of the package 29. Thus in the infrared detector 2e, it is possible to serve part of the cap 29b having light blocking property, which holds the window member 29w of the package 29, also as a light blocking part for preventing infrared as a detection object from being incident on the second pyroelectric element 23. The light blocking part is not limited to this, but may be configured by an infrared cut filter, a metal light blocking plate or the like.

In the infrared detection element 20a, a change in temperature of the first pyroelectric element 22 or the second pyroelectric element 23 caused by a change in environment temperature is more extremely slow, compared with a change in temperature of the first pyroelectric element 22 caused by infrared as a detection object being incident thereon, or a change in temperature of the second pyroelectric element 23 caused by the crosstalk of infrared. The environment temperature means ambient temperature of the infrared detection element 20a, and more specifically, ambient temperature of the package 29. The ambient temperature of the package 29 corresponds to temperature of outside air.

In the infrared detection element 20a, with respect to infrared as a detection object being incident on the first pyroelectric element 22, because basically only the first pyroelectric element 22 is heated, the heat capacity and the thermal time constant are small. On the other hand, with respect to an increase in the environment temperature, because the whole of the infrared detection element 20a is heated by the increase, the heat capacity and the thermal time constant are large. In particular, because the package 29 and the infrared detection element 20a are heated by the increase in the environment temperature, the heat capacity and the thermal time constant further become large.

Regarding the heat capacity, a relation of "H1>H2" is met, where H1 is the heat capacity of the first pyroelectric element 22 with respect to a change in the environment temperature, and H2 is the heat capacity of the first pyroelectric element 22 with respect to incidence of infrared as a detection object. This is caused by H1 being a heat capacity required for heating the first pyroelectric element 22 and the periphery thereof with a slow temperature change.

Regarding a thermal conductance, a relation of "G2>G1" is met, where G1 is the thermal conductance of the first pyroelectric element 22 with respect to a change in the environment temperature, and G2 is the thermal conductance of the first pyroelectric element 22 with respect to incidence of infrared as a detection object. This is caused by G2 being the thermal conductance of the first pyroelectric element 22 with respect to a surface of the package 29, and having a very small value.

Also regarding the thermal time constant, because a formula of "thermal time constant=[heat capacity]/[thermal conductance]" is met, a relation of "τ1>τ2" is met, where τ1 is the thermal time constant of the first pyroelectric element 22 with respect to a change in the environment temperature, and τ2 is the thermal time constant of the first pyroelectric element 22 with respect to incidence of infrared as a detection object.

Figure 1B:
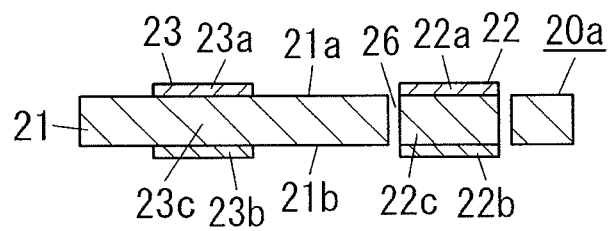
FIG. 1B is a schematic cross-sectional view taken along line X-X of FIG. 1A.
Figure 1C:
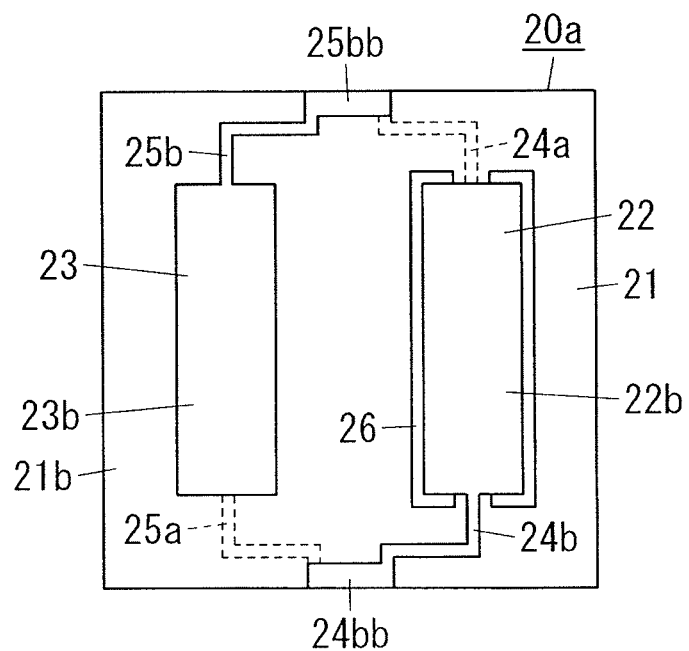
FIG. 1C is a schematic bottom view of the infrared detection element according to Embodiment 1.

As shown in FIGS. 1A, 1B and 1C, in the infrared detection element 20a, slits 26 are formed only in a periphery of the first pyroelectric element 22, and accordingly, it is possible to generate a sensitivity difference based on a difference between the thermal time constants of the first and second pyroelectric elements 22 and 23 caused by incidence of infrared as a detection object. Therefore, in the infrared detection element 20a, it is possible to reduce the influence by the crosstalk of infrared by connecting the first and second pyroelectric elements 22 and 23 in reverse parallel to each other, and utilizing the first pyroelectric element 22 as a pyroelectric element for receiving infrared light and the second pyroelectric element 23 as a pyroelectric element for compensating temperature. Thereby, the infrared detection element 20a can provide higher sensitivity.

In the pyroelectric substrate 21, it is preferred that the slit 26 be at least along a side of the first pyroelectric element 22, facing the second pyroelectric element 23. Accordingly, the infrared detection element 20a can more enhance the sensitivity of the first pyroelectric element 22 in the low frequency region, compared with that of the second pyroelectric element 23, and furthermore prevent crosstalk of heat. Therefore, it is possible to more improve the sensitivity of the first pyroelectric element 22. Here, the crosstalk of heat means that heat is transmitted between the first and second pyroelectric elements 22 and 23 through the pyroelectric substrate 21.

In the infrared detection element 20a, the number of the slits 26 is not limited in particular, as long as the slits 26 are formed along the outer periphery of the first pyroelectric element 22. In the infrared detection element 20a, it is possible to enhance mechanical strength by the slits 26 being formed in a periphery of the first pyroelectric element 22 so as to be spaced from each other in a direction along the outer periphery of the first pyroelectric element 22. It is preferable that the slits 26 be arranged at equal intervals in the direction along the outer periphery of the first pyroelectric element 22.

In the infrared detection element 20a, the first surface electrode 22a may be provided such that an outer circumferential edge thereof is spaced from an aperture edge of the slit 26 facing a side of the first surface electrode 22a. Accordingly, the infrared detection element 20a can more surely prevent occurrence of short-circuit between the first surface electrode 22a and the first back face electrode 22b while providing higher sensitivity.

In the infrared detection element 20a, it is preferable that the first back face electrode 22b be provided such that an outer circumferential edge thereof is spaced from an aperture edge of the slit 26 facing a side of the first back face electrode 22b. Accordingly, the infrared detection element 20a can more surely prevent occurrence of short-circuit between the first surface electrode 22a and the first back face electrode 22b, and thereby prevent a reduction of electrical stability.

The package 29 of the infrared detector 2e includes a pedestal 29a and a cap 29b that is fixed to the pedestal 29a. The package 29 further includes a window hole 29c that is formed part, in front of the infrared detection element 20a, of the cap 29b. The window hole 29c is in a top plate 29ba of the cap 29b. The package 29 of the infrared detector 2e further includes a window member 29w that is disposed to close the window hole 29c, and allows infrared to pass through. The window member 29w is configured by a silicon substrate shaped like a flat plate. The window member 29w is formed as a rectangle plate slightly larger than the opening size of the window hole 29c. The window member 29w is preferably fixed to the cap 29b with conductive material (such as solder or a conductive adhesive). Accordingly, the window member 29w can be made to have almost the same potential as that of the cap 29b, and therefore, there is an advantage that the infrared detector 2e is hardly influenced by external electromagnetic noise. The window member 29w is not limited to a silicon substrate, but may be e.g., a germanium substrate, a zinc sulfide substrate or the like. However, the use of the silicon substrate is advantageous in view of reducing the cost.

In the infrared detector 2e, the optical filter 30 is stored in the package 29 not to be exposed to air outside the package 29. Accordingly, the infrared detector 2e can prevent the optical filter 30 from being exposed to the external air. Therefore, the infrared detector 2e can prevent a change in the filter characteristic of the optical filter 30 with time.

The signal processor 4 includes an IC element(s) 40 for signal processing an output signal of the infrared detection element 20a. The IC element 40 is preferably stored in the package 29 of the infrared detector 2e. In this case, for example a base body 43, on which the infrared detection element 20a and the IC element 40 are mounted, is preferably stored in the package 29 of the infrared detector 2e.

In the infrared detector 2e, it is preferable that the infrared detection element 20a be disposed on a first surface 143 side of the base body 43 and the IC element 40 be disposed on a second surface 144 side of the base body 43.

The IC element 40 is a bare chip, and fixed on an inner bottom face of a recess 43y provided in the second surface 144 of the base body 43 with die bonding material. As the die bonding material, for example, epoxy resin may be used.

The package 29 is provided with three lead pins 29d that pierce the pedestal 29a in a thickness direction thereof. The respective three lead pins 29d are used as a ground terminal of the IC element 40, a power supply terminal for applying an operating voltage to the IC element 40, and a terminal for extracting an output signal of the IC element 40.

The IC element 40 may include a current-voltage conversion circuit and an amplifier circuit, for example. The current-voltage conversion circuit is configured to current-voltage convert a current signal as the output signal of the infrared detection element 20a, and output the converted signal. The amplifier circuit is configured to amplify the converted output signal of the current-voltage conversion circuit, and output it.

The signal processor 4 includes a signal processing circuit 45 configured to generate an output based on the output signal amplified by the IC element 40. The signal processing circuit 45 is configured to estimate concentration of gas as a detection object, based on a ratio between a first output signal of the infrared detection element 20a under the first drive condition and a second output signal of the infrared detection element 20a under the second drive condition, and then generate an output corresponding to the estimated concentration.

The signal processing circuit 45 may include an A/D conversion circuit 45a and a concentration estimating portion 45d. The A/D conversion circuit 45a is configured to perform an analog/digital conversion for the output signal of the IC element 40, and output the converted signal.

Note that, the whole of the signal processor 4 may be installed in the package 29 of the infrared detector 2e. The signal processor 4 may be installed in the package 29 by integrating, as a single-chip IC element, the current-voltage conversion circuit, the amplifier circuit and the signal processing circuit 45. Alternatively, the signal processor 4 may be configured by appropriately connecting two or more discrete components. The whole of the signal processor 4 may be installed separately from the infrared detector 2e.

The gas sensor 105 may include a display portion 8 for displaying concentration estimated by the concentration estimating portion 45d. The display portion 8 may be configured by e.g., a liquid crystal display, an organic EL display, a display with light-emitting diodes or the like.

Incidentally, in the gas sensor 105, by adjusting an input voltage to be applied to from the drive circuit 5 to the infrared emitting layer 13 of the infrared emitting element 10, it is possible to change Joule heat to be generated in the infrared emitting layer 13, thereby changing temperature of the infrared emitting layer 13. Thus, in the gas sensor 105, it is possible to change a peak wavelength in the emission energy distribution of the infrared emitting layer 13 by changing the temperature of the infrared emitting layer 13.

The drive circuit 5 is configured to apply to the infrared emitting element 10 a voltage having a prescribed pulse width (hereinafter, also referred to as a "pulse voltage") to pulse-drive the infrared emitting element 10. The drive circuit 5 is configured to boost a control signal received from the controller 51 to generate a pulse voltage. The drive circuit 5 has a boosting function that boosts an input voltage applied as the control signal. The control signal is a signal for indicating the prescribed pulse width. In the infrared emitting element 10, a time period during which the pulse voltage is applied corresponds to an energizing period, and a time period during which no pulse voltage is applied corresponds to a non-energizing period.

For example in a case of pulse-driving the infrared emitting element 10, using the pulse voltage as a drive voltage, the drive circuit 5 is configured to intermittently apply the drive voltage to the infrared emitting element 10.

The drive circuit 5 is configured to drive the infrared emitting element 10 in each of the first and second drive conditions. For example, the first drive condition may be set such that the infrared emitting element 10 generates heat at a first temperature to emit infrared. For example, the second drive condition may be set such that the infrared emitting element 10 generates heat at a second temperature to emit infrared. The first and second temperatures are different from each other. In the gas sensor 105, the second temperature is set lower than the first temperature. In the gas sensor 105, the respective first and second temperatures are set to 700 K and 500 K, but these values are one example. The temperatures are not limited in particular.

Figure 64:
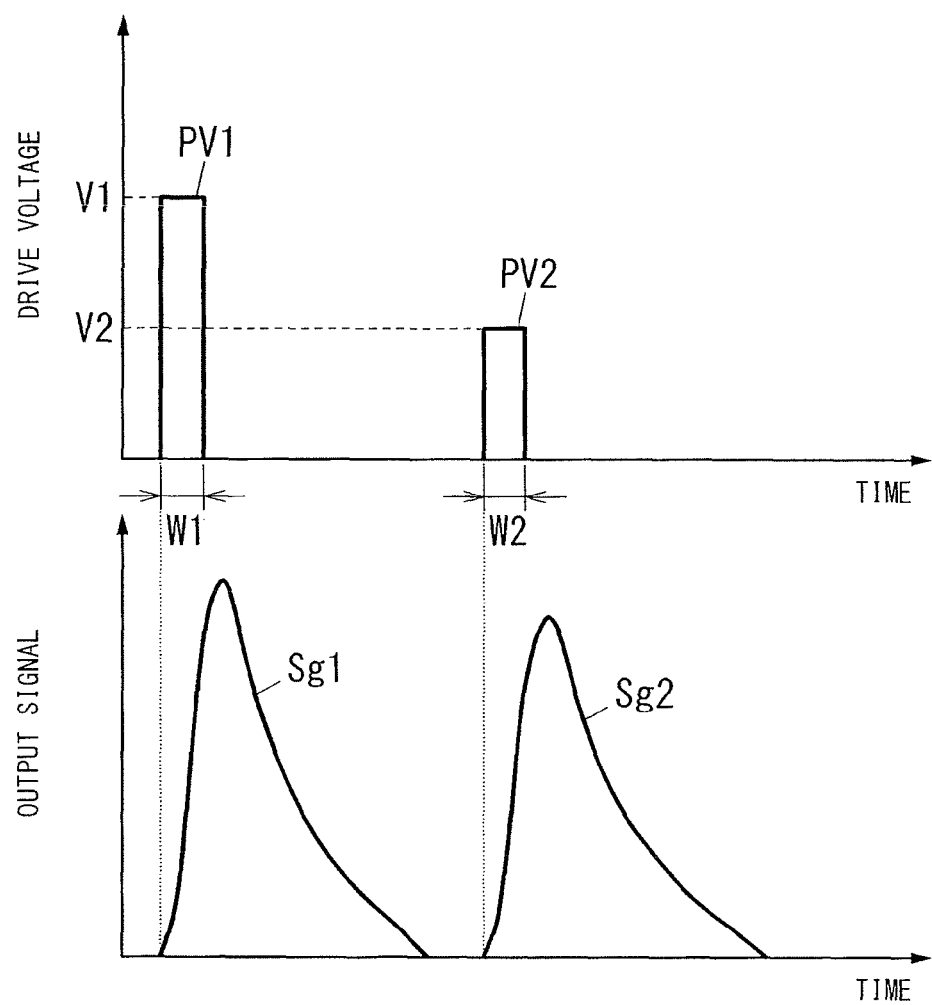
FIG. 64 is a drawing illustrating operation of the fourth variation of the infrared type gas sensor according to Embodiment 3.
Figure 65:
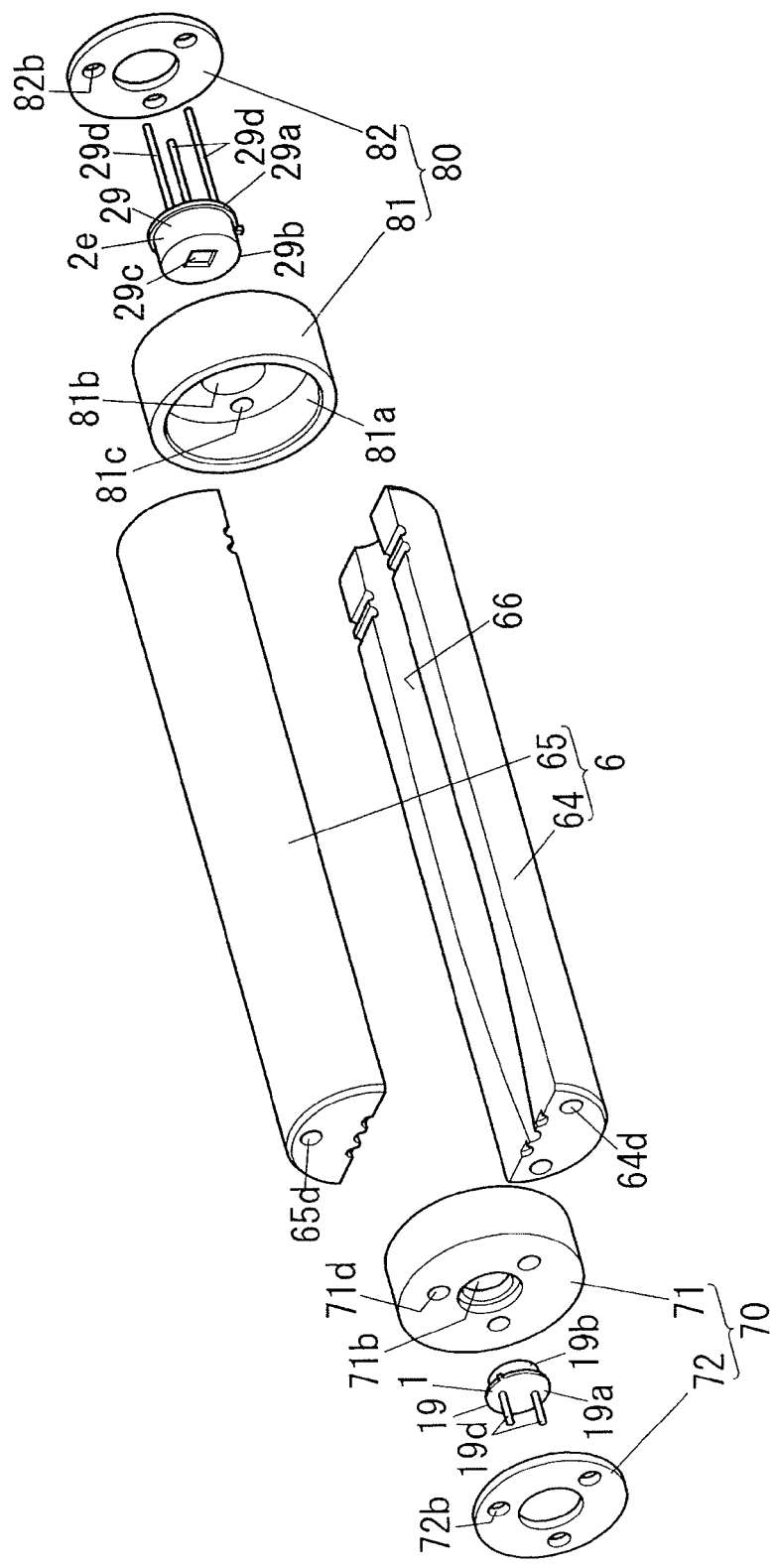
FIG. 65 is a schematic exploded perspective view of a main part in the fourth variation of the infrared type gas sensor according to Embodiment 3.
Figure 66:
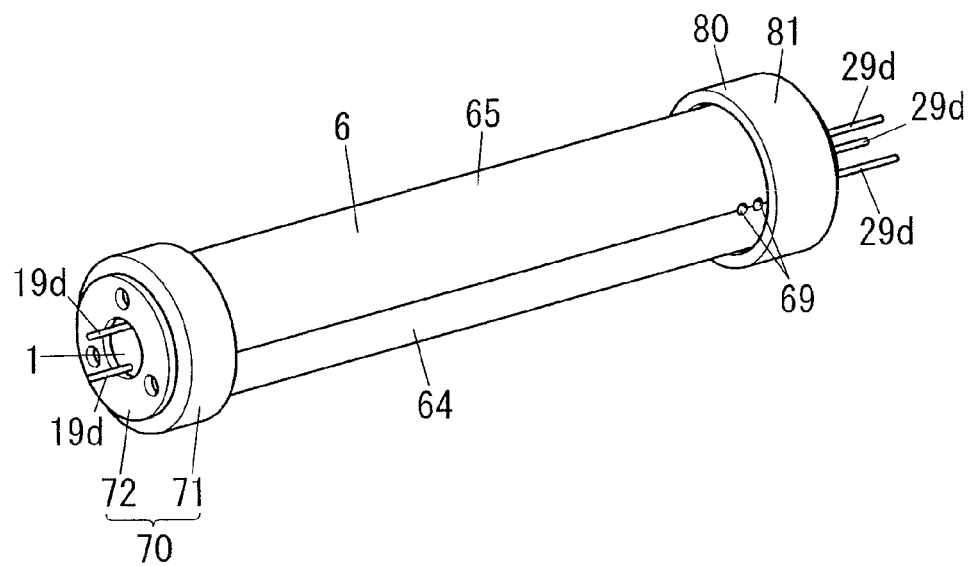
FIG. 66 is a schematic perspective view of the main part in the fourth variation of the infrared type gas sensor according to Embodiment 3.
Figure 67:
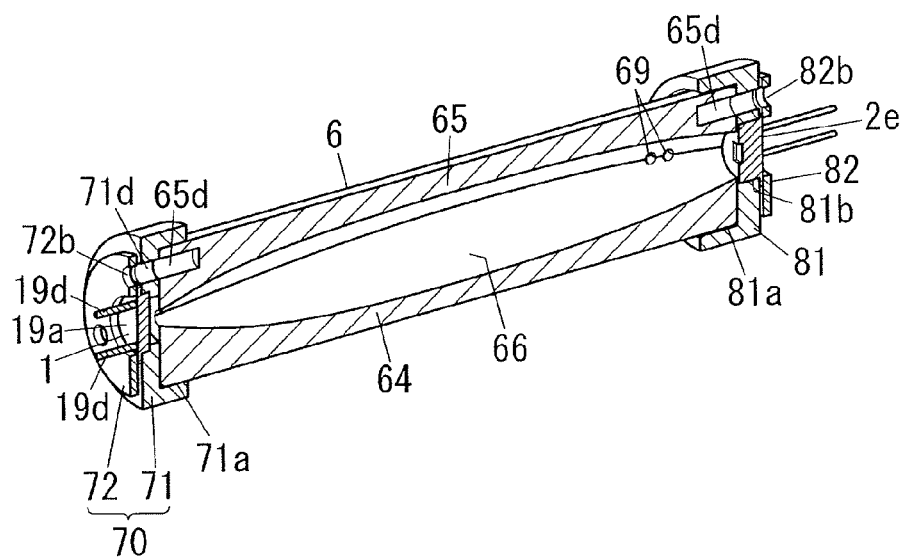
FIG. 67 is a schematic perspective view partially broken of the main part in the fourth variation of the infrared type gas sensor according to Embodiment 3.

In the drive circuit 5, the drive voltage in the first drive condition is defined as a first pulse voltage PV1 (refer to FIG. 64), and the drive voltage in the second drive condition is defined as a second pulse voltage PV2 (refer to FIG. 64). The first pulse voltage PV1 has a maximum value of V1 and a prescribed pulse width of W1. The second pulse voltage PV2 has a maximum value of V2 and a prescribed pulse width of W2.

Figure 63:
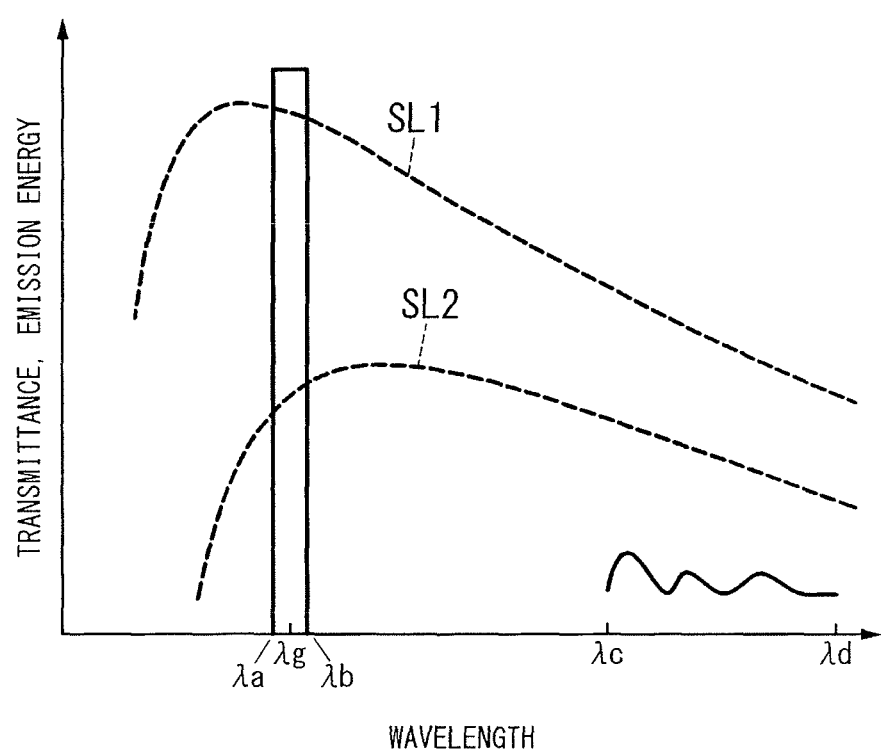
FIG. 63 is a schematic drawing showing a characteristic of the fourth variation of the infrared type gas sensor according to Embodiment 3.

In FIG. 63, a radiation spectrum SL1 of the infrared emitting element 10 is shown by a broken line when the drive circuit 5 has pulse-driven the infrared emitting element 10 under the first drive condition. Also in FIG. 63, a radiation spectrum SL2 of the infrared emitting element 10 is shown by a broken line when the drive circuit 5 has pulse-driven the infrared emitting element 10 under the second drive condition. Also in FIG. 63, a transmission spectrum (wavelength dependency of a transmittance) of the optical system 3 is shown by a solid line. From FIG. 63, it is found that a change in the emission energy distribution of the infrared emitting element 10 causes a change in the output signal of the infrared detection element 20a based on infrared having the first transmission wavelength band $\lambda a \sim \lambda b$.

The output signal of the IC element 40 includes: an output signal (hereinafter, also referred to as a "first output signal") of the IC element 40 while the drive circuit 5 pulse-drives the infrared emitting element 10 under the first drive condition; and an output signal (hereinafter, also referred to as a "second output signal") of the IC element 40 while the drive circuit 5 pulse-drives the infrared emitting element 10 under the second drive condition. The output signal of the IC element 40 corresponds to a signal obtained by current-voltage converting and amplifying the output signal of the infrared detection element 20a.

FIG. 64 schematically shows a relation between a waveform of the drive voltage applied from the drive circuit 5 to the infrared emitting element 10; and the output signal of the IC element 40. Specifically, FIG. 64 schematically shows a relation between the first pulse voltage PV1 and the first output signal of the IC element 40, when the infrared emitting element 10 has been pulse-driven at the first pulse voltage PV1. Also, FIG. 64 schematically shows a relation between the second pulse voltage PV2 and the second output signal of the IC element 40, when the infrared emitting element 10 has been pulse-driven at the second pulse voltage PV2.

In the gas sensor 105, the amplifier circuit of the IC element 40 is a variable amplifier circuit, and amplification factors thereof under the first and second drive conditions of the drive circuit 5 are changed to be different from each other so as to reduce a difference between the first and second output signals in a state where concentration of gas as a detection object is 0 ppm. The controller 51 sets, as a first amplification factor, the amplification factor of the variable amplifier circuit when allowing the drive circuit 5 to drive the infrared emitting element 10 under the first drive condition, and as a second amplification factor, the amplification factor of the variable amplifier circuit when allowing the drive circuit 5 to drive the infrared emitting element 10 under the second drive condition. The second amplification factor is more than the first amplification factor. The second amplification factor is four times as much as the first amplification factor, although not limited to this.

In the gas sensor 105, the first and second amplification factors (when the infrared emitting element 10 is pulse-driven under the respective first and second drive conditions) are controlled by the controller 51. As a result, in the gas sensor 105, it is possible to prevent the resolution for an input value of the A/D conversion circuit 45a from being reduced.

The concentration estimating portion 45d is configured to estimate concentration of gas as a detection object based on a ratio between the digital first and second output signals digitized by the A/D conversion circuit 45a. It is preferable that the controller 51 control the operation timings of the A/D conversion circuit 45a and the concentration estimating portion 45d of the signal processing circuit 45. In this case, in the gas sensor 105, it is preferable that for example the controller 51 and the signal processing circuit 45 be configured by a single microcomputer with appropriate programs.

In the gas sensor 105, each of the pulse widths W1 and W2 of the first and second pulse voltages PV1 and PV2 is set shorter than a response time during which a current is output from the infrared detection element 20a in response to a change in the amount of infrared received by the infrared detection element 20a with time. The infrared emitting element 10 is energized only for a time period during which the drive voltage is applied, and de-energized for a time period during which no drive voltage is applied.

In the infrared emitting element 10 and the infrared light source 1, gas existing in the opening part 11a of the infrared emitting element 10 is configured as a gas layer. It is preferable that gas configured as the gas layer be inert gas. Examples of the inert gas include $N_2$ gas, Ar gas and the like. By including the gas layer, the infrared emitting element 10 and the infrared light source 1 can efficiently increase temperature of the infrared emitting layer 13 during the energizing period. It is therefore possible to shorten the prescribed pulse width, and further secure a desired amount of infrared. Also by including the gas layer, the infrared emitting element 10 and the infrared light source 1 can emit infrared during a time period longer than the energizing period, also in the non-energizing period following the energizing period. The gas sensor 105 can shorten the prescribed pulse width, thereby reducing power consumption.

When the energizing to the infrared emitting layer 13 is started, the temperature thereof is increased with time. In the infrared emitting layer 13, the amount of infrared is increased in a curved line, depending on the increase in the temperature. When the infrared emitting layer 13 is de-energized, the temperature is decreased. In the infrared emitting layer 13, the amount of infrared is gradually decreased, depending on the decrease in the temperature. A frequency component of the amount of infrared emitted by the infrared emitting layer 13, which is changed with time, for the non-energizing period of the infrared emitting element 10 is determined by the structural thermal time constant of the infrared light source 1 having the gas layer. The non-energizing period of the infrared emitting element 10 is set as a time period sufficiently longer than the energizing period of the infrared emitting element 10. In the gas sensor 105, for example, the energizing period may be set to be in a range of about 5 ms to 30 ms, and the non-energizing period may be set to be in a range of about 5 sec to 30 sec. The frequency component of the amount of infrared, which is changed with time, for the non-energizing period of the infrared emitting element 10 has a frequency lower than that of a frequency component of the amount of infrared, which is changed with time, for the energizing period. Since the gas sensor 105 can emit infrared during a time period longer than the energizing period, also in the non-energizing period following the energizing period, it is possible to perform a low frequency response of utilizing infrared with a low frequency decreasing during the non-energizing period.

In the gas sensor 105, the first drive condition is a drive condition in which a peak wavelength is shorter than that in the second drive condition. It is preferable that the concentration estimating portion 45d of the signal processor 4 be configured to estimate concentration of gas as a detection object by a concentration conversion formula, as the following formula (38).

[Mathematical 40]

$$Con1 = A1 \times R1^2 + B1 \times R1 + C1 \qquad \text{formula(38)}$$

In the formula (38), Con1 is concentration of gas as a detection object [ppm]. R1 is a value obtained by normalizing a value R obtained by dividing the first output signal by the second output signal, such that R1 is "1" when the concentration of gas as a detection object is 0 ppm. Each of A1, B1 and C1 is a coefficient. The following Table 1 shows, as one example, the coefficients A1, B1 and C1 in a case where gas as a detection object is $CO_2$ and the respective first and second temperatures are 700 K and 500 K.

TABLE 1

| A1 | 856733 |
| B1 | −1765421 |
| C1 | 908690 |

Since the gas sensor 105 includes the concentration estimating portion 45d configured to estimate concentration of gas as a detection object by the concentration conversion formula as the formula (38), it is possible to improve long term stability of measurement accuracy.

In the gas sensor 105, when "Sg1" and "Sg2" are the respective first and second output signals of the IC element 40, they can be represented by the following formulas (39) and (40) based on Lambert-Beers' law, where "α" is an absorption coefficient of gas as a detection object, "C" is concentration of the gas, and "L" is an optical path length of infrared.

[Mathematical 41]

$$Sg1 \propto P11 \times 10^{-\alpha \cdot C \cdot L} + P12 \qquad \text{formula(39)}$$

In the formula (39), P11 is light power with respect to infrared having the first transmission wavelength band λa~λb, of light power received by the infrared detection element 20a while the infrared emitting element 10 is pulse-driven under the first drive condition for generating heat at the first temperature, and P12 is light power with respect to infrared having the second transmission wavelength band λc~λd, of the light power received by the infrared detection element.

[Mathematical 42]

$$Sg2 \propto P21 \times 10^{-\alpha \cdot C \cdot L} + P22 \qquad \text{formula (40)}$$

In the formula (40), P21 is light power with respect to infrared having the first transmission wavelength band λa~λb, of light power received by the infrared detection element 20a while the infrared emitting element 10 is pulse-driven under the second drive condition for generating heat at the second temperature, and P22 is light power with respect to infrared having the second transmission wavelength band, of the light power received by the infrared detection element.

The value R obtained by dividing the first output signal by the second output signal can be represented by the following formula (41).

[Mathematical 43]

$$R = \frac{Sg1}{Sg2} = \frac{P11 \times 10^{-\alpha \cdot C \cdot L} + P12}{P21 \times 10^{-\alpha \cdot C \cdot L} + P22} \qquad \text{formula (41)}$$

In the formula (41), when "Sg1=Sg2" is met, the value R obtained by dividing the first output signal by the second output signal can be represented by the following formula (42).

[Mathematical 44]

$$R = \frac{P21 \times 10^{-\alpha \cdot C \cdot L} + \{(P11 - P21) \times 10^{-\alpha \cdot C \cdot L}\} + P12}{P21 \times 10^{-\alpha \cdot C \cdot L} + P22} \qquad \text{formula (42)}$$

Accordingly, in the gas sensor 105, it is possible to estimate concentration of gas as a detection object based on the amount of a change in (P11-P21).

Incidentally, in the gas sensor 105, the amplifier circuit of the IC element 40 may have a constant amplification factor. In this case, e.g., as shown in FIG. 70, the pulse width W2 of the second pulse voltage PV2 being made longer than the pulse width V171 of the first pulse voltage PV1 can prevent the resolution for an input value of the A/D conversion circuit 45a from being reduced.

Figure 70:
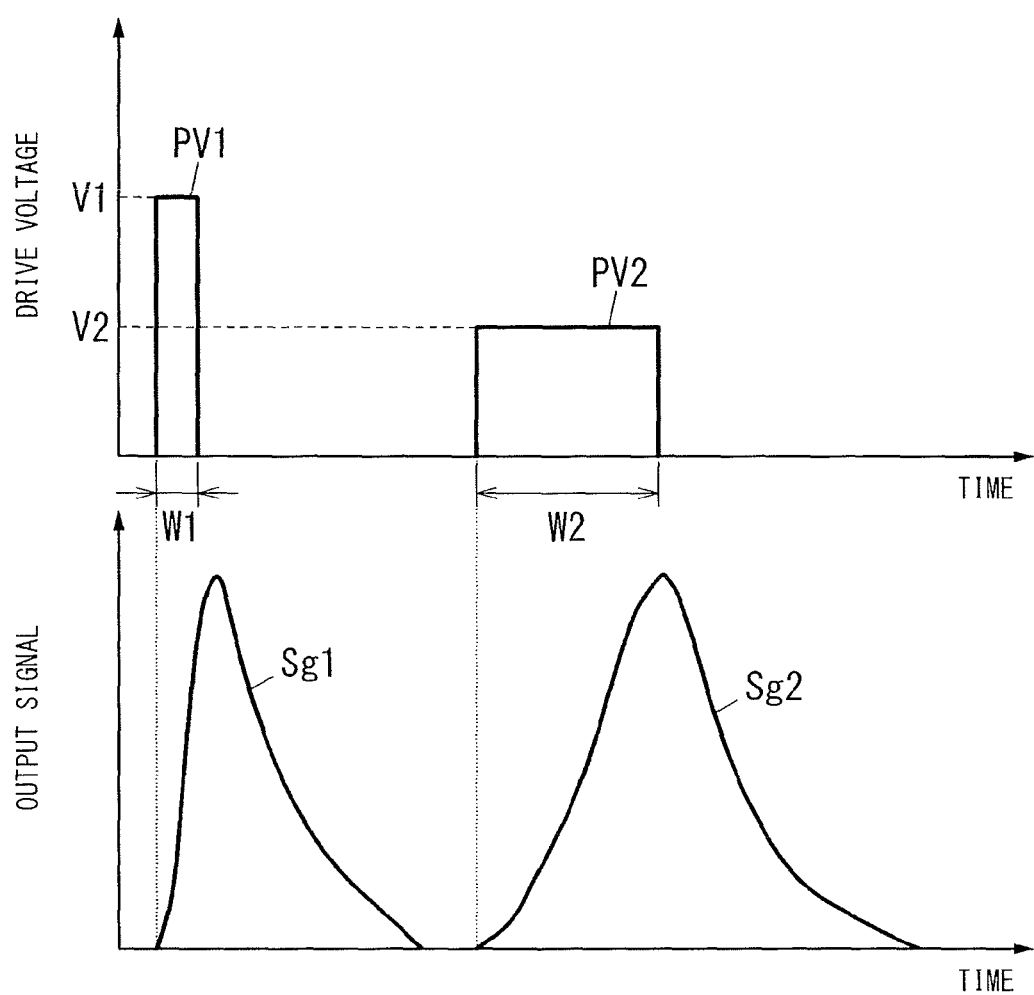
FIG. 70 is a drawing illustrating operation of a fifth variation of the infrared type gas sensor according to Embodiment 3.

FIG. 70 schematically shows a relation between a waveform of the drive voltage applied from the drive circuit 5 to the infrared emitting element 10; and the output signal of the IC element 40. Specifically, FIG. 70 schematically shows a relation between the first pulse voltage PV1 and the first output signal of the IC element 40, when the infrared emitting element 10 has been pulse-driven at the first pulse voltage PV1. Also, FIG. 70 schematically shows a relation between the second pulse voltage PV2 and the second output signal of the IC element 40, when the infrared emitting element 10 has been pulse-driven at the second pulse voltage PV2.

In the gas sensor 105, the concentration estimating portion 45d may be configured to estimate concentration of gas as a detection object by a concentration conversion formula, as the following formula (43).

[Mathematical 45]

$$Con2 = A2 \times X^2 + B2 \times X + C2 \qquad \text{formula(43)}$$

In the formula (43), Con2 is concentration of gas as a detection object. X is a value obtained by dividing the first output signal by a reference value. Each of A2, B2 and C2 is a coefficient. The reference value is an estimation value for an output signal of the infrared detection element 20a, when it is assumed that the concentration of the gas as the detection object is 0 ppm and the infrared emitting element 10 is pulse-driven under the first drive condition. The reference value is estimated based on Con1 and a value obtained by dividing the first output signal by the second output signal. The following Table 2 shows, as one example, the coefficients A2, B2 and C2 in a case where gas as a detection object is $CO_2$ and the respective first and second temperatures are 700 K and 500 K.

TABLE 2

| A2 | 113789 |
| B2 | −243532 |
| C2 | 129747 |

In the gas sensor 105, because a ratio at which P11 is attenuated due to concentration of gas as a detection object is large, the installation of the concentration estimating portion 45d configured to estimate concentration of gas as a detection object by the concentration conversion formula as the formula (43) can reduce variation in measurement accuracy.

The gas sensor 105 is not limited to the configuration where the pulse-drives for the infrared emitting element 10 under the first and second drive conditions are alternately repeated. For example, the gas sensor 105 may be configured such that the number of times that the infrared emitting element 10 is pulse-driven under the second drive condition is less than that under the first drive condition. Accordingly, the gas sensor 105 can more reduce power consumption. In this case, the gas sensor 105 may be configured to estimate the reference value with: the second output signal when a pulse drive has been performed under the second drive condition; the first output signal when a pulse drive has been performed under the first drive condition, which is closest to this pulse drive under the second drive condition; and Con1.

In the gas sensor 105, the long term stability of measurement accuracy can be more improved by using as the first output signal a value obtained by subjecting a plurality of first output signals to an averaging process.

Note that, in the gas sensor 105, the window member 19w of the infrared light source 1 may be configured by e.g., an optical filter (hereinafter, referred to as a "second optical filter) and the like for adjusting a cut-off rate with respect to infrared having the second transmission wavelength band λc~λd. The second optical filter may be provided as a non-reflection coating filter obtained by coating a third substrate with an antireflection film for reducing a reflectivity with respect to infrared having the first transmission wavelength band λa~λb. For example, the second optical filter can adjust, to almost 0%, a reflectivity with respect to infrared having an absorption wavelength λg, and further, to 40~80%, a reflectivity with respect to infrared having the second transmission wavelength band λc~λd. Examples of the third substrate include a silicon substrate, a germanium substrate, a sapphire substrate and the like. In the gas sensor 105, when the window member 19w of the infrared light source 1 is configured by the second optical filter, the second optical filter is configured as part of the optical system 3. Thus, in the gas sensor 105, it is possible to easily adjust transmittances in the first transmission wavelength band λa~λb and the second transmission wavelength band λc~λd.

Note that, in the gas sensor 105, the drive circuit 5 is not limited to the configuration of driving the infrared emitting element 10 with the pulse voltage. The drive circuit 5 may be configured to drive the infrared emitting element 10 with a pulse current.

Figure 71A:
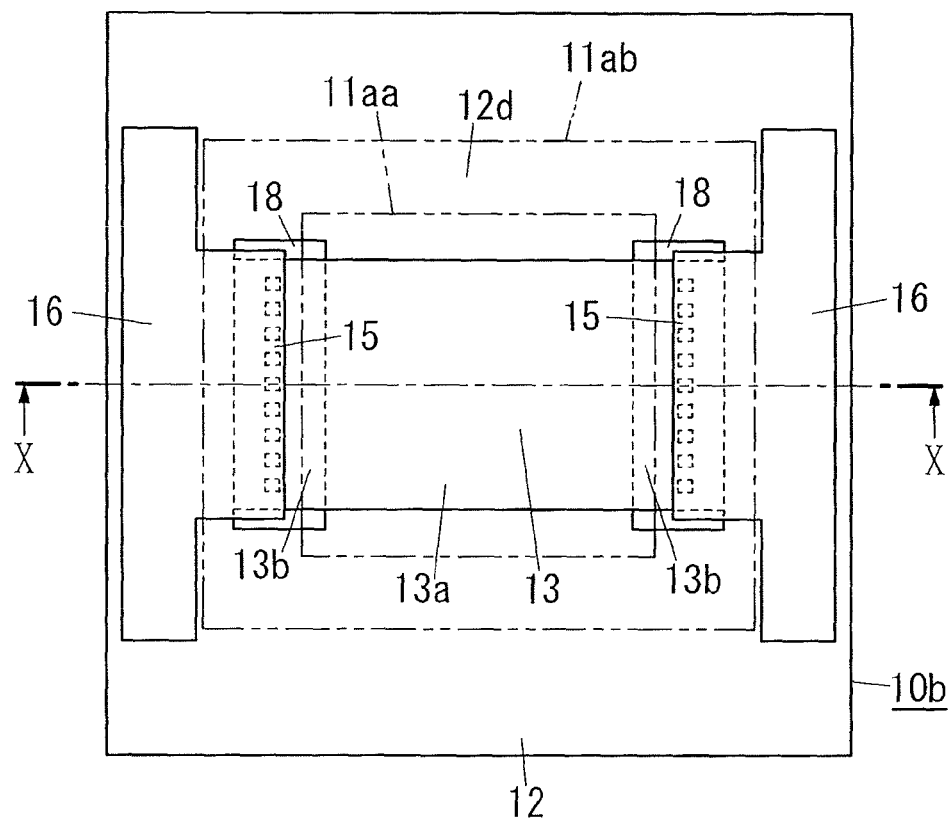
FIG. 71A is a schematic plan view of a variation of the infrared emitting element in the infrared type gas sensor according to Embodiment 3.
Figure 71B:
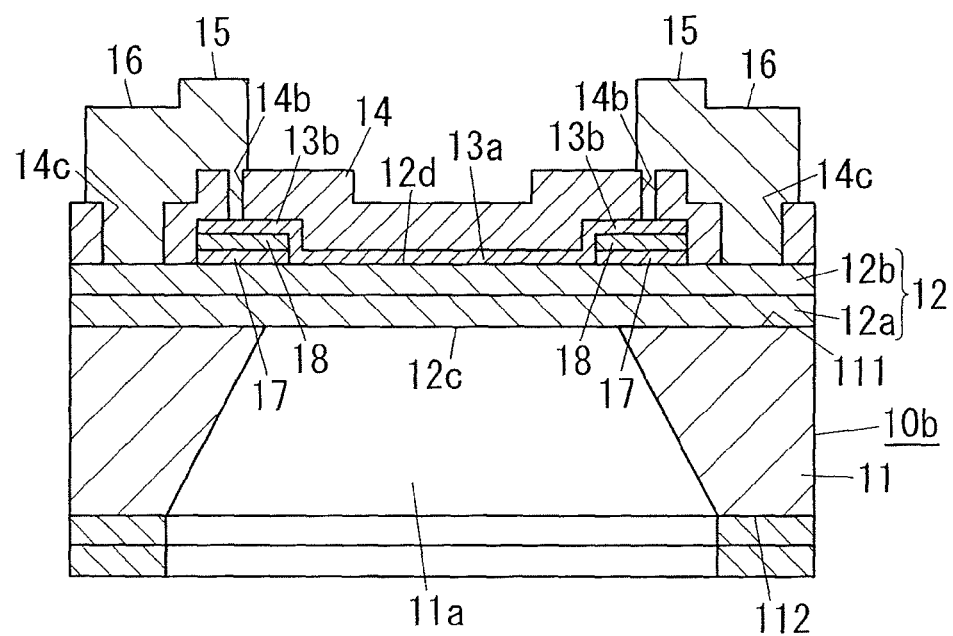
FIG. 71B is a schematic cross-sectional view taken along line X-X of FIG. 71A.
Figure 72:
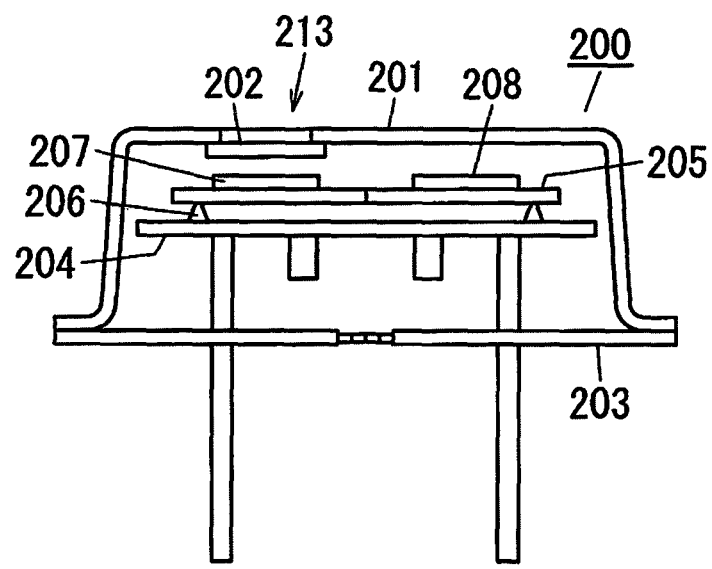
FIG. 72 is a longitudinal-sectional view of a conventional example as a pyroelectric infrared detection element.

FIGS. 71A and 71B show an infrared emitting element 10b as a variation of the infrared emitting element 10 shown in FIGS. 54A and 54B. Note that, regarding the infrared emitting element 10b as the variation, constituent elements similar to those of the infrared emitting element 10 are assigned with same reference numerals, and explanation thereof will be properly omitted. In FIG. 71A, the illustration of a protective layer 14 is omitted.

In FIG. 71A, a first outer peripheral line 11aa is shown by an alternate long and two short dashes line, as an outer peripheral line of a vertically projected area line from an opening of an opening part 11a in a surface 111 of a semiconductor substrate 11 to a second surface 12d of a thin film part 12. Also in FIG. 71A, a second outer peripheral line 11ab is shown by an alternate long and two short dashes line, as an outer peripheral line of a vertically projected area line from an opening of the opening part 11a in a back face 112 of the semiconductor substrate 11 to the second surface 12d of the thin film part 12. In the infrared emitting element 10b, the openings of the opening part 11a are shaped like rectangles, and the first and second outer peripheral lines 11aa and 11ab are shaped like rectangles, sizes of which are different from each other. In the infrared emitting element 10b, an opening area of the opening part 11a in the back face 112 of the semiconductor substrate 11 is larger than an opening area of the opening part 11a in the surface 111 of the semiconductor substrate 11. For this reason, an area surrounded by the second outer peripheral line 11ab is larger than an area surrounded by the first outer peripheral line 11aa. The opening part 11a of the semiconductor substrate 11 is shaped such that its opening area is gradually increased, as going away from the thin film part 12.

The infrared emitting layer 13 is shaped like a rectangle in planar view. The infrared emitting layer 13 is disposed such that its longitudinal direction is along a direction in which paired terminals 16 and 16 are arranged. A length of the infrared emitting layer 13 in the longitudinal direction is longer than a length of a side of the first outer peripheral line 11aa parallel to the longitudinal direction of the infrared emitting layer 13. A length of the infrared emitting layer 13 in a lateral direction thereof is shorter than a length of a side of the first outer peripheral line 11aa parallel to the lateral direction of the infrared emitting layer 13.

In the infrared emitting element 10b as the variation, each of both ends 13b and 13b of the infrared emitting layer 13 (in the direction in which the paired terminals 16 and 16 are arranged) is arranged across both of the inside and the outside of the first outer peripheral line 11aa.

In the infrared emitting element 10b, a central part 13a between the ends 13b and 13b of the infrared emitting layer 13 is formed directly on the second surface 12d of the thin film part 12. The central part 13a of the infrared emitting layer 13 is disposed inside the first outer peripheral line 11aa. In the infrared emitting element 10b, a laminated film of a first base layer 17 and a second base layer 18 is interposed between the thin film part 12 and each of the ends 13b and 13b. Accordingly, in the infrared emitting element 10b, the first and second base layers 17 and 18 are also arranged across both of the inside and the outside of the first outer peripheral line 11aa. It is preferable that the second base layer 18 be formed of material having a melting point higher than that of the semiconductor substrate 11, and electrical conductivity. It is preferable that the first base layer 17 be formed of the same material as the infrared emitting layer 13. In the infrared emitting element 10b, the second base layer 18 is held between the first base layer 17 and the end 13b of the infrared emitting layer 13 which are formed of the same material, and accordingly, it is possible to reduce stress in the second base layer 18. It is preferable that a thickness of the first base layer 17 be the same as that of the end 13b of the infrared emitting layer 13. The first and second base layers 17 and 18 are shaped like rectangles.

In the infrared emitting element 10b, when e.g., respective materials for the semiconductor substrate 11 and the infrared emitting layer 13 are Si and TaN, respective materials for the first and second base layers 17 and 18 may be TaN and Ta. In the infrared emitting element 10b, each wiring 15 and each terminal 16 may be formed of Al—Si.

In the infrared emitting element 10b, each wiring 15 is formed on the end 13b of the infrared emitting layer 13 to be electrically connected with the infrared emitting layer 13 via a corresponding connection hole 14b formed in the protective layer 14. In the infrared emitting element 10b, each terminal 16 is formed on the thin film part 12 via a corresponding hole 14c formed in the protective layer 14. Each hole 14c of the protective layer 14 is disposed outside the second outer peripheral line 11ab. Accordingly, in the infrared emitting element 10b, it is possible to prevent stress due to the terminals 16 from occurring in the infrared emitting layer 13. Furthermore in the infrared emitting element 10b, it is possible to utilize the semiconductor substrate 11 as a heat sink for radiating heat generated in the terminals 16 and the like to the outside. Note that, the terminals 16 are configured as pad electrodes.

In the infrared emitting element 10b, the semiconductor substrate 11 has a thickness of 525 μm, a silicon oxide film 12a has a thickness of 0.2 μm, a silicon nitride film 12b has a thickness of 0.2 μm, and the infrared emitting layer 13 has a thickness of 0.03 μm. In the infrared emitting element 10b, each first base layer 17 has a thickness of 0.03 μm, each second base layer 18 has a thickness of 0.07 μm, the protective layer 14 has a thickness of 0.3 μm, and each terminal 16 has a thickness of 1.5 μm. Numerical values of those constituent elements of the infrared emitting element 10b are merely one example, and not limited in particular.

In the infrared emitting element 10b, the thin film part 12 is configured by a laminated film of the silicon oxide film 12a and the silicon nitride film 12b. In the infrared emitting element 10b, a direction of inner stress in the silicon oxide film 12a is opposite to a direction of inner stress in the silicon nitride film 12b, and the silicon nitride film 12b functions as a shape stabilizing layer for more stabilizing the shape of the infrared emitting layer 13, compared with a case where the thin film part 12 is configured by only the silicon oxide film 12a.

The infrared light source 1 is not limited to the configuration with the infrared emitting element 10 and the package 19, but e.g., a halogen lamp or the like may be used. In this case, a filament of the halogen lamp is configured as an infrared emitting element.

The figures explained in the above-mentioned Embodiments 1 to 3 and the like are schematic, and therefore, a size ratio and a thickness ratio among the constituent elements do not necessarily represent an actual size ratio and an actual thickness ratio. In addition, the materials, the numerical values and the like in the embodiments and the like have been cited as merely preferable examples, but it is not limited to the cited preferable examples. Furthermore, in the present invention, modifications to the configuration can be made without departing from scope of the technical ideas.

The invention claimed is:

1. An infrared detection element comprising a first pyroelectric element and a second pyroelectric element,
the first pyroelectric element and the second pyroelectric element being arranged in a single pyroelectric substrate, the first pyroelectric element comprising:
a first surface electrode provided on a surface of the single pyroelectric substrate;
a first back face electrode provided on a back face of the single pyroelectric substrate; and
a first portion interposed between the first surface electrode and the first back face electrode, the first portion being provided as part of the single pyroelectric substrate, the first back face electrode facing the first surface electrode through the first portion,
the second pyroelectric element comprising:
a second surface electrode provided on the surface of the single pyroelectric substrate;
a second back face electrode provided on the back face of the single pyroelectric substrate; and
a second portion interposed between the second surface electrode and the second back face electrode, the second portion being provided as part of the single pyroelectric substrate, the second back face electrode facing the second surface electrode through the second portion,
the single pyroelectric substrate being provided on the surface thereof with a first surface wiring and a second surface wiring that are electrically connected with the first surface electrode and the second surface electrode, respectively,
the single pyroelectric substrate being provided on the back face thereof with a first back face wiring and a second back face wiring that are electrically connected with the first back face electrode and the second back face electrode, respectively,
the single pyroelectric substrate being provided in part thereof surrounding the first pyroelectric element with a slit that is shaped along an outer periphery of the first pyroelectric element, the slit being formed out of regions in which the first surface wiring and the first back face wiring are disposed, and
part of the single pyroelectric substrate surrounding the second pyroelectric element being continuously formed over an entire circumference of the second portion.

2. The infrared detection element according to claim 1, wherein the slit of the single pyroelectric substrate is at least along a side of the first pyroelectric element, facing the second pyroelectric element.

3. The infrared detection element according to claim 1, comprising at least two sets of the first pyroelectric element and the second pyroelectric element, the single pyroelectric substrate being formed with the slit at each of facing sides of two adjacent first pyroelectric elements.

4. The infrared detection element according to claim 1, further comprising an infrared absorption layer for absorbing infrared, which is on the first surface electrode.

5. The infrared detection element according to claim 4, wherein the first surface electrode and the second surface electrode have sheet resistances that function as infrared reflection layers for reflecting infrared.

6. The infrared detection element according to claim 4, wherein the infrared absorption layer is provided so as to cover a whole region that is surrounded by the slit in planar view,
the infrared absorption layer is formed of a first resin layer in which at least one kind of conductive fine powder is dispersed in resin, and the at least one kind of conductive fine powder is selected from a group of carbon fine powder, metal fine powder and metal oxide fine powder.

7. An infrared detector, comprising: the infrared detection element according to claim 1;
an optical filter disposed in front of the infrared detection element, and configured to transmit infrared having a wavelength band, as a detection object to be detected by the infrared detection element;
a base body on which the infrared detection element is mounted; and
a package that houses the infrared detection element, the optical filter and the base body, the package comprising:
a pedestal that supports the base body;
a cap made of metal, and fixed to the pedestal so as to cover the infrared detection element and the optical filter;
a window hole in a top plate of the cap; and
a window member disposed to close the window hole, the window member allowing infrared to pass through.

8. The infrared detector according to claim 7, wherein the infrared detection element comprises two sets of the first pyroelectric element for receiving infrared light and the second pyroelectric element for compensating temperature, one set thereof constituting a first detection element, another set thereof constituting a second detection element, and the first detection element and the second detection element being on the single pyroelectric substrate,
the optical filter comprises:
a first optical filter disposed in front of a light receiving surface of the first pyroelectric element of the first detection element; and
a second optical filter disposed in front of a light receiving surface of the first pyroelectric element of the second detection element,
the first detection element and the second detection element respectively comprise first output terminals provided on the surface of the single pyroelectric substrate, the first detection element and the second detection element further respectively comprising second output terminals provided on the back face of the single pyroelectric substrate,
the first output terminals are disposed so as not to overlap with the second output terminals in a thickness direction of the single pyroelectric substrate,
the base body comprises:
an insulation base member having an electric insulation property;
two first lead terminals; and
two second lead terminals, the two first lead terminals and the two first lead terminals being provided integrally with the insulation base member,
the first lead terminals are respectively electrically connected with the first output terminals of the first detection element and the second detection element individually via first bonding portions, each of which is made of a conductive adhesive,
the second lead terminals are respectively electrically connected with the second output terminals of the first detection element and the second detection element individually via second bonding portions, each of which is made of a conductive adhesive, the insulation base member is provided on a first surface thereof with at least one of:
a projection for positioning the infrared detection element, the projection projecting between each of the first lead terminals and a corresponding second lead terminal, outside an area where the infrared detection element is to be mounted, in a thickness direction of the insulation base member; and
a wall for positioning the infrared detection element, the wall projecting, outside the area where the infrared detection element is to be mounted, in the thickness direction of the insulation base member, a height of the wall being smaller than a thickness of the infrared detection element.

9. The infrared detector according to claim 8, wherein the insulation base member is provided with a positioning portion for positioning the first optical filter and the second optical filter, and
the positioning portion projects from the first surface of the insulation base member in a direction along a thickness direction of the infrared detection element.

10. The infrared detector according to claim 9, wherein the positioning portion comprises:
a wall portion for defining positions of the first optical filter and the second optical filter in a direction in which the first optical filter and the second optical filter are arranged in planar view; and
supporting portions between which the first optical filter and the second optical filter are installed.

11. The infrared detector according to claim 8, further comprising:
a first IC element for signal processing a first output signal of the first detection element; and
a second IC element for signal processing a second output signal of the second detection element,
the infrared detection element being disposed on a first surface side of the base body, and
the first IC element and the second IC element being disposed on a second surface side of the base body.

12. The infrared detector according to claim 7, wherein the first pyroelectric element for receiving infrared light and the second pyroelectric element for compensating temperature, which are paired, of the infrared detection element are arranged on the single pyroelectric substrate,
the first pyroelectric element and the second pyroelectric element,
which are paired, are connected in reverse parallel to or in reverse series to each other,
the infrared detection element is disposed such that the first pyroelectric element is positioned in an area of the infrared detection element, which is a vertically projected area from the window hole,
the optical filter is disposed between the window member and the first pyroelectric element, and
the infrared detector further comprises a light blocking member that is disposed between the window member and the infrared detection element,
the light blocking member being configured to block infrared that is directed toward the second pyroelectric element, after passing through the window member from an outside of the package and entering the package,
and the light blocking member being held by the base body.

13. The infrared detector according to claim 12, wherein the first pyroelectric element of the infrared detection element is provided in a central area of the single pyroelectric substrate,
the second pyroelectric element of the infrared detection element is provided in a peripheral area of the single pyroelectric substrate,
the light blocking member has a plate shape, and is provided in a central area thereof with an opening, and
the opening is larger than an area of the light blocking member, which is a vertically projected area from the first pyroelectric element in a thickness direction of the first pyroelectric element.

14. The infrared detector according to claim 13, wherein the light blocking member is further provided with:
a depression formed in a peripheral part of the opening such that end faces of the peripheral part facing the window member and the opening are recessed; and
a window part through which part of the infrared detection element is visible from a first surface of the light blocking member,
the window part is out of: the opening; the depression; and an area of the light blocking member, which is a vertically projected area from the second pyroelectric element in a thickness direction of the second pyroelectric element, and
the optical filter is disposed to close the opening, the optical filter being positioned to the light blocking member with a periphery thereof mounted on the depression.

15. An infrared type gas sensor, comprising:
an infrared emitting element configured to emit infrared by thermal radiation; and
the infrared detection element according to claim 1.

16. An infrared type gas sensor comprising:
the infrared detector according to claim 8;
an infrared emitting element configured to emit infrared by thermal radiation;
a sample cell disposed between the infrared emitting element and the infrared detector; and
a signal processor,
wherein the first optical filter has a first transmission wavelength band for transmitting infrared having an absorption wavelength of gas as a detection object,
the second optical filter has a second transmission wavelength band, without overlapping with the first transmission wavelength band, for transmitting infrared having a reference wavelength as a non-absorption wavelength of the gas,
the sample cell is provided with a vent hole through which the gas as the detection object is introduced therein or discharged outside, and
the signal processor is configured to calculate concentration of the gas based on a difference or a ratio between a first output signal of the first detection element and a second output signal of the second detection element.

17. The infrared type gas sensor according to claim 16, wherein the sample cell is shaped like a tube, an inner face of which is configured as a reflection surface for reflecting infrared emitted from the infrared emitting element,
the reflection surface is in a shape of a spheroid, a rotation axis of which is a major axis defined as a central axis of the sample cell, both ends of the spheroid in a direction of the major axis being cut by two planes perpendicular to the major axis,
the infrared emitting element is disposed in vicinity of one focal point of the spheroid on the central axis, and the infrared detector is disposed at a position near another focal point of the spheroid between the infrared emitting element and the another focal point on the central axis.

18. The infrared type gas sensor according to claim 15, comprising a first light receiving element and a second light receiving element,
wherein the infrared detection element is formed with two sets of the first pyroelectric element for receiving infrared light and the second pyroelectric element for compensating temperature, one set thereof constituting a first detection element,
another set thereof constituting a second detection element and the first detection element and the second detection element being on the single pyroelectric substrate,
the first pyroelectric element of the first detection element constitutes the first light receiving element,
the first pyroelectric element of the second detection element constitutes the second light receiving element,
the infrared type gas sensor further comprises:
a first optical system disposed between the infrared emitting element and the first light receiving element;
a second optical system disposed between the infrared emitting element and the second light receiving element;
a drive circuit configured to drive the infrared emitting element; and
a signal processor configured to calculate concentration of gas as a detection object based on a ratio between a first output signal of the first light receiving element and a second output signal of the second light receiving element,
the first optical system has a first transmission wavelength band for transmitting infrared having an absorption wavelength of the gas as the detection object,
the second optical system has a second transmission wavelength band for transmitting infrared having a reference wavelength,
the first transmission wavelength band is different from the second transmission wavelength band,
all wavelengths in the second transmission wavelength band are shorter than all wavelengths in the first transmission wavelength band the first optical system and the second optical system have a common prescribed wavelength band for compensation, all wavelengths in the common prescribed wavelength band are longer than all wavelengths in the first and second transmission wavelength bands, the first optical system has a first average transmittance in the common prescribed wavelength band, which is less than a second average transmittance of the second optical system in the common prescribed wavelength band and the first and second average transmittances are set to compensate a change in a ratio between: a first output signal component of the first light receiving element based on infrared having the first transmission wavelength band; and a second output signal component of the second light receiving element based on infrared having the second transmission wavelength band, the change in the ratio being caused due to a change in emission power of the infrared emitting element.

19. The infrared type gas sensor according to claim 15, comprising a first light receiving element and a second light receiving element,
wherein the infrared detection element is formed with two sets of the first pyroelectric element for receiving infrared light and the second pyroelectric element for compensating temperature, one set thereof constituting a first detection element,
another set thereof constituting a second detection element, and the first detection element and the second detection element being on the single pyroelectric substrate,
the first pyroelectric element of the first detection element constitutes the first light receiving element,
the first pyroelectric element of the second detection element constitutes the second light receiving element,
the infrared type gas sensor further comprises:
a first optical system disposed between the infrared emitting element and the first light receiving element;
a second optical system disposed between the infrared emitting element and the second light receiving element;
a drive circuit configured to drive the infrared emitting element; and
a signal processor configured to calculate concentration of gas as a detection object based on a ratio between a first output signal of the first light receiving element and a second output signal of the second light receiving element,
the first optical system has a first transmission wavelength band for transmitting infrared having an absorption wavelength of the gas as the detection object,
the second optical system has a second transmission wavelength band for transmitting infrared having a reference wavelength,
the first transmission wavelength band is different from the second transmission wavelength band,
all wavelengths in the second transmission wavelength band are longer than all wavelengths in the first transmission wavelength band,
the first optical system and the second optical system have a common prescribed wavelength band for compensation,
all wavelengths in the common prescribed wavelength band are longer than all wavelengths in the first and second transmission wavelength bands,
the first optical system has a first average transmittance in the common prescribed wavelength band which is more than a second average transmittance of the second optical system in the common prescribed wavelength band, and
the first and second average transmittances are set to compensate a change in a ratio between:
a first output signal component of the first light receiving element based on infrared having the first transmission wavelength band; and
a second output signal component of the second light receiving element based on infrared having the second transmission wavelength band,
the change in the ratio being caused due to a change in emission power of the infrared emitting element.

20. An infrared type gas sensor comprising the infrared detector according to claim 7, and an infrared emitting element configured to emit infrared by thermal radiation,
wherein the infrared detector further comprises an IC element for signal processing an output signal of the infrared detection element, and
the infrared type gas sensor further comprises:
a sample cell disposed between the infrared emitting element and the infrared detector, the sample cell allowing gas as a detection object to introduce therein or to discharge outside;

a drive circuit configured to intermittently energize the infrared emitting element;

a controller configured to control the drive circuit; and a signal processing circuit configured to signal-process an output signal of the IC element to calculate concentration of the gas as the detection object.

21. The infrared type gas sensor according to claim 20, wherein the infrared emitting element comprises:

a semiconductor substrate;

a thin film part on a surface of the semiconductor substrate;

an opening part in the semiconductor substrate, the opening part being for exposing partially a first surface of the thin film part facing the semiconductor substrate; and an infrared emitting layer on a second surface of the thin film part, the infrared emitting layer being configured to emit infrared by thermal radiation when energized, the infrared emitting element is configured to emit infrared even for a non-energizing period during which the infrared emitting layer is de-energized after energized, the IC element comprises a current-voltage conversion circuit that is configured to current-voltage convert a current signal as the output signal of the infrared detection element, and the current-voltage conversion circuit is configured such that a gain with respect to a frequency component of an amount of infrared emitted by the infrared emitting element, which is changed with time, for the non-energizing period is more than a gain with respect to a frequency band, all frequencies of which are higher than the frequency component.

22. The infrared type gas sensor according to claim 15, further comprising:

an optical system disposed between the infrared emitting element and the infrared detection element, the optical system having respective infrared transmittances in a first transmission wavelength band for transmitting infrared having an absorption wavelength of gas as a detection object, and a second transmission wavelength band, all wavelengths in the second transmission wavelength band being longer than all wavelengths in the first transmission wavelength band, the second transmission wavelength band having an average transmittance that is less than that of the first transmission wavelength band;

a drive circuit configured to pulse-drive the infrared emitting element;

a controller configured to control the drive circuit in time series such that the drive circuit pulse-drives the infrared emitting element under a first drive condition or a second drive condition, the infrared emitting element under the first drive condition having a peak wavelength in an emission energy distribution that is different from that under the second drive condition; and a signal processor configured to estimate concentration of gas as a detection object based on a ratio between a first output signal of the infrared detection element under the first drive condition and a second output signal of the infrared detection element under the second drive condition.

* * * * *